US011171742B2

(12) United States Patent
Kalachev et al.

(10) Patent No.: US 11,171,742 B2
(45) Date of Patent: Nov. 9, 2021

(54) MULTI-LABEL OFFSET LIFTING METHOD

(71) Applicant: Futurewei Technologies, Inc., Plano, TX (US)

(72) Inventors: Gleb Vyacheslavovich Kalachev, Moscow (RU); Ivan Leonidovich Mazurenko, Khimki (RU); Pavel Anatolyevich Panteleev, Odintsovo (RU); Elyar Eldarovich Gasanov, Moscow (RU); Aleksey Alexandrovich Letunovskiy, Moscow (RU); Wen Tong, Ottawa (CA); Carmela Cozzo, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/899,248

(22) Filed: Jun. 11, 2020

(65) Prior Publication Data

US 2020/0412480 A1 Dec. 31, 2020

Related U.S. Application Data

(62) Division of application No. 15/968,597, filed on May 1, 2018, now Pat. No. 10,735,138.

(Continued)

(51) Int. Cl.

*H04L 1/00* (2006.01)
*H03M 13/11* (2006.01)

(Continued)

(52) U.S. Cl.

CPC ........ *H04L 1/0057* (2013.01); *H03M 13/036* (2013.01); *H03M 13/116* (2013.01);

(Continued)

(58) Field of Classification Search

CPC ..... H04L 1/0057; H04L 1/0041; H04L 1/005; H04L 1/0068; H04L 1/0063;

(Continued)

(56) References Cited

U.S. PATENT DOCUMENTS

| | | | |
|---|---|---|---|
| 6,498,791 | B2 | 12/2002 | Pickett et al. |
| 2008/0178065 | A1 | 7/2008 | Khandekar et al. |

(Continued)

FOREIGN PATENT DOCUMENTS

| | | | |
|---|---|---|---|
| CN | 101924564 | A | 12/2010 |
| CN | 102386933 | A | 3/2012 |

(Continued)

OTHER PUBLICATIONS

T. Chen, D. Divsalar, J. Wang and R. D. Wesel, "Protograph-Based Raptor-Like LDPC Codes for Rate Compatibility with Short Blocklengths," 2011 IEEE Global Telecommunications Conference—GLOBECOM 2011, Houston, TX, USA, 2011, pp. 1-6. (Year: 2011).*

(Continued)

*Primary Examiner* — Cynthia Britt
(74) *Attorney, Agent, or Firm* — Slater Matsil, LLP

(57) ABSTRACT

A method for generating a code, a method for encoding and decoding data, and an encoder and a decoder performing the encoding and decoding are disclosed. In an embodiment, a method for lifting a child code from a base code for encoding and decoding data includes determining a single combination of a circulant size, a lifting function, and a labelled base matrix PCM according to an information length and a code rate using data stored in a lifting table. The lifting table was defined at a code generation stage. The method also includes calculating a plurality of shifts for the child code. Each shift is calculated by applying the lifting function to the labelled base matrix PCM with a defined (Continued)

index using the circulant size and using the derived child PCM to encode or decode data.

20 Claims, 114 Drawing Sheets

Related U.S. Application Data

(60) Provisional application No. 62/500,370, filed on May 2, 2017.

(51) Int. Cl.
*H03M 13/03* (2006.01)
*H03M 13/00* (2006.01)

(52) U.S. Cl.
CPC ..... *H03M 13/1165* (2013.01); *H03M 13/616* (2013.01); *H03M 13/618* (2013.01); *H03M 13/6362* (2013.01); *H03M 13/6516* (2013.01); *H04L 1/005* (2013.01); *H04L 1/0041* (2013.01); *H04L 1/0063* (2013.01); *H04L 1/0068* (2013.01)

(58) Field of Classification Search
CPC ........... H03M 13/618; H03M 13/6362; H03M 13/616; H03M 13/6516; H03M 13/036; H03M 13/116; H03M 13/1165; H03M 13/1162; H03M 13/6306; H03M 13/1102; H03M 13/15; H03M 13/6525
See application file for complete search history.

(56) References Cited

U.S. PATENT DOCUMENTS

| | | | |
|---|---|---|---|
| 2011/0066916 A1 | 3/2011 | Abu-Surra et al. | |
| 2011/0307760 A1 | 12/2011 | Pisek et al. | |
| 2013/0139024 A1 | 5/2013 | Nguyen et al. | |
| 2014/0223254 A1 | 8/2014 | Pisek | |
| 2016/0164538 A1* | 6/2016 | Abu-Surra | H03M 13/1154 714/776 |
| 2017/0149528 A1 | 5/2017 | Kim et al. | |
| 2018/0175886 A1 | 6/2018 | Myung et al. | |
| 2018/0226992 A1 | 8/2018 | Panteleev et al. | |
| 2018/0323801 A1 | 11/2018 | Hsu et al. | |
| 2018/0323802 A1 | 11/2018 | Kalachev et al. | |
| 2018/0337691 A1 | 11/2018 | Kalachev et al. | |
| 2019/0052400 A1 | 2/2019 | Soriaga et al. | |
| 2019/0349003 A1 | 11/2019 | Usatyuk et al. | |

FOREIGN PATENT DOCUMENTS

| | | |
|---|---|---|
| CN | 102739346 A | 10/2012 |
| CN | 102939720 A | 2/2013 |
| CN | 104581589 A | 4/2015 |
| CN | 105356993 A | 2/2016 |
| CN | 106130655 A | 11/2016 |
| WO | 2016011814 A1 | 1/2016 |

OTHER PUBLICATIONS

N. Bonello, S. Chen and L. Hanzo, "Construction of Regular Quasi-Cyclic Protograph LDPC codes based on Vandermonde Matrices," 2008 IEEE 68th Vehicular Technology Conference, Calgary, AB, Canada, 2008, pp. 1-5. (Year: 2008).*

Y. Fang, G. Bi, Y. L. Guan and F. C. M. Lau, "A Survey on Protograph LDPC Codes and Their Applications," in IEEE Communications Surveys & Tutorials, vol. 17, No. 4, pp. 1989-2016, Fourthquarter 2015. (Year: 2016).*

ZTE Corp., et al. "Discussion on LDPC codes for NR", 3GPP TSG RAN WG1 #86, Gothenburg, Sweeden, Aug. 22-26, 2016, R1-166414, 11 pages.

Qualcomm Incorporated, "LDPC rate compatible design", 3GPP TSG-RAN WG1 NR Ad Hoc, Jan. 16-20, 2017, Spokane, USA, R1-1700830, 19 pages.

"3rd Generation Partnership Project; Technical Specification Group Radio Access Network; NR; Multiplexing and channel coding (Release 15)," 3GPP TS 38.212 V0.1.1, Sep. 2017, 29 pages.

"5G," Wikipedia, downloaded from https://en.wikipedia.org/wiki/5G on May 1, 2018, 4 pages.

Chen, J. et al., "Improved Min-Sum Decoding Algorithms for Irregular LDPC Codes," Proceedings of the 2005 IEEE International Symposium on Information Theory, Sep. 2005, 5 pages.

Chen, T.Y. et al., "Protograph-Based Raptor-Like LDPC Codes," IEEE Transactions on Communications, vol. 63, No. 5, May 2015, 11 pages.

Fossorier, M.P.C., "Quasi-Cyclic Low-Density Parity-Check Codes From Circulant Permutation Matrices," IEEE Transactions on Information Theory, vol. 50, No. 8, Aug. 2004, 6 pages.

Fossorier, M.P.C. et al., "Reduced Complexity Iterative Decoding of Low-Density Parity Check Codes Based on Belief Propagation," Transactioins Papers, IEEE Transactions on Communications, vol. 47, No. 5, May 1999, 8 pages.

"Hybrid automatic repeat request," Wikipedia, downloaded from https://en.wikipedia.org/wiki/Hybrid_automatic_repeat_request on May 1, 2018, 4 pages.

"Part 11: Wireless LAN Medium Access Control (MAC) and Physical Layer (PHY) Specifications, Amendment 3: Enhancements for Very High Throughput in the 60 GHz Band," IEEE P802.11ad/D9.0, Draft Standard for Information Technology—Telecommunications and Informational Exchange Between Systems—Local and Metropolitan Area Networks—Specific Requirements, Jul. 2012, 679 pages.

"Part 11: Wireless LAN Medium Access Control (MAC) and Physical Layer (PHY) Specifications Amendment 5: Enhancements for Higher Throughput," IEEE Standard for Information Technology—Telecommunications and Information Exchange Between Systems—Local and Metropoliltan Area Networks—Specific Requirements, IEEE Std 802.11n-2009, 2009, 534 pages.

Mitchell, D. et al., "Quasi-Cuclic LDPC Codes Based on Pre-Lifted Protographs," in IEEE Transactions on Information Theory, vol. 60, No. 10, pp. 5856-5874, Oct. 2014.

Mitchell D, et al., "Constructiong good QC-LDPC codes by prelifting protographs", 2012 IEEE Information Theory Workshop, Lausanne, 2012, pp. 202-206.

Myung S. et al., "Extension of quasi-cyclic LDPC codes by lifting", Proceedings, International Symposium on Information Theory, 2005. ISIT 2005. Adelaide, SA, 2005, pp. 2305-2309.

Myung S, et al., "Lifting methods for quasi-cyclic LDPC codes," in IEEE Communications Letters, vol. 10, No. 6, pp. 489-491, Jun. 2006.

Panteleev, P.A. et al., "Offset Lifting Method," filed Feb. 3, 2017, U.S. Appl. No. 62/454,416.

Panteleev, P.A. et al., "Offset Lifting Method," filed Feb. 2, 2018, U.S. Appl. No. 15/887,148.

Paolini E. et al., "Low-Density Parity-Check Code Constructions," Chapter 3 from "Channel Coding: Theory, Algorithms, and Applications," Elsevier Ltd., 2014, 69 pages.

"LDPC design for eMBB," Agenda item: 8.1.3.1, Source: Nokia, Alcatel-Lucent Shanghai Bell, Document for: Discussion and Decision, 3GPP TSG-RAN WG1 #86bis, R1-1609584, Oct. 10-12, 2016, 14 pages.

"Flexibility of LDPC-Length, Rate and IR-HARQ," Agenda Item: 7.1.5.1, Source: Samsung, Document for: Discussion and Decision, 3GPP TSG RAN WG1 #85, R1-164007, May 23-27, 2016, 8 pages.

"LDPC Design Overview," Agenda item: 7.1.5.1, Source: Qualcomm Incorporated, Document for: Discussion/Decision, 3GPP TSG-RAN WG1 #85, R1-164697, May 23-27, 2016, 5 pages.

"Chairman's Notes of Agenda Item 5.1.5 Channel Coding," Agenda item: 5.1.5, Source: Session Chairman (Nokia), Document for: Endorsement, 3GPP TSG RAN WG1 AH_NR Meeting, R1-1701384, Jan. 16-20, 2017, 6 pages.

(56) References Cited

OTHER PUBLICATIONS

"Implementation Aspects of LDPC Codes," Agenda Item: 8.1.4.1, Source: Huawei, HiSilicon, Document for: Discussion and Decision, 3GPP TSG RAN WG1 Meeting #88, R1-1701707, Feb. 13-17, 2017, 14 pages.
"Performance Evaluation of LDPC Codes," Agenda Item: 8.1.4.1, Source: Huawei, HiSilicon, Document for: Discussion and Decision, 3GPP TSG RAN WG1 Meeting #88, R1-1701708, Feb. 13-17, 2017, 13 pages.
Richardson, T.J. et al., "Efficient Encoding of Low-Density Parity-Check Codes," IEEE Transactions on Information Theory, vol. 47, No. 2, Feb. 2001, 19 pages.
Savin, V. et al., "Split-Extended LDPC Codes for coded Cooperation," 2010 International Symposium on Information Theory and its Applications (ISITA), Oct. 17-20, 2010, 6 pages.
Xie, Y. et al., "Protograph Quantum LDPC Codes from Tensor Product of Parity-Check Matrices", 2015 IEEE Workshops (GC wkshps), San Diego, CA 2015, pp. 1-5.
IEEE Std 802.16E-2005, "Air Interface for Fixed and Mobile Broadband Wireless Access Systems", Amendment 2 and Corrigendum 1 to IEEE Std 802.16-2004, Feb. 28, 2006, XP002515198, pp. 626-630.
Zhang, X., "Binary LDPC Codes & Decoder Architectures: VLSI Architectures for Modern Error-Correcting Codes," CRC Press, 2016, pp. 225-267.
Ericsson, "LDPC Code Design", 3GPP TSG RAN WG1 AH_NR Meeting, R1-1700108, Jan. 16-20, 2017, 11 Pages, Spokane, USA.
ZTE et al., "Further consideration on compact LDPC design for eMBB", 3GPP TSG RAN WG1 Meeting #88bis, R1-1704382, Apr. 3-7, 2017, 17 Pages, Spokane, USA.

* cited by examiner

402

| $Z_{orig}$=[K/Kb] | i = 1,2...,m | J = 1,2...,n | PCM = 1,2,...,t |
|---|---|---|---|
| $Z_{min}$ | 1 | 3 | 1 |
| ... | ... | ... | ... |
| $Z_{max}$ | 2 | 4 | 3 |

404

| $Z_{orig}$=[K/Kb] | Z | J = 1,2...,n | PCM = 1,2,...,t |
|---|---|---|---|
| $Z_{min}$ | 8 | 3 | 1 |
| ... | ... | ... | ... |
| $Z_{max}$ | 384 | 4 | 3 |

| $Z_{orig}$=[K/Kb] | Z | PCM = 1,2,...,t |
|---|---|---|
| $Z_{min}$ | 8 | 1 |
| ... | ... | ... |
| $Z_{max}$ | 384 | 3 |

Figure 5B:
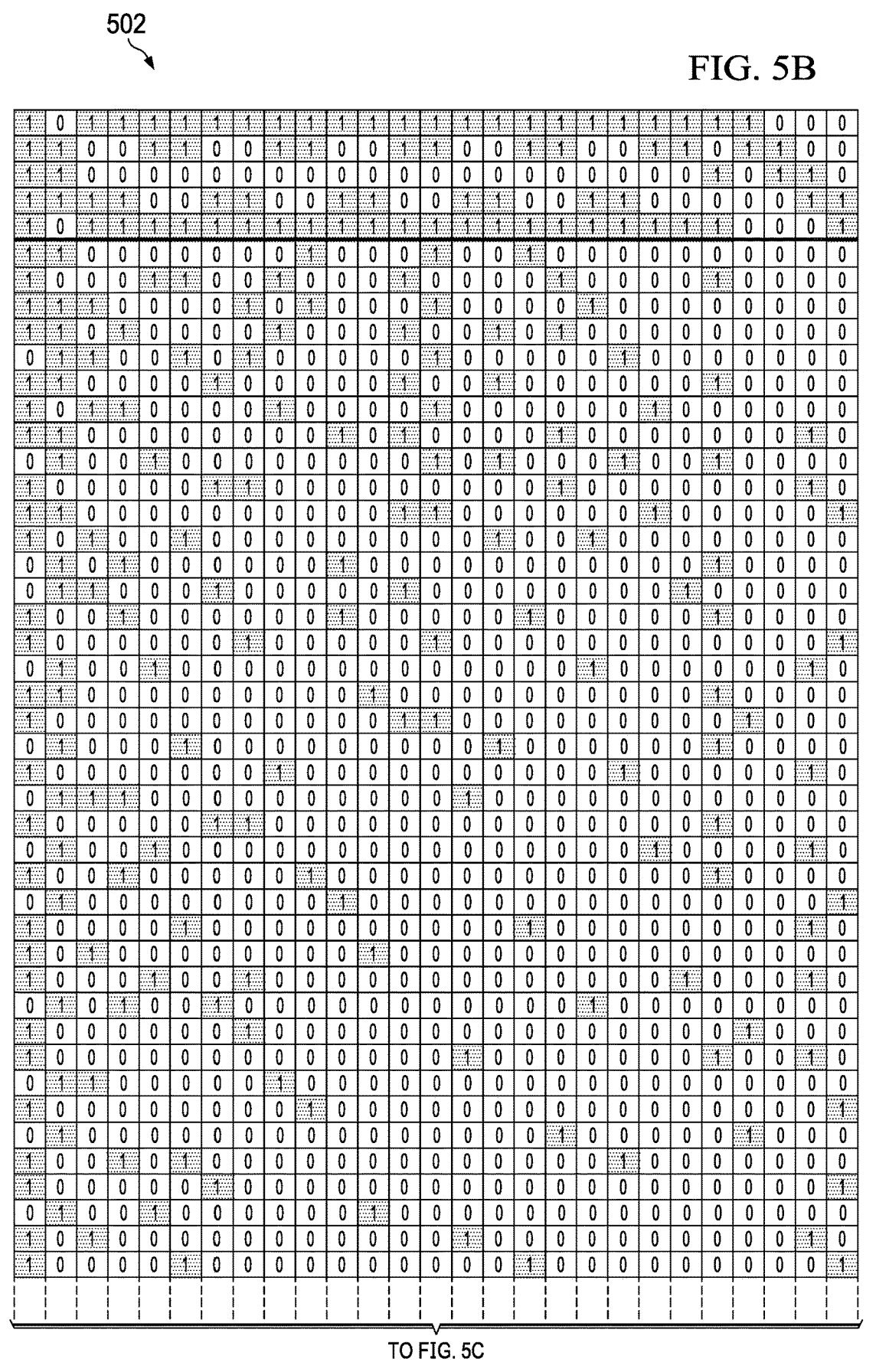

| | | | | | | | | | | | | | | | | | | | | | | | | | | |
|---|---|---|---|---|---|---|---|---|---|---|---|---|---|---|---|---|---|---|---|---|---|---|---|---|---|---|
| 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 |
| 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 1 | 1 | 0 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 1 | 1 | 0 |
| 1 | 1 | 1 | 1 | 0 | 0 | 1 | 1 | 0 | 0 | 1 | 1 | 0 | 0 | 1 | 1 | 0 | 0 | 1 | 1 | 0 | 0 | 0 | 0 | 0 | 1 | 1 |
| 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 1 |
| 1 | 1 | 0 | 0 | 0 | 0 | 0 | 0 | 0 | 1 | 0 | 0 | 0 | 1 | 0 | 0 | 1 | 0 | 0 | 0 | 0 | 0 | 0 | 0 | 0 | 0 | 0 |
| 1 | 0 | 0 | 0 | 1 | 1 | 0 | 0 | 1 | 0 | 0 | 0 | 1 | 0 | 0 | 0 | 0 | 1 | 0 | 0 | 0 | 0 | 1 | 0 | 0 | 0 | 0 |
| 1 | 1 | 1 | 0 | 0 | 0 | 0 | 1 | 0 | 1 | 0 | 0 | 0 | 1 | 0 | 0 | 0 | 0 | 1 | 0 | 0 | 0 | 0 | 0 | 0 | 0 | 0 |
| 1 | 1 | 0 | 1 | 0 | 0 | 0 | 0 | 1 | 0 | 0 | 0 | 1 | 0 | 0 | 1 | 0 | 1 | 0 | 0 | 0 | 0 | 0 | 0 | 0 | 0 | 0 |
| 0 | 1 | 1 | 0 | 0 | 1 | 0 | 1 | 0 | 0 | 0 | 0 | 0 | 1 | 0 | 0 | 0 | 0 | 0 | 1 | 0 | 0 | 0 | 0 | 0 | 0 | 0 |
| 1 | 1 | 0 | 0 | 0 | 0 | 1 | 0 | 0 | 0 | 0 | 0 | 1 | 0 | 0 | 1 | 0 | 0 | 0 | 0 | 0 | 0 | 1 | 0 | 0 | 0 | 0 |
| 1 | 0 | 1 | 1 | 0 | 0 | 0 | 0 | 1 | 0 | 0 | 0 | 0 | 1 | 0 | 0 | 0 | 0 | 0 | 0 | 1 | 0 | 0 | 0 | 0 | 0 | 0 |
| 1 | 1 | 0 | 0 | 0 | 0 | 0 | 0 | 0 | 0 | 1 | 0 | 1 | 0 | 0 | 0 | 0 | 1 | 0 | 0 | 0 | 0 | 0 | 0 | 0 | 1 | 0 |
| 0 | 1 | 0 | 0 | 1 | 0 | 0 | 0 | 0 | 0 | 0 | 0 | 0 | 1 | 0 | 1 | 0 | 0 | 0 | 1 | 0 | 0 | 1 | 0 | 0 | 0 | 0 |
| 1 | 0 | 0 | 0 | 0 | 0 | 1 | 1 | 0 | 0 | 0 | 0 | 0 | 0 | 0 | 0 | 0 | 1 | 0 | 0 | 0 | 0 | 0 | 0 | 0 | 1 | 0 |
| 1 | 1 | 0 | 0 | 0 | 0 | 0 | 0 | 0 | 0 | 0 | 0 | 1 | 1 | 0 | 0 | 0 | 0 | 0 | 0 | 1 | 0 | 0 | 0 | 0 | 0 | 1 |
| 1 | 0 | 1 | 0 | 0 | 1 | 0 | 0 | 0 | 0 | 0 | 0 | 0 | 0 | 0 | 1 | 0 | 0 | 1 | 0 | 0 | 0 | 0 | 0 | 0 | 0 | 0 |
| 0 | 1 | 0 | 1 | 0 | 0 | 0 | 0 | 0 | 0 | 1 | 0 | 0 | 0 | 0 | 0 | 0 | 0 | 0 | 0 | 0 | 0 | 1 | 0 | 0 | 0 | 0 |
| 0 | 1 | 1 | 0 | 0 | 0 | 1 | 0 | 0 | 0 | 0 | 0 | 1 | 0 | 0 | 0 | 0 | 0 | 0 | 0 | 0 | 1 | 0 | 0 | 0 | 0 | 0 |
| 1 | 0 | 0 | 1 | 0 | 0 | 0 | 0 | 0 | 0 | 1 | 0 | 0 | 0 | 0 | 0 | 1 | 0 | 0 | 0 | 0 | 0 | 1 | 0 | 0 | 0 | 0 |
| 1 | 0 | 0 | 0 | 0 | 0 | 0 | 1 | 0 | 0 | 0 | 0 | 0 | 1 | 0 | 0 | 0 | 0 | 0 | 0 | 0 | 0 | 0 | 0 | 0 | 0 | 1 |
| 0 | 1 | 0 | 0 | 1 | 0 | 0 | 0 | 0 | 0 | 0 | 0 | 0 | 0 | 0 | 0 | 0 | 0 | 1 | 0 | 0 | 0 | 0 | 0 | 0 | 1 | 0 |
| 1 | 1 | 0 | 0 | 0 | 0 | 0 | 0 | 0 | 0 | 0 | 1 | 0 | 0 | 0 | 0 | 0 | 0 | 0 | 0 | 0 | 0 | 1 | 0 | 0 | 0 | 0 |
| 1 | 0 | 0 | 0 | 0 | 0 | 0 | 0 | 0 | 0 | 0 | 0 | 1 | 1 | 0 | 0 | 0 | 0 | 0 | 0 | 0 | 0 | 0 | 1 | 0 | 0 | 0 |
| 0 | 1 | 0 | 0 | 0 | 1 | 0 | 0 | 0 | 0 | 0 | 0 | 0 | 0 | 0 | 1 | 0 | 0 | 0 | 0 | 0 | 0 | 1 | 0 | 0 | 0 | 0 |
| 1 | 0 | 0 | 0 | 0 | 0 | 0 | 0 | 1 | 0 | 0 | 0 | 0 | 0 | 0 | 0 | 0 | 0 | 0 | 1 | 0 | 0 | 0 | 0 | 0 | 1 | 0 |
| 0 | 1 | 1 | 1 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |
| 1 | 0 | 0 | 0 | 0 | 0 | 1 | 1 | 0 | 0 | 0 | 0 | 0 | 0 | 0 | 0 | 0 | 0 | 0 | 0 | 0 | 0 | 1 | 0 | 0 | 0 | 0 |
| 0 | 1 | 0 | 0 | 1 | 0 | 0 | 0 | 0 | 0 | 0 | 0 | 0 | 0 | 0 | 0 | 0 | 0 | 0 | 0 | 1 | 0 | 0 | 0 | 0 | 1 | 0 |
| 1 | 0 | 0 | 1 | 0 | 0 | 0 | 0 | 0 | 1 | 0 | 0 | 0 | 0 | 0 | 0 | 0 | 0 | 0 | 0 | 0 | 0 | 1 | 0 | 0 | 0 | 0 |
| 0 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 1 |
| 1 | 0 | 0 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 1 | 0 |
| 1 | 0 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 1 | 0 | 0 | 0 | 0 | 0 | 0 | 0 | 0 | 0 | 0 | 0 | 0 | 0 | 1 | 0 | 0 | 0 | 1 | 0 |
| 0 | 1 | 0 | 1 | 0 | 0 | 1 | 0 | 0 | 0 | 0 | 0 | 0 | 0 | 0 | 0 | 0 | 0 | 1 | 0 | 0 | 0 | 0 | 0 | 0 | 0 | 0 |
| 1 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 1 | 0 | 0 | 0 |
| 1 | 0 | 0 | 0 | 0 | 0 | 0 | 0 | 0 | 0 | 0 | 0 | 0 | 0 | 1 | 0 | 0 | 0 | 0 | 0 | 0 | 0 | 1 | 0 | 0 | 1 | 0 |
| 0 | 1 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 1 |
| 0 | 1 | 0 | 0 | 0 | 0 | 0 | 0 | 0 | 0 | 0 | 0 | 0 | 0 | 0 | 0 | 0 | 1 | 0 | 0 | 0 | 0 | 0 | 1 | 0 | 0 | 0 |
| 1 | 0 | 0 | 1 | 0 | 1 | 0 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 1 |
| 0 | 1 | 0 | 0 | 1 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 1 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 1 | 0 |
| 1 | 0 | 0 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 1 |

TO FIG. 5C

Figure 5C:
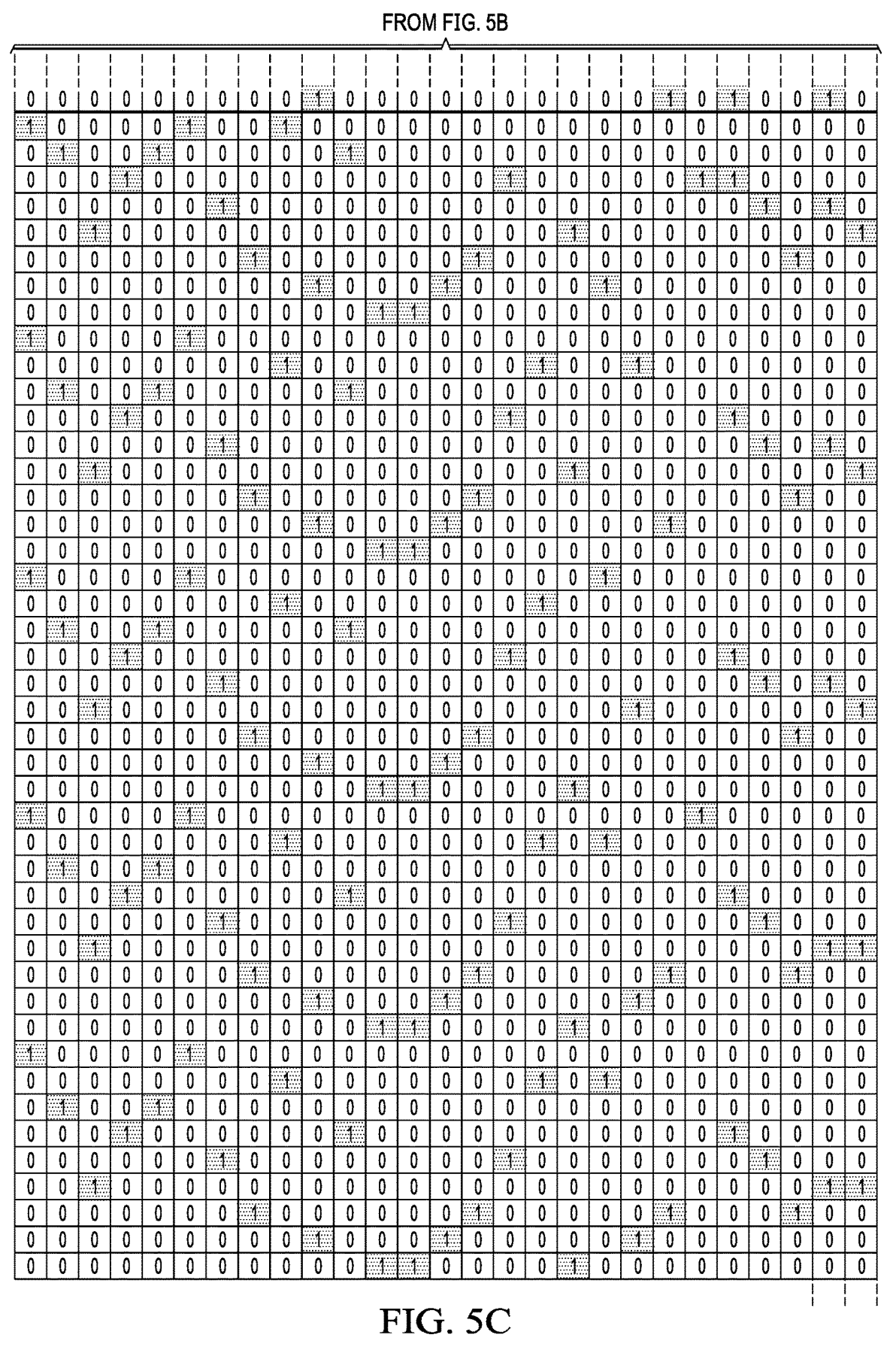

FROM FIG. 5B

| | | | | | | | | | | | | | | | | | | | | | | | | | | |
|---|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 1 | 0 | 0 | 0 | 0 | 0 | 0 | 0 | 0 | 0 | 0 | 1 | 0 | 1 | 0 | 0 | 1 | 0 |
| 1 | 0 | 0 | 0 | 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 1 | 0 | 0 | 0 | 0 | 0 | 1 | 1 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 1 | 0 | 1 | 0 |
| 0 | 0 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 1 |
| 0 | 0 | 0 | 0 | 0 | 0 | 0 | 1 | 0 | 0 | 0 | 0 | 0 | 0 | 1 | 0 | 0 | 0 | 0 | 0 | 0 | 0 | 0 | 0 | 1 | 0 | 0 |
| 0 | 0 | 0 | 0 | 0 | 0 | 0 | 0 | 0 | 1 | 0 | 0 | 0 | 1 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 1 | 0 | 0 | 1 | 0 | 0 | 0 | 0 | 0 | 0 | 0 |
| 0 | 1 | 0 | 0 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 1 | 0 | 0 | 0 | 0 | 0 | 0 | 1 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 1 | 0 | 1 | 0 |
| 0 | 0 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 1 |
| 0 | 0 | 0 | 0 | 0 | 0 | 0 | 1 | 0 | 0 | 0 | 0 | 0 | 0 | 1 | 0 | 0 | 0 | 0 | 0 | 0 | 0 | 0 | 0 | 1 | 0 | 0 |
| 0 | 0 | 0 | 0 | 0 | 0 | 0 | 0 | 0 | 1 | 0 | 0 | 0 | 1 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 1 | 0 | 0 | 0 | 0 | 0 | 0 | 0 | 0 | 0 | 0 |
| 0 | 1 | 0 | 0 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 1 | 0 | 0 | 0 | 0 | 0 | 0 | 1 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 1 | 0 | 1 | 0 |
| 0 | 0 | 1 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 1 |
| 0 | 0 | 0 | 0 | 0 | 0 | 0 | 1 | 0 | 0 | 0 | 0 | 0 | 0 | 1 | 0 | 0 | 0 | 0 | 0 | 0 | 0 | 0 | 0 | 1 | 0 | 0 |
| 0 | 0 | 0 | 0 | 0 | 0 | 0 | 0 | 0 | 1 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 1 | 1 | 0 | 0 | 0 | 0 | 1 | 0 | 0 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 1 | 0 | 0 | 0 | 0 | 0 | 0 | 0 | 1 | 0 | 1 | 0 | 0 | 0 | 0 | 0 | 0 | 0 | 0 |
| 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 1 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 1 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| 0 | 0 | 0 | 0 | 0 | 0 | 0 | 1 | 0 | 0 | 0 | 0 | 0 | 0 | 1 | 0 | 0 | 0 | 0 | 0 | 1 | 0 | 0 | 0 | 1 | 0 | 0 |
| 0 | 0 | 0 | 0 | 0 | 0 | 0 | 0 | 0 | 1 | 0 | 0 | 0 | 1 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 1 | 1 | 0 | 0 | 0 | 0 | 1 | 0 | 0 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 1 | 0 | 1 | 0 | 0 | 0 | 0 | 0 | 0 | 0 | 0 |
| 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 1 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 1 | 0 | 0 | 0 | 0 | 0 | 0 | 0 | 0 | 1 | 0 | 0 | 0 | 0 | 0 | 0 | 0 | 1 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| 0 | 0 | 0 | 0 | 0 | 0 | 0 | 1 | 0 | 0 | 0 | 0 | 0 | 0 | 1 | 0 | 0 | 0 | 0 | 0 | 1 | 0 | 0 | 0 | 1 | 0 | 0 |
| 0 | 0 | 0 | 0 | 0 | 0 | 0 | 0 | 0 | 1 | 0 | 0 | 0 | 1 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 1 | 1 | 0 | 0 | 0 | 0 | 1 | 0 | 0 | 0 | 0 | 0 | 0 | 0 | 0 | 0 |

| | | | | | | | | | | | | |
|---|---|---|---|---|---|---|---|---|---|---|---|---|
| 251 | -1 | 181 | 109 | 155 | 122 | 112 | 132 | 113 | 243 | 63 | 234 | 228 |
| 231 | 178 | -1 | -1 | 232 | 179 | -1 | -1 | 188 | 72 | -1 | -1 | 127 |
| 129 | 78 | -1 | -1 | -1 | -1 | -1 | -1 | -1 | -1 | -1 | -1 | -1 |
| 34 | 0 | 74 | 53 | -1 | -1 | 174 | 125 | -1 | -1 | 250 | 50 | -1 |
| 4 | -1 | 0 | 12 | 128 | 4 | 3 | 1 | 35 | 67 | 3 | 4 | 5 |
| 212 | 204 | -1 | -1 | -1 | -1 | -1 | -1 | -1 | 9 | -1 | -1 | -1 |
| 149 | -1 | -1 | -1 | 108 | 169 | -1 | -1 | 61 | -1 | -1 | -1 | 252 |
| 16 | 138 | 83 | -1 | -1 | -1 | -1 | 216 | -1 | 213 | -1 | -1 | -1 |
| 189 | 38 | -1 | 147 | -1 | -1 | -1 | -1 | 217 | -1 | -1 | -1 | 233 |
| -1 | 232 | 39 | -1 | -1 | 232 | -1 | 65 | -1 | -1 | -1 | -1 | -1 |
| 242 | 182 | -1 | -1 | -1 | -1 | 69 | -1 | -1 | -1 | -1 | -1 | 166 |
| 4 | -1 | 143 | 233 | -1 | -1 | -1 | -1 | 116 | -1 | -1 | -1 | -1 |
| 91 | 170 | -1 | -1 | -1 | -1 | -1 | -1 | -1 | -1 | 30 | -1 | 12 |
| -1 | 25 | -1 | -1 | 56 | -1 | -1 | -1 | -1 | -1 | -1 | -1 | -1 |
| 69 | -1 | -1 | -1 | -1 | -1 | 27 | 227 | -1 | -1 | -1 | -1 | -1 |
| 35 | 216 | -1 | -1 | -1 | -1 | -1 | -1 | -1 | -1 | -1 | -1 | 249 |
| 7 | -1 | 28 | -1 | -1 | 180 | -1 | -1 | -1 | -1 | -1 | -1 | -1 |
| -1 | 122 | -1 | 166 | -1 | -1 | -1 | -1 | -1 | -1 | 26 | -1 | -1 |
| -1 | 106 | 77 | -1 | -1 | -1 | 163 | -1 | -1 | -1 | -1 | -1 | 209 |
| 92 | -1 | -1 | 28 | -1 | -1 | -1 | -1 | -1 | -1 | 129 | -1 | -1 |
| 124 | -1 | -1 | -1 | -1 | -1 | -1 | 206 | -1 | -1 | -1 | -1 | -1 |
| -1 | 177 | -1 | -1 | 130 | -1 | -1 | -1 | -1 | -1 | -1 | -1 | -1 |
| 246 | 22 | -1 | -1 | -1 | -1 | -1 | -1 | -1 | -1 | -1 | 92 | -1 |
| 205 | -1 | -1 | -1 | -1 | -1 | -1 | -1 | -1 | -1 | -1 | -1 | 122 |
| -1 | 143 | -1 | -1 | -1 | 198 | -1 | -1 | -1 | -1 | -1 | -1 | -1 |
| 149 | -1 | -1 | -1 | -1 | -1 | -1 | -1 | 56 | -1 | -1 | -1 | -1 |
| -1 | 104 | 181 | 56 | -1 | -1 | -1 | -1 | -1 | -1 | -1 | -1 | -1 |
| 130 | -1 | -1 | -1 | -1 | -1 | 18 | 3 | -1 | -1 | -1 | -1 | -1 |
| -1 | 204 | -1 | -1 | 48 | -1 | -1 | -1 | -1 | -1 | -1 | -1 | -1 |
| 17 | -1 | -1 | 138 | -1 | -1 | -1 | -1 | -1 | 103 | -1 | -1 | -1 |
| -1 | 145 | -1 | -1 | -1 | -1 | -1 | -1 | -1 | -1 | 158 | -1 | -1 |
| 23 | -1 | -1 | -1 | -1 | 72 | -1 | -1 | -1 | -1 | -1 | -1 | -1 |
| 92 | -1 | 83 | -1 | -1 | -1 | -1 | -1 | -1 | -1 | -1 | 157 | -1 |
| 180 | -1 | -1 | -1 | 241 | -1 | -1 | 243 | -1 | -1 | -1 | -1 | -1 |
| -1 | 218 | -1 | 244 | -1 | -1 | 188 | -1 | -1 | -1 | -1 | -1 | -1 |
| 124 | -1 | -1 | -1 | -1 | -1 | -1 | 136 | -1 | -1 | -1 | -1 | -1 |
| 96 | -1 | -1 | -1 | -1 | -1 | -1 | -1 | -1 | -1 | -1 | -1 | -1 |
| -1 | 149 | 99 | -1 | -1 | -1 | -1 | -1 | 189 | -1 | -1 | -1 | -1 |
| 249 | -1 | -1 | -1 | -1 | -1 | -1 | -1 | -1 | 91 | -1 | -1 | -1 |
| -1 | 136 | -1 | -1 | -1 | -1 | -1 | -1 | -1 | -1 | -1 | -1 | -1 |
| 0 | -1 | -1 | 155 | -1 | 202 | -1 | -1 | -1 | -1 | -1 | -1 | -1 |
| 139 | -1 | -1 | -1 | -1 | -1 | 188 | -1 | -1 | -1 | -1 | -1 | -1 |
| -1 | 64 | -1 | -1 | 157 | -1 | -1 | -1 | -1 | -1 | -1 | 199 | -1 |
| 248 | -1 | 137 | -1 | -1 | -1 | -1 | -1 | -1 | -1 | -1 | -1 | -1 |
| 149 | -1 | -1 | -1 | -1 | 119 | -1 | -1 | -1 | -1 | -1 | -1 | -1 |

FROM FIG. 6B

| | | | | | | | | | | | | | |
|---|---|---|---|---|---|---|---|---|---|---|---|---|---|
| 171 | 185 | 184 | 122 | 45 | 236 | 110 | 233 | 217 | 0 | 0 | -1 | -1 | -1 |
| 125 | -1 | -1 | 232 | 214 | -1 | -1 | 16 | 51 | -1 | 0 | 0 | -1 | -1 |
| -1 | -1 | -1 | -1 | -1 | -1 | -1 | -1 | -1 | 1 | -1 | 0 | 0 | -1 |
| -1 | 89 | 218 | -1 | -1 | 190 | 212 | -1 | -1 | -1 | -1 | -1 | 0 | 0 |
| 9 | 5 | 148 | 34 | 3 | 133 | 5 | 4 | 8 | 0 | -1 | -1 | -1 | 0 |
| 184 | -1 | -1 | 44 | -1 | -1 | -1 | -1 | -1 | -1 | -1 | -1 | -1 | -1 |
| -1 | -1 | -1 | -1 | 134 | -1 | -1 | -1 | -1 | 46 | -1 | -1 | -1 | -1 |
| 243 | -1 | -1 | -1 | -1 | 205 | -1 | -1 | -1 | -1 | -1 | -1 | -1 | -1 |
| -1 | -1 | 79 | -1 | 225 | -1 | -1 | -1 | -1 | -1 | -1 | -1 | -1 | -1 |
| 134 | -1 | -1 | -1 | -1 | -1 | 223 | -1 | -1 | -1 | -1 | -1 | -1 | -1 |
| -1 | -1 | 155 | -1 | -1 | -1 | -1 | -1 | -1 | 148 | -1 | -1 | -1 | -1 |
| 35 | -1 | -1 | -1 | -1 | -1 | -1 | 215 | -1 | -1 | -1 | -1 | -1 | -1 |
| -1 | -1 | -1 | -1 | 64 | -1 | -1 | -1 | -1 | -1 | -1 | -1 | 182 | -1 |
| 255 | -1 | 32 | -1 | -1 | -1 | 55 | -1 | -1 | 139 | -1 | -1 | -1 | -1 |
| -1 | -1 | -1 | -1 | 239 | -1 | -1 | -1 | -1 | -1 | -1 | -1 | 103 | -1 |
| 219 | -1 | -1 | -1 | -1 | -1 | -1 | 173 | -1 | -1 | -1 | -1 | -1 | 211 |
| -1 | -1 | 61 | -1 | -1 | 127 | -1 | -1 | -1 | -1 | -1 | -1 | -1 | -1 |
| -1 | -1 | -1 | -1 | -1 | -1 | -1 | -1 | -1 | 190 | -1 | -1 | -1 | -1 |
| -1 | -1 | -1 | -1 | -1 | -1 | -1 | -1 | 170 | -1 | -1 | -1 | -1 | -1 |
| -1 | -1 | -1 | 230 | -1 | -1 | -1 | -1 | -1 | 235 | -1 | -1 | -1 | -1 |
| 138 | -1 | -1 | -1 | -1 | -1 | -1 | -1 | -1 | -1 | -1 | -1 | -1 | 227 |
| -1 | -1 | -1 | -1 | -1 | 208 | -1 | -1 | -1 | -1 | -1 | -1 | 24 | -1 |
| -1 | -1 | -1 | -1 | -1 | -1 | -1 | -1 | -1 | 55 | -1 | -1 | -1 | -1 |
| 231 | -1 | -1 | -1 | -1 | -1 | -1 | -1 | -1 | -1 | 23 | -1 | -1 | -1 |
| -1 | -1 | 90 | -1 | -1 | -1 | -1 | -1 | -1 | 87 | -1 | -1 | -1 | -1 |
| -1 | -1 | -1 | -1 | -1 | -1 | 193 | -1 | -1 | -1 | -1 | -1 | 217 | -1 |
| -1 | 131 | -1 | -1 | -1 | -1 | -1 | -1 | -1 | -1 | -1 | -1 | -1 | -1 |
| -1 | -1 | -1 | -1 | -1 | -1 | -1 | -1 | -1 | 53 | -1 | -1 | -1 | -1 |
| -1 | -1 | -1 | -1 | -1 | -1 | -1 | 79 | -1 | -1 | -1 | -1 | 89 | -1 |
| -1 | -1 | -1 | -1 | -1 | -1 | -1 | -1 | -1 | 103 | -1 | -1 | -1 | -1 |
| -1 | -1 | -1 | -1 | -1 | -1 | -1 | -1 | -1 | -1 | -1 | -1 | -1 | 254 |
| -1 | -1 | -1 | 12 | -1 | -1 | -1 | -1 | -1 | -1 | -1 | -1 | 207 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 109 | -1 | -1 | -1 | 205 | -1 |
| -1 | -1 | -1 | -1 | -1 | 111 | -1 | -1 | -1 | -1 | -1 | -1 | -1 | -1 |
| -1 | -1 | -1 | -1 | -1 | -1 | -1 | -1 | -1 | -1 | 112 | -1 | -1 | -1 |
| -1 | 116 | -1 | -1 | -1 | -1 | -1 | -1 | -1 | 218 | -1 | -1 | 229 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 147 |
| -1 | -1 | -1 | -1 | 69 | -1 | -1 | -1 | -1 | -1 | 179 | -1 | -1 | -1 |
| -1 | -1 | -1 | -1 | -1 | -1 | 125 | -1 | -1 | -1 | -1 | -1 | -1 | -1 |
| -1 | -1 | -1 | -1 | -1 | -1 | -1 | -1 | -1 | -1 | -1 | -1 | -1 | 148 |
| -1 | -1 | -1 | -1 | -1 | -1 | -1 | -1 | -1 | -1 | -1 | -1 | -1 | -1 |
| -1 | 203 | -1 | -1 | -1 | -1 | -1 | -1 | -1 | -1 | -1 | -1 | 85 | -1 |
| -1 | -1 | -1 | 32 | -1 | -1 | -1 | -1 | -1 | -1 | -1 | -1 | -1 | 224 |

FROM FIG. 6B

| | | | | | | | | | | | | |
|---|---|---|---|---|---|---|---|---|---|---|---|---|
| -1 | -1 | -1 | -1 | -1 | -1 | -1 | -1 | -1 | 192 | -1 | -1 | -1 |
| 123 | -1 | -1 | -1 | -1 | 163 | -1 | -1 | 213 | -1 | -1 | -1 | -1 |
| -1 | 93 | -1 | -1 | 24 | -1 | -1 | -1 | -1 | -1 | 64 | -1 | -1 |
| -1 | -1 | -1 | 247 | -1 | -1 | -1 | -1 | -1 | -1 | -1 | -1 | -1 |
| -1 | -1 | -1 | -1 | -1 | -1 | 21 | -1 | -1 | -1 | -1 | -1 | -1 |
| -1 | -1 | 212 | -1 | -1 | -1 | -1 | -1 | -1 | -1 | -1 | -1 | -1 |
| -1 | -1 | -1 | -1 | -1 | -1 | -1 | 211 | -1 | -1 | -1 | -1 | -1 |
| -1 | -1 | -1 | -1 | -1 | -1 | -1 | -1 | -1 | 69 | -1 | -1 | -1 |
| -1 | -1 | -1 | -1 | -1 | -1 | -1 | -1 | -1 | -1 | -1 | 216 | 213 |
| 204 | -1 | -1 | -1 | -1 | 151 | -1 | -1 | -1 | -1 | -1 | -1 | -1 |
| -1 | -1 | -1 | -1 | -1 | -1 | -1 | -1 | 133 | -1 | -1 | -1 | -1 |
| -1 | 32 | -1 | -1 | 72 | -1 | -1 | -1 | -1 | -1 | 190 | -1 | -1 |
| -1 | -1 | -1 | 226 | -1 | -1 | -1 | -1 | -1 | -1 | -1 | -1 | -1 |
| -1 | -1 | -1 | -1 | -1 | -1 | 183 | -1 | -1 | -1 | -1 | -1 | -1 |
| -1 | -1 | 151 | -1 | -1 | -1 | -1 | -1 | -1 | -1 | -1 | -1 | -1 |
| -1 | -1 | -1 | -1 | -1 | -1 | -1 | 221 | -1 | -1 | -1 | -1 | -1 |
| -1 | -1 | -1 | -1 | -1 | -1 | -1 | -1 | -1 | 34 | -1 | -1 | -1 |
| -1 | -1 | -1 | -1 | -1 | -1 | -1 | -1 | -1 | -1 | -1 | 139 | 162 |
| 13 | -1 | -1 | -1 | -1 | 171 | -1 | -1 | -1 | -1 | -1 | -1 | -1 |
| -1 | -1 | -1 | -1 | -1 | -1 | -1 | -1 | 150 | -1 | -1 | -1 | -1 |
| -1 | 139 | -1 | -1 | 237 | -1 | -1 | -1 | -1 | -1 | 28 | -1 | -1 |
| -1 | -1 | -1 | 118 | -1 | -1 | -1 | -1 | -1 | -1 | -1 | -1 | -1 |
| -1 | -1 | -1 | -1 | -1 | -1 | 153 | -1 | -1 | -1 | -1 | -1 | -1 |
| -1 | -1 | 154 | -1 | -1 | -1 | -1 | -1 | -1 | -1 | -1 | -1 | -1 |
| -1 | -1 | -1 | -1 | -1 | -1 | -1 | 37 | -1 | -1 | -1 | -1 | -1 |
| -1 | -1 | -1 | -1 | -1 | -1 | -1 | -1 | -1 | 255 | -1 | -1 | -1 |
| -1 | -1 | -1 | -1 | -1 | -1 | -1 | -1 | -1 | -1 | -1 | 23 | 213 |
| 188 | -1 | -1 | -1 | -1 | 2 | -1 | -1 | -1 | -1 | -1 | -1 | -1 |
| -1 | -1 | -1 | -1 | -1 | -1 | -1 | -1 | 88 | -1 | -1 | -1 | -1 |
| -1 | 163 | -1 | -1 | 122 | -1 | -1 | -1 | -1 | -1 | -1 | -1 | -1 |
| -1 | -1 | -1 | 244 | -1 | -1 | -1 | -1 | -1 | -1 | 247 | -1 | -1 |
| -1 | -1 | -1 | -1 | -1 | -1 | 163 | -1 | -1 | -1 | -1 | -1 | -1 |
| -1 | -1 | 99 | -1 | -1 | -1 | -1 | -1 | -1 | -1 | -1 | -1 | -1 |
| -1 | -1 | -1 | -1 | -1 | -1 | -1 | 89 | -1 | -1 | -1 | -1 | -1 |
| -1 | -1 | -1 | -1 | -1 | -1 | -1 | -1 | -1 | 157 | -1 | -1 | -1 |
| -1 | -1 | -1 | -1 | -1 | -1 | -1 | -1 | -1 | -1 | -1 | 65 | 105 |
| 180 | -1 | -1 | -1 | -1 | 107 | -1 | -1 | -1 | -1 | -1 | -1 | -1 |
| -1 | -1 | -1 | -1 | -1 | -1 | -1 | -1 | 20 | -1 | -1 | -1 | -1 |
| -1 | 37 | -1 | -1 | 202 | -1 | -1 | -1 | -1 | -1 | -1 | -1 | -1 |
| -1 | -1 | -1 | 184 | -1 | -1 | -1 | -1 | -1 | -1 | 238 | -1 | -1 |
| -1 | -1 | -1 | -1 | -1 | -1 | 83 | -1 | -1 | -1 | -1 | -1 | -1 |
| -1 | -1 | 162 | -1 | -1 | -1 | -1 | -1 | -1 | -1 | -1 | -1 | -1 |
| -1 | -1 | -1 | -1 | -1 | -1 | -1 | 121 | -1 | -1 | -1 | -1 | -1 |
| -1 | -1 | -1 | -1 | -1 | -1 | -1 | -1 | -1 | 51 | -1 | -1 | -1 |
| -1 | -1 | -1 | -1 | -1 | -1 | -1 | -1 | -1 | -1 | -1 | 4 | 32 |

FROM FIG. 6C

FROM FIG. 6D

| | | | | | | | | | | | | | |
|---|---|---|---|---|---|---|---|---|---|---|---|---|---|
| -1 | -1 | -1 | -1 | -1 | -1 | -1 | 4 | -1 | 252 | -1 | -1 | 65 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 25 | -1 | -1 | -1 | -1 | -1 | 209 | 83 | -1 | -1 | -1 | -1 |
| -1 | -1 | -1 | -1 | -1 | -1 | -1 | -1 | -1 | -1 | 248 | -1 | 212 | -1 |
| -1 | -1 | -1 | -1 | 106 | -1 | -1 | -1 | -1 | -1 | -1 | -1 | -1 | 200 |
| -1 | 14 | -1 | -1 | -1 | -1 | -1 | -1 | -1 | -1 | -1 | 153 | -1 | -1 |
| 63 | -1 | -1 | -1 | -1 | 36 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 250 | -1 | -1 | 36 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 23 | -1 | -1 | -1 | -1 | -1 | -1 | 125 | -1 | -1 | -1 | -1 |
| -1 | -1 | -1 | -1 | -1 | -1 | -1 | -1 | -1 | -1 | 84 | -1 | 146 | -1 |
| -1 | -1 | -1 | -1 | 220 | -1 | -1 | -1 | -1 | -1 | -1 | -1 | -1 | 102 |
| -1 | 228 | -1 | -1 | -1 | -1 | -1 | -1 | -1 | -1 | -1 | 40 | -1 | -1 |
| 126 | -1 | -1 | -1 | -1 | -1 | -1 | 207 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 175 | -1 | -1 | -1 | -1 | -1 | -1 | -1 | -1 |
| -1 | -1 | -1 | 137 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 228 | -1 | -1 | -1 | -1 | -1 | -1 | 27 | -1 | -1 | -1 | -1 |
| -1 | -1 | -1 | -1 | -1 | -1 | -1 | -1 | -1 | -1 | 216 | -1 | 119 | -1 |
| -1 | -1 | -1 | -1 | -1 | -1 | 238 | -1 | -1 | -1 | -1 | -1 | -1 | 23 |
| -1 | 235 | -1 | -1 | -1 | -1 | -1 | -1 | -1 | -1 | -1 | 53 | -1 | -1 |
| 32 | -1 | -1 | -1 | -1 | -1 | -1 | -1 | -1 | -1 | -1 | -1 | -1 | -1 |
| -1 | -1 | -1 | -1 | 0 | -1 | -1 | -1 | -1 | -1 | -1 | -1 | -1 | -1 |
| -1 | -1 | -1 | -1 | -1 | -1 | -1 | -1 | 7 | -1 | -1 | -1 | -1 | -1 |
| -1 | -1 | -1 | 200 | -1 | 255 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 213 | -1 | -1 | -1 | -1 |
| -1 | -1 | 149 | -1 | -1 | -1 | -1 | -1 | -1 | -1 | 167 | -1 | -1 | -1 |
| -1 | -1 | -1 | -1 | -1 | -1 | -1 | -1 | -1 | -1 | -1 | -1 | 147 | 126 |
| -1 | 178 | -1 | -1 | -1 | -1 | -1 | 181 | -1 | -1 | -1 | 115 | -1 | -1 |
| 255 | -1 | -1 | -1 | -1 | -1 | 201 | -1 | -1 | -1 | -1 | -1 | -1 | -1 |
| -1 | -1 | -1 | -1 | 158 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 159 | -1 | 156 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 62 | -1 | -1 | -1 | -1 |
| -1 | -1 | 104 | -1 | -1 | -1 | -1 | -1 | -1 | -1 | 12 | -1 | -1 | -1 |
| -1 | -1 | -1 | -1 | -1 | -1 | -1 | -1 | -1 | -1 | -1 | -1 | 117 | 123 |
| -1 | 243 | -1 | -1 | -1 | -1 | -1 | 55 | -1 | -1 | -1 | 106 | -1 | -1 |
| 12 | -1 | -1 | -1 | -1 | -1 | 50 | -1 | -1 | -1 | -1 | -1 | -1 | -1 |
| -1 | -1 | -1 | -1 | 224 | -1 | -1 | -1 | -1 | -1 | -1 | -1 | -1 | -1 |

| | | | | | | | | | | | | |
|---|---|---|---|---|---|---|---|---|---|---|---|---|
| 93 | -1 | 202 | 27 | 194 | 262 | 283 | 263 | 135 | 249 | 283 | 142 | 30 |
| 127 | 228 | -1 | -1 | 278 | 30 | -1 | -1 | 247 | 208 | -1 | -1 | 281 |
| 86 | 62 | -1 | -1 | -1 | -1 | -1 | -1 | -1 | -1 | -1 | -1 | -1 |
| 209 | 1 | 136 | 256 | -1 | -1 | 74 | 94 | -1 | -1 | 142 | 281 | -1 |
| 6 | -1 | 6 | 5 | 2 | 9 | 72 | 6 | 89 | 153 | 76 | 95 | 4 |
| 148 | 185 | -1 | -1 | -1 | -1 | -1 | -1 | -1 | 78 | -1 | -1 | -1 |
| 229 | -1 | -1 | -1 | 259 | 9 | -1 | -1 | 122 | -1 | -1 | -1 | 36 |
| 66 | 116 | 142 | -1 | -1 | -1 | -1 | 96 | -1 | 59 | -1 | -1 | -1 |
| 248 | 162 | -1 | 203 | -1 | -1 | -1 | -1 | 111 | -1 | -1 | -1 | 18 |
| -1 | 198 | 25 | -1 | -1 | 96 | -1 | 107 | -1 | -1 | -1 | -1 | -1 |
| 267 | 195 | -1 | -1 | -1 | -1 | 217 | -1 | -1 | -1 | -1 | -1 | 12 |
| 150 | -1 | 102 | 4 | -1 | -1 | -1 | -1 | 60 | -1 | -1 | -1 | -1 |
| 81 | 15 | -1 | -1 | -1 | -1 | -1 | -1 | -1 | -1 | 123 | -1 | 164 |
| -1 | 84 | -1 | -1 | 63 | -1 | -1 | -1 | -1 | -1 | -1 | -1 | -1 |
| 248 | -1 | -1 | -1 | -1 | -1 | 128 | 19 | -1 | -1 | -1 | -1 | -1 |
| 120 | 181 | -1 | -1 | -1 | -1 | -1 | -1 | -1 | -1 | -1 | -1 | 13 |
| 117 | -1 | 255 | -1 | -1 | 8 | -1 | -1 | -1 | -1 | -1 | -1 | -1 |
| -1 | 0 | -1 | 160 | -1 | -1 | -1 | -1 | -1 | -1 | 62 | -1 | -1 |
| -1 | 181 | 101 | -1 | -1 | -1 | 61 | -1 | -1 | -1 | -1 | -1 | 284 |
| 96 | -1 | -1 | 226 | -1 | -1 | -1 | -1 | -1 | -1 | 206 | -1 | -1 |
| 70 | -1 | -1 | -1 | -1 | -1 | -1 | 233 | -1 | -1 | -1 | -1 | -1 |
| -1 | 127 | -1 | -1 | 4 | -1 | -1 | -1 | -1 | -1 | -1 | -1 | -1 |
| 63 | 116 | -1 | -1 | -1 | -1 | -1 | -1 | -1 | -1 | -1 | 209 | -1 |
| 10 | -1 | -1 | -1 | -1 | -1 | -1 | -1 | -1 | -1 | -1 | -1 | 220 |
| -1 | 220 | -1 | -1 | -1 | 97 | -1 | -1 | -1 | -1 | -1 | -1 | -1 |
| 209 | -1 | -1 | -1 | -1 | -1 | -1 | -1 | 226 | -1 | -1 | -1 | -1 |
| -1 | 71 | 73 | 16 | -1 | -1 | -1 | -1 | -1 | -1 | -1 | -1 | -1 |
| 13 | -1 | -1 | -1 | -1 | -1 | 282 | 125 | -1 | -1 | -1 | -1 | -1 |
| -1 | 246 | -1 | -1 | 50 | -1 | -1 | -1 | -1 | -1 | -1 | -1 | -1 |
| 44 | -1 | -1 | 54 | -1 | -1 | -1 | -1 | -1 | 234 | -1 | -1 | -1 |
| -1 | 10 | -1 | -1 | -1 | -1 | -1 | -1 | -1 | -1 | 157 | -1 | -1 |
| 248 | -1 | -1 | -1 | -1 | 231 | -1 | -1 | -1 | -1 | -1 | -1 | -1 |
| 265 | -1 | 198 | -1 | -1 | -1 | -1 | -1 | -1 | -1 | -1 | 266 | -1 |
| 215 | -1 | -1 | -1 | 203 | -1 | -1 | 23 | -1 | -1 | -1 | -1 | -1 |
| -1 | 75 | -1 | 149 | -1 | -1 | 239 | -1 | -1 | -1 | -1 | -1 | -1 |
| 119 | -1 | -1 | -1 | -1 | -1 | -1 | 187 | -1 | -1 | -1 | -1 | -1 |
| 93 | -1 | -1 | -1 | -1 | -1 | -1 | -1 | -1 | -1 | -1 | -1 | -1 |
| -1 | 228 | 125 | -1 | -1 | -1 | -1 | -1 | 68 | -1 | -1 | -1 | -1 |
| 35 | -1 | -1 | -1 | -1 | -1 | -1 | -1 | -1 | 57 | -1 | -1 | -1 |
| -1 | 7 | -1 | -1 | -1 | -1 | -1 | -1 | -1 | -1 | -1 | -1 | -1 |
| 8 | -1 | -1 | 257 | -1 | 84 | -1 | -1 | -1 | -1 | -1 | -1 | -1 |
| 103 | -1 | -1 | -1 | -1 | -1 | 177 | -1 | -1 | -1 | -1 | -1 | -1 |
| -1 | 153 | -1 | -1 | 107 | -1 | -1 | -1 | -1 | -1 | -1 | 44 | -1 |
| 95 | -1 | 138 | -1 | -1 | -1 | -1 | -1 | -1 | -1 | -1 | -1 | -1 |

FROM FIG. 7B

| | | | | | | | | | | | | | |
|---|---|---|---|---|---|---|---|---|---|---|---|---|---|
| 272 | 210 | 242 | 284 | 285 | 286 | 246 | 286 | 273 | 0 | 0 | -1 | -1 | -1 |
| 89 | -1 | -1 | 56 | 279 | -1 | -1 | 12 | 32 | -1 | 0 | 0 | -1 | -1 |
| -1 | -1 | -1 | -1 | -1 | -1 | -1 | -1 | -1 | 1 | -1 | 0 | 0 | -1 |
| -1 | 263 | 208 | -1 | -1 | 212 | 211 | -1 | -1 | -1 | -1 | -1 | 0 | 0 |
| 0 | 36 | 18 | 18 | 18 | 171 | 7 | 13 | 28 | 0 | -1 | -1 | -1 | 0 |
| 216 | -1 | -1 | 206 | -1 | -1 | -1 | -1 | -1 | -1 | -1 | -1 | -1 | -1 |
| -1 | -1 | -1 | -1 | 103 | -1 | -1 | -1 | -1 | 156 | -1 | -1 | -1 | -1 |
| 241 | -1 | -1 | -1 | -1 | 278 | -1 | -1 | -1 | -1 | -1 | -1 | -1 | -1 |
| -1 | -1 | 66 | -1 | 258 | -1 | -1 | -1 | -1 | -1 | -1 | -1 | -1 | -1 |
| 57 | -1 | -1 | -1 | -1 | -1 | 115 | -1 | -1 | -1 | -1 | -1 | -1 | -1 |
| -1 | -1 | 84 | -1 | -1 | -1 | -1 | -1 | -1 | 277 | -1 | -1 | -1 | -1 |
| 135 | -1 | -1 | -1 | -1 | -1 | -1 | 108 | -1 | -1 | -1 | -1 | -1 | -1 |
| -1 | -1 | -1 | -1 | 58 | -1 | -1 | -1 | -1 | -1 | -1 | -1 | 195 | -1 |
| 172 | -1 | 103 | -1 | -1 | -1 | 39 | -1 | -1 | 285 | -1 | -1 | -1 | -1 |
| -1 | -1 | -1 | -1 | 156 | -1 | -1 | -1 | -1 | -1 | -1 | -1 | 172 | -1 |
| 254 | -1 | -1 | -1 | -1 | -1 | -1 | 126 | -1 | -1 | -1 | -1 | -1 | 232 |
| -1 | -1 | 265 | -1 | -1 | 64 | -1 | -1 | -1 | -1 | -1 | -1 | -1 | -1 |
| -1 | -1 | -1 | -1 | -1 | -1 | -1 | -1 | -1 | 215 | -1 | -1 | -1 | -1 |
| -1 | -1 | -1 | -1 | -1 | -1 | -1 | -1 | 31 | -1 | -1 | -1 | -1 | -1 |
| -1 | -1 | -1 | 209 | -1 | -1 | -1 | -1 | -1 | 138 | -1 | -1 | -1 | -1 |
| 31 | -1 | -1 | -1 | -1 | -1 | -1 | -1 | -1 | -1 | -1 | -1 | -1 | 201 |
| -1 | -1 | -1 | -1 | -1 | 215 | -1 | -1 | -1 | -1 | -1 | -1 | 143 | -1 |
| -1 | -1 | -1 | -1 | -1 | -1 | -1 | -1 | -1 | 251 | -1 | -1 | -1 | -1 |
| 123 | -1 | -1 | -1 | -1 | -1 | -1 | -1 | -1 | -1 | 116 | -1 | -1 | -1 |
| -1 | -1 | 209 | -1 | -1 | -1 | -1 | -1 | -1 | 269 | -1 | -1 | -1 | -1 |
| -1 | -1 | -1 | -1 | -1 | -1 | 64 | -1 | -1 | -1 | -1 | -1 | 112 | -1 |
| -1 | 276 | -1 | -1 | -1 | -1 | -1 | -1 | -1 | -1 | -1 | -1 | -1 | -1 |
| -1 | -1 | -1 | -1 | -1 | -1 | -1 | -1 | -1 | 166 | -1 | -1 | -1 | -1 |
| -1 | -1 | -1 | -1 | -1 | -1 | -1 | 28 | -1 | -1 | -1 | -1 | 41 | -1 |
| -1 | -1 | -1 | -1 | -1 | -1 | -1 | -1 | -1 | 276 | -1 | -1 | -1 | -1 |
| -1 | -1 | -1 | -1 | -1 | -1 | -1 | -1 | -1 | -1 | -1 | -1 | -1 | 10 |
| -1 | -1 | -1 | 75 | -1 | -1 | -1 | -1 | -1 | -1 | -1 | -1 | 158 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 187 | -1 | -1 | -1 | 259 | -1 |
| -1 | -1 | -1 | -1 | -1 | 218 | -1 | -1 | -1 | -1 | -1 | -1 | -1 | -1 |
| -1 | -1 | -1 | -1 | -1 | -1 | -1 | -1 | -1 | -1 | 241 | -1 | -1 | -1 |
| -1 | 189 | -1 | -1 | -1 | -1 | -1 | -1 | -1 | 32 | -1 | -1 | 258 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 154 |
| -1 | -1 | -1 | -1 | 183 | -1 | -1 | -1 | -1 | -1 | 162 | -1 | -1 | -1 |
| -1 | -1 | -1 | -1 | -1 | -1 | 15 | -1 | -1 | -1 | -1 | -1 | -1 | -1 |
| -1 | -1 | -1 | -1 | -1 | -1 | -1 | -1 | -1 | -1 | -1 | -1 | -1 | 185 |
| -1 | -1 | -1 | -1 | -1 | -1 | -1 | -1 | -1 | -1 | -1 | -1 | -1 | -1 |
| -1 | 46 | -1 | -1 | -1 | -1 | -1 | -1 | -1 | -1 | -1 | -1 | 276 | -1 |

TO FIG. 7E

FROM FIG. 7B

| | | | | | | | | | | | | |
|---|---|---|---|---|---|---|---|---|---|---|---|---|
| 221 | -1 | -1 | -1 | -1 | 47 | -1 | -1 | -1 | -1 | -1 | -1 | -1 |
| -1 | -1 | -1 | -1 | -1 | -1 | -1 | -1 | -1 | 163 | -1 | -1 | -1 |
| 98 | -1 | -1 | -1 | -1 | 229 | -1 | -1 | 150 | -1 | -1 | -1 | -1 |
| -1 | 58 | -1 | -1 | 146 | -1 | -1 | -1 | -1 | -1 | 189 | -1 | -1 |
| -1 | -1 | -1 | 107 | -1 | -1 | -1 | -1 | -1 | -1 | -1 | -1 | -1 |
| -1 | -1 | -1 | -1 | -1 | -1 | 187 | -1 | -1 | -1 | -1 | -1 | -1 |
| -1 | -1 | 32 | -1 | -1 | -1 | -1 | -1 | -1 | -1 | -1 | -1 | -1 |
| -1 | -1 | -1 | -1 | -1 | -1 | -1 | 8 | -1 | -1 | -1 | -1 | -1 |
| -1 | -1 | -1 | -1 | -1 | -1 | -1 | -1 | -1 | 49 | -1 | -1 | -1 |
| -1 | -1 | -1 | -1 | -1 | -1 | -1 | -1 | -1 | -1 | -1 | 167 | 279 |
| 192 | -1 | -1 | -1 | -1 | 264 | -1 | -1 | -1 | -1 | -1 | -1 | -1 |
| -1 | -1 | -1 | -1 | -1 | -1 | -1 | -1 | 183 | -1 | -1 | -1 | -1 |
| -1 | 115 | -1 | -1 | 210 | -1 | -1 | -1 | -1 | -1 | 247 | -1 | -1 |
| -1 | -1 | -1 | 208 | -1 | -1 | -1 | -1 | -1 | -1 | -1 | -1 | -1 |
| -1 | -1 | -1 | -1 | -1 | -1 | 181 | -1 | -1 | -1 | -1 | -1 | -1 |
| -1 | -1 | 202 | -1 | -1 | -1 | -1 | -1 | -1 | -1 | -1 | -1 | -1 |
| -1 | -1 | -1 | -1 | -1 | -1 | -1 | 81 | -1 | -1 | -1 | -1 | -1 |
| -1 | -1 | -1 | -1 | -1 | -1 | -1 | -1 | -1 | 265 | -1 | -1 | -1 |
| -1 | -1 | -1 | -1 | -1 | -1 | -1 | -1 | -1 | -1 | -1 | 188 | 81 |
| 22 | -1 | -1 | -1 | -1 | 179 | -1 | -1 | -1 | -1 | -1 | -1 | -1 |
| -1 | -1 | -1 | -1 | -1 | -1 | -1 | -1 | 13 | -1 | -1 | -1 | -1 |
| -1 | 58 | -1 | -1 | 75 | -1 | -1 | -1 | -1 | -1 | 178 | -1 | -1 |
| -1 | -1 | -1 | 171 | -1 | -1 | -1 | -1 | -1 | -1 | -1 | -1 | -1 |
| -1 | -1 | -1 | -1 | -1 | -1 | 2 | -1 | -1 | -1 | -1 | -1 | -1 |
| -1 | -1 | 170 | -1 | -1 | -1 | -1 | -1 | -1 | -1 | -1 | -1 | -1 |
| -1 | -1 | -1 | -1 | -1 | -1 | -1 | 115 | -1 | -1 | -1 | -1 | -1 |
| -1 | -1 | -1 | -1 | -1 | -1 | -1 | -1 | -1 | 199 | -1 | -1 | -1 |
| -1 | -1 | -1 | -1 | -1 | -1 | -1 | -1 | -1 | -1 | -1 | 54 | 36 |
| 141 | -1 | -1 | -1 | -1 | 102 | -1 | -1 | -1 | -1 | -1 | -1 | -1 |
| -1 | -1 | -1 | -1 | -1 | -1 | -1 | -1 | 124 | -1 | -1 | -1 | -1 |
| -1 | 108 | -1 | -1 | 65 | -1 | -1 | -1 | -1 | -1 | -1 | -1 | -1 |
| -1 | -1 | -1 | 143 | -1 | -1 | -1 | -1 | -1 | -1 | 194 | -1 | -1 |
| -1 | -1 | -1 | -1 | -1 | -1 | 229 | -1 | -1 | -1 | -1 | -1 | -1 |
| -1 | -1 | 59 | -1 | -1 | -1 | -1 | -1 | -1 | -1 | -1 | -1 | -1 |
| -1 | -1 | -1 | -1 | -1 | -1 | -1 | 224 | -1 | -1 | -1 | -1 | -1 |
| -1 | -1 | -1 | -1 | -1 | -1 | -1 | -1 | -1 | 54 | -1 | -1 | -1 |
| -1 | -1 | -1 | -1 | -1 | -1 | -1 | -1 | -1 | -1 | -1 | 38 | 161 |
| 200 | -1 | -1 | -1 | -1 | 174 | -1 | -1 | -1 | -1 | -1 | -1 | -1 |
| -1 | -1 | -1 | -1 | -1 | -1 | -1 | -1 | 169 | -1 | -1 | -1 | -1 |
| -1 | 193 | -1 | -1 | 184 | -1 | -1 | -1 | -1 | -1 | -1 | -1 | -1 |
| -1 | -1 | -1 | 93 | -1 | -1 | -1 | -1 | -1 | -1 | 58 | -1 | -1 |
| -1 | -1 | -1 | -1 | -1 | -1 | 164 | -1 | -1 | -1 | -1 | -1 | -1 |
| -1 | -1 | 64 | -1 | -1 | -1 | -1 | -1 | -1 | -1 | -1 | -1 | -1 |
| -1 | -1 | -1 | -1 | -1 | -1 | -1 | 12 | -1 | -1 | -1 | -1 | -1 |
| -1 | -1 | -1 | -1 | -1 | -1 | -1 | -1 | -1 | 117 | -1 | -1 | -1 |
| -1 | -1 | -1 | -1 | -1 | -1 | -1 | -1 | -1 | -1 | -1 | 183 | 51 |

FROM FIG. 7C

FROM FIG. 7D

| | | | | | | | | | | | | | |
|---|---|---|---|---|---|---|---|---|---|---|---|---|---|
| -1 | -1 | -1 | 274 | -1 | -1 | -1 | -1 | -1 | -1 | -1 | -1 | -1 | 104 |
| -1 | -1 | -1 | -1 | -1 | -1 | -1 | 256 | -1 | 152 | -1 | -1 | 166 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 231 | -1 | -1 | -1 | -1 | -1 | 216 | 263 | -1 | -1 | -1 | -1 |
| -1 | -1 | -1 | -1 | -1 | -1 | -1 | -1 | -1 | -1 | 283 | -1 | 17 | -1 |
| -1 | -1 | -1 | -1 | 214 | -1 | -1 | -1 | -1 | -1 | -1 | -1 | -1 | 218 |
| -1 | 152 | -1 | -1 | -1 | -1 | -1 | -1 | -1 | -1 | -1 | 11 | -1 | -1 |
| 84 | -1 | -1 | -1 | -1 | 267 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 127 | -1 | -1 | 106 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 119 | -1 | -1 | -1 | -1 | -1 | -1 | 98 | -1 | -1 | -1 | -1 |
| -1 | -1 | -1 | -1 | -1 | -1 | -1 | -1 | -1 | -1 | 32 | -1 | 60 | -1 |
| -1 | -1 | -1 | -1 | 109 | -1 | -1 | -1 | -1 | -1 | -1 | -1 | -1 | 165 |
| -1 | 55 | -1 | -1 | -1 | -1 | -1 | -1 | -1 | -1 | -1 | 88 | -1 | -1 |
| 244 | -1 | -1 | -1 | -1 | -1 | -1 | 241 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 116 | -1 | -1 | -1 | -1 | -1 | -1 | -1 | -1 |
| -1 | -1 | -1 | 199 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 2 | -1 | -1 | -1 | -1 | -1 | -1 | 271 | -1 | -1 | -1 | -1 |
| -1 | -1 | -1 | -1 | -1 | -1 | -1 | -1 | -1 | -1 | 82 | -1 | 249 | -1 |
| -1 | -1 | -1 | -1 | -1 | -1 | 167 | -1 | -1 | -1 | -1 | -1 | -1 | 78 |
| -1 | 198 | -1 | -1 | -1 | -1 | -1 | -1 | -1 | -1 | -1 | 207 | -1 | -1 |
| 143 | -1 | -1 | -1 | -1 | -1 | -1 | -1 | -1 | -1 | -1 | -1 | -1 | -1 |
| -1 | -1 | -1 | -1 | 136 | -1 | -1 | -1 | -1 | -1 | -1 | -1 | -1 | -1 |
| -1 | -1 | -1 | -1 | -1 | -1 | -1 | -1 | 34 | -1 | -1 | -1 | -1 | -1 |
| -1 | -1 | -1 | 168 | -1 | 252 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 274 | -1 | -1 | -1 | -1 |
| -1 | -1 | 216 | -1 | -1 | -1 | -1 | -1 | -1 | -1 | 63 | -1 | -1 | -1 |
| -1 | -1 | -1 | -1 | -1 | -1 | -1 | -1 | -1 | -1 | -1 | -1 | 3 | 18 |
| -1 | 257 | -1 | -1 | -1 | -1 | -1 | 32 | -1 | -1 | -1 | 171 | -1 | -1 |
| 256 | -1 | -1 | -1 | -1 | -1 | 220 | -1 | -1 | -1 | -1 | -1 | -1 | -1 |
| -1 | -1 | -1 | -1 | 162 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 129 | -1 | 83 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 150 | -1 | -1 | -1 | -1 |
| -1 | -1 | 194 | -1 | -1 | -1 | -1 | -1 | -1 | -1 | 112 | -1 | -1 | -1 |
| -1 | -1 | -1 | -1 | -1 | -1 | -1 | -1 | -1 | -1 | -1 | -1 | 122 | 82 |
| -1 | 148 | -1 | -1 | -1 | -1 | -1 | 273 | -1 | -1 | -1 | 101 | -1 | -1 |
| 95 | -1 | -1 | -1 | -1 | -1 | 110 | -1 | -1 | -1 | -1 | -1 | -1 | -1 |
| -1 | -1 | -1 | -1 | 48 | -1 | -1 | -1 | -1 | -1 | -1 | -1 | -1 | -1 |

| | | | | | | | | | | | | |
|---|---|---|---|---|---|---|---|---|---|---|---|---|
| 153 | -1 | 265 | 316 | 166 | 238 | 226 | 272 | 318 | 292 | 300 | 270 | 308 |
| 46 | 232 | -1 | -1 | 312 | 136 | -1 | -1 | 122 | 23 | -1 | -1 | 175 |
| 209 | 107 | -1 | -1 | -1 | -1 | -1 | -1 | -1 | -1 | -1 | -1 | -1 |
| 2 | 9 | 53 | 101 | -1 | -1 | 137 | 285 | -1 | -1 | 274 | 152 | -1 |
| 7 | -1 | 7 | 22 | 4 | 9 | 49 | 161 | 6 | 4 | 183 | 14 | 163 |
| 116 | 5 | -1 | -1 | -1 | -1 | -1 | -1 | -1 | 207 | -1 | -1 | -1 |
| 1 | -1 | -1 | -1 | 0 | 198 | -1 | -1 | 139 | -1 | -1 | -1 | 94 |
| 260 | 130 | 117 | -1 | -1 | -1 | -1 | 22 | -1 | 109 | -1 | -1 | -1 |
| 264 | 17 | -1 | 258 | -1 | -1 | -1 | -1 | 68 | -1 | -1 | -1 | 184 |
| -1 | 127 | 276 | -1 | -1 | 237 | -1 | 307 | -1 | -1 | -1 | -1 | -1 |
| 8 | 260 | -1 | -1 | -1 | -1 | 269 | -1 | -1 | -1 | -1 | -1 | 118 |
| 308 | -1 | 143 | 65 | -1 | -1 | -1 | -1 | 118 | -1 | -1 | -1 | -1 |
| 35 | 286 | -1 | -1 | -1 | -1 | -1 | -1 | -1 | -1 | 134 | -1 | 247 |
| -1 | 231 | -1 | -1 | 137 | -1 | -1 | -1 | -1 | -1 | -1 | -1 | -1 |
| 83 | -1 | -1 | -1 | -1 | -1 | 247 | 248 | -1 | -1 | -1 | -1 | -1 |
| 68 | 33 | -1 | -1 | -1 | -1 | -1 | -1 | -1 | -1 | -1 | -1 | 235 |
| 154 | -1 | 68 | -1 | -1 | 88 | -1 | -1 | -1 | -1 | -1 | -1 | -1 |
| -1 | 234 | -1 | 271 | -1 | -1 | -1 | -1 | -1 | -1 | 240 | -1 | -1 |
| -1 | 34 | 59 | -1 | -1 | -1 | 204 | -1 | -1 | -1 | -1 | -1 | 90 |
| 260 | -1 | -1 | 8 | -1 | -1 | -1 | -1 | -1 | -1 | 153 | -1 | -1 |
| 318 | -1 | -1 | -1 | -1 | -1 | -1 | 139 | -1 | -1 | -1 | -1 | -1 |
| -1 | 51 | -1 | -1 | 80 | -1 | -1 | -1 | -1 | -1 | -1 | -1 | -1 |
| 245 | 209 | -1 | -1 | -1 | -1 | -1 | -1 | -1 | -1 | -1 | 199 | -1 |
| 112 | -1 | -1 | -1 | -1 | -1 | -1 | -1 | -1 | -1 | -1 | -1 | 170 |
| -1 | 21 | -1 | -1 | -1 | 154 | -1 | -1 | -1 | -1 | -1 | -1 | -1 |
| 1 | -1 | -1 | -1 | -1 | -1 | -1 | -1 | 294 | -1 | -1 | -1 | -1 |
| -1 | 69 | 312 | 62 | -1 | -1 | -1 | -1 | -1 | -1 | -1 | -1 | -1 |
| 169 | -1 | -1 | -1 | -1 | -1 | 45 | 95 | -1 | -1 | -1 | -1 | -1 |
| -1 | 267 | -1 | -1 | 130 | -1 | -1 | -1 | -1 | -1 | -1 | -1 | -1 |
| 54 | -1 | -1 | 134 | -1 | -1 | -1 | -1 | -1 | 297 | -1 | -1 | -1 |
| -1 | 189 | -1 | -1 | -1 | -1 | -1 | -1 | -1 | -1 | 300 | -1 | -1 |
| 191 | -1 | -1 | -1 | -1 | 89 | -1 | -1 | -1 | -1 | -1 | -1 | -1 |
| 53 | -1 | 171 | -1 | -1 | -1 | -1 | -1 | -1 | -1 | -1 | 309 | -1 |
| 111 | -1 | -1 | -1 | 163 | -1 | -1 | 38 | -1 | -1 | -1 | -1 | -1 |
| -1 | 154 | -1 | 262 | -1 | -1 | 77 | -1 | -1 | -1 | -1 | -1 | -1 |
| 211 | -1 | -1 | -1 | -1 | -1 | -1 | 111 | -1 | -1 | -1 | -1 | -1 |
| 207 | -1 | -1 | -1 | -1 | -1 | -1 | -1 | -1 | -1 | -1 | -1 | -1 |
| -1 | 174 | 46 | -1 | -1 | -1 | -1 | -1 | 187 | -1 | -1 | -1 | -1 |
| 287 | -1 | -1 | -1 | -1 | -1 | -1 | -1 | -1 | 12 | -1 | -1 | -1 |
| -1 | 11 | -1 | -1 | -1 | -1 | -1 | -1 | -1 | -1 | -1 | -1 | -1 |
| 311 | -1 | -1 | 292 | -1 | 310 | -1 | -1 | -1 | -1 | -1 | -1 | -1 |
| 12 | -1 | -1 | -1 | -1 | -1 | 60 | -1 | -1 | -1 | -1 | -1 | -1 |
| -1 | 134 | -1 | -1 | 189 | -1 | -1 | -1 | -1 | -1 | -1 | 48 | -1 |
| 221 | -1 | 200 | -1 | -1 | -1 | -1 | -1 | -1 | -1 | -1 | -1 | -1 |

FROM FIG. 8B

| | | | | | | | | | | | | | |
|---|---|---|---|---|---|---|---|---|---|---|---|---|---|
| 316 | 279 | 276 | 254 | 311 | 252 | 319 | 252 | 7 | 0 | 0 | -1 | -1 | -1 |
| 278 | -1 | -1 | 159 | 110 | -1 | -1 | 228 | 316 | -1 | 0 | 0 | -1 | -1 |
| -1 | -1 | -1 | -1 | -1 | -1 | -1 | -1 | -1 | 1 | -1 | 0 | 0 | -1 |
| -1 | 57 | 150 | -1 | -1 | 233 | 59 | -1 | -1 | -1 | -1 | -1 | 0 | 0 |
| 163 | 15 | 95 | 95 | 27 | 6 | 56 | 7 | 6 | 0 | -1 | -1 | -1 | 0 |
| 264 | -1 | -1 | 101 | -1 | -1 | -1 | -1 | -1 | -1 | -1 | -1 | -1 | -1 |
| -1 | -1 | -1 | -1 | 114 | -1 | -1 | -1 | -1 | 255 | -1 | -1 | -1 | -1 |
| 235 | -1 | -1 | -1 | -1 | 213 | -1 | -1 | -1 | -1 | -1 | -1 | -1 | -1 |
| -1 | -1 | 99 | -1 | 60 | -1 | -1 | -1 | -1 | -1 | -1 | -1 | -1 | -1 |
| 58 | -1 | -1 | -1 | -1 | -1 | 233 | -1 | -1 | -1 | -1 | -1 | -1 | -1 |
| -1 | -1 | 44 | -1 | -1 | -1 | -1 | -1 | -1 | 137 | -1 | -1 | -1 | -1 |
| 268 | -1 | -1 | -1 | -1 | -1 | -1 | 5 | -1 | -1 | -1 | -1 | -1 | -1 |
| -1 | -1 | -1 | -1 | 156 | -1 | -1 | -1 | -1 | -1 | -1 | -1 | 55 | -1 |
| 75 | -1 | 179 | -1 | -1 | -1 | 235 | -1 | -1 | 110 | -1 | -1 | -1 | -1 |
| -1 | -1 | -1 | -1 | 290 | -1 | -1 | -1 | -1 | -1 | -1 | -1 | 215 | -1 |
| 6 | -1 | -1 | -1 | -1 | -1 | -1 | 11 | -1 | -1 | -1 | -1 | -1 | 119 |
| -1 | -1 | 311 | -1 | -1 | 59 | -1 | -1 | -1 | -1 | -1 | -1 | -1 | -1 |
| -1 | -1 | -1 | -1 | -1 | -1 | -1 | -1 | -1 | 222 | -1 | -1 | -1 | -1 |
| -1 | -1 | -1 | -1 | -1 | -1 | -1 | -1 | 97 | -1 | -1 | -1 | -1 | -1 |
| -1 | -1 | -1 | 89 | -1 | -1 | -1 | -1 | -1 | 48 | -1 | -1 | -1 | -1 |
| 119 | -1 | -1 | -1 | -1 | -1 | -1 | -1 | -1 | -1 | -1 | -1 | -1 | 255 |
| -1 | -1 | -1 | -1 | -1 | 18 | -1 | -1 | -1 | -1 | -1 | -1 | 211 | -1 |
| -1 | -1 | -1 | -1 | -1 | -1 | -1 | -1 | -1 | 160 | -1 | -1 | -1 | -1 |
| 99 | -1 | -1 | -1 | -1 | -1 | -1 | -1 | -1 | -1 | 267 | -1 | -1 | -1 |
| -1 | -1 | 151 | -1 | -1 | -1 | -1 | -1 | -1 | 133 | -1 | -1 | -1 | -1 |
| -1 | -1 | -1 | -1 | -1 | -1 | 152 | -1 | -1 | -1 | -1 | -1 | 317 | -1 |
| -1 | 89 | -1 | -1 | -1 | -1 | -1 | -1 | -1 | -1 | -1 | -1 | -1 | -1 |
| -1 | -1 | -1 | -1 | -1 | -1 | -1 | -1 | -1 | 5 | -1 | -1 | -1 | -1 |
| -1 | -1 | -1 | -1 | -1 | -1 | -1 | 304 | -1 | -1 | -1 | -1 | 243 | -1 |
| -1 | -1 | -1 | -1 | -1 | -1 | -1 | -1 | -1 | 159 | -1 | -1 | -1 | -1 |
| -1 | -1 | -1 | -1 | -1 | -1 | -1 | -1 | -1 | -1 | -1 | -1 | -1 | 273 |
| -1 | -1 | -1 | 243 | -1 | -1 | -1 | -1 | -1 | -1 | -1 | -1 | 235 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 86 | -1 | -1 | -1 | 108 | -1 |
| -1 | -1 | -1 | -1 | -1 | 192 | -1 | -1 | -1 | -1 | -1 | -1 | -1 | -1 |
| -1 | -1 | -1 | -1 | -1 | -1 | -1 | -1 | -1 | -1 | 161 | -1 | -1 | -1 |
| -1 | 87 | -1 | -1 | -1 | -1 | -1 | -1 | -1 | 57 | -1 | -1 | 102 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 33 |
| -1 | -1 | -1 | -1 | 67 | -1 | -1 | -1 | -1 | -1 | 45 | -1 | -1 | -1 |
| -1 | -1 | -1 | -1 | -1 | -1 | 3 | -1 | -1 | -1 | -1 | -1 | -1 | -1 |
| -1 | -1 | -1 | -1 | -1 | -1 | -1 | -1 | -1 | -1 | -1 | -1 | -1 | 204 |
| -1 | -1 | -1 | -1 | -1 | -1 | -1 | -1 | -1 | -1 | -1 | -1 | -1 | -1 |
| -1 | 13 | -1 | -1 | -1 | -1 | -1 | -1 | -1 | -1 | -1 | -1 | 14 | -1 |

TO FIG. 8E

FROM FIG. 8B

| | | | | | | | | | | | | |
|---|---|---|---|---|---|---|---|---|---|---|---|---|
| 298 | -1 | -1 | -1 | -1 | 114 | -1 | -1 | -1 | -1 | -1 | -1 | -1 |
| -1 | -1 | -1 | -1 | -1 | -1 | -1 | -1 | -1 | 247 | -1 | -1 | -1 |
| 205 | -1 | -1 | -1 | -1 | 203 | -1 | -1 | 173 | -1 | -1 | -1 | -1 |
| -1 | 163 | -1 | -1 | 240 | -1 | -1 | -1 | -1 | -1 | 7 | -1 | -1 |
| -1 | -1 | -1 | 190 | -1 | -1 | -1 | -1 | -1 | -1 | -1 | -1 | -1 |
| -1 | -1 | -1 | -1 | -1 | -1 | 65 | -1 | -1 | -1 | -1 | -1 | -1 |
| -1 | -1 | 318 | -1 | -1 | -1 | -1 | -1 | -1 | -1 | -1 | -1 | -1 |
| -1 | -1 | -1 | -1 | -1 | -1 | -1 | 245 | -1 | -1 | -1 | -1 | -1 |
| -1 | -1 | -1 | -1 | -1 | -1 | -1 | -1 | -1 | 125 | -1 | -1 | -1 |
| -1 | -1 | -1 | -1 | -1 | -1 | -1 | -1 | -1 | -1 | -1 | 102 | 288 |
| 43 | -1 | -1 | -1 | -1 | 124 | -1 | -1 | -1 | -1 | -1 | -1 | -1 |
| -1 | -1 | -1 | -1 | -1 | -1 | -1 | -1 | 135 | -1 | -1 | -1 | -1 |
| -1 | 2 | -1 | -1 | 95 | -1 | -1 | -1 | -1 | -1 | 140 | -1 | -1 |
| -1 | -1 | -1 | 110 | -1 | -1 | -1 | -1 | -1 | -1 | -1 | -1 | -1 |
| -1 | -1 | -1 | -1 | -1 | -1 | 43 | -1 | -1 | -1 | -1 | -1 | -1 |
| -1 | -1 | 264 | -1 | -1 | -1 | -1 | -1 | -1 | -1 | -1 | -1 | -1 |
| -1 | -1 | -1 | -1 | -1 | -1 | -1 | 296 | -1 | -1 | -1 | -1 | -1 |
| -1 | -1 | -1 | -1 | -1 | -1 | -1 | -1 | -1 | 229 | -1 | -1 | -1 |
| -1 | -1 | -1 | -1 | -1 | -1 | -1 | -1 | -1 | -1 | -1 | 304 | 27 |
| 9 | -1 | -1 | -1 | -1 | 176 | -1 | -1 | -1 | -1 | -1 | -1 | -1 |
| -1 | -1 | -1 | -1 | -1 | -1 | -1 | -1 | 214 | -1 | -1 | -1 | -1 |
| -1 | 238 | -1 | -1 | 210 | -1 | -1 | -1 | -1 | -1 | 193 | -1 | -1 |
| -1 | -1 | -1 | 16 | -1 | -1 | -1 | -1 | -1 | -1 | -1 | -1 | -1 |
| -1 | -1 | -1 | -1 | -1 | -1 | 184 | -1 | -1 | -1 | -1 | -1 | -1 |
| -1 | -1 | 230 | -1 | -1 | -1 | -1 | -1 | -1 | -1 | -1 | -1 | -1 |
| -1 | -1 | -1 | -1 | -1 | -1 | -1 | 236 | -1 | -1 | -1 | -1 | -1 |
| -1 | -1 | -1 | -1 | -1 | -1 | -1 | -1 | -1 | 168 | -1 | -1 | -1 |
| -1 | -1 | -1 | -1 | -1 | -1 | -1 | -1 | -1 | -1 | -1 | 95 | 79 |
| 228 | -1 | -1 | -1 | -1 | 111 | -1 | -1 | -1 | -1 | -1 | -1 | -1 |
| -1 | -1 | -1 | -1 | -1 | -1 | -1 | -1 | 3 | -1 | -1 | -1 | -1 |
| -1 | 99 | -1 | -1 | 197 | -1 | -1 | -1 | -1 | -1 | -1 | -1 | -1 |
| -1 | -1 | -1 | 99 | -1 | -1 | -1 | -1 | -1 | -1 | 258 | -1 | -1 |
| -1 | -1 | -1 | -1 | -1 | -1 | 207 | -1 | -1 | -1 | -1 | -1 | -1 |
| -1 | -1 | 27 | -1 | -1 | -1 | -1 | -1 | -1 | -1 | -1 | -1 | -1 |
| -1 | -1 | -1 | -1 | -1 | -1 | -1 | 278 | -1 | -1 | -1 | -1 | -1 |
| -1 | -1 | -1 | -1 | -1 | -1 | -1 | -1 | -1 | 187 | -1 | -1 | -1 |
| -1 | -1 | -1 | -1 | -1 | -1 | -1 | -1 | -1 | -1 | -1 | 85 | 5 |
| 282 | -1 | -1 | -1 | -1 | 262 | -1 | -1 | -1 | -1 | -1 | -1 | -1 |
| -1 | -1 | -1 | -1 | -1 | -1 | -1 | -1 | 310 | -1 | -1 | -1 | -1 |
| -1 | 141 | -1 | -1 | 151 | -1 | -1 | -1 | -1 | -1 | -1 | -1 | -1 |
| -1 | -1 | -1 | 189 | -1 | -1 | -1 | -1 | -1 | -1 | 264 | -1 | -1 |
| -1 | -1 | -1 | -1 | -1 | -1 | 306 | -1 | -1 | -1 | -1 | -1 | -1 |
| -1 | -1 | 135 | -1 | -1 | -1 | -1 | -1 | -1 | -1 | -1 | -1 | -1 |
| -1 | -1 | -1 | -1 | -1 | -1 | -1 | 118 | -1 | -1 | -1 | -1 | -1 |
| -1 | -1 | -1 | -1 | -1 | -1 | -1 | -1 | -1 | 263 | -1 | -1 | -1 |
| -1 | -1 | -1 | -1 | -1 | -1 | -1 | -1 | -1 | -1 | -1 | 148 | 210 |

FROM FIG. 8C

FROM FIG. 8D

| | | | | | | | | | | | | | |
|---|---|---|---|---|---|---|---|---|---|---|---|---|---|
| -1 | -1 | -1 | 25 | -1 | -1 | -1 | -1 | -1 | -1 | -1 | -1 | -1 | 43 |
| -1 | -1 | -1 | -1 | -1 | -1 | -1 | 188 | -1 | 12 | -1 | -1 | 13 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 175 | -1 | -1 | -1 | -1 | -1 | 203 | 51 | -1 | -1 | -1 | -1 |
| -1 | -1 | -1 | -1 | -1 | -1 | -1 | -1 | -1 | -1 | 41 | -1 | 142 | -1 |
| -1 | -1 | -1 | -1 | 282 | -1 | -1 | -1 | -1 | -1 | -1 | -1 | -1 | 319 |
| -1 | 284 | -1 | -1 | -1 | -1 | -1 | -1 | -1 | -1 | -1 | 172 | -1 | -1 |
| 97 | -1 | -1 | -1 | -1 | 310 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 288 | -1 | -1 | 84 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 184 | -1 | -1 | -1 | -1 | -1 | -1 | 127 | -1 | -1 | -1 | -1 |
| -1 | -1 | -1 | -1 | -1 | -1 | -1 | -1 | -1 | -1 | 191 | -1 | 216 | -1 |
| -1 | -1 | -1 | -1 | 186 | -1 | -1 | -1 | -1 | -1 | -1 | -1 | -1 | 48 |
| -1 | 91 | -1 | -1 | -1 | -1 | -1 | -1 | -1 | -1 | -1 | 56 | -1 | -1 |
| 304 | -1 | -1 | -1 | -1 | -1 | -1 | 24 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 86 | -1 | -1 | -1 | -1 | -1 | -1 | -1 | -1 |
| -1 | -1 | -1 | 222 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 248 | -1 | -1 | -1 | -1 | -1 | -1 | 282 | -1 | -1 | -1 | -1 |
| -1 | -1 | -1 | -1 | -1 | -1 | -1 | -1 | -1 | -1 | 59 | -1 | 293 | -1 |
| -1 | -1 | -1 | -1 | -1 | -1 | 70 | -1 | -1 | -1 | -1 | -1 | -1 | 26 |
| -1 | 319 | -1 | -1 | -1 | -1 | -1 | -1 | -1 | -1 | -1 | 122 | -1 | -1 |
| 115 | -1 | -1 | -1 | -1 | -1 | -1 | -1 | -1 | -1 | -1 | -1 | -1 | -1 |
| -1 | -1 | -1 | -1 | 144 | -1 | -1 | -1 | -1 | -1 | -1 | -1 | -1 | -1 |
| -1 | -1 | -1 | -1 | -1 | -1 | -1 | -1 | 119 | -1 | -1 | -1 | -1 | -1 |
| -1 | -1 | -1 | 174 | -1 | 319 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 172 | -1 | -1 | -1 | -1 |
| -1 | -1 | 314 | -1 | -1 | -1 | -1 | -1 | -1 | -1 | 160 | -1 | -1 | -1 |
| -1 | -1 | -1 | -1 | -1 | -1 | -1 | -1 | -1 | -1 | -1 | -1 | 295 | 52 |
| -1 | 14 | -1 | -1 | -1 | -1 | -1 | 168 | -1 | -1 | -1 | 193 | -1 | -1 |
| 210 | -1 | -1 | -1 | -1 | -1 | 216 | -1 | -1 | -1 | -1 | -1 | -1 | -1 |
| -1 | -1 | -1 | -1 | 272 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 185 | -1 | 285 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 191 | -1 | -1 | -1 | -1 |
| -1 | -1 | 294 | -1 | -1 | -1 | -1 | -1 | -1 | -1 | 13 | -1 | -1 | -1 |
| -1 | -1 | -1 | -1 | -1 | -1 | -1 | -1 | -1 | -1 | -1 | -1 | 1 | 165 |
| -1 | 142 | -1 | -1 | -1 | -1 | -1 | 190 | -1 | -1 | -1 | 312 | -1 | -1 |
| 299 | -1 | -1 | -1 | -1 | -1 | 78 | -1 | -1 | -1 | -1 | -1 | -1 | -1 |
| -1 | -1 | -1 | -1 | 116 | -1 | -1 | -1 | -1 | -1 | -1 | -1 | -1 | -1 |

| | | | | | | | | | | | | |
|---|---|---|---|---|---|---|---|---|---|---|---|---|
| 48 | -1 | 334 | 258 | 163 | 344 | 167 | 345 | 340 | 255 | 167 | 221 | 305 |
| 199 | 34 | -1 | -1 | 197 | 321 | -1 | -1 | 303 | 109 | -1 | -1 | 244 |
| 129 | 294 | -1 | -1 | -1 | -1 | -1 | -1 | -1 | -1 | -1 | -1 | -1 |
| 6 | 5 | 34 | 331 | -1 | -1 | 288 | 263 | -1 | -1 | 198 | 303 | -1 |
| 10 | -1 | 8 | 248 | 1 | 140 | 10 | 233 | 94 | 0 | 6 | 4 | 208 |
| 42 | 189 | -1 | -1 | -1 | -1 | -1 | -1 | -1 | 11 | -1 | -1 | -1 |
| 84 | -1 | -1 | -1 | 186 | 311 | -1 | -1 | 108 | -1 | -1 | -1 | 120 |
| 183 | 219 | 98 | -1 | -1 | -1 | -1 | 333 | -1 | 0 | -1 | -1 | -1 |
| 219 | 349 | -1 | 2 | -1 | -1 | -1 | -1 | 196 | -1 | -1 | -1 | 119 |
| -1 | 47 | 63 | -1 | -1 | 335 | -1 | 165 | -1 | -1 | -1 | -1 | -1 |
| 190 | 54 | -1 | -1 | -1 | -1 | 319 | -1 | -1 | -1 | -1 | -1 | 104 |
| 149 | -1 | 239 | 344 | -1 | -1 | -1 | -1 | 334 | -1 | -1 | -1 | -1 |
| 349 | 148 | -1 | -1 | -1 | -1 | -1 | -1 | -1 | -1 | 245 | -1 | 266 |
| -1 | 131 | -1 | -1 | 66 | -1 | -1 | -1 | -1 | -1 | -1 | -1 | -1 |
| 15 | -1 | -1 | -1 | -1 | -1 | 149 | 57 | -1 | -1 | -1 | -1 | -1 |
| 168 | 93 | -1 | -1 | -1 | -1 | -1 | -1 | -1 | -1 | -1 | -1 | 131 |
| 177 | -1 | 269 | -1 | -1 | 3 | -1 | -1 | -1 | -1 | -1 | -1 | -1 |
| -1 | 318 | -1 | 332 | -1 | -1 | -1 | -1 | -1 | -1 | 127 | -1 | -1 |
| -1 | 216 | 255 | -1 | -1 | -1 | 226 | -1 | -1 | -1 | -1 | -1 | 91 |
| 9 | -1 | -1 | 321 | -1 | -1 | -1 | -1 | -1 | -1 | 228 | -1 | -1 |
| 73 | -1 | -1 | -1 | -1 | -1 | -1 | 19 | -1 | -1 | -1 | -1 | -1 |
| -1 | 56 | -1 | -1 | 181 | -1 | -1 | -1 | -1 | -1 | -1 | -1 | -1 |
| 163 | 168 | -1 | -1 | -1 | -1 | -1 | -1 | -1 | -1 | -1 | 342 | -1 |
| 164 | -1 | -1 | -1 | -1 | -1 | -1 | -1 | -1 | -1 | -1 | -1 | 19 |
| -1 | 279 | -1 | -1 | -1 | 34 | -1 | -1 | -1 | -1 | -1 | -1 | -1 |
| 257 | -1 | -1 | -1 | -1 | -1 | -1 | -1 | 235 | -1 | -1 | -1 | -1 |
| -1 | 22 | 218 | 78 | -1 | -1 | -1 | -1 | -1 | -1 | -1 | -1 | -1 |
| 178 | -1 | -1 | -1 | -1 | -1 | 128 | 349 | -1 | -1 | -1 | -1 | -1 |
| -1 | 79 | -1 | -1 | 206 | -1 | -1 | -1 | -1 | -1 | -1 | -1 | -1 |
| 294 | -1 | -1 | 197 | -1 | -1 | -1 | -1 | -1 | 195 | -1 | -1 | -1 |
| -1 | 263 | -1 | -1 | -1 | -1 | -1 | -1 | -1 | -1 | 189 | -1 | -1 |
| 259 | -1 | -1 | -1 | -1 | 307 | -1 | -1 | -1 | -1 | -1 | -1 | -1 |
| 242 | -1 | 346 | -1 | -1 | -1 | -1 | -1 | -1 | -1 | -1 | 28 | -1 |
| 244 | -1 | -1 | -1 | 255 | -1 | -1 | 186 | -1 | -1 | -1 | -1 | -1 |
| -1 | 12 | -1 | 339 | -1 | -1 | 282 | -1 | -1 | -1 | -1 | -1 | -1 |
| 77 | -1 | -1 | -1 | -1 | -1 | -1 | 324 | -1 | -1 | -1 | -1 | -1 |
| 79 | -1 | -1 | -1 | -1 | -1 | -1 | -1 | -1 | -1 | -1 | -1 | -1 |
| -1 | 329 | 106 | -1 | -1 | -1 | -1 | -1 | 323 | -1 | -1 | -1 | -1 |
| 347 | -1 | -1 | -1 | -1 | -1 | -1 | -1 | -1 | 93 | -1 | -1 | -1 |
| -1 | 349 | -1 | -1 | -1 | -1 | -1 | -1 | -1 | -1 | -1 | -1 | -1 |
| 226 | -1 | -1 | 280 | -1 | 320 | -1 | -1 | -1 | -1 | -1 | -1 | -1 |
| 56 | -1 | -1 | -1 | -1 | -1 | 191 | -1 | -1 | -1 | -1 | -1 | -1 |
| -1 | 313 | -1 | -1 | 180 | -1 | -1 | -1 | -1 | -1 | -1 | 294 | -1 |
| 54 | -1 | 259 | -1 | -1 | -1 | -1 | -1 | -1 | -1 | -1 | -1 | -1 |

FROM FIG. 9B

| | | | | | | | | | | | | | |
|---|---|---|---|---|---|---|---|---|---|---|---|---|---|
| 261 | 237 | 213 | 341 | 266 | 80 | 329 | 348 | 351 | 0 | 0 | -1 | -1 | -1 |
| 143 | -1 | -1 | 42 | 175 | -1 | -1 | 123 | 123 | -1 | 0 | 0 | -1 | -1 |
| -1 | -1 | -1 | -1 | -1 | -1 | -1 | -1 | -1 | 1 | -1 | 0 | 0 | -1 |
| -1 | 169 | 161 | -1 | -1 | 340 | 201 | -1 | -1 | -1 | -1 | -1 | 0 | 0 |
| 51 | 50 | 0 | 19 | 4 | 53 | 4 | 127 | 5 | 0 | -1 | -1 | -1 | 0 |
| 296 | -1 | -1 | 323 | -1 | -1 | -1 | -1 | -1 | -1 | -1 | -1 | -1 | -1 |
| -1 | -1 | -1 | -1 | 160 | -1 | -1 | -1 | -1 | 192 | -1 | -1 | -1 | -1 |
| 57 | -1 | -1 | -1 | -1 | 216 | -1 | -1 | -1 | -1 | -1 | -1 | -1 | -1 |
| -1 | -1 | 262 | -1 | 306 | -1 | -1 | -1 | -1 | -1 | -1 | -1 | -1 | -1 |
| 107 | -1 | -1 | -1 | -1 | -1 | 195 | -1 | -1 | -1 | -1 | -1 | -1 | -1 |
| -1 | -1 | 252 | -1 | -1 | -1 | -1 | -1 | -1 | 310 | -1 | -1 | -1 | -1 |
| 285 | -1 | -1 | -1 | -1 | -1 | -1 | 21 | -1 | -1 | -1 | -1 | -1 | -1 |
| -1 | -1 | -1 | -1 | 158 | -1 | -1 | -1 | -1 | -1 | -1 | -1 | 56 | -1 |
| 251 | -1 | 128 | -1 | -1 | -1 | 302 | -1 | -1 | 250 | -1 | -1 | -1 | -1 |
| -1 | -1 | -1 | -1 | 98 | -1 | -1 | -1 | -1 | -1 | -1 | -1 | 133 | -1 |
| 78 | -1 | -1 | -1 | -1 | -1 | -1 | 184 | -1 | -1 | -1 | -1 | -1 | 95 |
| -1 | -1 | 289 | -1 | -1 | 217 | -1 | -1 | -1 | -1 | -1 | -1 | -1 | -1 |
| -1 | -1 | -1 | -1 | -1 | -1 | -1 | -1 | -1 | 16 | -1 | -1 | -1 | -1 |
| -1 | -1 | -1 | -1 | -1 | -1 | -1 | -1 | 332 | -1 | -1 | -1 | -1 | -1 |
| -1 | -1 | -1 | 218 | -1 | -1 | -1 | -1 | -1 | 157 | -1 | -1 | -1 | -1 |
| 311 | -1 | -1 | -1 | -1 | -1 | -1 | -1 | -1 | -1 | -1 | -1 | -1 | 343 |
| -1 | -1 | -1 | -1 | -1 | 125 | -1 | -1 | -1 | -1 | -1 | -1 | 1 | -1 |
| -1 | -1 | -1 | -1 | -1 | -1 | -1 | -1 | -1 | 37 | -1 | -1 | -1 | -1 |
| 224 | -1 | -1 | -1 | -1 | -1 | -1 | -1 | -1 | -1 | 170 | -1 | -1 | -1 |
| -1 | -1 | 186 | -1 | -1 | -1 | -1 | -1 | -1 | 155 | -1 | -1 | -1 | -1 |
| -1 | -1 | -1 | -1 | -1 | -1 | 93 | -1 | -1 | -1 | -1 | -1 | 26 | -1 |
| -1 | 130 | -1 | -1 | -1 | -1 | -1 | -1 | -1 | -1 | -1 | -1 | -1 | -1 |
| -1 | -1 | -1 | -1 | -1 | -1 | -1 | -1 | -1 | 277 | -1 | -1 | -1 | -1 |
| -1 | -1 | -1 | -1 | -1 | -1 | -1 | 103 | -1 | -1 | -1 | -1 | 28 | -1 |
| -1 | -1 | -1 | -1 | -1 | -1 | -1 | -1 | -1 | 54 | -1 | -1 | -1 | -1 |
| -1 | -1 | -1 | -1 | -1 | -1 | -1 | -1 | -1 | -1 | -1 | -1 | -1 | 307 |
| -1 | -1 | -1 | 317 | -1 | -1 | -1 | -1 | -1 | -1 | -1 | -1 | 184 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 144 | -1 | -1 | -1 | 210 | -1 |
| -1 | -1 | -1 | -1 | -1 | 318 | -1 | -1 | -1 | -1 | -1 | -1 | -1 | -1 |
| -1 | -1 | -1 | -1 | -1 | -1 | -1 | -1 | -1 | -1 | 218 | -1 | -1 | -1 |
| -1 | 140 | -1 | -1 | -1 | -1 | -1 | -1 | -1 | 21 | -1 | -1 | 58 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 136 |
| -1 | -1 | -1 | -1 | 118 | -1 | -1 | -1 | -1 | -1 | 244 | -1 | -1 | -1 |
| -1 | -1 | -1 | -1 | -1 | -1 | 310 | -1 | -1 | -1 | -1 | -1 | -1 | -1 |
| -1 | -1 | -1 | -1 | -1 | -1 | -1 | -1 | -1 | -1 | -1 | -1 | -1 | 207 |
| -1 | -1 | -1 | -1 | -1 | -1 | -1 | -1 | -1 | -1 | -1 | -1 | -1 | -1 |
| -1 | 88 | -1 | -1 | -1 | -1 | -1 | -1 | -1 | -1 | -1 | -1 | 162 | -1 |

TO FIG. 9E

FROM FIG. 9B

| | | | | | | | | | | | | |
|---|---|---|---|---|---|---|---|---|---|---|---|---|
| 344 | -1 | -1 | -1 | -1 | 124 | -1 | -1 | -1 | -1 | -1 | -1 | -1 |
| -1 | -1 | -1 | -1 | -1 | -1 | -1 | -1 | -1 | 334 | -1 | -1 | -1 |
| 63 | -1 | -1 | -1 | -1 | 218 | -1 | -1 | 207 | -1 | -1 | -1 | -1 |
| -1 | 96 | -1 | -1 | 13 | -1 | -1 | -1 | -1 | -1 | 196 | -1 | -1 |
| -1 | -1 | -1 | 307 | -1 | -1 | -1 | -1 | -1 | -1 | -1 | -1 | -1 |
| -1 | -1 | -1 | -1 | -1 | -1 | 90 | -1 | -1 | -1 | -1 | -1 | -1 |
| -1 | -1 | 104 | -1 | -1 | -1 | -1 | -1 | -1 | -1 | -1 | -1 | -1 |
| -1 | -1 | -1 | -1 | -1 | -1 | -1 | 233 | -1 | -1 | -1 | -1 | -1 |
| -1 | -1 | -1 | -1 | -1 | -1 | -1 | -1 | -1 | 344 | -1 | -1 | -1 |
| -1 | -1 | -1 | -1 | -1 | -1 | -1 | -1 | -1 | -1 | -1 | 182 | 285 |
| 240 | -1 | -1 | -1 | -1 | 6 | -1 | -1 | -1 | -1 | -1 | -1 | -1 |
| -1 | -1 | -1 | -1 | -1 | -1 | -1 | -1 | 60 | -1 | -1 | -1 | -1 |
| -1 | 18 | -1 | -1 | 203 | -1 | -1 | -1 | -1 | -1 | 266 | -1 | -1 |
| -1 | -1 | -1 | 28 | -1 | -1 | -1 | -1 | -1 | -1 | -1 | -1 | -1 |
| -1 | -1 | -1 | -1 | -1 | -1 | 275 | -1 | -1 | -1 | -1 | -1 | -1 |
| -1 | -1 | 194 | -1 | -1 | -1 | -1 | -1 | -1 | -1 | -1 | -1 | -1 |
| -1 | -1 | -1 | -1 | -1 | -1 | -1 | 57 | -1 | -1 | -1 | -1 | -1 |
| -1 | -1 | -1 | -1 | -1 | -1 | -1 | -1 | -1 | 122 | -1 | -1 | -1 |
| -1 | -1 | -1 | -1 | -1 | -1 | -1 | -1 | -1 | -1 | -1 | 292 | 167 |
| 79 | -1 | -1 | -1 | -1 | 140 | -1 | -1 | -1 | -1 | -1 | -1 | -1 |
| -1 | -1 | -1 | -1 | -1 | -1 | -1 | -1 | 277 | -1 | -1 | -1 | -1 |
| -1 | 317 | -1 | -1 | 21 | -1 | -1 | -1 | -1 | -1 | 5 | -1 | -1 |
| -1 | -1 | -1 | 261 | -1 | -1 | -1 | -1 | -1 | -1 | -1 | -1 | -1 |
| -1 | -1 | -1 | -1 | -1 | -1 | 87 | -1 | -1 | -1 | -1 | -1 | -1 |
| -1 | -1 | 94 | -1 | -1 | -1 | -1 | -1 | -1 | -1 | -1 | -1 | -1 |
| -1 | -1 | -1 | -1 | -1 | -1 | -1 | 207 | -1 | -1 | -1 | -1 | -1 |
| -1 | -1 | -1 | -1 | -1 | -1 | -1 | -1 | -1 | 47 | -1 | -1 | -1 |
| -1 | -1 | -1 | -1 | -1 | -1 | -1 | -1 | -1 | -1 | -1 | 81 | 72 |
| 11 | -1 | -1 | -1 | -1 | 242 | -1 | -1 | -1 | -1 | -1 | -1 | -1 |
| -1 | -1 | -1 | -1 | -1 | -1 | -1 | -1 | 216 | -1 | -1 | -1 | -1 |
| -1 | 64 | -1 | -1 | 313 | -1 | -1 | -1 | -1 | -1 | -1 | -1 | -1 |
| -1 | -1 | -1 | 86 | -1 | -1 | -1 | -1 | -1 | -1 | 53 | -1 | -1 |
| -1 | -1 | -1 | -1 | -1 | -1 | 174 | -1 | -1 | -1 | -1 | -1 | -1 |
| -1 | -1 | 121 | -1 | -1 | -1 | -1 | -1 | -1 | -1 | -1 | -1 | -1 |
| -1 | -1 | -1 | -1 | -1 | -1 | -1 | 301 | -1 | -1 | -1 | -1 | -1 |
| -1 | -1 | -1 | -1 | -1 | -1 | -1 | -1 | -1 | 93 | -1 | -1 | -1 |
| -1 | -1 | -1 | -1 | -1 | -1 | -1 | -1 | -1 | -1 | -1 | 30 | 119 |
| 68 | -1 | -1 | -1 | -1 | 8 | -1 | -1 | -1 | -1 | -1 | -1 | -1 |
| -1 | -1 | -1 | -1 | -1 | -1 | -1 | -1 | 62 | -1 | -1 | -1 | -1 |
| -1 | 164 | -1 | -1 | 34 | -1 | -1 | -1 | -1 | -1 | -1 | -1 | -1 |
| -1 | -1 | -1 | 212 | -1 | -1 | -1 | -1 | -1 | -1 | 110 | -1 | -1 |
| -1 | -1 | -1 | -1 | -1 | -1 | 321 | -1 | -1 | -1 | -1 | -1 | -1 |
| -1 | -1 | 345 | -1 | -1 | -1 | -1 | -1 | -1 | -1 | -1 | -1 | -1 |
| -1 | -1 | -1 | -1 | -1 | -1 | -1 | 260 | -1 | -1 | -1 | -1 | -1 |
| -1 | -1 | -1 | -1 | -1 | -1 | -1 | -1 | -1 | 346 | -1 | -1 | -1 |
| -1 | -1 | -1 | -1 | -1 | -1 | -1 | -1 | -1 | -1 | -1 | 80 | 231 |

FROM FIG. 9C

FROM FIG. 9D

| | | | | | | | | | | | | | |
|---|---|---|---|---|---|---|---|---|---|---|---|---|---|
| -1 | -1 | -1 | 151 | -1 | -1 | -1 | -1 | -1 | -1 | -1 | -1 | -1 | 109 |
| -1 | -1 | -1 | -1 | -1 | -1 | -1 | 102 | -1 | 43 | -1 | -1 | 26 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 70 | -1 | -1 | -1 | -1 | -1 | 89 | 34 | -1 | -1 | -1 | -1 |
| -1 | -1 | -1 | -1 | -1 | -1 | -1 | -1 | -1 | -1 | 8 | -1 | 150 | -1 |
| -1 | -1 | -1 | -1 | 250 | -1 | -1 | -1 | -1 | -1 | -1 | -1 | -1 | 260 |
| -1 | 346 | -1 | -1 | -1 | -1 | -1 | -1 | -1 | -1 | -1 | 235 | -1 | -1 |
| 78 | -1 | -1 | -1 | -1 | 218 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 125 | -1 | -1 | 153 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 104 | -1 | -1 | -1 | -1 | -1 | -1 | 209 | -1 | -1 | -1 | -1 |
| -1 | -1 | -1 | -1 | -1 | -1 | -1 | -1 | -1 | -1 | 2 | -1 | 65 | -1 |
| -1 | -1 | -1 | -1 | 294 | -1 | -1 | -1 | -1 | -1 | -1 | -1 | -1 | 58 |
| -1 | 207 | -1 | -1 | -1 | -1 | -1 | -1 | -1 | -1 | -1 | 192 | -1 | -1 |
| 95 | -1 | -1 | -1 | -1 | -1 | -1 | 275 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 296 | -1 | -1 | -1 | -1 | -1 | -1 | -1 | -1 |
| -1 | -1 | -1 | 142 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 8 | -1 | -1 | -1 | -1 | -1 | -1 | 331 | -1 | -1 | -1 | -1 |
| -1 | -1 | -1 | -1 | -1 | -1 | -1 | -1 | -1 | -1 | 21 | -1 | 8 | -1 |
| -1 | -1 | -1 | -1 | -1 | -1 | 125 | -1 | -1 | -1 | -1 | -1 | -1 | 334 |
| -1 | 256 | -1 | -1 | -1 | -1 | -1 | -1 | -1 | -1 | -1 | 148 | -1 | -1 |
| 77 | -1 | -1 | -1 | -1 | -1 | -1 | -1 | -1 | -1 | -1 | -1 | -1 | -1 |
| -1 | -1 | -1 | -1 | 208 | -1 | -1 | -1 | -1 | -1 | -1 | -1 | -1 | -1 |
| -1 | -1 | -1 | -1 | -1 | -1 | -1 | -1 | 170 | -1 | -1 | -1 | -1 | -1 |
| -1 | -1 | -1 | 223 | -1 | 100 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 130 | -1 | -1 | -1 | -1 |
| -1 | -1 | 94 | -1 | -1 | -1 | -1 | -1 | -1 | -1 | 116 | -1 | -1 | -1 |
| -1 | -1 | -1 | -1 | -1 | -1 | -1 | -1 | -1 | -1 | -1 | -1 | 155 | 129 |
| -1 | 116 | -1 | -1 | -1 | -1 | -1 | 130 | -1 | -1 | -1 | 20 | -1 | -1 |
| 204 | -1 | -1 | -1 | -1 | -1 | 287 | -1 | -1 | -1 | -1 | -1 | -1 | -1 |
| -1 | -1 | -1 | -1 | 103 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 143 | -1 | 214 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 24 | -1 | -1 | -1 | -1 |
| -1 | -1 | 7 | -1 | -1 | -1 | -1 | -1 | -1 | -1 | 223 | -1 | -1 | -1 |
| -1 | -1 | -1 | -1 | -1 | -1 | -1 | -1 | -1 | -1 | -1 | -1 | 253 | 229 |
| -1 | 345 | -1 | -1 | -1 | -1 | -1 | 310 | -1 | -1 | -1 | 30 | -1 | -1 |
| 339 | -1 | -1 | -1 | -1 | -1 | 245 | -1 | -1 | -1 | -1 | -1 | -1 | -1 |
| -1 | -1 | -1 | -1 | 266 | -1 | -1 | -1 | -1 | -1 | -1 | -1 | -1 | -1 |

| | | | | | | | | | | | | |
|---|---|---|---|---|---|---|---|---|---|---|---|---|
| 216 | -1 | 382 | 383 | 103 | 140 | 280 | 219 | 264 | 137 | 326 | 307 | 86 |
| 183 | 276 | -1 | -1 | 374 | 258 | -1 | -1 | 373 | 261 | -1 | -1 | 295 |
| 178 | 318 | -1 | -1 | -1 | -1 | -1 | -1 | -1 | -1 | -1 | -1 | -1 |
| 203 | 201 | 325 | 97 | -1 | -1 | 98 | 167 | -1 | -1 | 351 | 276 | -1 |
| 5 | -1 | 220 | 99 | 5 | 19 | 6 | 0 | 80 | 8 | 288 | 210 | 3 |
| 81 | 339 | -1 | -1 | -1 | -1 | -1 | -1 | -1 | 9 | -1 | -1 | -1 |
| 144 | -1 | -1 | -1 | 222 | 365 | -1 | -1 | 139 | -1 | -1 | -1 | 147 |
| 336 | 5 | 185 | -1 | -1 | -1 | -1 | 222 | -1 | 220 | -1 | -1 | -1 |
| 315 | 76 | -1 | 276 | -1 | -1 | -1 | -1 | 35 | -1 | -1 | -1 | 106 |
| -1 | 174 | 128 | -1 | -1 | 322 | -1 | 24 | -1 | -1 | -1 | -1 | -1 |
| 221 | 77 | -1 | -1 | -1 | -1 | 219 | -1 | -1 | -1 | -1 | -1 | 149 |
| 147 | -1 | 355 | 167 | -1 | -1 | -1 | -1 | 20 | -1 | -1 | -1 | -1 |
| 119 | 10 | -1 | -1 | -1 | -1 | -1 | -1 | -1 | -1 | 247 | -1 | 369 |
| -1 | 324 | -1 | -1 | 328 | -1 | -1 | -1 | -1 | -1 | -1 | -1 | -1 |
| 270 | -1 | -1 | -1 | -1 | -1 | 146 | 329 | -1 | -1 | -1 | -1 | -1 |
| 53 | 180 | -1 | -1 | -1 | -1 | -1 | -1 | -1 | -1 | -1 | -1 | 374 |
| 108 | -1 | 139 | -1 | -1 | 246 | -1 | -1 | -1 | -1 | -1 | -1 | -1 |
| -1 | 131 | -1 | 48 | -1 | -1 | -1 | -1 | -1 | -1 | 336 | -1 | -1 |
| -1 | 297 | 79 | -1 | -1 | -1 | 287 | -1 | -1 | -1 | -1 | -1 | 348 |
| 287 | -1 | -1 | 258 | -1 | -1 | -1 | -1 | -1 | -1 | 192 | -1 | -1 |
| 2 | -1 | -1 | -1 | -1 | -1 | -1 | 366 | -1 | -1 | -1 | -1 | -1 |
| -1 | 365 | -1 | -1 | 380 | -1 | -1 | -1 | -1 | -1 | -1 | -1 | -1 |
| 376 | 176 | -1 | -1 | -1 | -1 | -1 | -1 | -1 | -1 | -1 | 126 | -1 |
| 336 | -1 | -1 | -1 | -1 | -1 | -1 | -1 | -1 | -1 | -1 | -1 | 282 |
| -1 | 34 | -1 | -1 | -1 | 1 | -1 | -1 | -1 | -1 | -1 | -1 | -1 |
| 298 | -1 | -1 | -1 | -1 | -1 | -1 | -1 | 371 | -1 | -1 | -1 | -1 |
| -1 | 340 | 27 | 129 | -1 | -1 | -1 | -1 | -1 | -1 | -1 | -1 | -1 |
| 277 | -1 | -1 | -1 | -1 | -1 | 54 | 130 | -1 | -1 | -1 | -1 | -1 |
| -1 | 79 | -1 | -1 | 170 | -1 | -1 | -1 | -1 | -1 | -1 | -1 | -1 |
| 51 | -1 | -1 | 224 | -1 | -1 | -1 | -1 | -1 | 71 | -1 | -1 | -1 |
| -1 | 64 | -1 | -1 | -1 | -1 | -1 | -1 | -1 | -1 | 117 | -1 | -1 |
| 156 | -1 | -1 | -1 | -1 | 304 | -1 | -1 | -1 | -1 | -1 | -1 | -1 |
| 100 | -1 | 271 | -1 | -1 | -1 | -1 | -1 | -1 | -1 | -1 | 211 | -1 |
| 217 | -1 | -1 | -1 | 363 | -1 | -1 | 222 | -1 | -1 | -1 | -1 | -1 |
| -1 | 76 | -1 | 202 | -1 | -1 | 17 | -1 | -1 | -1 | -1 | -1 | -1 |
| 70 | -1 | -1 | -1 | -1 | -1 | -1 | 0 | -1 | -1 | -1 | -1 | -1 |
| 226 | -1 | -1 | -1 | -1 | -1 | -1 | -1 | -1 | -1 | -1 | -1 | -1 |
| -1 | 68 | 221 | -1 | -1 | -1 | -1 | -1 | 293 | -1 | -1 | -1 | -1 |
| 9 | -1 | -1 | -1 | -1 | -1 | -1 | -1 | -1 | 31 | -1 | -1 | -1 |
| -1 | 189 | -1 | -1 | -1 | -1 | -1 | -1 | -1 | -1 | -1 | -1 | -1 |
| 139 | -1 | -1 | 301 | -1 | 2 | -1 | -1 | -1 | -1 | -1 | -1 | -1 |
| 42 | -1 | -1 | -1 | -1 | -1 | 137 | -1 | -1 | -1 | -1 | -1 | -1 |
| -1 | 103 | -1 | -1 | 121 | -1 | -1 | -1 | -1 | -1 | -1 | 189 | -1 |
| 14 | -1 | 371 | -1 | -1 | -1 | -1 | -1 | -1 | -1 | -1 | -1 | -1 |

FROM FIG. 10B

| | | | | | | | | | | | | | |
|---|---|---|---|---|---|---|---|---|---|---|---|---|---|
| 216 | 360 | 301 | 306 | 375 | 368 | 231 | 232 | 368 | 0 | 0 | -1 | -1 | -1 |
| 189 | -1 | -1 | 377 | 270 | -1 | -1 | 156 | 358 | -1 | 0 | 0 | -1 | -1 |
| -1 | -1 | -1 | -1 | -1 | -1 | -1 | -1 | -1 | 1 | -1 | 0 | 0 | -1 |
| -1 | 283 | 94 | -1 | -1 | 301 | 175 | -1 | -1 | -1 | -1 | -1 | 0 | 0 |
| 31 | 269 | 6 | 213 | 27 | 192 | 0 | 17 | 148 | 0 | -1 | -1 | -1 | 0 |
| 103 | -1 | -1 | 379 | -1 | -1 | -1 | -1 | -1 | -1 | -1 | -1 | -1 | -1 |
| -1 | -1 | -1 | -1 | 356 | -1 | -1 | -1 | -1 | 220 | -1 | -1 | -1 | -1 |
| 17 | -1 | -1 | -1 | -1 | 36 | -1 | -1 | -1 | -1 | -1 | -1 | -1 | -1 |
| -1 | -1 | 238 | -1 | 224 | -1 | -1 | -1 | -1 | -1 | -1 | -1 | -1 | -1 |
| 209 | -1 | -1 | -1 | -1 | -1 | 54 | -1 | -1 | -1 | -1 | -1 | -1 | -1 |
| -1 | -1 | 58 | -1 | -1 | -1 | -1 | -1 | -1 | 7 | -1 | -1 | -1 | -1 |
| 126 | -1 | -1 | -1 | -1 | -1 | -1 | 98 | -1 | -1 | -1 | -1 | -1 | -1 |
| -1 | -1 | -1 | -1 | 217 | -1 | -1 | -1 | -1 | -1 | -1 | -1 | 38 | -1 |
| 15 | -1 | 251 | -1 | -1 | -1 | 278 | -1 | -1 | 54 | -1 | -1 | -1 | -1 |
| -1 | -1 | -1 | -1 | 270 | -1 | -1 | -1 | -1 | -1 | -1 | -1 | 40 | -1 |
| 242 | -1 | -1 | -1 | -1 | -1 | -1 | 147 | -1 | -1 | -1 | -1 | -1 | 170 |
| -1 | -1 | 336 | -1 | -1 | 141 | -1 | -1 | -1 | -1 | -1 | -1 | -1 | -1 |
| -1 | -1 | -1 | -1 | -1 | -1 | -1 | -1 | -1 | 307 | -1 | -1 | -1 | -1 |
| -1 | -1 | -1 | -1 | -1 | -1 | -1 | -1 | 287 | -1 | -1 | -1 | -1 | -1 |
| -1 | -1 | -1 | 343 | -1 | -1 | -1 | -1 | -1 | 376 | -1 | -1 | -1 | -1 |
| 102 | -1 | -1 | -1 | -1 | -1 | -1 | -1 | -1 | -1 | -1 | -1 | -1 | 146 |
| -1 | -1 | -1 | -1 | -1 | 133 | -1 | -1 | -1 | -1 | -1 | -1 | 376 | -1 |
| -1 | -1 | -1 | -1 | -1 | -1 | -1 | -1 | -1 | 341 | -1 | -1 | -1 | -1 |
| 131 | -1 | -1 | -1 | -1 | -1 | -1 | -1 | -1 | -1 | 89 | -1 | -1 | -1 |
| -1 | -1 | 337 | -1 | -1 | -1 | -1 | -1 | -1 | 351 | -1 | -1 | -1 | -1 |
| -1 | -1 | -1 | -1 | -1 | -1 | 343 | -1 | -1 | -1 | -1 | -1 | 26 | -1 |
| -1 | 152 | -1 | -1 | -1 | -1 | -1 | -1 | -1 | -1 | -1 | -1 | -1 | -1 |
| -1 | -1 | -1 | -1 | -1 | -1 | -1 | -1 | -1 | 83 | -1 | -1 | -1 | -1 |
| -1 | -1 | -1 | -1 | -1 | -1 | -1 | 284 | -1 | -1 | -1 | -1 | 305 | -1 |
| -1 | -1 | -1 | -1 | -1 | -1 | -1 | -1 | -1 | 300 | -1 | -1 | -1 | -1 |
| -1 | -1 | -1 | -1 | -1 | -1 | -1 | -1 | -1 | -1 | -1 | -1 | -1 | 101 |
| -1 | -1 | -1 | 297 | -1 | -1 | -1 | -1 | -1 | -1 | -1 | -1 | 105 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 363 | -1 | -1 | -1 | 32 | -1 |
| -1 | -1 | -1 | -1 | -1 | 289 | -1 | -1 | -1 | -1 | -1 | -1 | -1 | -1 |
| -1 | -1 | -1 | -1 | -1 | -1 | -1 | -1 | -1 | -1 | 326 | -1 | -1 | -1 |
| -1 | 23 | -1 | -1 | -1 | -1 | -1 | -1 | -1 | 16 | -1 | -1 | 382 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 32 |
| -1 | -1 | -1 | -1 | 322 | -1 | -1 | -1 | -1 | -1 | 134 | -1 | -1 | -1 |
| -1 | -1 | -1 | -1 | -1 | -1 | 372 | -1 | -1 | -1 | -1 | -1 | -1 | -1 |
| -1 | -1 | -1 | -1 | -1 | -1 | -1 | -1 | -1 | -1 | -1 | -1 | -1 | 124 |
| -1 | -1 | -1 | -1 | -1 | -1 | -1 | -1 | -1 | -1 | -1 | -1 | -1 | -1 |
| -1 | 81 | -1 | -1 | -1 | -1 | -1 | -1 | -1 | -1 | -1 | -1 | 127 | -1 |

TO FIG. 10E

FROM FIG. 10B

| | | | | | | | | | | | | |
|---|---|---|---|---|---|---|---|---|---|---|---|---|
| 204 | -1 | -1 | -1 | -1 | 93 | -1 | -1 | -1 | -1 | -1 | -1 | -1 |
| -1 | -1 | -1 | -1 | -1 | -1 | -1 | -1 | -1 | 187 | -1 | -1 | -1 |
| 74 | -1 | -1 | -1 | -1 | 241 | -1 | -1 | 13 | -1 | -1 | -1 | -1 |
| -1 | 83 | -1 | -1 | 251 | -1 | -1 | -1 | -1 | -1 | 30 | -1 | -1 |
| -1 | -1 | -1 | 347 | -1 | -1 | -1 | -1 | -1 | -1 | -1 | -1 | -1 |
| -1 | -1 | -1 | -1 | -1 | -1 | 97 | -1 | -1 | -1 | -1 | -1 | -1 |
| -1 | -1 | 7 | -1 | -1 | -1 | -1 | -1 | -1 | -1 | -1 | -1 | -1 |
| -1 | -1 | -1 | -1 | -1 | -1 | -1 | 142 | -1 | -1 | -1 | -1 | -1 |
| -1 | -1 | -1 | -1 | -1 | -1 | -1 | -1 | -1 | 379 | -1 | -1 | -1 |
| -1 | -1 | -1 | -1 | -1 | -1 | -1 | -1 | -1 | -1 | -1 | 149 | 212 |
| 247 | -1 | -1 | -1 | -1 | 325 | -1 | -1 | -1 | -1 | -1 | -1 | -1 |
| -1 | -1 | -1 | -1 | -1 | -1 | -1 | -1 | 290 | -1 | -1 | -1 | -1 |
| -1 | 164 | -1 | -1 | 66 | -1 | -1 | -1 | -1 | -1 | 5 | -1 | -1 |
| -1 | -1 | -1 | 5 | -1 | -1 | -1 | -1 | -1 | -1 | -1 | -1 | -1 |
| -1 | -1 | -1 | -1 | -1 | -1 | 111 | -1 | -1 | -1 | -1 | -1 | -1 |
| -1 | -1 | 68 | -1 | -1 | -1 | -1 | -1 | -1 | -1 | -1 | -1 | -1 |
| -1 | -1 | -1 | -1 | -1 | -1 | -1 | 305 | -1 | -1 | -1 | -1 | -1 |
| -1 | -1 | -1 | -1 | -1 | -1 | -1 | -1 | -1 | 158 | -1 | -1 | -1 |
| -1 | -1 | -1 | -1 | -1 | -1 | -1 | -1 | -1 | -1 | -1 | 344 | 149 |
| 150 | -1 | -1 | -1 | -1 | 114 | -1 | -1 | -1 | -1 | -1 | -1 | -1 |
| -1 | -1 | -1 | -1 | -1 | -1 | -1 | -1 | 218 | -1 | -1 | -1 | -1 |
| -1 | 254 | -1 | -1 | 309 | -1 | -1 | -1 | -1 | -1 | 2 | -1 | -1 |
| -1 | -1 | -1 | 35 | -1 | -1 | -1 | -1 | -1 | -1 | -1 | -1 | -1 |
| -1 | -1 | -1 | -1 | -1 | -1 | 118 | -1 | -1 | -1 | -1 | -1 | -1 |
| -1 | -1 | 18 | -1 | -1 | -1 | -1 | -1 | -1 | -1 | -1 | -1 | -1 |
| -1 | -1 | -1 | -1 | -1 | -1 | -1 | 22 | -1 | -1 | -1 | -1 | -1 |
| -1 | -1 | -1 | -1 | -1 | -1 | -1 | -1 | -1 | 367 | -1 | -1 | -1 |
| -1 | -1 | -1 | -1 | -1 | -1 | -1 | -1 | -1 | -1 | -1 | 136 | 10 |
| 145 | -1 | -1 | -1 | -1 | 2 | -1 | -1 | -1 | -1 | -1 | -1 | -1 |
| -1 | -1 | -1 | -1 | -1 | -1 | -1 | -1 | 341 | -1 | -1 | -1 | -1 |
| -1 | 355 | -1 | -1 | 136 | -1 | -1 | -1 | -1 | -1 | -1 | -1 | -1 |
| -1 | -1 | -1 | 30 | -1 | -1 | -1 | -1 | -1 | -1 | 1 | -1 | -1 |
| -1 | -1 | -1 | -1 | -1 | -1 | 256 | -1 | -1 | -1 | -1 | -1 | -1 |
| -1 | -1 | 131 | -1 | -1 | -1 | -1 | -1 | -1 | -1 | -1 | -1 | -1 |
| -1 | -1 | -1 | -1 | -1 | -1 | -1 | 31 | -1 | -1 | -1 | -1 | -1 |
| -1 | -1 | -1 | -1 | -1 | -1 | -1 | -1 | -1 | 173 | -1 | -1 | -1 |
| -1 | -1 | -1 | -1 | -1 | -1 | -1 | -1 | -1 | -1 | -1 | 19 | 19 |
| 146 | -1 | -1 | -1 | -1 | 330 | -1 | -1 | -1 | -1 | -1 | -1 | -1 |
| -1 | -1 | -1 | -1 | -1 | -1 | -1 | -1 | 189 | -1 | -1 | -1 | -1 |
| -1 | 110 | -1 | -1 | 259 | -1 | -1 | -1 | -1 | -1 | -1 | -1 | -1 |
| -1 | -1 | -1 | 57 | -1 | -1 | -1 | -1 | -1 | -1 | 141 | -1 | -1 |
| -1 | -1 | -1 | -1 | -1 | -1 | 337 | -1 | -1 | -1 | -1 | -1 | -1 |
| -1 | -1 | 295 | -1 | -1 | -1 | -1 | -1 | -1 | -1 | -1 | -1 | -1 |
| -1 | -1 | -1 | -1 | -1 | -1 | -1 | 214 | -1 | -1 | -1 | -1 | -1 |
| -1 | -1 | -1 | -1 | -1 | -1 | -1 | -1 | -1 | 370 | -1 | -1 | -1 |
| -1 | -1 | -1 | -1 | -1 | -1 | -1 | -1 | -1 | -1 | -1 | 147 | 130 |

FROM FIG. 10C

FROM FIG. 10D

| | | | | | | | | | | | | | |
|---|---|---|---|---|---|---|---|---|---|---|---|---|---|
| -1 | -1 | -1 | 171 | -1 | -1 | -1 | -1 | -1 | -1 | -1 | -1 | -1 | 315 |
| -1 | -1 | -1 | -1 | -1 | -1 | -1 | 103 | -1 | 221 | -1 | -1 | 285 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 231 | -1 | -1 | -1 | -1 | -1 | 337 | 291 | -1 | -1 | -1 | -1 |
| -1 | -1 | -1 | -1 | -1 | -1 | -1 | -1 | -1 | -1 | 202 | -1 | 218 | -1 |
| -1 | -1 | -1 | -1 | 346 | -1 | -1 | -1 | -1 | -1 | -1 | -1 | -1 | 183 |
| -1 | 89 | -1 | -1 | -1 | -1 | -1 | -1 | -1 | -1 | -1 | 254 | -1 | -1 |
| 227 | -1 | -1 | -1 | -1 | 109 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 169 | -1 | -1 | 224 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 265 | -1 | -1 | -1 | -1 | -1 | -1 | 186 | -1 | -1 | -1 | -1 |
| -1 | -1 | -1 | -1 | -1 | -1 | -1 | -1 | -1 | -1 | 293 | -1 | 194 | -1 |
| -1 | -1 | -1 | -1 | 90 | -1 | -1 | -1 | -1 | -1 | -1 | -1 | -1 | 90 |
| -1 | 81 | -1 | -1 | -1 | -1 | -1 | -1 | -1 | -1 | -1 | 268 | -1 | -1 |
| 260 | -1 | -1 | -1 | -1 | -1 | -1 | 212 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 203 | -1 | -1 | -1 | -1 | -1 | -1 | -1 | -1 |
| -1 | -1 | -1 | 166 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 4 | -1 | -1 | -1 | -1 | -1 | -1 | 203 | -1 | -1 | -1 | -1 |
| -1 | -1 | -1 | -1 | -1 | -1 | -1 | -1 | -1 | -1 | 365 | -1 | 27 | -1 |
| -1 | -1 | -1 | -1 | -1 | -1 | 27 | -1 | -1 | -1 | -1 | -1 | -1 | 300 |
| -1 | 304 | -1 | -1 | -1 | -1 | -1 | -1 | -1 | -1 | -1 | 10 | -1 | -1 |
| 252 | -1 | -1 | -1 | -1 | -1 | -1 | -1 | -1 | -1 | -1 | -1 | -1 | -1 |
| -1 | -1 | -1 | -1 | 30 | -1 | -1 | -1 | -1 | -1 | -1 | -1 | -1 | -1 |
| -1 | -1 | -1 | -1 | -1 | -1 | -1 | -1 | 357 | -1 | -1 | -1 | -1 | -1 |
| -1 | -1 | -1 | 62 | -1 | 138 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 276 | -1 | -1 | -1 | -1 |
| -1 | -1 | 315 | -1 | -1 | -1 | -1 | -1 | -1 | -1 | 353 | -1 | -1 | -1 |
| -1 | -1 | -1 | -1 | -1 | -1 | -1 | -1 | -1 | -1 | -1 | -1 | 60 | 102 |
| -1 | 82 | -1 | -1 | -1 | -1 | -1 | 193 | -1 | -1 | -1 | 361 | -1 | -1 |
| 56 | -1 | -1 | -1 | -1 | -1 | 350 | -1 | -1 | -1 | -1 | -1 | -1 | -1 |
| -1 | -1 | -1 | -1 | 287 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 321 | -1 | 279 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 330 | -1 | -1 | -1 | -1 |
| -1 | -1 | 199 | -1 | -1 | -1 | -1 | -1 | -1 | -1 | 252 | -1 | -1 | -1 |
| -1 | -1 | -1 | -1 | -1 | -1 | -1 | -1 | -1 | -1 | -1 | -1 | 26 | 319 |
| -1 | 79 | -1 | -1 | -1 | -1 | -1 | 185 | -1 | -1 | -1 | 195 | -1 | -1 |
| 251 | -1 | -1 | -1 | -1 | -1 | 131 | -1 | -1 | -1 | -1 | -1 | -1 | -1 |
| -1 | -1 | -1 | -1 | 304 | -1 | -1 | -1 | -1 | -1 | -1 | -1 | -1 | -1 |

| | | | | | | | | | | | | |
|---|---|---|---|---|---|---|---|---|---|---|---|---|
| 136 | -1 | 41 | 94 | 94 | 174 | 197 | 69 | 186 | 125 | 198 | 206 | 176 |
| 198 | 130 | -1 | -1 | 114 | 100 | -1 | -1 | 169 | 87 | -1 | -1 | 80 |
| 38 | 98 | -1 | -1 | -1 | -1 | -1 | -1 | -1 | -1 | -1 | -1 | -1 |
| 131 | 10 | 170 | 164 | -1 | -1 | 21 | 188 | -1 | -1 | 82 | 40 | -1 |
| 34 | -1 | 18 | 10 | 11 | 63 | 1 | 1 | 52 | 0 | 83 | 26 | 63 |
| 69 | 121 | -1 | -1 | -1 | -1 | -1 | -1 | -1 | 14 | -1 | -1 | -1 |
| 101 | -1 | -1 | -1 | 3 | 144 | -1 | -1 | 181 | -1 | -1 | -1 | 95 |
| 127 | 100 | 60 | -1 | -1 | -1 | -1 | 193 | -1 | 59 | -1 | -1 | -1 |
| 175 | 102 | -1 | 37 | -1 | -1 | -1 | -1 | 80 | -1 | -1 | -1 | 32 |
| -1 | 203 | 81 | -1 | -1 | 44 | -1 | 202 | -1 | -1 | -1 | -1 | -1 |
| 65 | 80 | -1 | -1 | -1 | -1 | 27 | -1 | -1 | -1 | -1 | -1 | 80 |
| 69 | -1 | 127 | 8 | -1 | -1 | -1 | -1 | 133 | -1 | -1 | -1 | -1 |
| 39 | 206 | -1 | -1 | -1 | -1 | -1 | -1 | -1 | -1 | 111 | -1 | 191 |
| -1 | 185 | -1 | -1 | 66 | -1 | -1 | -1 | -1 | -1 | -1 | -1 | -1 |
| 123 | -1 | -1 | -1 | -1 | -1 | 200 | 73 | -1 | -1 | -1 | -1 | -1 |
| 156 | 162 | -1 | -1 | -1 | -1 | -1 | -1 | -1 | -1 | -1 | -1 | 75 |
| 103 | -1 | 136 | -1 | -1 | 127 | -1 | -1 | -1 | -1 | -1 | -1 | -1 |
| -1 | 54 | -1 | 155 | -1 | -1 | -1 | -1 | -1 | -1 | 160 | -1 | -1 |
| -1 | 43 | 33 | -1 | -1 | -1 | 84 | -1 | -1 | -1 | -1 | -1 | 88 |
| 200 | -1 | -1 | 70 | -1 | -1 | -1 | -1 | -1 | -1 | 29 | -1 | -1 |
| 190 | -1 | -1 | -1 | -1 | -1 | -1 | 148 | -1 | -1 | -1 | -1 | -1 |
| -1 | 47 | -1 | -1 | 14 | -1 | -1 | -1 | -1 | -1 | -1 | -1 | -1 |
| 23 | 169 | -1 | -1 | -1 | -1 | -1 | -1 | -1 | -1 | -1 | 26 | -1 |
| 0 | -1 | -1 | -1 | -1 | -1 | -1 | -1 | -1 | -1 | -1 | -1 | 99 |
| -1 | 3 | -1 | -1 | -1 | 185 | -1 | -1 | -1 | -1 | -1 | -1 | -1 |
| 48 | -1 | -1 | -1 | -1 | -1 | -1 | -1 | 106 | -1 | -1 | -1 | -1 |
| -1 | 91 | 46 | 85 | -1 | -1 | -1 | -1 | -1 | -1 | -1 | -1 | -1 |
| 94 | -1 | -1 | -1 | -1 | -1 | 86 | 64 | -1 | -1 | -1 | -1 | -1 |
| -1 | 56 | -1 | -1 | 46 | -1 | -1 | -1 | -1 | -1 | -1 | -1 | -1 |
| 115 | -1 | -1 | 165 | -1 | -1 | -1 | -1 | -1 | 19 | -1 | -1 | -1 |
| -1 | 43 | -1 | -1 | -1 | -1 | -1 | -1 | -1 | -1 | 53 | -1 | -1 |
| 9 | -1 | -1 | -1 | -1 | 31 | -1 | -1 | -1 | -1 | -1 | -1 | -1 |
| 165 | -1 | 27 | -1 | -1 | -1 | -1 | -1 | -1 | -1 | -1 | 109 | -1 |
| 132 | -1 | -1 | -1 | 182 | -1 | -1 | 83 | -1 | -1 | -1 | -1 | -1 |
| -1 | 141 | -1 | 46 | -1 | -1 | 21 | -1 | -1 | -1 | -1 | -1 | -1 |
| 119 | -1 | -1 | -1 | -1 | -1 | -1 | 2 | -1 | -1 | -1 | -1 | -1 |
| 165 | -1 | -1 | -1 | -1 | -1 | -1 | -1 | -1 | -1 | -1 | -1 | -1 |
| -1 | 187 | 161 | -1 | -1 | -1 | -1 | -1 | 30 | -1 | -1 | -1 | -1 |
| 19 | -1 | -1 | -1 | -1 | -1 | -1 | -1 | -1 | 114 | -1 | -1 | -1 |
| -1 | 16 | -1 | -1 | -1 | -1 | -1 | -1 | -1 | -1 | -1 | -1 | -1 |
| 79 | -1 | -1 | 91 | -1 | 152 | -1 | -1 | -1 | -1 | -1 | -1 | -1 |
| 109 | -1 | -1 | -1 | -1 | -1 | 200 | -1 | -1 | -1 | -1 | -1 | -1 |
| -1 | 194 | -1 | -1 | 8 | -1 | -1 | -1 | -1 | -1 | -1 | 110 | -1 |
| 116 | -1 | 15 | -1 | -1 | -1 | -1 | -1 | -1 | -1 | -1 | -1 | -1 |

FROM FIG. 11B

| | | | | | | | | | | | | | |
|---|---|---|---|---|---|---|---|---|---|---|---|---|---|
| 143 | 171 | 196 | 200 | 143 | 94 | 94 | 195 | 188 | 0 | 0 | -1 | -1 | -1 |
| 198 | -1 | -1 | 118 | 62 | -1 | -1 | 15 | 153 | -1 | 0 | 0 | -1 | -1 |
| -1 | -1 | -1 | -1 | -1 | -1 | -1 | -1 | -1 | 1 | -1 | 0 | 0 | -1 |
| -1 | 26 | 75 | -1 | -1 | 185 | 143 | -1 | -1 | -1 | -1 | -1 | 0 | 0 |
| 128 | 7 | 2 | 0 | 0 | 58 | 48 | 20 | 7 | 0 | -1 | -1 | -1 | 0 |
| 146 | -1 | -1 | 104 | -1 | -1 | -1 | -1 | -1 | -1 | -1 | -1 | -1 | -1 |
| -1 | -1 | -1 | -1 | 154 | -1 | -1 | -1 | -1 | 33 | -1 | -1 | -1 | -1 |
| 106 | -1 | -1 | -1 | -1 | 199 | -1 | -1 | -1 | -1 | -1 | -1 | -1 | -1 |
| -1 | -1 | 6 | -1 | 192 | -1 | -1 | -1 | -1 | -1 | -1 | -1 | -1 | -1 |
| 138 | -1 | -1 | -1 | -1 | -1 | 100 | -1 | -1 | -1 | -1 | -1 | -1 | -1 |
| -1 | -1 | 96 | -1 | -1 | -1 | -1 | -1 | -1 | 66 | -1 | -1 | -1 | -1 |
| 140 | -1 | -1 | -1 | -1 | -1 | -1 | 15 | -1 | -1 | -1 | -1 | -1 | -1 |
| -1 | -1 | -1 | -1 | 168 | -1 | -1 | -1 | -1 | -1 | -1 | -1 | 156 | -1 |
| 12 | -1 | 105 | -1 | -1 | -1 | 139 | -1 | -1 | 176 | -1 | -1 | -1 | -1 |
| -1 | -1 | -1 | -1 | 181 | -1 | -1 | -1 | -1 | -1 | -1 | -1 | 138 | -1 |
| 138 | -1 | -1 | -1 | -1 | -1 | -1 | 178 | -1 | -1 | -1 | -1 | -1 | 26 |
| -1 | -1 | 143 | -1 | -1 | 182 | -1 | -1 | -1 | -1 | -1 | -1 | -1 | -1 |
| -1 | -1 | -1 | -1 | -1 | -1 | -1 | -1 | -1 | 179 | -1 | -1 | -1 | -1 |
| -1 | -1 | -1 | -1 | -1 | -1 | -1 | -1 | 4 | -1 | -1 | -1 | -1 | -1 |
| -1 | -1 | -1 | 97 | -1 | -1 | -1 | -1 | -1 | 121 | -1 | -1 | -1 | -1 |
| 129 | -1 | -1 | -1 | -1 | -1 | -1 | -1 | -1 | -1 | -1 | -1 | -1 | 184 |
| -1 | -1 | -1 | -1 | -1 | 114 | -1 | -1 | -1 | -1 | -1 | -1 | 187 | -1 |
| -1 | -1 | -1 | -1 | -1 | -1 | -1 | -1 | -1 | 45 | -1 | -1 | -1 | -1 |
| 2 | -1 | -1 | -1 | -1 | -1 | -1 | -1 | -1 | -1 | 60 | -1 | -1 | -1 |
| -1 | -1 | 0 | -1 | -1 | -1 | -1 | -1 | -1 | 13 | -1 | -1 | -1 | -1 |
| -1 | -1 | -1 | -1 | -1 | -1 | 159 | -1 | -1 | -1 | -1 | -1 | 56 | -1 |
| -1 | 151 | -1 | -1 | -1 | -1 | -1 | -1 | -1 | -1 | -1 | -1 | -1 | -1 |
| -1 | -1 | -1 | -1 | -1 | -1 | -1 | -1 | -1 | 198 | -1 | -1 | -1 | -1 |
| -1 | -1 | -1 | -1 | -1 | -1 | -1 | 78 | -1 | -1 | -1 | -1 | 203 | -1 |
| -1 | -1 | -1 | -1 | -1 | -1 | -1 | -1 | -1 | 30 | -1 | -1 | -1 | -1 |
| -1 | -1 | -1 | -1 | -1 | -1 | -1 | -1 | -1 | -1 | -1 | -1 | -1 | 119 |
| -1 | -1 | -1 | 175 | -1 | -1 | -1 | -1 | -1 | -1 | -1 | -1 | 77 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 4 | -1 | -1 | -1 | 175 | -1 |
| -1 | -1 | -1 | -1 | -1 | 140 | -1 | -1 | -1 | -1 | -1 | -1 | -1 | -1 |
| -1 | -1 | -1 | -1 | -1 | -1 | -1 | -1 | -1 | -1 | 27 | -1 | -1 | -1 |
| -1 | 14 | -1 | -1 | -1 | -1 | -1 | -1 | -1 | 69 | -1 | -1 | 122 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 16 |
| -1 | -1 | -1 | -1 | 9 | -1 | -1 | -1 | -1 | -1 | 195 | -1 | -1 | -1 |
| -1 | -1 | -1 | -1 | -1 | -1 | 82 | -1 | -1 | -1 | -1 | -1 | -1 | -1 |
| -1 | -1 | -1 | -1 | -1 | -1 | -1 | -1 | -1 | -1 | -1 | -1 | -1 | 97 |
| -1 | -1 | -1 | -1 | -1 | -1 | -1 | -1 | -1 | -1 | -1 | -1 | -1 | -1 |
| -1 | 148 | -1 | -1 | -1 | -1 | -1 | -1 | -1 | -1 | -1 | -1 | 45 | -1 |

TO FIG. 11E

FROM FIG. 11B

| | | | | | | | | | | | | |
|---|---|---|---|---|---|---|---|---|---|---|---|---|
| 132 | -1 | -1 | -1 | -1 | 64 | -1 | -1 | -1 | -1 | -1 | -1 | -1 |
| -1 | -1 | -1 | -1 | -1 | -1 | -1 | -1 | -1 | 41 | -1 | -1 | -1 |
| 17 | -1 | -1 | -1 | -1 | 22 | -1 | -1 | 155 | -1 | -1 | -1 | -1 |
| -1 | 62 | -1 | -1 | 115 | -1 | -1 | -1 | -1 | -1 | 93 | -1 | -1 |
| -1 | -1 | -1 | 149 | -1 | -1 | -1 | -1 | -1 | -1 | -1 | -1 | -1 |
| -1 | -1 | -1 | -1 | -1 | -1 | 169 | -1 | -1 | -1 | -1 | -1 | -1 |
| -1 | -1 | 101 | -1 | -1 | -1 | -1 | -1 | -1 | -1 | -1 | -1 | -1 |
| -1 | -1 | -1 | -1 | -1 | -1 | -1 | 68 | -1 | -1 | -1 | -1 | -1 |
| -1 | -1 | -1 | -1 | -1 | -1 | -1 | -1 | -1 | 67 | -1 | -1 | -1 |
| -1 | -1 | -1 | -1 | -1 | -1 | -1 | -1 | -1 | -1 | -1 | 55 | 20 |
| 174 | -1 | -1 | -1 | -1 | 181 | -1 | -1 | -1 | -1 | -1 | -1 | -1 |
| -1 | -1 | -1 | -1 | -1 | -1 | -1 | -1 | 79 | -1 | -1 | -1 | -1 |
| -1 | 73 | -1 | -1 | 23 | -1 | -1 | -1 | -1 | -1 | 47 | -1 | -1 |
| -1 | -1 | -1 | 41 | -1 | -1 | -1 | -1 | -1 | -1 | -1 | -1 | -1 |
| -1 | -1 | -1 | -1 | -1 | -1 | 6 | -1 | -1 | -1 | -1 | -1 | -1 |
| -1 | -1 | 110 | -1 | -1 | -1 | -1 | -1 | -1 | -1 | -1 | -1 | -1 |
| -1 | -1 | -1 | -1 | -1 | -1 | -1 | 25 | -1 | -1 | -1 | -1 | -1 |
| -1 | -1 | -1 | -1 | -1 | -1 | -1 | -1 | -1 | 67 | -1 | -1 | -1 |
| -1 | -1 | -1 | -1 | -1 | -1 | -1 | -1 | -1 | -1 | -1 | 78 | 71 |
| 193 | -1 | -1 | -1 | -1 | 181 | -1 | -1 | -1 | -1 | -1 | -1 | -1 |
| -1 | -1 | -1 | -1 | -1 | -1 | -1 | -1 | 128 | -1 | -1 | -1 | -1 |
| -1 | 84 | -1 | -1 | 115 | -1 | -1 | -1 | -1 | -1 | 203 | -1 | -1 |
| -1 | -1 | -1 | 0 | -1 | -1 | -1 | -1 | -1 | -1 | -1 | -1 | -1 |
| -1 | -1 | -1 | -1 | -1 | -1 | 57 | -1 | -1 | -1 | -1 | -1 | -1 |
| -1 | -1 | 102 | -1 | -1 | -1 | -1 | -1 | -1 | -1 | -1 | -1 | -1 |
| -1 | -1 | -1 | -1 | -1 | -1 | -1 | 162 | -1 | -1 | -1 | -1 | -1 |
| -1 | -1 | -1 | -1 | -1 | -1 | -1 | -1 | -1 | 153 | -1 | -1 | -1 |
| -1 | -1 | -1 | -1 | -1 | -1 | -1 | -1 | -1 | -1 | -1 | 150 | 194 |
| 170 | -1 | -1 | -1 | -1 | 198 | -1 | -1 | -1 | -1 | -1 | -1 | -1 |
| -1 | -1 | -1 | -1 | -1 | -1 | -1 | -1 | 79 | -1 | -1 | -1 | -1 |
| -1 | 174 | -1 | -1 | 4 | -1 | -1 | -1 | -1 | -1 | -1 | -1 | -1 |
| -1 | -1 | -1 | 154 | -1 | -1 | -1 | -1 | -1 | -1 | 205 | -1 | -1 |
| -1 | -1 | -1 | -1 | -1 | -1 | 155 | -1 | -1 | -1 | -1 | -1 | -1 |
| -1 | -1 | 10 | -1 | -1 | -1 | -1 | -1 | -1 | -1 | -1 | -1 | -1 |
| -1 | -1 | -1 | -1 | -1 | -1 | -1 | 87 | -1 | -1 | -1 | -1 | -1 |
| -1 | -1 | -1 | -1 | -1 | -1 | -1 | -1 | -1 | 30 | -1 | -1 | -1 |
| -1 | -1 | -1 | -1 | -1 | -1 | -1 | -1 | -1 | -1 | -1 | 198 | 161 |
| 138 | -1 | -1 | -1 | -1 | 177 | -1 | -1 | -1 | -1 | -1 | -1 | -1 |
| -1 | -1 | -1 | -1 | -1 | -1 | -1 | -1 | 17 | -1 | -1 | -1 | -1 |
| -1 | 16 | -1 | -1 | 159 | -1 | -1 | -1 | -1 | -1 | -1 | -1 | -1 |
| -1 | -1 | -1 | 108 | -1 | -1 | -1 | -1 | -1 | -1 | 13 | -1 | -1 |
| -1 | -1 | -1 | -1 | -1 | -1 | 2 | -1 | -1 | -1 | -1 | -1 | -1 |
| -1 | -1 | 207 | -1 | -1 | -1 | -1 | -1 | -1 | -1 | -1 | -1 | -1 |
| -1 | -1 | -1 | -1 | -1 | -1 | -1 | 182 | -1 | -1 | -1 | -1 | -1 |
| -1 | -1 | -1 | -1 | -1 | -1 | -1 | -1 | -1 | 81 | -1 | -1 | -1 |
| -1 | -1 | -1 | -1 | -1 | -1 | -1 | -1 | -1 | -1 | -1 | 124 | 132 |

FROM FIG. 11C

FROM FIG. 11D

| | | | | | | | | | | | | | |
|---|---|---|---|---|---|---|---|---|---|---|---|---|---|
| -1 | -1 | -1 | 178 | -1 | -1 | -1 | -1 | -1 | -1 | -1 | -1 | -1 | 156 |
| -1 | -1 | -1 | -1 | -1 | -1 | -1 | 63 | -1 | 14 | -1 | -1 | 189 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 197 | -1 | -1 | -1 | -1 | -1 | 168 | 124 | -1 | -1 | -1 | -1 |
| -1 | -1 | -1 | -1 | -1 | -1 | -1 | -1 | -1 | -1 | 177 | -1 | 158 | -1 |
| -1 | -1 | -1 | -1 | 59 | -1 | -1 | -1 | -1 | -1 | -1 | -1 | -1 | 166 |
| -1 | 101 | -1 | -1 | -1 | -1 | -1 | -1 | -1 | -1 | -1 | 113 | -1 | -1 |
| 174 | -1 | -1 | -1 | -1 | 119 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 50 | -1 | -1 | 139 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 123 | -1 | -1 | -1 | -1 | -1 | -1 | 46 | -1 | -1 | -1 | -1 |
| -1 | -1 | -1 | -1 | -1 | -1 | -1 | -1 | -1 | -1 | 201 | -1 | 146 | -1 |
| -1 | -1 | -1 | -1 | 11 | -1 | -1 | -1 | -1 | -1 | -1 | -1 | -1 | 142 |
| -1 | 202 | -1 | -1 | -1 | -1 | -1 | -1 | -1 | -1 | -1 | 39 | -1 | -1 |
| 176 | -1 | -1 | -1 | -1 | -1 | -1 | 32 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 15 | -1 | -1 | -1 | -1 | -1 | -1 | -1 | -1 |
| -1 | -1 | -1 | 61 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 16 | -1 | -1 | -1 | -1 | -1 | -1 | 119 | -1 | -1 | -1 | -1 |
| -1 | -1 | -1 | -1 | -1 | -1 | -1 | -1 | -1 | -1 | 171 | -1 | 89 | -1 |
| -1 | -1 | -1 | -1 | -1 | -1 | 1 | -1 | -1 | -1 | -1 | -1 | -1 | 72 |
| -1 | 31 | -1 | -1 | -1 | -1 | -1 | -1 | -1 | -1 | -1 | 177 | -1 | -1 |
| 86 | -1 | -1 | -1 | -1 | -1 | -1 | -1 | -1 | -1 | -1 | -1 | -1 | -1 |
| -1 | -1 | -1 | -1 | 76 | -1 | -1 | -1 | -1 | -1 | -1 | -1 | -1 | -1 |
| -1 | -1 | -1 | -1 | -1 | -1 | -1 | -1 | 145 | -1 | -1 | -1 | -1 | -1 |
| -1 | -1 | -1 | 21 | -1 | 78 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 158 | -1 | -1 | -1 | -1 |
| -1 | -1 | 57 | -1 | -1 | -1 | -1 | -1 | -1 | -1 | 174 | -1 | -1 | -1 |
| -1 | -1 | -1 | -1 | -1 | -1 | -1 | -1 | -1 | -1 | -1 | -1 | 21 | 63 |
| -1 | 36 | -1 | -1 | -1 | -1 | -1 | 142 | -1 | -1 | -1 | 170 | -1 | -1 |
| 68 | -1 | -1 | -1 | -1 | -1 | 190 | -1 | -1 | -1 | -1 | -1 | -1 | -1 |
| -1 | -1 | -1 | -1 | 171 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 61 | -1 | 129 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 134 | -1 | -1 | -1 | -1 |
| -1 | -1 | 61 | -1 | -1 | -1 | -1 | -1 | -1 | -1 | 43 | -1 | -1 | -1 |
| -1 | -1 | -1 | -1 | -1 | -1 | -1 | -1 | -1 | -1 | -1 | -1 | 175 | 17 |
| -1 | 54 | -1 | -1 | -1 | -1 | -1 | 205 | -1 | -1 | -1 | 179 | -1 | -1 |
| 135 | -1 | -1 | -1 | -1 | -1 | 146 | -1 | -1 | -1 | -1 | -1 | -1 | -1 |
| -1 | -1 | -1 | -1 | 133 | -1 | -1 | -1 | -1 | -1 | -1 | -1 | -1 | -1 |

| | | | | | | | | | | | | |
|---|---|---|---|---|---|---|---|---|---|---|---|---|
| 149 | -1 | 209 | 181 | 22 | 219 | 175 | 175 | 42 | 211 | 187 | 191 | 216 |
| 216 | 183 | -1 | -1 | 202 | 140 | -1 | -1 | 184 | 200 | -1 | -1 | 14 |
| 152 | 36 | -1 | -1 | -1 | -1 | -1 | -1 | -1 | -1 | -1 | -1 | -1 |
| 112 | 11 | 166 | 52 | -1 | -1 | 53 | 108 | -1 | -1 | 196 | 101 | -1 |
| 119 | -1 | 118 | 8 | 9 | 117 | 6 | 1 | 2 | 90 | 171 | 19 | 26 |
| 89 | 10 | -1 | -1 | -1 | -1 | -1 | -1 | -1 | 23 | -1 | -1 | -1 |
| 90 | -1 | -1 | -1 | 133 | 35 | -1 | -1 | 78 | -1 | -1 | -1 | 205 |
| 71 | 44 | 24 | -1 | -1 | -1 | -1 | 208 | -1 | 36 | -1 | -1 | -1 |
| 174 | 188 | -1 | 222 | -1 | -1 | -1 | -1 | 201 | -1 | -1 | -1 | 52 |
| -1 | 154 | 94 | -1 | -1 | 168 | -1 | 85 | -1 | -1 | -1 | -1 | -1 |
| 131 | 143 | -1 | -1 | -1 | -1 | 97 | -1 | -1 | -1 | -1 | -1 | 71 |
| 147 | -1 | 208 | 113 | -1 | -1 | -1 | -1 | 84 | -1 | -1 | -1 | -1 |
| 158 | 143 | -1 | -1 | -1 | -1 | -1 | -1 | -1 | -1 | 96 | -1 | 31 |
| -1 | 44 | -1 | -1 | 108 | -1 | -1 | -1 | -1 | -1 | -1 | -1 | -1 |
| 223 | -1 | -1 | -1 | -1 | -1 | 134 | 174 | -1 | -1 | -1 | -1 | -1 |
| 99 | 65 | -1 | -1 | -1 | -1 | -1 | -1 | -1 | -1 | -1 | -1 | 101 |
| 20 | -1 | 105 | -1 | -1 | 208 | -1 | -1 | -1 | -1 | -1 | -1 | -1 |
| -1 | 125 | -1 | 37 | -1 | -1 | -1 | -1 | -1 | -1 | 150 | -1 | -1 |
| -1 | 45 | 30 | -1 | -1 | -1 | 103 | -1 | -1 | -1 | -1 | -1 | 69 |
| 60 | -1 | -1 | 107 | -1 | -1 | -1 | -1 | -1 | -1 | 81 | -1 | -1 |
| 40 | -1 | -1 | -1 | -1 | -1 | -1 | 171 | -1 | -1 | -1 | -1 | -1 |
| -1 | 55 | -1 | -1 | 220 | -1 | -1 | -1 | -1 | -1 | -1 | -1 | -1 |
| 168 | 200 | -1 | -1 | -1 | -1 | -1 | -1 | -1 | -1 | -1 | 134 | -1 |
| 171 | -1 | -1 | -1 | -1 | -1 | -1 | -1 | -1 | -1 | -1 | -1 | 121 |
| -1 | 206 | -1 | -1 | -1 | 148 | -1 | -1 | -1 | -1 | -1 | -1 | -1 |
| 122 | -1 | -1 | -1 | -1 | -1 | -1 | -1 | 195 | -1 | -1 | -1 | -1 |
| -1 | 169 | 139 | 190 | -1 | -1 | -1 | -1 | -1 | -1 | -1 | -1 | -1 |
| 74 | -1 | -1 | -1 | -1 | -1 | 105 | 129 | -1 | -1 | -1 | -1 | -1 |
| -1 | 182 | -1 | -1 | 161 | -1 | -1 | -1 | -1 | -1 | -1 | -1 | -1 |
| 6 | -1 | -1 | 127 | -1 | -1 | -1 | -1 | -1 | 86 | -1 | -1 | -1 |
| -1 | 29 | -1 | -1 | -1 | -1 | -1 | -1 | -1 | -1 | 72 | -1 | -1 |
| 57 | -1 | -1 | -1 | -1 | 164 | -1 | -1 | -1 | -1 | -1 | -1 | -1 |
| 74 | -1 | 62 | -1 | -1 | -1 | -1 | -1 | -1 | -1 | -1 | 92 | -1 |
| 52 | -1 | -1 | -1 | 117 | -1 | -1 | 223 | -1 | -1 | -1 | -1 | -1 |
| -1 | 153 | -1 | 109 | -1 | -1 | 221 | -1 | -1 | -1 | -1 | -1 | -1 |
| 164 | -1 | -1 | -1 | -1 | -1 | -1 | 72 | -1 | -1 | -1 | -1 | -1 |
| 105 | -1 | -1 | -1 | -1 | -1 | -1 | -1 | -1 | -1 | -1 | -1 | -1 |
| -1 | 6 | 76 | -1 | -1 | -1 | -1 | -1 | 166 | -1 | -1 | -1 | -1 |
| 165 | -1 | -1 | -1 | -1 | -1 | -1 | -1 | -1 | 151 | -1 | -1 | -1 |
| -1 | 16 | -1 | -1 | -1 | -1 | -1 | -1 | -1 | -1 | -1 | -1 | -1 |
| 125 | -1 | -1 | 139 | -1 | 34 | -1 | -1 | -1 | -1 | -1 | -1 | -1 |
| 28 | -1 | -1 | -1 | -1 | -1 | 70 | -1 | -1 | -1 | -1 | -1 | -1 |
| -1 | 0 | -1 | -1 | 167 | -1 | -1 | -1 | -1 | -1 | -1 | 63 | -1 |
| 116 | -1 | 150 | -1 | -1 | -1 | -1 | -1 | -1 | -1 | -1 | -1 | -1 |
| 204 | -1 | -1 | -1 | -1 | 179 | -1 | -1 | -1 | -1 | -1 | -1 | -1 |
| -1 | -1 | -1 | -1 | -1 | -1 | -1 | -1 | -1 | 174 | -1 | -1 | -1 |

FROM FIG. 12B

| | | | | | | | | | | | | | |
|---|---|---|---|---|---|---|---|---|---|---|---|---|---|
| 167 | 198 | 214 | 214 | 108 | 219 | 204 | 103 | 211 | 0 | 0 | -1 | -1 | -1 |
| 62 | -1 | -1 | 14 | 112 | -1 | -1 | 210 | 105 | -1 | 0 | 0 | -1 | -1 |
| -1 | -1 | -1 | -1 | -1 | -1 | -1 | -1 | -1 | 1 | -1 | 0 | 0 | -1 |
| -1 | 42 | 39 | -1 | -1 | 151 | 18 | -1 | -1 | -1 | -1 | -1 | 0 | 0 |
| 3 | 35 | 7 | 4 | 7 | 148 | 10 | 50 | 78 | 0 | -1 | -1 | -1 | 0 |
| 143 | -1 | -1 | 150 | -1 | -1 | -1 | -1 | -1 | -1 | -1 | -1 | -1 | -1 |
| -1 | -1 | -1 | -1 | 52 | -1 | -1 | -1 | -1 | 18 | -1 | -1 | -1 | -1 |
| 162 | -1 | -1 | -1 | -1 | 7 | -1 | -1 | -1 | -1 | -1 | -1 | -1 | -1 |
| -1 | -1 | 54 | -1 | 198 | -1 | -1 | -1 | -1 | -1 | -1 | -1 | -1 | -1 |
| 181 | -1 | -1 | -1 | -1 | -1 | 222 | -1 | -1 | -1 | -1 | -1 | -1 | -1 |
| -1 | -1 | 138 | -1 | -1 | -1 | -1 | -1 | -1 | 158 | -1 | -1 | -1 | -1 |
| 204 | -1 | -1 | -1 | -1 | -1 | -1 | 123 | -1 | -1 | -1 | -1 | -1 | -1 |
| -1 | -1 | -1 | -1 | 137 | -1 | -1 | -1 | -1 | -1 | -1 | -1 | 192 | -1 |
| 33 | -1 | 7 | -1 | -1 | -1 | 57 | -1 | -1 | 120 | -1 | -1 | -1 | -1 |
| -1 | -1 | -1 | -1 | 16 | -1 | -1 | -1 | -1 | -1 | -1 | -1 | 98 | -1 |
| 202 | -1 | -1 | -1 | -1 | -1 | -1 | 48 | -1 | -1 | -1 | -1 | -1 | 81 |
| -1 | -1 | 173 | -1 | -1 | 92 | -1 | -1 | -1 | -1 | -1 | -1 | -1 | -1 |
| -1 | -1 | -1 | -1 | -1 | -1 | -1 | -1 | -1 | 170 | -1 | -1 | -1 | -1 |
| -1 | -1 | -1 | -1 | -1 | -1 | -1 | -1 | 39 | -1 | -1 | -1 | -1 | -1 |
| -1 | -1 | -1 | 133 | -1 | -1 | -1 | -1 | -1 | 182 | -1 | -1 | -1 | -1 |
| 81 | -1 | -1 | -1 | -1 | -1 | -1 | -1 | -1 | -1 | -1 | -1 | -1 | 202 |
| -1 | -1 | -1 | -1 | -1 | 203 | -1 | -1 | -1 | -1 | -1 | -1 | 79 | -1 |
| -1 | -1 | -1 | -1 | -1 | -1 | -1 | -1 | -1 | 60 | -1 | -1 | -1 | -1 |
| 123 | -1 | -1 | -1 | -1 | -1 | -1 | -1 | -1 | -1 | 164 | -1 | -1 | -1 |
| -1 | -1 | 39 | -1 | -1 | -1 | -1 | -1 | -1 | 57 | -1 | -1 | -1 | -1 |
| -1 | -1 | -1 | -1 | -1 | -1 | 170 | -1 | -1 | -1 | -1 | -1 | 121 | -1 |
| -1 | 83 | -1 | -1 | -1 | -1 | -1 | -1 | -1 | -1 | -1 | -1 | -1 | -1 |
| -1 | -1 | -1 | -1 | -1 | -1 | -1 | -1 | -1 | 97 | -1 | -1 | -1 | -1 |
| -1 | -1 | -1 | -1 | -1 | -1 | -1 | 89 | -1 | -1 | -1 | -1 | 163 | -1 |
| -1 | -1 | -1 | -1 | -1 | -1 | -1 | -1 | -1 | 126 | -1 | -1 | -1 | -1 |
| -1 | -1 | -1 | -1 | -1 | -1 | -1 | -1 | -1 | -1 | -1 | -1 | -1 | 203 |
| -1 | -1 | -1 | 49 | -1 | -1 | -1 | -1 | -1 | -1 | -1 | -1 | 92 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 113 | -1 | -1 | -1 | 99 | -1 |
| -1 | -1 | -1 | -1 | -1 | 182 | -1 | -1 | -1 | -1 | -1 | -1 | -1 | -1 |
| -1 | -1 | -1 | -1 | -1 | -1 | -1 | -1 | -1 | -1 | 189 | -1 | -1 | -1 |
| -1 | 215 | -1 | -1 | -1 | -1 | -1 | -1 | -1 | 107 | -1 | -1 | 193 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 1 |
| -1 | -1 | -1 | -1 | 76 | -1 | -1 | -1 | -1 | -1 | 33 | -1 | -1 | -1 |
| -1 | -1 | -1 | -1 | -1 | -1 | 167 | -1 | -1 | -1 | -1 | -1 | -1 | -1 |
| -1 | -1 | -1 | -1 | -1 | -1 | -1 | -1 | -1 | -1 | -1 | -1 | -1 | 118 |
| -1 | -1 | -1 | -1 | -1 | -1 | -1 | -1 | -1 | -1 | -1 | -1 | -1 | -1 |
| -1 | 35 | -1 | -1 | -1 | -1 | -1 | -1 | -1 | -1 | -1 | -1 | 113 | -1 |
| | -1 | -1 | 200 | -1 | -1 | -1 | -1 | -1 | -1 | -1 | -1 | -1 | 75 |
| | -1 | -1 | -1 | -1 | -1 | -1 | 98 | -1 | 95 | -1 | -1 | 26 | -1 |

| | | | | | | | | | | | | |
|---|---|---|---|---|---|---|---|---|---|---|---|---|
| 193 | -1 | 169 | 146 | 238 | 116 | 110 | 35 | 166 | 97 | 184 | 230 | 224 |
| 17 | 160 | -1 | -1 | 157 | 173 | -1 | -1 | 231 | 230 | -1 | -1 | 226 |
| 35 | 108 | -1 | -1 | -1 | -1 | -1 | -1 | -1 | -1 | -1 | -1 | -1 |
| 0 | 14 | 183 | 226 | -1 | -1 | 136 | 227 | -1 | -1 | 178 | 21 | -1 |
| 7 | -1 | 0 | 6 | 5 | 44 | 3 | 6 | 135 | 72 | 1 | 15 | 33 |
| 164 | 59 | -1 | -1 | -1 | -1 | -1 | -1 | -1 | 55 | -1 | -1 | -1 |
| 210 | -1 | -1 | -1 | 191 | 154 | -1 | -1 | 238 | -1 | -1 | -1 | 135 |
| 237 | 113 | 10 | -1 | -1 | -1 | -1 | 23 | -1 | 215 | -1 | -1 | -1 |
| 185 | 114 | -1 | 204 | -1 | -1 | -1 | -1 | 191 | -1 | -1 | -1 | 160 |
| -1 | 92 | 108 | -1 | -1 | 86 | -1 | 12 | -1 | -1 | -1 | -1 | -1 |
| 192 | 217 | -1 | -1 | -1 | -1 | 222 | -1 | -1 | -1 | -1 | -1 | 211 |
| 65 | -1 | 136 | 11 | -1 | -1 | -1 | -1 | 139 | -1 | -1 | -1 | -1 |
| 54 | 176 | -1 | -1 | -1 | -1 | -1 | -1 | -1 | -1 | 121 | -1 | 90 |
| -1 | 217 | -1 | -1 | 83 | -1 | -1 | -1 | -1 | -1 | -1 | -1 | -1 |
| 59 | -1 | -1 | -1 | -1 | -1 | 73 | 157 | -1 | -1 | -1 | -1 | -1 |
| 122 | 86 | -1 | -1 | -1 | -1 | -1 | -1 | -1 | -1 | -1 | -1 | 119 |
| 72 | -1 | 199 | -1 | -1 | 90 | -1 | -1 | -1 | -1 | -1 | -1 | -1 |
| -1 | 123 | -1 | 191 | -1 | -1 | -1 | -1 | -1 | -1 | 181 | -1 | -1 |
| -1 | 229 | 174 | -1 | -1 | -1 | 28 | -1 | -1 | -1 | -1 | -1 | 239 |
| 59 | -1 | -1 | 83 | -1 | -1 | -1 | -1 | -1 | -1 | 210 | -1 | -1 |
| 32 | -1 | -1 | -1 | -1 | -1 | -1 | 162 | -1 | -1 | -1 | -1 | -1 |
| -1 | 152 | -1 | -1 | 204 | -1 | -1 | -1 | -1 | -1 | -1 | -1 | -1 |
| 118 | 181 | -1 | -1 | -1 | -1 | -1 | -1 | -1 | -1 | -1 | 59 | -1 |
| 117 | -1 | -1 | -1 | -1 | -1 | -1 | -1 | -1 | -1 | -1 | -1 | 202 |
| -1 | 148 | -1 | -1 | -1 | 226 | -1 | -1 | -1 | -1 | -1 | -1 | -1 |
| 89 | -1 | -1 | -1 | -1 | -1 | -1 | -1 | 151 | -1 | -1 | -1 | -1 |
| -1 | 52 | 121 | 106 | -1 | -1 | -1 | -1 | -1 | -1 | -1 | -1 | -1 |
| 87 | -1 | -1 | -1 | -1 | -1 | 110 | 18 | -1 | -1 | -1 | -1 | -1 |
| -1 | 155 | -1 | -1 | 145 | -1 | -1 | -1 | -1 | -1 | -1 | -1 | -1 |
| 178 | -1 | -1 | 30 | -1 | -1 | -1 | -1 | -1 | 30 | -1 | -1 | -1 |
| -1 | 116 | -1 | -1 | -1 | -1 | -1 | -1 | -1 | -1 | 222 | -1 | -1 |
| 164 | -1 | -1 | -1 | -1 | 145 | -1 | -1 | -1 | -1 | -1 | -1 | -1 |
| 65 | -1 | 81 | -1 | -1 | -1 | -1 | -1 | -1 | -1 | -1 | 195 | -1 |
| 159 | -1 | -1 | -1 | 78 | -1 | -1 | 237 | -1 | -1 | -1 | -1 | -1 |
| -1 | 201 | -1 | 88 | -1 | -1 | 201 | -1 | -1 | -1 | -1 | -1 | -1 |
| 128 | -1 | -1 | -1 | -1 | -1 | -1 | 159 | -1 | -1 | -1 | -1 | -1 |
| 131 | -1 | -1 | -1 | -1 | -1 | -1 | -1 | -1 | -1 | -1 | -1 | -1 |
| -1 | 153 | 167 | -1 | -1 | -1 | -1 | -1 | 145 | -1 | -1 | -1 | -1 |
| 14 | -1 | -1 | -1 | -1 | -1 | -1 | -1 | -1 | 153 | -1 | -1 | -1 |
| -1 | 150 | -1 | -1 | -1 | -1 | -1 | -1 | -1 | -1 | -1 | -1 | -1 |
| 110 | -1 | -1 | 95 | -1 | 152 | -1 | -1 | -1 | -1 | -1 | -1 | -1 |
| 116 | -1 | -1 | -1 | -1 | -1 | 143 | -1 | -1 | -1 | -1 | -1 | -1 |
| -1 | 5 | -1 | -1 | 43 | -1 | -1 | -1 | -1 | -1 | -1 | 163 | -1 |
| 224 | -1 | 63 | -1 | -1 | -1 | -1 | -1 | -1 | -1 | -1 | -1 | -1 |

FROM FIG. 13B

| | | | | | | | | | | | | | |
|---|---|---|---|---|---|---|---|---|---|---|---|---|---|
| 210 | 106 | 117 | 106 | 218 | 226 | 164 | 147 | 236 | 0 | 0 | -1 | -1 | -1 |
| 86 | -1 | -1 | 172 | 24 | -1 | -1 | 226 | 79 | -1 | 0 | 0 | -1 | -1 |
| -1 | -1 | -1 | -1 | -1 | -1 | -1 | -1 | -1 | 1 | -1 | 0 | 0 | -1 |
| -1 | 136 | 235 | -1 | -1 | 158 | 230 | -1 | -1 | -1 | -1 | -1 | 0 | 0 |
| 8 | 7 | 93 | 55 | 10 | 30 | 120 | 120 | 24 | 0 | -1 | -1 | -1 | 0 |
| 77 | -1 | -1 | 61 | -1 | -1 | -1 | -1 | -1 | -1 | -1 | -1 | -1 | -1 |
| -1 | -1 | -1 | -1 | 89 | -1 | -1 | -1 | -1 | 189 | -1 | -1 | -1 | -1 |
| 142 | -1 | -1 | -1 | -1 | 221 | -1 | -1 | -1 | -1 | -1 | -1 | -1 | -1 |
| -1 | -1 | 189 | -1 | 26 | -1 | -1 | -1 | -1 | -1 | -1 | -1 | -1 | -1 |
| 177 | -1 | -1 | -1 | -1 | -1 | 157 | -1 | -1 | -1 | -1 | -1 | -1 | -1 |
| -1 | -1 | 190 | -1 | -1 | -1 | -1 | -1 | -1 | 3 | -1 | -1 | -1 | -1 |
| 77 | -1 | -1 | -1 | -1 | -1 | -1 | 231 | -1 | -1 | -1 | -1 | -1 | -1 |
| -1 | -1 | -1 | -1 | 56 | -1 | -1 | -1 | -1 | -1 | -1 | -1 | 208 | -1 |
| 74 | -1 | 102 | -1 | -1 | -1 | 190 | -1 | -1 | 82 | -1 | -1 | -1 | -1 |
| -1 | -1 | -1 | -1 | 153 | -1 | -1 | -1 | -1 | -1 | -1 | -1 | 126 | -1 |
| 37 | -1 | -1 | -1 | -1 | -1 | -1 | 215 | -1 | -1 | -1 | -1 | -1 | 124 |
| -1 | -1 | 144 | -1 | -1 | 220 | -1 | -1 | -1 | -1 | -1 | -1 | -1 | -1 |
| -1 | -1 | -1 | -1 | -1 | -1 | -1 | -1 | -1 | 97 | -1 | -1 | -1 | -1 |
| -1 | -1 | -1 | -1 | -1 | -1 | -1 | -1 | 40 | -1 | -1 | -1 | -1 | -1 |
| -1 | -1 | -1 | 172 | -1 | -1 | -1 | -1 | -1 | 148 | -1 | -1 | -1 | -1 |
| 231 | -1 | -1 | -1 | -1 | -1 | -1 | -1 | -1 | -1 | -1 | -1 | -1 | 119 |
| -1 | -1 | -1 | -1 | -1 | 142 | -1 | -1 | -1 | -1 | -1 | -1 | 203 | -1 |
| -1 | -1 | -1 | -1 | -1 | -1 | -1 | -1 | -1 | 175 | -1 | -1 | -1 | -1 |
| 101 | -1 | -1 | -1 | -1 | -1 | -1 | -1 | -1 | -1 | 170 | -1 | -1 | -1 |
| -1 | -1 | 161 | -1 | -1 | -1 | -1 | -1 | -1 | 45 | -1 | -1 | -1 | -1 |
| -1 | -1 | -1 | -1 | -1 | -1 | 191 | -1 | -1 | -1 | -1 | -1 | 214 | -1 |
| -1 | 109 | -1 | -1 | -1 | -1 | -1 | -1 | -1 | -1 | -1 | -1 | -1 | -1 |
| -1 | -1 | -1 | -1 | -1 | -1 | -1 | -1 | -1 | 67 | -1 | -1 | -1 | -1 |
| -1 | -1 | -1 | -1 | -1 | -1 | -1 | 226 | -1 | -1 | -1 | -1 | 118 | -1 |
| -1 | -1 | -1 | -1 | -1 | -1 | -1 | -1 | -1 | 107 | -1 | -1 | -1 | -1 |
| -1 | -1 | -1 | -1 | -1 | -1 | -1 | -1 | -1 | -1 | -1 | -1 | -1 | 15 |
| -1 | -1 | -1 | 207 | -1 | -1 | -1 | -1 | -1 | -1 | -1 | -1 | 106 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 227 | -1 | -1 | -1 | 192 | -1 |
| -1 | -1 | -1 | -1 | -1 | 139 | -1 | -1 | -1 | -1 | -1 | -1 | -1 | -1 |
| -1 | -1 | -1 | -1 | -1 | -1 | -1 | -1 | -1 | -1 | 0 | -1 | -1 | -1 |
| -1 | 201 | -1 | -1 | -1 | -1 | -1 | -1 | -1 | 196 | -1 | -1 | 62 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 199 |
| -1 | -1 | -1 | -1 | 160 | -1 | -1 | -1 | -1 | -1 | 0 | -1 | -1 | -1 |
| -1 | -1 | -1 | -1 | -1 | -1 | 217 | -1 | -1 | -1 | -1 | -1 | -1 | -1 |
| -1 | -1 | -1 | -1 | -1 | -1 | -1 | -1 | -1 | -1 | -1 | -1 | -1 | 69 |
| -1 | -1 | -1 | -1 | -1 | -1 | -1 | -1 | -1 | -1 | -1 | -1 | -1 | -1 |
| -1 | 183 | -1 | -1 | -1 | -1 | -1 | -1 | -1 | -1 | -1 | -1 | 13 | -1 |

TO FIG. 13E

FROM FIG. 13B

| | | | | | | | | | | | | |
|---|---|---|---|---|---|---|---|---|---|---|---|---|
| 236 | -1 | -1 | -1 | -1 | 126 | -1 | -1 | -1 | -1 | -1 | -1 | -1 |
| -1 | -1 | -1 | -1 | -1 | -1 | -1 | -1 | -1 | 218 | -1 | -1 | -1 |
| 25 | -1 | -1 | -1 | -1 | 195 | -1 | -1 | 116 | -1 | -1 | -1 | -1 |
| -1 | 156 | -1 | -1 | 83 | -1 | -1 | -1 | -1 | -1 | 63 | -1 | -1 |
| -1 | -1 | -1 | 154 | -1 | -1 | -1 | -1 | -1 | -1 | -1 | -1 | -1 |
| -1 | -1 | -1 | -1 | -1 | -1 | 10 | -1 | -1 | -1 | -1 | -1 | -1 |
| -1 | -1 | 11 | -1 | -1 | -1 | -1 | -1 | -1 | -1 | -1 | -1 | -1 |
| -1 | -1 | -1 | -1 | -1 | -1 | -1 | 147 | -1 | -1 | -1 | -1 | -1 |
| -1 | -1 | -1 | -1 | -1 | -1 | -1 | -1 | -1 | 218 | -1 | -1 | -1 |
| -1 | -1 | -1 | -1 | -1 | -1 | -1 | -1 | -1 | -1 | -1 | 161 | 169 |
| 130 | -1 | -1 | -1 | -1 | 153 | -1 | -1 | -1 | -1 | -1 | -1 | -1 |
| -1 | -1 | -1 | -1 | -1 | -1 | -1 | -1 | 30 | -1 | -1 | -1 | -1 |
| -1 | 8 | -1 | -1 | 27 | -1 | -1 | -1 | -1 | -1 | 139 | -1 | -1 |
| -1 | -1 | -1 | 116 | -1 | -1 | -1 | -1 | -1 | -1 | -1 | -1 | -1 |
| -1 | -1 | -1 | -1 | -1 | -1 | 126 | -1 | -1 | -1 | -1 | -1 | -1 |
| -1 | -1 | 57 | -1 | -1 | -1 | -1 | -1 | -1 | -1 | -1 | -1 | -1 |
| -1 | -1 | -1 | -1 | -1 | -1 | -1 | 209 | -1 | -1 | -1 | -1 | -1 |
| -1 | -1 | -1 | -1 | -1 | -1 | -1 | -1 | -1 | 43 | -1 | -1 | -1 |
| -1 | -1 | -1 | -1 | -1 | -1 | -1 | -1 | -1 | -1 | -1 | 13 | 152 |
| 235 | -1 | -1 | -1 | -1 | 170 | -1 | -1 | -1 | -1 | -1 | -1 | -1 |
| -1 | -1 | -1 | -1 | -1 | -1 | -1 | -1 | 218 | -1 | -1 | -1 | -1 |
| -1 | 199 | -1 | -1 | 137 | -1 | -1 | -1 | -1 | -1 | 170 | -1 | -1 |
| -1 | -1 | -1 | 46 | -1 | -1 | -1 | -1 | -1 | -1 | -1 | -1 | -1 |
| -1 | -1 | -1 | -1 | -1 | -1 | 26 | -1 | -1 | -1 | -1 | -1 | -1 |
| -1 | -1 | 72 | -1 | -1 | -1 | -1 | -1 | -1 | -1 | -1 | -1 | -1 |
| -1 | -1 | -1 | -1 | -1 | -1 | -1 | 135 | -1 | -1 | -1 | -1 | -1 |
| -1 | -1 | -1 | -1 | -1 | -1 | -1 | -1 | -1 | 215 | -1 | -1 | -1 |
| -1 | -1 | -1 | -1 | -1 | -1 | -1 | -1 | -1 | -1 | -1 | 209 | 15 |
| 164 | -1 | -1 | -1 | -1 | 1 | -1 | -1 | -1 | -1 | -1 | -1 | -1 |
| -1 | -1 | -1 | -1 | -1 | -1 | -1 | -1 | 211 | -1 | -1 | -1 | -1 |
| -1 | 179 | -1 | -1 | 122 | -1 | -1 | -1 | -1 | -1 | -1 | -1 | -1 |
| -1 | -1 | -1 | 156 | -1 | -1 | -1 | -1 | -1 | -1 | 220 | -1 | -1 |
| -1 | -1 | -1 | -1 | -1 | -1 | 75 | -1 | -1 | -1 | -1 | -1 | -1 |
| -1 | -1 | 174 | -1 | -1 | -1 | -1 | -1 | -1 | -1 | -1 | -1 | -1 |
| -1 | -1 | -1 | -1 | -1 | -1 | -1 | 194 | -1 | -1 | -1 | -1 | -1 |
| -1 | -1 | -1 | -1 | -1 | -1 | -1 | -1 | -1 | 93 | -1 | -1 | -1 |
| -1 | -1 | -1 | -1 | -1 | -1 | -1 | -1 | -1 | -1 | -1 | 27 | 113 |
| 100 | -1 | -1 | -1 | -1 | 157 | -1 | -1 | -1 | -1 | -1 | -1 | -1 |
| -1 | -1 | -1 | -1 | -1 | -1 | -1 | -1 | 227 | -1 | -1 | -1 | -1 |
| -1 | 79 | -1 | -1 | 220 | -1 | -1 | -1 | -1 | -1 | -1 | -1 | -1 |
| -1 | -1 | -1 | 34 | -1 | -1 | -1 | -1 | -1 | -1 | 94 | -1 | -1 |
| -1 | -1 | -1 | -1 | -1 | -1 | 136 | -1 | -1 | -1 | -1 | -1 | -1 |
| -1 | -1 | 124 | -1 | -1 | -1 | -1 | -1 | -1 | -1 | -1 | -1 | -1 |
| -1 | -1 | -1 | -1 | -1 | -1 | -1 | 18 | -1 | -1 | -1 | -1 | -1 |
| -1 | -1 | -1 | -1 | -1 | -1 | -1 | -1 | -1 | 174 | -1 | -1 | -1 |
| -1 | -1 | -1 | -1 | -1 | -1 | -1 | -1 | -1 | -1 | -1 | 162 | 26 |

FROM FIG. 13C

FROM FIG. 13D

| | | | | | | | | | | | | | |
|---|---|---|---|---|---|---|---|---|---|---|---|---|---|
| -1 | -1 | -1 | 111 | -1 | -1 | -1 | -1 | -1 | -1 | -1 | -1 | -1 | 27 |
| -1 | -1 | -1 | -1 | -1 | -1 | -1 | 16 | -1 | 62 | -1 | -1 | 53 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 108 | -1 | -1 | -1 | -1 | -1 | 183 | 62 | -1 | -1 | -1 | -1 |
| -1 | -1 | -1 | -1 | -1 | -1 | -1 | -1 | -1 | -1 | 77 | -1 | 49 | -1 |
| -1 | -1 | -1 | -1 | 110 | -1 | -1 | -1 | -1 | -1 | -1 | -1 | -1 | 228 |
| -1 | 194 | -1 | -1 | -1 | -1 | -1 | -1 | -1 | -1 | -1 | 205 | -1 | -1 |
| 196 | -1 | -1 | -1 | -1 | 1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 144 | -1 | -1 | 49 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 197 | -1 | -1 | -1 | -1 | -1 | -1 | 221 | -1 | -1 | -1 | -1 |
| -1 | -1 | -1 | -1 | -1 | -1 | -1 | -1 | -1 | -1 | 32 | -1 | 54 | -1 |
| -1 | -1 | -1 | -1 | 34 | -1 | -1 | -1 | -1 | -1 | -1 | -1 | -1 | 126 |
| -1 | 19 | -1 | -1 | -1 | -1 | -1 | -1 | -1 | -1 | -1 | 235 | -1 | -1 |
| 142 | -1 | -1 | -1 | -1 | -1 | -1 | 152 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | 79 | -1 | -1 | -1 | -1 | -1 | -1 | -1 | -1 |
| -1 | -1 | -1 | 123 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | 122 | -1 | -1 | -1 | -1 | -1 | -1 | 141 | -1 | -1 | -1 | -1 |
| -1 | -1 | -1 | -1 | -1 | -1 | -1 | -1 | -1 | -1 | 53 | -1 | 69 | -1 |
| -1 | -1 | -1 | -1 | -1 | -1 | 196 | -1 | -1 | -1 | -1 | -1 | -1 | 159 |
| -1 | 237 | -1 | -1 | -1 | -1 | -1 | -1 | -1 | -1 | -1 | 199 | -1 | -1 |
| 47 | -1 | -1 | -1 | -1 | -1 | -1 | -1 | -1 | -1 | -1 | -1 | -1 | -1 |
| -1 | -1 | -1 | -1 | 132 | -1 | -1 | -1 | -1 | -1 | -1 | -1 | -1 | -1 |
| -1 | -1 | -1 | -1 | -1 | -1 | -1 | -1 | 25 | -1 | -1 | -1 | -1 | -1 |
| -1 | -1 | -1 | 108 | -1 | 200 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 208 | -1 | -1 | -1 | -1 |
| -1 | -1 | 175 | -1 | -1 | -1 | -1 | -1 | -1 | -1 | 200 | -1 | -1 | -1 |
| -1 | -1 | -1 | -1 | -1 | -1 | -1 | -1 | -1 | -1 | -1 | -1 | 193 | 71 |
| -1 | 72 | -1 | -1 | -1 | -1 | -1 | 107 | -1 | -1 | -1 | 119 | -1 | -1 |
| 201 | -1 | -1 | -1 | -1 | -1 | 236 | -1 | -1 | -1 | -1 | -1 | -1 | -1 |
| -1 | -1 | -1 | -1 | 207 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | 165 | -1 | 90 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 15 | -1 | -1 | -1 | -1 |
| -1 | -1 | 6 | -1 | -1 | -1 | -1 | -1 | -1 | -1 | 15 | -1 | -1 | -1 |
| -1 | -1 | -1 | -1 | -1 | -1 | -1 | -1 | -1 | -1 | -1 | -1 | 106 | 205 |
| -1 | 22 | -1 | -1 | -1 | -1 | -1 | 53 | -1 | -1 | -1 | 8 | -1 | -1 |
| 52 | -1 | -1 | -1 | -1 | -1 | 166 | -1 | -1 | -1 | -1 | -1 | -1 | -1 |
| -1 | -1 | -1 | -1 | 216 | -1 | -1 | -1 | -1 | -1 | -1 | -1 | -1 | -1 |

| | | | | | | | | | | | | |
|---|---|---|---|---|---|---|---|---|---|---|---|---|
| 1 | 1 | 1 | 1 | 1 | 1 | 1 | 1 | 1 | 1 | 1 | 1 | 0 |
| 0 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 0 | 1 |
| 1 | 1 | 0 | 0 | 0 | 0 | 0 | 0 | 0 | 0 | 0 | 0 | 0 |
| 1 | 0 | 1 | 0 | 0 | 0 | 0 | 1 | 0 | 1 | 1 | 0 | 0 |
| 1 | 1 | 0 | 0 | 0 | 0 | 1 | 0 | 0 | 0 | 0 | 0 | 1 |
| 1 | 1 | 0 | 0 | 1 | 0 | 0 | 1 | 0 | 1 | 0 | 0 | 0 |
| 0 | 1 | 0 | 1 | 0 | 0 | 1 | 0 | 0 | 0 | 1 | 0 | 0 |
| 1 | 1 | 0 | 0 | 0 | 0 | 0 | 1 | 0 | 1 | 0 | 0 | 1 |
| 1 | 0 | 0 | 0 | 1 | 1 | 0 | 0 | 0 | 0 | 1 | 0 | 0 |
| 1 | 1 | 1 | 0 | 0 | 0 | 0 | 1 | 0 | 0 | 0 | 0 | 0 |
| 1 | 0 | 0 | 1 | 0 | 0 | 0 | 0 | 0 | 1 | 0 | 0 | 1 |
| 0 | 1 | 0 | 0 | 0 | 1 | 0 | 1 | 0 | 0 | 1 | 0 | 0 |
| 1 | 0 | 0 | 1 | 0 | 0 | 0 | 0 | 0 | 1 | 0 | 0 | 1 |
| 1 | 1 | 0 | 0 | 0 | 0 | 0 | 0 | 1 | 0 | 1 | 0 | 0 |
| 0 | 1 | 1 | 0 | 0 | 1 | 0 | 0 | 0 | 0 | 0 | 0 | 0 |
| 1 | 0 | 0 | 0 | 1 | 0 | 0 | 0 | 0 | 0 | 0 | 0 | 1 |
| 1 | 1 | 0 | 0 | 0 | 1 | 0 | 0 | 0 | 0 | 1 | 0 | 0 |
| 1 | 0 | 0 | 0 | 0 | 0 | 0 | 1 | 0 | 0 | 0 | 1 | 0 |
| 1 | 1 | 0 | 1 | 0 | 0 | 0 | 0 | 0 | 0 | 0 | 0 | 0 |
| 1 | 0 | 0 | 0 | 0 | 0 | 1 | 0 | 0 | 0 | 1 | 0 | 0 |
| 1 | 0 | 1 | 0 | 0 | 0 | 0 | 0 | 0 | 0 | 0 | 0 | 1 |
| 0 | 1 | 0 | 0 | 0 | 0 | 0 | 0 | 0 | 1 | 0 | 1 | 0 |
| 1 | 0 | 0 | 0 | 1 | 0 | 0 | 0 | 0 | 0 | 1 | 0 | 0 |
| 1 | 0 | 1 | 0 | 0 | 1 | 0 | 0 | 0 | 0 | 0 | 0 | 0 |
| 1 | 1 | 0 | 0 | 0 | 0 | 0 | 0 | 1 | 0 | 1 | 0 | 0 |
| 1 | 0 | 0 | 1 | 0 | 0 | 0 | 0 | 0 | 0 | 0 | 0 | 1 |
| 0 | 1 | 0 | 0 | 0 | 0 | 1 | 0 | 0 | 0 | 1 | 0 | 0 |
| 1 | 0 | 0 | 0 | 1 | 0 | 0 | 0 | 0 | 0 | 0 | 0 | 1 |
| 1 | 0 | 0 | 0 | 0 | 0 | 0 | 0 | 1 | 0 | 0 | 1 | 0 |
| 1 | 0 | 1 | 0 | 0 | 0 | 0 | 0 | 0 | 0 | 1 | 0 | 0 |
| 0 | 1 | 0 | 1 | 0 | 0 | 0 | 0 | 1 | 0 | 0 | 0 | 0 |
| 1 | 0 | 0 | 0 | 0 | 1 | 0 | 0 | 0 | 0 | 0 | 0 | 1 |
| 1 | 0 | 0 | 0 | 1 | 0 | 0 | 0 | 0 | 0 | 0 | 1 | 0 |
| 1 | 0 | 1 | 0 | 0 | 0 | 0 | 0 | 0 | 0 | 1 | 0 | 0 |
| 1 | 0 | 0 | 0 | 0 | 0 | 1 | 0 | 0 | 0 | 0 | 0 | 1 |
| 0 | 1 | 0 | 0 | 0 | 0 | 0 | 0 | 0 | 0 | 0 | 1 | 0 |
| 1 | 0 | 0 | 1 | 0 | 0 | 0 | 0 | 1 | 0 | 1 | 0 | 0 |
| 1 | 0 | 1 | 0 | 0 | 0 | 1 | 0 | 0 | 0 | 0 | 0 | 0 |
| 1 | 0 | 0 | 0 | 0 | 1 | 0 | 0 | 0 | 0 | 0 | 1 | 0 |
| 0 | 0 | 0 | 0 | 0 | 0 | 0 | 0 | 1 | 0 | 1 | 0 | 1 |
| 1 | 0 | 0 | 0 | 1 | 0 | 0 | 0 | 0 | 0 | 0 | 1 | 0 |
| 1 | 0 | 0 | 1 | 0 | 0 | 0 | 0 | 0 | 0 | 1 | 0 | 0 |
| 0 | 1 | 1 | 0 | 0 | 0 | 0 | 0 | 0 | 1 | 0 | 0 | 0 |
| 1 | 0 | 0 | 0 | 0 | 1 | 0 | 0 | 0 | 0 | 0 | 1 | 0 |
| 0 | 0 | 0 | 0 | 0 | 0 | 0 | 1 | 0 | 0 | 1 | 0 | 1 |

FROM FIG. 14C

| | | | | | | | | | | | | |
|---|---|---|---|---|---|---|---|---|---|---|---|---|
| 0 | 0 | 1 | 0 | 0 | 0 | 0 | 0 | 0 | 0 | 0 | 1 | 0 |
| 0 | 0 | 0 | 0 | 0 | 0 | 1 | 0 | 0 | 0 | 1 | 0 | 1 |
| 1 | 0 | 0 | 0 | 1 | 0 | 0 | 0 | 0 | 0 | 0 | 1 | 0 |
| 0 | 1 | 0 | 0 | 0 | 0 | 0 | 0 | 0 | 0 | 0 | 0 | 1 |
| 1 | 0 | 0 | 1 | 0 | 0 | 0 | 0 | 1 | 0 | 1 | 0 | 0 |
| 0 | 1 | 0 | 0 | 0 | 1 | 0 | 0 | 0 | 0 | 0 | 0 | 1 |
| 1 | 0 | 0 | 0 | 1 | 0 | 0 | 0 | 0 | 0 | 1 | 0 | 0 |
| 0 | 0 | 1 | 0 | 0 | 0 | 0 | 0 | 0 | 1 | 0 | 0 | 1 |
| 0 | 0 | 0 | 0 | 0 | 0 | 0 | 1 | 0 | 0 | 1 | 1 | 0 |
| 1 | 0 | 0 | 1 | 0 | 0 | 0 | 0 | 0 | 0 | 0 | 0 | 0 |
| 1 | 1 | 0 | 0 | 0 | 0 | 1 | 0 | 0 | 0 | 0 | 1 | 0 |
| 0 | 0 | 1 | 0 | 0 | 0 | 0 | 0 | 0 | 0 | 1 | 0 | 0 |
| 0 | 0 | 0 | 0 | 0 | 0 | 1 | 0 | 0 | 0 | 0 | 1 | 1 |
| 0 | 1 | 0 | 0 | 1 | 0 | 0 | 0 | 1 | 0 | 1 | 0 | 0 |
| 0 | 1 | 0 | 0 | 0 | 0 | 0 | 0 | 0 | 0 | 0 | 1 | 0 |
| 0 | 0 | 0 | 0 | 0 | 1 | 0 | 0 | 0 | 1 | 1 | 0 | 1 |
| 0 | 0 | 0 | 1 | 0 | 0 | 0 | 0 | 0 | 0 | 0 | 1 | 0 |
| 1 | 1 | 0 | 0 | 0 | 0 | 0 | 1 | 0 | 0 | 1 | 0 | 0 |
| 0 | 1 | 0 | 0 | 1 | 0 | 0 | 0 | 0 | 0 | 0 | 0 | 0 |
| 0 | 0 | 1 | 0 | 0 | 0 | 0 | 0 | 0 | 0 | 0 | 0 | 1 |
| 1 | 1 | 0 | 0 | 0 | 0 | 1 | 0 | 1 | 0 | 1 | 0 | 0 |
| 0 | 0 | 0 | 0 | 0 | 0 | 0 | 0 | 0 | 0 | 0 | 1 | 1 |
| 1 | 0 | 1 | 0 | 0 | 0 | 0 | 1 | 0 | 0 | 1 | 0 | 0 |
| 1 | 0 | 0 | 0 | 0 | 1 | 0 | 0 | 0 | 0 | 0 | 0 | 1 |
| 0 | 0 | 0 | 1 | 0 | 0 | 0 | 0 | 0 | 0 | 1 | 0 | 0 |
| 1 | 1 | 0 | 0 | 0 | 0 | 1 | 0 | 1 | 1 | 0 | 0 | 1 |
| 0 | 0 | 0 | 0 | 0 | 0 | 0 | 0 | 0 | 0 | 1 | 1 | 0 |
| 0 | 0 | 1 | 0 | 0 | 0 | 0 | 0 | 0 | 1 | 0 | 0 | 1 |
| 0 | 0 | 0 | 0 | 0 | 1 | 0 | 0 | 0 | 0 | 1 | 1 | 0 |
| 0 | 1 | 1 | 0 | 0 | 0 | 0 | 0 | 0 | 0 | 0 | 0 | 0 |
| 1 | 0 | 0 | 1 | 0 | 0 | 0 | 1 | 0 | 0 | 0 | 0 | 1 |
| 0 | 0 | 0 | 0 | 0 | 0 | 0 | 0 | 0 | 0 | 1 | 1 | 0 |
| 1 | 1 | 0 | 0 | 1 | 0 | 0 | 0 | 1 | 0 | 0 | 0 | 1 |
| 1 | 0 | 0 | 1 | 0 | 0 | 0 | 0 | 0 | 0 | 0 | 0 | 0 |
| 1 | 1 | 0 | 0 | 0 | 0 | 1 | 1 | 0 | 0 | 1 | 0 | 0 |
| 1 | 0 | 0 | 0 | 0 | 0 | 0 | 0 | 0 | 0 | 0 | 1 | 0 |
| 1 | 1 | 0 | 0 | 0 | 1 | 0 | 0 | 1 | 1 | 1 | 0 | 0 |
| 0 | 0 | 0 | 0 | 1 | 0 | 0 | 0 | 0 | 0 | 0 | 1 | 0 |
| 0 | 0 | 0 | 0 | 0 | 0 | 1 | 0 | 0 | 0 | 1 | 0 | 1 |
| 0 | 0 | 1 | 0 | 0 | 0 | 0 | 0 | 0 | 1 | 0 | 1 | 0 |
| 0 | 0 | 0 | 0 | 1 | 0 | 0 | 0 | 0 | 0 | 1 | 0 | 1 |

TO FIG. 14E

FROM FIG. 14D

| | | | | | | | | | | | | |
|---|---|---|---|---|---|---|---|---|---|---|---|---|
| 0 | 1 | 0 | 0 | 0 | 0 | 0 | 1 | 0 | 0 | 0 | 0 | 0 |
| 1 | 1 | 0 | 0 | 0 | 1 | 0 | 0 | 1 | 0 | 0 | 0 | 1 |
| 0 | 0 | 1 | 0 | 0 | 0 | 0 | 0 | 0 | 0 | 1 | 0 | 0 |
| 1 | 0 | 0 | 1 | 0 | 0 | 0 | 0 | 0 | 0 | 0 | 0 | 1 |
| 1 | 1 | 0 | 0 | 0 | 1 | 0 | 0 | 0 | 0 | 1 | 0 | 0 |
| 1 | 0 | 1 | 0 | 0 | 0 | 0 | 0 | 0 | 0 | 0 | 0 | 0 |
| 1 | 1 | 0 | 0 | 1 | 0 | 0 | 1 | 0 | 1 | 1 | 0 | 0 |
| 1 | 0 | 0 | 0 | 0 | 0 | 0 | 0 | 0 | 0 | 0 | 0 | 1 |
| 1 | 1 | 0 | 1 | 0 | 0 | 1 | 0 | 1 | 0 | 0 | 0 | 0 |
| 1 | 0 | 0 | 0 | 0 | 0 | 0 | 0 | 0 | 1 | 0 | 0 | 0 |
| 1 | 1 | 0 | 0 | 1 | 0 | 1 | 0 | 0 | 0 | 1 | 0 | 0 |
| 1 | 1 | 0 | 0 | 0 | 1 | 0 | 0 | 0 | 0 | 0 | 0 | 1 |
| 0 | 1 | 0 | 1 | 0 | 0 | 0 | 0 | 0 | 0 | 1 | 0 | 0 |
| 0 | 1 | 0 | 0 | 1 | 0 | 0 | 0 | 0 | 0 | 0 | 0 | 1 |
| 0 | 0 | 0 | 0 | 0 | 0 | 0 | 0 | 0 | 0 | 1 | 1 | 0 |
| 1 | 0 | 0 | 1 | 0 | 0 | 0 | 1 | 0 | 0 | 0 | 0 | 1 |
| 1 | 1 | 1 | 0 | 0 | 0 | 0 | 0 | 1 | 0 | 0 | 0 | 0 |
| 0 | 0 | 0 | 0 | 0 | 0 | 0 | 0 | 0 | 0 | 1 | 0 | 1 |
| 0 | 1 | 0 | 0 | 0 | 1 | 0 | 0 | 0 | 0 | 0 | 1 | 0 |
| 0 | 0 | 0 | 0 | 1 | 0 | 0 | 0 | 0 | 0 | 0 | 0 | 1 |
| 1 | 1 | 0 | 0 | 0 | 0 | 1 | 1 | 0 | 1 | 1 | 0 | 0 |
| 0 | 0 | 0 | 0 | 0 | 0 | 0 | 0 | 0 | 0 | 0 | 1 | 1 |
| 0 | 0 | 1 | 0 | 0 | 0 | 0 | 0 | 1 | 0 | 1 | 0 | 0 |
| 1 | 1 | 0 | 1 | 0 | 0 | 0 | 0 | 0 | 0 | 0 | 0 | 0 |
| 1 | 1 | 0 | 0 | 0 | 0 | 1 | 0 | 0 | 0 | 0 | 1 | 0 |
| 0 | 1 | 1 | 0 | 0 | 0 | 0 | 0 | 0 | 0 | 0 | 0 | 0 |
| 0 | 0 | 0 | 1 | 0 | 0 | 0 | 0 | 0 | 0 | 0 | 1 | 0 |
| 1 | 1 | 0 | 0 | 0 | 1 | 0 | 1 | 0 | 1 | 1 | 0 | 0 |
| 0 | 1 | 0 | 0 | 0 | 0 | 0 | 0 | 0 | 0 | 0 | 0 | 1 |
| 0 | 0 | 0 | 0 | 0 | 0 | 1 | 0 | 0 | 0 | 1 | 1 | 0 |

| | | | | | | | | | | | | |
|---|---|---|---|---|---|---|---|---|---|---|---|---|
| 253 | 213 | 206 | 183 | 217 | 55 | 210 | 58 | 187 | 161 | 0 | 0 | -1 |
| -1 | 89 | 248 | 250 | 168 | 220 | 169 | 188 | 105 | 14 | 1 | 0 | 0 |
| 82 | 115 | 97 | 112 | 203 | 33 | 6 | 96 | 92 | 80 | 0 | -1 | 0 |
| 64 | 11 | -1 | -1 | -1 | -1 | -1 | -1 | -1 | -1 | -1 | -1 | -1 |
| 36 | -1 | 176 | -1 | -1 | -1 | -1 | 56 | -1 | 49 | 179 | -1 | -1 |
| 164 | 138 | -1 | -1 | -1 | -1 | 43 | -1 | -1 | -1 | -1 | -1 | 19 |
| 111 | 137 | -1 | -1 | 226 | -1 | -1 | 33 | -1 | 132 | -1 | -1 | -1 |
| -1 | 111 | -1 | 71 | -1 | -1 | 8 | -1 | -1 | -1 | 19 | -1 | -1 |
| 177 | 240 | -1 | -1 | -1 | -1 | -1 | 225 | -1 | 55 | -1 | -1 | 99 |
| 96 | -1 | -1 | -1 | 202 | 43 | -1 | -1 | -1 | -1 | 173 | -1 | -1 |
| 206 | 27 | 51 | -1 | -1 | -1 | -1 | 137 | -1 | -1 | -1 | -1 | -1 |
| 62 | -1 | -1 | 14 | -1 | -1 | -1 | -1 | -1 | 173 | -1 | -1 | 219 |
| -1 | 245 | -1 | -1 | -1 | 182 | -1 | 144 | -1 | -1 | 148 | -1 | -1 |
| 32 | -1 | -1 | 4 | -1 | -1 | -1 | -1 | -1 | 17 | -1 | -1 | 0 |
| 233 | 206 | -1 | -1 | -1 | -1 | -1 | -1 | 145 | -1 | 4 | -1 | -1 |
| -1 | 118 | 243 | -1 | -1 | 246 | -1 | -1 | -1 | -1 | -1 | -1 | -1 |
| 58 | -1 | -1 | -1 | 234 | -1 | -1 | -1 | -1 | -1 | -1 | -1 | 166 |
| 126 | 18 | -1 | -1 | -1 | 223 | -1 | -1 | -1 | -1 | 27 | -1 | -1 |
| 82 | -1 | -1 | -1 | -1 | -1 | -1 | 155 | -1 | -1 | -1 | 130 | -1 |
| 206 | 145 | -1 | 39 | -1 | -1 | -1 | -1 | -1 | -1 | -1 | -1 | -1 |
| 31 | -1 | -1 | -1 | -1 | -1 | 69 | -1 | -1 | -1 | 201 | -1 | -1 |
| 246 | -1 | 220 | -1 | -1 | -1 | -1 | -1 | -1 | -1 | -1 | -1 | 143 |
| -1 | 101 | -1 | -1 | -1 | -1 | -1 | -1 | -1 | 85 | -1 | 81 | -1 |
| 35 | -1 | -1 | -1 | 1 | -1 | -1 | -1 | -1 | -1 | 115 | -1 | -1 |
| 31 | -1 | 57 | -1 | -1 | 251 | -1 | -1 | -1 | -1 | -1 | -1 | -1 |
| 156 | 78 | -1 | -1 | -1 | -1 | -1 | -1 | 40 | -1 | 17 | -1 | -1 |
| 223 | -1 | -1 | 26 | -1 | -1 | -1 | -1 | -1 | -1 | -1 | -1 | 147 |
| -1 | 16 | -1 | -1 | -1 | -1 | 66 | -1 | -1 | -1 | 33 | -1 | -1 |
| 214 | -1 | -1 | -1 | 139 | -1 | -1 | -1 | -1 | -1 | -1 | -1 | 137 |
| 43 | -1 | -1 | -1 | -1 | -1 | -1 | -1 | 210 | -1 | -1 | 133 | -1 |
| 96 | -1 | 243 | -1 | -1 | -1 | -1 | -1 | -1 | -1 | 209 | -1 | -1 |
| -1 | 220 | -1 | 155 | -1 | -1 | -1 | -1 | 57 | -1 | -1 | -1 | -1 |
| 225 | -1 | -1 | -1 | -1 | 70 | -1 | -1 | -1 | -1 | -1 | -1 | 12 |
| 177 | -1 | -1 | -1 | 176 | -1 | -1 | -1 | -1 | -1 | -1 | 149 | -1 |
| 102 | -1 | 70 | -1 | -1 | -1 | -1 | -1 | -1 | -1 | 146 | -1 | -1 |
| 220 | -1 | -1 | -1 | -1 | -1 | 60 | -1 | -1 | -1 | -1 | -1 | 49 |
| -1 | 209 | -1 | -1 | -1 | -1 | -1 | -1 | -1 | -1 | -1 | 67 | -1 |

FROM FIG. 15B

| | | | | | | | | | | | | |
|---|---|---|---|---|---|---|---|---|---|---|---|---|
| 56 | -1 | -1 | 190 | -1 | -1 | -1 | -1 | 225 | -1 | 48 | -1 | -1 |
| 113 | -1 | 102 | -1 | -1 | -1 | 12 | -1 | -1 | -1 | -1 | -1 | -1 |
| 68 | -1 | -1 | -1 | -1 | 106 | -1 | -1 | -1 | -1 | -1 | 154 | -1 |
| -1 | -1 | -1 | -1 | -1 | -1 | -1 | -1 | 95 | -1 | 9 | -1 | 207 |
| 12 | -1 | -1 | -1 | 247 | -1 | -1 | -1 | -1 | -1 | -1 | 147 | -1 |
| 202 | -1 | -1 | 57 | -1 | -1 | -1 | -1 | -1 | -1 | 236 | -1 | -1 |
| -1 | 8 | 228 | -1 | -1 | -1 | -1 | -1 | -1 | 17 | -1 | -1 | -1 |
| 235 | -1 | -1 | -1 | -1 | 239 | -1 | -1 | -1 | -1 | -1 | 164 | -1 |
| -1 | -1 | -1 | -1 | -1 | -1 | -1 | 84 | -1 | -1 | 85 | -1 | 146 |
| -1 | -1 | 48 | -1 | -1 | -1 | -1 | -1 | -1 | -1 | -1 | 41 | -1 |
| -1 | -1 | -1 | -1 | -1 | -1 | 86 | -1 | -1 | -1 | 71 | -1 | 161 |
| 101 | -1 | -1 | -1 | 219 | -1 | -1 | -1 | -1 | -1 | -1 | 17 | -1 |
| -1 | 171 | -1 | -1 | -1 | -1 | -1 | -1 | -1 | -1 | -1 | -1 | 145 |
| 248 | -1 | -1 | 27 | -1 | -1 | -1 | -1 | 157 | -1 | 35 | -1 | -1 |
| -1 | 78 | -1 | -1 | -1 | 117 | -1 | -1 | -1 | -1 | -1 | -1 | 46 |
| 85 | -1 | -1 | -1 | 246 | -1 | -1 | -1 | -1 | -1 | 126 | -1 | -1 |
| -1 | -1 | 110 | -1 | -1 | -1 | -1 | -1 | -1 | 70 | -1 | -1 | 123 |
| -1 | -1 | -1 | -1 | -1 | -1 | -1 | 148 | -1 | -1 | 35 | 198 | -1 |
| 171 | -1 | -1 | 56 | -1 | -1 | -1 | -1 | -1 | -1 | -1 | -1 | -1 |
| 153 | 93 | -1 | -1 | -1 | -1 | 83 | -1 | -1 | -1 | -1 | 22 | -1 |
| -1 | -1 | 36 | -1 | -1 | -1 | -1 | -1 | -1 | -1 | 161 | -1 | -1 |
| -1 | -1 | -1 | -1 | -1 | -1 | 113 | -1 | -1 | -1 | -1 | 227 | 18 |
| -1 | 222 | -1 | -1 | 132 | -1 | -1 | -1 | 202 | -1 | 108 | -1 | -1 |
| -1 | 199 | -1 | -1 | -1 | -1 | -1 | -1 | -1 | -1 | -1 | 229 | -1 |
| -1 | -1 | -1 | -1 | -1 | 243 | -1 | -1 | -1 | 224 | 148 | -1 | 163 |
| -1 | -1 | -1 | 137 | -1 | -1 | -1 | -1 | -1 | -1 | -1 | 9 | -1 |
| 23 | 0 | -1 | -1 | -1 | -1 | -1 | 4 | -1 | -1 | 70 | -1 | -1 |
| -1 | 171 | -1 | -1 | 165 | -1 | -1 | -1 | -1 | -1 | -1 | -1 | -1 |
| -1 | -1 | 100 | -1 | -1 | -1 | -1 | -1 | -1 | -1 | -1 | -1 | 162 |
| 61 | 187 | -1 | -1 | -1 | -1 | 143 | -1 | 122 | -1 | 87 | -1 | -1 |
| -1 | -1 | -1 | -1 | -1 | -1 | -1 | -1 | -1 | -1 | -1 | 90 | 207 |
| 74 | -1 | 172 | -1 | -1 | -1 | -1 | 145 | -1 | -1 | 134 | -1 | -1 |
| 147 | -1 | -1 | -1 | -1 | 11 | -1 | -1 | -1 | -1 | -1 | -1 | 141 |
| -1 | -1 | -1 | 54 | -1 | -1 | -1 | -1 | -1 | -1 | 179 | -1 | -1 |
| 53 | 37 | -1 | -1 | -1 | -1 | 164 | -1 | 23 | 7 | -1 | -1 | 48 |
| -1 | -1 | -1 | -1 | -1 | -1 | -1 | -1 | -1 | -1 | 183 | 243 | |
| -1 | -1 | 91 | -1 | -1 | -1 | -1 | -1 | -1 | 73 | -1 | -1 | 19 |
| -1 | -1 | -1 | -1 | -1 | 251 | -1 | -1 | -1 | -1 | 83 | 106 | -1 |
| -1 | 180 | 55 | -1 | -1 | -1 | -1 | -1 | -1 | -1 | -1 | -1 | -1 |
| 75 | -1 | -1 | 103 | -1 | -1 | -1 | 46 | -1 | -1 | -1 | -1 | 81 |
| -1 | -1 | -1 | -1 | -1 | -1 | -1 | -1 | -1 | -1 | 100 | 93 | -1 |
| 220 | 67 | -1 | -1 | 14 | -1 | -1 | -1 | 182 | -1 | -1 | -1 | 161 |
| 197 | -1 | -1 | 103 | -1 | -1 | -1 | -1 | -1 | -1 | -1 | -1 | -1 |

TO FIG. 15D

FROM FIG. 15C

| | | | | | | | | | | | | |
|---|---|---|---|---|---|---|---|---|---|---|---|---|
| 232 | 114 | -1 | -1 | -1 | -1 | 135 | 68 | -1 | -1 | 76 | -1 | -1 |
| 170 | -1 | -1 | -1 | -1 | -1 | -1 | -1 | -1 | -1 | -1 | 229 | -1 |
| 76 | 97 | -1 | -1 | -1 | 39 | -1 | -1 | 197 | 23 | 213 | -1 | -1 |
| -1 | -1 | -1 | -1 | 81 | -1 | -1 | -1 | -1 | -1 | -1 | 195 | -1 |
| -1 | -1 | -1 | -1 | -1 | -1 | 207 | -1 | -1 | -1 | 34 | -1 | 157 |
| -1 | -1 | 57 | -1 | -1 | -1 | -1 | -1 | -1 | 93 | -1 | 152 | -1 |
| -1 | -1 | -1 | -1 | 38 | -1 | -1 | -1 | -1 | -1 | 34 | -1 | 247 |
| -1 | 130 | -1 | -1 | -1 | -1 | -1 | 169 | -1 | -1 | -1 | -1 | -1 |
| 148 | 0 | -1 | -1 | -1 | 212 | -1 | -1 | 101 | -1 | -1 | -1 | 151 |
| -1 | -1 | 199 | -1 | -1 | -1 | -1 | -1 | -1 | -1 | 15 | -1 | -1 |
| 136 | -1 | -1 | 93 | -1 | -1 | -1 | -1 | -1 | -1 | -1 | -1 | 208 |
| 122 | 211 | -1 | -1 | -1 | 72 | -1 | -1 | -1 | -1 | 51 | -1 | -1 |
| 149 | -1 | 16 | -1 | -1 | -1 | -1 | -1 | -1 | -1 | -1 | -1 | -1 |
| 166 | 33 | -1 | -1 | 61 | -1 | -1 | 235 | -1 | 176 | 41 | -1 | -1 |
| 42 | -1 | -1 | -1 | -1 | -1 | -1 | -1 | -1 | -1 | -1 | -1 | 145 |
| 21 | 242 | -1 | 192 | -1 | -1 | 218 | -1 | 41 | -1 | -1 | -1 | -1 |
| 243 | -1 | -1 | -1 | -1 | -1 | -1 | -1 | -1 | 131 | -1 | -1 | -1 |
| 105 | 58 | -1 | -1 | 55 | -1 | 17 | -1 | -1 | -1 | 5 | -1 | -1 |
| 104 | 254 | -1 | -1 | -1 | 153 | -1 | -1 | -1 | -1 | -1 | -1 | 38 |
| -1 | 181 | -1 | 72 | -1 | -1 | -1 | -1 | -1 | -1 | 50 | -1 | -1 |
| -1 | 18 | -1 | -1 | 176 | -1 | -1 | -1 | -1 | -1 | -1 | -1 | 42 |
| -1 | -1 | -1 | -1 | -1 | -1 | -1 | -1 | -1 | -1 | 62 | 24 | -1 |
| 250 | -1 | -1 | 107 | -1 | -1 | -1 | 196 | -1 | -1 | -1 | -1 | 13 |
| 148 | 34 | 220 | -1 | -1 | -1 | -1 | -1 | 48 | -1 | -1 | -1 | -1 |
| -1 | -1 | -1 | -1 | -1 | -1 | -1 | -1 | -1 | -1 | 11 | -1 | 156 |
| -1 | 40 | -1 | -1 | -1 | 55 | -1 | -1 | -1 | -1 | -1 | 109 | -1 |
| -1 | -1 | -1 | -1 | 67 | -1 | -1 | -1 | -1 | -1 | -1 | -1 | 178 |
| 241 | 205 | -1 | -1 | -1 | -1 | 169 | 64 | -1 | 117 | 146 | -1 | -1 |
| -1 | -1 | -1 | -1 | -1 | -1 | -1 | -1 | -1 | -1 | -1 | 228 | 197 |
| -1 | -1 | 213 | -1 | -1 | -1 | -1 | -1 | 252 | -1 | 119 | -1 | -1 |
| 203 | 30 | -1 | 98 | -1 | -1 | -1 | -1 | -1 | -1 | -1 | -1 | -1 |
| 244 | 42 | -1 | -1 | -1 | -1 | 24 | -1 | -1 | -1 | -1 | 141 | -1 |
| -1 | 51 | 55 | -1 | -1 | -1 | -1 | -1 | -1 | -1 | -1 | -1 | -1 |
| -1 | -1 | -1 | 166 | -1 | -1 | -1 | -1 | -1 | -1 | -1 | 163 | -1 |
| 35 | 131 | -1 | -1 | -1 | 45 | -1 | 162 | -1 | 54 | 153 | -1 | -1 |
| -1 | 233 | -1 | -1 | -1 | -1 | -1 | -1 | -1 | -1 | -1 | -1 | 237 |
| -1 | -1 | -1 | -1 | -1 | -1 | 206 | -1 | -1 | -1 | 149 | 95 | -1 |

| | | | | | | | | | | | | |
|---|---|---|---|---|---|---|---|---|---|---|---|---|
| 253 | 187 | 216 | 236 | 183 | 250 | 220 | 239 | 91 | 123 | 0 | 0 | -1 |
| -1 | 73 | 61 | 187 | 242 | 112 | 113 | 122 | 180 | 169 | 1 | 0 | 0 |
| 81 | 6 | 14 | 174 | 172 | 3 | 77 | 46 | 2 | 11 | 0 | -1 | 0 |
| 77 | 252 | -1 | -1 | -1 | -1 | -1 | -1 | -1 | -1 | -1 | -1 | -1 |
| 148 | -1 | 54 | -1 | -1 | -1 | -1 | 42 | -1 | 212 | 53 | -1 | -1 |
| 141 | 38 | -1 | -1 | -1 | -1 | 216 | -1 | -1 | -1 | -1 | -1 | 17 |
| 152 | 210 | -1 | -1 | 196 | -1 | -1 | 104 | -1 | 153 | -1 | -1 | -1 |
| -1 | 230 | -1 | 244 | -1 | -1 | 86 | -1 | -1 | -1 | 140 | -1 | -1 |
| 20 | 124 | -1 | -1 | -1 | -1 | -1 | 229 | -1 | 43 | -1 | -1 | 205 |
| 224 | -1 | -1 | -1 | 57 | 54 | -1 | -1 | -1 | -1 | 62 | -1 | -1 |
| 104 | 28 | 87 | -1 | -1 | -1 | -1 | 161 | -1 | -1 | -1 | -1 | -1 |
| 143 | -1 | -1 | 130 | -1 | -1 | -1 | -1 | -1 | 220 | -1 | -1 | 53 |
| -1 | 250 | -1 | -1 | -1 | 252 | -1 | 10 | -1 | -1 | 118 | -1 | -1 |
| 246 | -1 | -1 | 200 | -1 | -1 | -1 | -1 | -1 | 56 | -1 | -1 | 30 |
| 253 | 40 | -1 | -1 | -1 | -1 | -1 | -1 | 101 | -1 | 255 | -1 | -1 |
| -1 | 38 | 12 | -1 | -1 | 90 | -1 | -1 | -1 | -1 | -1 | -1 | -1 |
| 109 | -1 | -1 | -1 | 84 | -1 | -1 | -1 | -1 | -1 | -1 | -1 | 183 |
| 92 | 29 | -1 | -1 | -1 | 168 | -1 | -1 | -1 | -1 | 79 | -1 | -1 |
| 174 | -1 | -1 | -1 | -1 | -1 | -1 | 21 | -1 | -1 | -1 | 135 | -1 |
| 130 | 194 | -1 | 246 | -1 | -1 | -1 | -1 | -1 | -1 | -1 | -1 | -1 |
| 45 | -1 | -1 | -1 | -1 | -1 | 61 | -1 | -1 | -1 | 202 | -1 | -1 |
| 52 | -1 | 248 | -1 | -1 | -1 | -1 | -1 | -1 | -1 | -1 | -1 | 241 |
| -1 | 198 | -1 | -1 | -1 | -1 | -1 | -1 | -1 | 216 | -1 | 249 | -1 |
| 252 | -1 | -1 | -1 | 42 | -1 | -1 | -1 | -1 | -1 | 4 | -1 | -1 |
| 185 | -1 | 255 | -1 | -1 | 208 | -1 | -1 | -1 | -1 | -1 | -1 | -1 |
| 186 | 125 | -1 | -1 | -1 | -1 | -1 | -1 | 92 | -1 | 64 | -1 | -1 |
| 158 | -1 | -1 | 110 | -1 | -1 | -1 | -1 | -1 | -1 | -1 | -1 | 222 |
| -1 | 124 | -1 | -1 | -1 | -1 | 17 | -1 | -1 | -1 | 90 | -1 | -1 |
| 183 | -1 | -1 | -1 | 175 | -1 | -1 | -1 | -1 | -1 | -1 | -1 | 94 |
| 134 | -1 | -1 | -1 | -1 | -1 | -1 | -1 | 99 | -1 | -1 | 238 | -1 |
| 236 | -1 | 37 | -1 | -1 | -1 | -1 | -1 | -1 | -1 | 16 | -1 | -1 |
| -1 | 181 | -1 | 152 | -1 | -1 | -1 | -1 | 155 | -1 | -1 | -1 | -1 |
| 166 | -1 | -1 | -1 | -1 | 198 | -1 | -1 | -1 | -1 | -1 | -1 | 57 |
| 144 | -1 | -1 | -1 | 197 | -1 | -1 | -1 | -1 | -1 | -1 | 2 | -1 |
| 197 | -1 | 181 | -1 | -1 | -1 | -1 | -1 | -1 | -1 | 46 | -1 | -1 |
| 218 | -1 | -1 | -1 | -1 | -1 | 16 | -1 | -1 | -1 | -1 | -1 | 184 |
| -1 | 84 | -1 | -1 | -1 | -1 | -1 | -1 | -1 | -1 | -1 | 34 | -1 |

FROM FIG.16B

| | | | | | | | | | | | | |
|---|---|---|---|---|---|---|---|---|---|---|---|---|
| 40 | -1 | -1 | 105 | -1 | -1 | -1 | -1 | 23 | -1 | 136 | -1 | -1 |
| 140 | -1 | 173 | -1 | -1 | -1 | 174 | -1 | -1 | -1 | -1 | -1 | -1 |
| 66 | -1 | -1 | -1 | -1 | 245 | -1 | -1 | -1 | -1 | -1 | 81 | -1 |
| -1 | -1 | -1 | -1 | -1 | -1 | -1 | -1 | 219 | -1 | 154 | -1 | 44 |
| 247 | -1 | -1 | -1 | 45 | -1 | -1 | -1 | -1 | -1 | -1 | 172 | -1 |
| 65 | -1 | -1 | 103 | -1 | -1 | -1 | -1 | -1 | -1 | 200 | -1 | -1 |
| -1 | 79 | 46 | -1 | -1 | -1 | -1 | -1 | -1 | 13 | -1 | -1 | -1 |
| 151 | -1 | -1 | -1 | -1 | 224 | -1 | -1 | -1 | -1 | -1 | 245 | -1 |
| -1 | -1 | -1 | -1 | -1 | -1 | -1 | 46 | -1 | -1 | 35 | -1 | 199 |
| -1 | -1 | 39 | -1 | -1 | -1 | -1 | -1 | -1 | -1 | -1 | 212 | -1 |
| -1 | -1 | -1 | -1 | -1 | -1 | 244 | -1 | -1 | -1 | 203 | -1 | 134 |
| 154 | -1 | -1 | -1 | 156 | -1 | -1 | -1 | -1 | -1 | -1 | 230 | -1 |
| -1 | 186 | -1 | -1 | -1 | -1 | -1 | -1 | -1 | -1 | -1 | -1 | 240 |
| 181 | -1 | -1 | 177 | -1 | -1 | -1 | -1 | 41 | -1 | 52 | -1 | -1 |
| -1 | 160 | -1 | -1 | -1 | 241 | -1 | -1 | -1 | -1 | -1 | -1 | 104 |
| 95 | -1 | -1 | -1 | 211 | -1 | -1 | -1 | -1 | -1 | 251 | -1 | -1 |
| -1 | -1 | 6 | -1 | -1 | -1 | -1 | -1 | -1 | 158 | -1 | -1 | 118 |
| -1 | -1 | -1 | -1 | -1 | -1 | -1 | 36 | -1 | -1 | 236 | 225 | -1 |
| 0 | -1 | -1 | 202 | -1 | -1 | -1 | -1 | -1 | -1 | -1 | -1 | -1 |
| 226 | 47 | -1 | -1 | -1 | -1 | 35 | -1 | -1 | -1 | -1 | 8 | -1 |
| -1 | -1 | 169 | -1 | -1 | -1 | -1 | -1 | -1 | -1 | 207 | -1 | -1 |
| -1 | -1 | -1 | -1 | -1 | -1 | 119 | -1 | -1 | -1 | -1 | 26 | 44 |
| -1 | 0 | -1 | -1 | 13 | -1 | -1 | -1 | 26 | -1 | 170 | -1 | -1 |
| -1 | 38 | -1 | -1 | -1 | -1 | -1 | -1 | -1 | -1 | -1 | 230 | -1 |
| -1 | -1 | -1 | -1 | -1 | 120 | -1 | -1 | -1 | 230 | 116 | -1 | 129 |
| -1 | -1 | -1 | 56 | -1 | -1 | -1 | -1 | -1 | -1 | -1 | 143 | -1 |
| 123 | 13 | -1 | -1 | -1 | -1 | -1 | 111 | -1 | -1 | 237 | -1 | -1 |
| -1 | 210 | -1 | -1 | 209 | -1 | -1 | -1 | -1 | -1 | -1 | -1 | -1 |
| -1 | -1 | 15 | -1 | -1 | -1 | -1 | -1 | -1 | -1 | -1 | -1 | 189 |
| 133 | 12 | -1 | -1 | -1 | -1 | 95 | -1 | 69 | -1 | 151 | -1 | -1 |
| -1 | -1 | -1 | -1 | -1 | -1 | -1 | -1 | -1 | -1 | -1 | 89 | 52 |
| 54 | -1 | 27 | -1 | -1 | -1 | -1 | 145 | -1 | -1 | 174 | -1 | -1 |
| 248 | -1 | -1 | -1 | -1 | 231 | -1 | -1 | -1 | -1 | -1 | -1 | 13 |
| -1 | -1 | -1 | 45 | -1 | -1 | -1 | -1 | -1 | -1 | 122 | -1 | -1 |
| 216 | 228 | -1 | -1 | -1 | -1 | 96 | -1 | 89 | 173 | -1 | -1 | 225 |
| -1 | -1 | -1 | -1 | -1 | -1 | -1 | -1 | -1 | -1 | 222 | 140 | -1 |
| -1 | -1 | 229 | -1 | -1 | -1 | -1 | -1 | -1 | 207 | -1 | -1 | 174 |
| -1 | -1 | -1 | -1 | -1 | 72 | -1 | -1 | -1 | -1 | 107 | 130 | -1 |
| -1 | 252 | 134 | -1 | -1 | -1 | -1 | -1 | -1 | -1 | -1 | -1 | -1 |
| 28 | -1 | -1 | 10 | -1 | -1 | -1 | 15 | -1 | -1 | -1 | -1 | 158 |
| -1 | -1 | -1 | -1 | -1 | -1 | -1 | -1 | -1 | -1 | 255 | 99 | -1 |
| 55 | 173 | -1 | -1 | 149 | -1 | -1 | -1 | 68 | -1 | -1 | -1 | 15 |
| 196 | -1 | -1 | 93 | -1 | -1 | -1 | -1 | -1 | -1 | -1 | -1 | -1 |

TO FIG.16D

FROM FIG.16C

| | | | | | | | | | | | | |
|---|---|---|---|---|---|---|---|---|---|---|---|---|
| 100 | 38 | -1 | -1 | -1 | -1 | 4 | 89 | -1 | -1 | 3 | -1 | -1 |
| 125 | -1 | -1 | -1 | -1 | -1 | -1 | -1 | -1 | -1 | -1 | 104 | -1 |
| 133 | 182 | -1 | -1 | -1 | 36 | -1 | -1 | 151 | 185 | 16 | -1 | -1 |
| -1 | -1 | -1 | -1 | 209 | -1 | -1 | -1 | -1 | -1 | -1 | 20 | -1 |
| -1 | -1 | -1 | -1 | -1 | -1 | 188 | -1 | -1 | -1 | 182 | -1 | 162 |
| -1 | -1 | 245 | -1 | -1 | -1 | -1 | -1 | -1 | 30 | -1 | 92 | -1 |
| -1 | -1 | -1 | -1 | 129 | -1 | -1 | -1 | -1 | -1 | 236 | -1 | 166 |
| -1 | 39 | -1 | -1 | -1 | -1 | -1 | 150 | -1 | -1 | -1 | -1 | -1 |
| 151 | 175 | -1 | -1 | -1 | 21 | -1 | -1 | 178 | -1 | -1 | -1 | 79 |
| -1 | -1 | 94 | -1 | -1 | -1 | -1 | -1 | -1 | -1 | 67 | -1 | -1 |
| 13 | -1 | -1 | 148 | -1 | -1 | -1 | -1 | -1 | -1 | -1 | -1 | 123 |
| 93 | 195 | -1 | -1 | -1 | 3 | -1 | -1 | -1 | -1 | 83 | -1 | -1 |
| 108 | -1 | 152 | -1 | -1 | -1 | -1 | -1 | -1 | -1 | -1 | -1 | -1 |
| 18 | 91 | -1 | -1 | 22 | -1 | -1 | 247 | -1 | 215 | 250 | -1 | -1 |
| 141 | -1 | -1 | -1 | -1 | -1 | -1 | -1 | -1 | -1 | -1 | -1 | 201 |
| 3 | 237 | -1 | 35 | -1 | -1 | 22 | -1 | 0 | -1 | -1 | -1 | -1 |
| 221 | -1 | -1 | -1 | -1 | -1 | -1 | -1 | -1 | 232 | -1 | -1 | -1 |
| 202 | 111 | -1 | -1 | 18 | -1 | 188 | -1 | -1 | -1 | 241 | -1 | -1 |
| 84 | 203 | -1 | -1 | -1 | 100 | -1 | -1 | -1 | -1 | -1 | -1 | 224 |
| -1 | 52 | -1 | 187 | -1 | -1 | -1 | -1 | -1 | -1 | 213 | -1 | -1 |
| -1 | 91 | -1 | -1 | 236 | -1 | -1 | -1 | -1 | -1 | -1 | -1 | 100 |
| -1 | -1 | -1 | -1 | -1 | -1 | -1 | -1 | -1 | -1 | 156 | 77 | -1 |
| 198 | -1 | -1 | 158 | -1 | -1 | -1 | 176 | -1 | -1 | -1 | -1 | 11 |
| 33 | 116 | 221 | -1 | -1 | -1 | -1 | -1 | 166 | -1 | -1 | -1 | -1 |
| -1 | -1 | -1 | -1 | -1 | -1 | -1 | -1 | -1 | -1 | 175 | -1 | 189 |
| -1 | 34 | -1 | -1 | -1 | 12 | -1 | -1 | -1 | -1 | -1 | 35 | -1 |
| -1 | -1 | -1 | -1 | 38 | -1 | -1 | -1 | -1 | -1 | -1 | -1 | 215 |
| 87 | 121 | -1 | -1 | -1 | -1 | 40 | 36 | -1 | 239 | 67 | -1 | -1 |
| -1 | -1 | -1 | -1 | -1 | -1 | -1 | -1 | -1 | -1 | -1 | 22 | 133 |
| -1 | -1 | 228 | -1 | -1 | -1 | -1 | -1 | 244 | -1 | 128 | -1 | -1 |
| 170 | 199 | -1 | 4 | -1 | -1 | -1 | -1 | -1 | -1 | -1 | -1 | -1 |
| 58 | 231 | -1 | -1 | -1 | -1 | 49 | -1 | -1 | -1 | -1 | 219 | -1 |
| -1 | 229 | 134 | -1 | -1 | -1 | -1 | -1 | -1 | -1 | -1 | -1 | -1 |
| -1 | -1 | -1 | 242 | -1 | -1 | -1 | -1 | -1 | -1 | -1 | 252 | -1 |
| 16 | 90 | -1 | -1 | -1 | 12 | -1 | 24 | -1 | 32 | 166 | -1 | -1 |
| -1 | 53 | -1 | -1 | -1 | -1 | -1 | -1 | -1 | -1 | -1 | -1 | 129 |
| -1 | -1 | -1 | -1 | -1 | -1 | 224 | -1 | -1 | -1 | 114 | 16 | -1 |

| | | | | | | | | | | | | |
|---|---|---|---|---|---|---|---|---|---|---|---|---|
| 135 | 143 | 17 | 130 | 53 | 140 | 107 | 64 | 130 | 114 | 0 | 0 | -1 |
| -1 | 10 | 140 | 29 | 137 | 67 | 56 | 86 | 63 | 65 | 1 | 0 | 0 |
| 40 | 6 | 11 | 21 | 40 | 70 | 15 | 3 | 32 | 12 | 0 | -1 | 0 |
| 54 | 45 | -1 | -1 | -1 | -1 | -1 | -1 | -1 | -1 | -1 | -1 | -1 |
| 43 | -1 | 79 | -1 | -1 | -1 | -1 | 1 | -1 | 21 | 139 | -1 | -1 |
| 126 | 112 | -1 | -1 | -1 | -1 | 15 | -1 | -1 | -1 | -1 | -1 | 116 |
| 24 | 135 | -1 | -1 | 139 | -1 | -1 | 98 | -1 | 81 | -1 | -1 | -1 |
| -1 | 23 | -1 | 9 | -1 | -1 | 29 | -1 | -1 | -1 | 99 | -1 | -1 |
| 118 | 62 | -1 | -1 | -1 | -1 | -1 | 62 | -1 | 66 | -1 | -1 | 67 |
| 116 | -1 | -1 | -1 | 13 | 116 | -1 | -1 | -1 | -1 | 114 | -1 | -1 |
| 83 | 35 | 59 | -1 | -1 | -1 | -1 | 11 | -1 | -1 | -1 | -1 | -1 |
| 100 | -1 | -1 | 10 | -1 | -1 | -1 | -1 | -1 | 65 | -1 | -1 | 137 |
| -1 | 101 | -1 | -1 | -1 | 127 | -1 | 18 | -1 | -1 | 90 | -1 | -1 |
| 21 | -1 | -1 | 82 | -1 | -1 | -1 | -1 | -1 | 124 | -1 | -1 | 63 |
| 48 | 8 | -1 | -1 | -1 | -1 | -1 | -1 | 131 | -1 | 22 | -1 | -1 |
| -1 | 83 | 75 | -1 | -1 | 49 | -1 | -1 | -1 | -1 | -1 | -1 | -1 |
| 104 | -1 | -1 | -1 | 24 | -1 | -1 | -1 | -1 | -1 | -1 | -1 | 50 |
| 94 | 86 | -1 | -1 | -1 | 66 | -1 | -1 | -1 | -1 | 130 | -1 | -1 |
| 139 | -1 | -1 | -1 | -1 | -1 | -1 | 35 | -1 | -1 | -1 | 54 | -1 |
| 52 | 75 | -1 | 75 | -1 | -1 | -1 | -1 | -1 | -1 | -1 | -1 | -1 |
| 28 | -1 | -1 | -1 | -1 | -1 | 56 | -1 | -1 | -1 | 121 | -1 | -1 |
| 57 | -1 | 59 | -1 | -1 | -1 | -1 | -1 | -1 | -1 | -1 | -1 | 97 |
| -1 | 81 | -1 | -1 | -1 | -1 | -1 | -1 | -1 | 35 | -1 | 120 | -1 |
| 131 | -1 | -1 | -1 | 9 | -1 | -1 | -1 | -1 | -1 | 22 | -1 | -1 |
| 34 | -1 | 137 | -1 | -1 | 139 | -1 | -1 | -1 | -1 | -1 | -1 | -1 |
| 93 | 124 | -1 | -1 | -1 | -1 | -1 | -1 | 20 | -1 | 130 | -1 | -1 |
| 138 | -1 | -1 | 123 | -1 | -1 | -1 | -1 | -1 | -1 | -1 | -1 | 10 |
| -1 | 20 | -1 | -1 | -1 | -1 | 69 | -1 | -1 | -1 | 120 | -1 | -1 |
| 42 | -1 | -1 | -1 | 63 | -1 | -1 | -1 | -1 | -1 | -1 | -1 | 129 |
| 91 | -1 | -1 | -1 | -1 | -1 | -1 | -1 | 123 | -1 | -1 | 40 | -1 |
| 63 | -1 | 51 | -1 | -1 | -1 | -1 | -1 | -1 | -1 | 17 | -1 | -1 |
| -1 | 132 | -1 | 72 | -1 | -1 | -1 | -1 | 105 | -1 | -1 | -1 | -1 |
| 58 | -1 | -1 | -1 | -1 | 123 | -1 | -1 | -1 | -1 | -1 | -1 | 6 |
| 139 | -1 | -1 | -1 | 33 | -1 | -1 | -1 | -1 | -1 | -1 | 74 | -1 |
| 4 | -1 | 72 | -1 | -1 | -1 | -1 | -1 | -1 | -1 | 134 | -1 | -1 |
| 51 | -1 | -1 | -1 | -1 | -1 | 54 | -1 | -1 | -1 | -1 | -1 | 68 |
| -1 | 36 | -1 | -1 | -1 | -1 | -1 | -1 | -1 | -1 | -1 | 25 | -1 |

FROM FIG.17B

| | | | | | | | | | | | | |
|---|---|---|---|---|---|---|---|---|---|---|---|---|
| 37 | -1 | -1 | 21 | -1 | -1 | -1 | -1 | 142 | -1 | 124 | -1 | -1 |
| 131 | -1 | 114 | -1 | -1 | -1 | 126 | -1 | -1 | -1 | -1 | -1 | -1 |
| 63 | -1 | -1 | -1 | -1 | 61 | -1 | -1 | -1 | -1 | -1 | 62 | -1 |
| -1 | -1 | -1 | -1 | -1 | -1 | -1 | -1 | 85 | -1 | 124 | -1 | 14 |
| 17 | -1 | -1 | -1 | 59 | -1 | -1 | -1 | -1 | -1 | -1 | 126 | -1 |
| 77 | -1 | -1 | 123 | -1 | -1 | -1 | -1 | -1 | -1 | 142 | -1 | -1 |
| -1 | 86 | 98 | -1 | -1 | -1 | -1 | -1 | -1 | 91 | -1 | -1 | -1 |
| 99 | -1 | -1 | -1 | -1 | 13 | -1 | -1 | -1 | -1 | -1 | 114 | -1 |
| -1 | -1 | -1 | -1 | -1 | -1 | -1 | 58 | -1 | -1 | 6 | -1 | 65 |
| -1 | -1 | 66 | -1 | -1 | -1 | -1 | -1 | -1 | -1 | -1 | 9 | -1 |
| -1 | -1 | -1 | -1 | -1 | -1 | 14 | -1 | -1 | -1 | 50 | -1 | 108 |
| 136 | -1 | -1 | -1 | 29 | -1 | -1 | -1 | -1 | -1 | -1 | 32 | -1 |
| -1 | 65 | -1 | -1 | -1 | -1 | -1 | -1 | -1 | -1 | -1 | -1 | 103 |
| 118 | -1 | -1 | 7 | -1 | -1 | -1 | -1 | 17 | -1 | 113 | -1 | -1 |
| -1 | 88 | -1 | -1 | -1 | 75 | -1 | -1 | -1 | -1 | -1 | -1 | 88 |
| 80 | -1 | -1 | -1 | 43 | -1 | -1 | -1 | -1 | -1 | 100 | -1 | -1 |
| -1 | -1 | 39 | -1 | -1 | -1 | -1 | -1 | -1 | 74 | -1 | -1 | 78 |
| -1 | -1 | -1 | -1 | -1 | -1 | -1 | 31 | -1 | -1 | 50 | 1 | -1 |
| 97 | -1 | -1 | 77 | -1 | -1 | -1 | -1 | -1 | -1 | -1 | -1 | -1 |
| 73 | 120 | -1 | -1 | -1 | -1 | 98 | -1 | -1 | -1 | -1 | 138 | -1 |
| -1 | -1 | 91 | -1 | -1 | -1 | -1 | -1 | -1 | -1 | 67 | -1 | -1 |
| -1 | -1 | -1 | -1 | -1 | -1 | 2 | -1 | -1 | -1 | -1 | 119 | 138 |
| -1 | 7 | -1 | -1 | 49 | -1 | -1 | -1 | 116 | -1 | 105 | -1 | -1 |
| -1 | 110 | -1 | -1 | -1 | -1 | -1 | -1 | -1 | -1 | -1 | 124 | -1 |
| -1 | -1 | -1 | -1 | -1 | 57 | -1 | -1 | -1 | 97 | 48 | -1 | 55 |
| -1 | -1 | -1 | 77 | -1 | -1 | -1 | -1 | -1 | -1 | -1 | 58 | -1 |
| 97 | 62 | -1 | -1 | -1 | -1 | -1 | 103 | -1 | -1 | 29 | -1 | -1 |
| -1 | 42 | -1 | -1 | 50 | -1 | -1 | -1 | -1 | -1 | -1 | -1 | -1 |
| -1 | -1 | 18 | -1 | -1 | -1 | -1 | -1 | -1 | -1 | -1 | -1 | 109 |
| 65 | 41 | -1 | -1 | -1 | -1 | 35 | -1 | 143 | -1 | 48 | -1 | -1 |
| -1 | -1 | -1 | -1 | -1 | -1 | -1 | -1 | -1 | -1 | -1 | 99 | 61 |
| 130 | -1 | 91 | -1 | -1 | -1 | -1 | 36 | -1 | -1 | 4 | -1 | -1 |
| 26 | -1 | -1 | -1 | -1 | 117 | -1 | -1 | -1 | -1 | -1 | -1 | 93 |
| -1 | -1 | -1 | 91 | -1 | -1 | -1 | -1 | -1 | -1 | 94 | -1 | -1 |
| 61 | 96 | -1 | -1 | -1 | -1 | 131 | -1 | 98 | 126 | -1 | -1 | 59 |
| -1 | -1 | -1 | -1 | -1 | -1 | -1 | -1 | -1 | -1 | 111 | 36 | -1 |
| -1 | -1 | 5 | -1 | -1 | -1 | -1 | -1 | -1 | 131 | -1 | -1 | 31 |
| -1 | -1 | -1 | -1 | -1 | 88 | -1 | -1 | -1 | -1 | 129 | 24 | -1 |
| -1 | 43 | 117 | -1 | -1 | -1 | -1 | -1 | -1 | -1 | -1 | -1 | -1 |
| 78 | -1 | -1 | 35 | -1 | -1 | -1 | 31 | -1 | -1 | -1 | -1 | 49 |
| -1 | -1 | -1 | -1 | -1 | -1 | -1 | -1 | -1 | -1 | 107 | 48 | -1 |
| 39 | 10 | -1 | -1 | 15 | -1 | -1 | -1 | 134 | -1 | -1 | -1 | 25 |
| 86 | -1 | -1 | 76 | -1 | -1 | -1 | -1 | -1 | -1 | -1 | -1 | -1 |

TO FIG.17D

FROM FIG.17C

| | | | | | | | | | | | | |
|---|---|---|---|---|---|---|---|---|---|---|---|---|
| 128 | 71 | -1 | -1 | -1 | -1 | 60 | 110 | -1 | -1 | 83 | -1 | -1 |
| 58 | -1 | -1 | -1 | -1 | -1 | -1 | -1 | -1 | -1 | -1 | 35 | -1 |
| 79 | 79 | -1 | -1 | -1 | 52 | -1 | -1 | 82 | 90 | 36 | -1 | -1 |
| -1 | -1 | -1 | -1 | 105 | -1 | -1 | -1 | -1 | -1 | -1 | 129 | -1 |
| -1 | -1 | -1 | -1 | -1 | -1 | 78 | -1 | -1 | -1 | 18 | -1 | 66 |
| -1 | -1 | 134 | -1 | -1 | -1 | -1 | -1 | -1 | 138 | -1 | 49 | -1 |
| -1 | -1 | -1 | -1 | 140 | -1 | -1 | -1 | -1 | -1 | 138 | -1 | 77 |
| -1 | 27 | -1 | -1 | -1 | -1 | -1 | 118 | -1 | -1 | -1 | -1 | -1 |
| 12 | 26 | -1 | -1 | -1 | 66 | -1 | -1 | 108 | -1 | -1 | -1 | 119 |
| -1 | -1 | 62 | -1 | -1 | -1 | -1 | -1 | -1 | -1 | 75 | -1 | -1 |
| 9 | -1 | -1 | 51 | -1 | -1 | -1 | -1 | -1 | -1 | -1 | -1 | 108 |
| 117 | 35 | -1 | -1 | -1 | 131 | -1 | -1 | -1 | -1 | 53 | -1 | -1 |
| 57 | -1 | 13 | -1 | -1 | -1 | -1 | -1 | -1 | -1 | -1 | -1 | -1 |
| 51 | 13 | -1 | -1 | 138 | -1 | -1 | 63 | -1 | 34 | 56 | -1 | -1 |
| 70 | -1 | -1 | -1 | -1 | -1 | -1 | -1 | -1 | -1 | -1 | -1 | 21 |
| 137 | 82 | -1 | 110 | -1 | -1 | 116 | -1 | 82 | -1 | -1 | -1 | -1 |
| 38 | -1 | -1 | -1 | -1 | -1 | -1 | -1 | -1 | 74 | -1 | -1 | -1 |
| 40 | 84 | -1 | -1 | 50 | -1 | 53 | -1 | -1 | -1 | 8 | -1 | -1 |
| 106 | 132 | -1 | -1 | -1 | 35 | -1 | -1 | -1 | -1 | -1 | -1 | 41 |
| -1 | 102 | -1 | 101 | -1 | -1 | -1 | -1 | -1 | -1 | 4 | -1 | -1 |
| -1 | 133 | -1 | -1 | 118 | -1 | -1 | -1 | -1 | -1 | -1 | -1 | 59 |
| -1 | -1 | -1 | -1 | -1 | -1 | -1 | -1 | -1 | -1 | 27 | 115 | -1 |
| 42 | -1 | -1 | 25 | -1 | -1 | -1 | 53 | -1 | -1 | -1 | -1 | 18 |
| 136 | 119 | 91 | -1 | -1 | -1 | -1 | -1 | 18 | -1 | -1 | -1 | -1 |
| -1 | -1 | -1 | -1 | -1 | -1 | -1 | -1 | -1 | -1 | 8 | -1 | 27 |
| -1 | 100 | -1 | -1 | -1 | 4 | -1 | -1 | -1 | -1 | -1 | 106 | -1 |
| -1 | -1 | -1 | -1 | 124 | -1 | -1 | -1 | -1 | -1 | -1 | -1 | 81 |
| 109 | 66 | -1 | -1 | -1 | -1 | 34 | 128 | -1 | 10 | 26 | -1 | -1 |
| -1 | -1 | -1 | -1 | -1 | -1 | -1 | -1 | -1 | -1 | -1 | 115 | 111 |
| -1 | -1 | 39 | -1 | -1 | -1 | -1 | -1 | 139 | -1 | 4 | -1 | -1 |
| 66 | 19 | -1 | 80 | -1 | -1 | -1 | -1 | -1 | -1 | -1 | -1 | -1 |
| 101 | 26 | -1 | -1 | -1 | -1 | 29 | -1 | -1 | -1 | -1 | 73 | -1 |
| -1 | 121 | 119 | -1 | -1 | -1 | -1 | -1 | -1 | -1 | -1 | -1 | -1 |
| -1 | -1 | -1 | 29 | -1 | -1 | -1 | -1 | -1 | -1 | -1 | 86 | -1 |
| 70 | 74 | -1 | -1 | -1 | 33 | -1 | 87 | -1 | 27 | 47 | -1 | -1 |
| -1 | 1 | -1 | -1 | -1 | -1 | -1 | -1 | -1 | -1 | -1 | -1 | 29 |
| -1 | -1 | -1 | -1 | -1 | -1 | 18 | -1 | -1 | -1 | 26 | 51 | -1 |

| | | | | | | | | | | | | |
|---|---|---|---|---|---|---|---|---|---|---|---|---|
| 310 | 238 | 303 | 317 | 317 | 238 | 308 | 301 | 179 | 224 | 0 | 0 | -1 |
| -1 | 112 | 231 | 46 | 120 | 154 | 270 | 96 | 157 | 125 | 1 | 0 | 0 |
| 205 | 15 | 49 | 48 | 81 | 50 | 107 | 4 | 12 | 52 | 0 | -1 | 0 |
| 221 | 44 | -1 | -1 | -1 | -1 | -1 | -1 | -1 | -1 | -1 | -1 | -1 |
| 43 | -1 | 151 | -1 | -1 | -1 | -1 | 37 | -1 | 204 | 295 | -1 | -1 |
| 149 | 20 | -1 | -1 | -1 | -1 | 226 | -1 | -1 | -1 | -1 | -1 | 57 |
| 138 | 155 | -1 | -1 | 126 | -1 | -1 | 273 | -1 | 284 | -1 | -1 | -1 |
| -1 | 184 | -1 | 306 | -1 | -1 | 193 | -1 | -1 | -1 | 242 | -1 | -1 |
| 299 | 38 | -1 | -1 | -1 | -1 | -1 | 235 | -1 | 159 | -1 | -1 | 252 |
| 128 | -1 | -1 | -1 | 3 | 248 | -1 | -1 | -1 | -1 | 129 | -1 | -1 |
| 252 | 7 | 237 | -1 | -1 | -1 | -1 | 89 | -1 | -1 | -1 | -1 | -1 |
| 111 | -1 | -1 | 2 | -1 | -1 | -1 | -1 | -1 | 194 | -1 | -1 | 188 |
| -1 | 270 | -1 | -1 | -1 | 207 | -1 | 276 | -1 | -1 | 146 | -1 | -1 |
| 20 | -1 | -1 | 150 | -1 | -1 | -1 | -1 | -1 | 175 | -1 | -1 | 1 |
| 29 | 5 | -1 | -1 | -1 | -1 | -1 | -1 | 237 | -1 | 132 | -1 | -1 |
| -1 | 259 | 291 | -1 | -1 | 287 | -1 | -1 | -1 | -1 | -1 | -1 | -1 |
| 111 | -1 | -1 | -1 | 280 | -1 | -1 | -1 | -1 | -1 | -1 | -1 | 227 |
| 104 | 98 | -1 | -1 | -1 | 291 | -1 | -1 | -1 | -1 | 249 | -1 | -1 |
| 312 | -1 | -1 | -1 | -1 | -1 | -1 | 55 | -1 | -1 | -1 | 315 | -1 |
| 235 | 87 | -1 | 134 | -1 | -1 | -1 | -1 | -1 | -1 | -1 | -1 | -1 |
| 38 | -1 | -1 | -1 | -1 | -1 | 123 | -1 | -1 | -1 | 157 | -1 | -1 |
| 64 | -1 | 273 | -1 | -1 | -1 | -1 | -1 | -1 | -1 | -1 | -1 | 38 |
| -1 | 97 | -1 | -1 | -1 | -1 | -1 | -1 | -1 | 45 | -1 | 304 | -1 |
| 141 | -1 | -1 | -1 | 205 | -1 | -1 | -1 | -1 | -1 | 39 | -1 | -1 |
| 195 | -1 | 192 | -1 | -1 | 71 | -1 | -1 | -1 | -1 | -1 | -1 | -1 |
| 290 | 295 | -1 | -1 | -1 | -1 | -1 | -1 | 123 | -1 | 179 | -1 | -1 |
| 153 | -1 | -1 | 1 | -1 | -1 | -1 | -1 | -1 | -1 | -1 | -1 | 71 |
| -1 | 21 | -1 | -1 | -1 | -1 | 274 | -1 | -1 | -1 | 271 | -1 | -1 |
| 44 | -1 | -1 | -1 | 126 | -1 | -1 | -1 | -1 | -1 | -1 | -1 | 154 |
| 107 | -1 | -1 | -1 | -1 | -1 | -1 | -1 | 112 | -1 | -1 | 52 | -1 |
| 76 | -1 | 196 | -1 | -1 | -1 | -1 | -1 | -1 | -1 | 42 | -1 | -1 |
| -1 | 142 | -1 | 48 | -1 | -1 | -1 | -1 | 95 | -1 | -1 | -1 | -1 |
| 63 | -1 | -1 | -1 | -1 | 95 | -1 | -1 | -1 | -1 | -1 | -1 | 232 |
| 317 | -1 | -1 | -1 | 90 | -1 | -1 | -1 | -1 | -1 | -1 | 78 | -1 |
| 4 | -1 | 240 | -1 | -1 | -1 | -1 | -1 | -1 | -1 | 308 | -1 | -1 |
| 212 | -1 | -1 | -1 | -1 | -1 | 6 | -1 | -1 | -1 | -1 | -1 | 264 |
| -1 | 47 | -1 | -1 | -1 | -1 | -1 | -1 | -1 | -1 | -1 | 126 | -1 |

FROM FIG.18B

| | | | | | | | | | | | | |
|---|---|---|---|---|---|---|---|---|---|---|---|---|
| 49 | -1 | -1 | 85 | -1 | -1 | -1 | -1 | 115 | -1 | 282 | -1 | -1 |
| 141 | -1 | 42 | -1 | -1 | -1 | 24 | -1 | -1 | -1 | -1 | -1 | -1 |
| 236 | -1 | -1 | -1 | -1 | 219 | -1 | -1 | -1 | -1 | -1 | 218 | -1 |
| -1 | -1 | -1 | -1 | -1 | -1 | -1 | -1 | 259 | -1 | 218 | -1 | 23 |
| 10 | -1 | -1 | -1 | 160 | -1 | -1 | -1 | -1 | -1 | -1 | 74 | -1 |
| 243 | -1 | -1 | 147 | -1 | -1 | -1 | -1 | -1 | -1 | 131 | -1 | -1 |
| -1 | 93 | 246 | -1 | -1 | -1 | -1 | -1 | -1 | 43 | -1 | -1 | -1 |
| 118 | -1 | -1 | -1 | -1 | 47 | -1 | -1 | -1 | -1 | -1 | 57 | -1 |
| -1 | -1 | -1 | -1 | -1 | -1 | -1 | 68 | -1 | -1 | 289 | -1 | 111 |
| -1 | -1 | 290 | -1 | -1 | -1 | -1 | -1 | -1 | -1 | -1 | 10 | -1 |
| -1 | -1 | -1 | -1 | -1 | -1 | 174 | -1 | -1 | -1 | 264 | -1 | 0 |
| 153 | -1 | -1 | -1 | 274 | -1 | -1 | -1 | -1 | -1 | -1 | 10 | -1 |
| -1 | 78 | -1 | -1 | -1 | -1 | -1 | -1 | -1 | -1 | -1 | -1 | 21 |
| 136 | -1 | -1 | 101 | -1 | -1 | -1 | -1 | 16 | -1 | 29 | -1 | -1 |
| -1 | 98 | -1 | -1 | -1 | 319 | -1 | -1 | -1 | -1 | -1 | -1 | 250 |
| 89 | -1 | -1 | -1 | 146 | -1 | -1 | -1 | -1 | -1 | 176 | -1 | -1 |
| -1 | -1 | 141 | -1 | -1 | -1 | -1 | -1 | -1 | 86 | -1 | -1 | 197 |
| -1 | -1 | -1 | -1 | -1 | -1 | -1 | 31 | -1 | -1 | 93 | 307 | -1 |
| 103 | -1 | -1 | 175 | -1 | -1 | -1 | -1 | -1 | -1 | -1 | -1 | -1 |
| 208 | 297 | -1 | -1 | -1 | -1 | 84 | -1 | -1 | -1 | -1 | 83 | -1 |
| -1 | -1 | 104 | -1 | -1 | -1 | -1 | -1 | -1 | -1 | 279 | -1 | -1 |
| -1 | -1 | -1 | -1 | -1 | -1 | 5 | -1 | -1 | -1 | -1 | 148 | 137 |
| -1 | 4 | -1 | -1 | 107 | -1 | -1 | -1 | 283 | -1 | 5 | -1 | -1 |
| -1 | 287 | -1 | -1 | -1 | -1 | -1 | -1 | -1 | -1 | -1 | 258 | -1 |
| -1 | -1 | -1 | -1 | -1 | 42 | -1 | -1 | -1 | 266 | 78 | -1 | 115 |
| -1 | -1 | -1 | 88 | -1 | -1 | -1 | -1 | -1 | -1 | -1 | 167 | -1 |
| 58 | 222 | -1 | -1 | -1 | -1 | -1 | 283 | -1 | -1 | 317 | -1 | -1 |
| -1 | 203 | -1 | -1 | 57 | -1 | -1 | -1 | -1 | -1 | -1 | -1 | -1 |
| -1 | -1 | 21 | -1 | -1 | -1 | -1 | -1 | -1 | -1 | -1 | -1 | 14 |
| 299 | 46 | -1 | -1 | -1 | -1 | 120 | -1 | 160 | -1 | 200 | -1 | -1 |
| -1 | -1 | -1 | -1 | -1 | -1 | -1 | -1 | -1 | -1 | -1 | 119 | 305 |
| 149 | -1 | 64 | -1 | -1 | -1 | -1 | 317 | -1 | -1 | 164 | -1 | -1 |
| 21 | -1 | -1 | -1 | -1 | 162 | -1 | -1 | -1 | -1 | -1 | -1 | 40 |
| -1 | -1 | -1 | 269 | -1 | -1 | -1 | -1 | -1 | -1 | 238 | -1 | -1 |
| 86 | 264 | -1 | -1 | -1 | -1 | 225 | -1 | 4 | 208 | -1 | -1 | 210 |
| -1 | -1 | -1 | -1 | -1 | -1 | -1 | -1 | -1 | -1 | 167 | 203 | |
| -1 | -1 | 234 | -1 | -1 | -1 | -1 | -1 | -1 | 304 | -1 | -1 | 291 |
| -1 | -1 | -1 | -1 | -1 | 257 | -1 | -1 | -1 | -1 | 52 | 34 | -1 |
| -1 | 205 | 223 | -1 | -1 | -1 | -1 | -1 | -1 | -1 | -1 | -1 | -1 |
| 240 | -1 | -1 | 49 | -1 | -1 | -1 | 182 | -1 | -1 | -1 | -1 | 262 |
| -1 | -1 | -1 | -1 | -1 | -1 | -1 | -1 | -1 | -1 | 133 | 51 | -1 |
| 267 | 13 | -1 | -1 | 190 | -1 | -1 | -1 | 189 | -1 | -1 | -1 | 54 |
| 93 | -1 | -1 | 290 | -1 | -1 | -1 | -1 | -1 | -1 | -1 | -1 | -1 |

TO FIG.18D

FROM FIG.18C

| | | | | | | | | | | | | |
|---|---|---|---|---|---|---|---|---|---|---|---|---|
| 138 | 239 | -1 | -1 | -1 | -1 | 144 | 219 | -1 | -1 | 292 | -1 | -1 |
| 228 | -1 | -1 | -1 | -1 | -1 | -1 | -1 | -1 | -1 | -1 | 274 | -1 |
| 141 | 83 | -1 | -1 | -1 | 79 | -1 | -1 | 225 | 138 | 97 | -1 | -1 |
| -1 | -1 | -1 | -1 | 278 | -1 | -1 | -1 | -1 | -1 | -1 | 13 | -1 |
| -1 | -1 | -1 | -1 | -1 | -1 | 246 | -1 | -1 | -1 | 242 | -1 | 90 |
| -1 | -1 | 66 | -1 | -1 | -1 | -1 | -1 | -1 | 158 | -1 | 312 | -1 |
| -1 | -1 | -1 | -1 | 311 | -1 | -1 | -1 | -1 | -1 | 156 | -1 | 137 |
| -1 | 198 | -1 | -1 | -1 | -1 | -1 | 43 | -1 | -1 | -1 | -1 | -1 |
| 276 | 189 | -1 | -1 | -1 | 218 | -1 | -1 | 195 | -1 | -1 | -1 | 167 |
| -1 | -1 | 229 | -1 | -1 | -1 | -1 | -1 | -1 | -1 | 12 | -1 | -1 |
| 177 | -1 | -1 | 57 | -1 | -1 | -1 | -1 | -1 | -1 | -1 | -1 | 62 |
| 52 | 32 | -1 | -1 | -1 | 286 | -1 | -1 | -1 | -1 | 49 | -1 | -1 |
| 63 | -1 | 15 | -1 | -1 | -1 | -1 | -1 | -1 | -1 | -1 | -1 | -1 |
| 56 | 174 | -1 | -1 | 234 | -1 | -1 | 44 | -1 | 26 | 179 | -1 | -1 |
| 71 | -1 | -1 | -1 | -1 | -1 | -1 | -1 | -1 | -1 | -1 | -1 | 291 |
| 13 | 259 | -1 | 34 | -1 | -1 | 67 | -1 | 130 | -1 | -1 | -1 | -1 |
| 203 | -1 | -1 | -1 | -1 | -1 | -1 | -1 | -1 | 61 | -1 | -1 | -1 |
| 222 | 251 | -1 | -1 | 256 | -1 | 153 | -1 | -1 | -1 | 288 | -1 | -1 |
| 97 | 140 | -1 | -1 | -1 | 123 | -1 | -1 | -1 | -1 | -1 | -1 | 267 |
| -1 | 111 | -1 | 239 | -1 | -1 | -1 | -1 | -1 | -1 | 170 | -1 | -1 |
| -1 | 142 | -1 | -1 | 54 | -1 | -1 | -1 | -1 | -1 | -1 | -1 | 317 |
| -1 | -1 | -1 | -1 | -1 | -1 | -1 | -1 | -1 | -1 | 82 | 129 | -1 |
| 200 | -1 | -1 | 158 | -1 | -1 | -1 | 250 | -1 | -1 | -1 | -1 | 305 |
| 12 | 131 | 282 | -1 | -1 | -1 | -1 | -1 | 74 | -1 | -1 | -1 | -1 |
| -1 | -1 | -1 | -1 | -1 | -1 | -1 | -1 | -1 | -1 | 7 | -1 | 191 |
| -1 | 115 | -1 | -1 | -1 | 253 | -1 | -1 | -1 | -1 | -1 | 28 | -1 |
| -1 | -1 | -1 | -1 | 130 | -1 | -1 | -1 | -1 | -1 | -1 | -1 | 85 |
| 109 | 236 | -1 | -1 | -1 | -1 | 213 | 111 | -1 | 307 | 152 | -1 | -1 |
| -1 | -1 | -1 | -1 | -1 | -1 | -1 | -1 | -1 | -1 | -1 | 289 | 227 |
| -1 | -1 | 45 | -1 | -1 | -1 | -1 | -1 | 316 | -1 | 6 | -1 | -1 |
| 144 | 186 | -1 | 17 | -1 | -1 | -1 | -1 | -1 | -1 | -1 | -1 | -1 |
| 213 | 186 | -1 | -1 | -1 | -1 | 57 | -1 | -1 | -1 | -1 | 81 | -1 |
| -1 | 294 | 300 | -1 | -1 | -1 | -1 | -1 | -1 | -1 | -1 | -1 | -1 |
| -1 | -1 | -1 | 32 | -1 | -1 | -1 | -1 | -1 | -1 | -1 | 277 | -1 |
| 311 | 242 | -1 | -1 | -1 | 108 | -1 | 38 | -1 | 178 | 255 | -1 | -1 |
| -1 | 5 | -1 | -1 | -1 | -1 | -1 | -1 | -1 | -1 | -1 | -1 | 115 |
| -1 | -1 | -1 | -1 | -1 | -1 | 23 | -1 | -1 | -1 | 201 | 98 | -1 |

| | | | | | | | | | | | | |
|---|---|---|---|---|---|---|---|---|---|---|---|---|
| 347 | 336 | 172 | 343 | 332 | 335 | 326 | 338 | 295 | 125 | 0 | 0 | -1 |
| -1 | 173 | 268 | 210 | 85 | 254 | 87 | 105 | 69 | 254 | 1 | 0 | 0 |
| 231 | 48 | 98 | 25 | 17 | 57 | 14 | 113 | 19 | 26 | 0 | -1 | 0 |
| 244 | 108 | -1 | -1 | -1 | -1 | -1 | -1 | -1 | -1 | -1 | -1 | -1 |
| 46 | -1 | 108 | -1 | -1 | -1 | -1 | 254 | -1 | 202 | 107 | -1 | -1 |
| 162 | 248 | -1 | -1 | -1 | -1 | 131 | -1 | -1 | -1 | -1 | -1 | 16 |
| 147 | 175 | -1 | -1 | 85 | -1 | -1 | 92 | -1 | 312 | -1 | -1 | -1 |
| -1 | 199 | -1 | 334 | -1 | -1 | 326 | -1 | -1 | -1 | 208 | -1 | -1 |
| 322 | 118 | -1 | -1 | -1 | -1 | -1 | 328 | -1 | 19 | -1 | -1 | 329 |
| 136 | -1 | -1 | -1 | 53 | 345 | -1 | -1 | -1 | -1 | 115 | -1 | -1 |
| 284 | 298 | 287 | -1 | -1 | -1 | -1 | 51 | -1 | -1 | -1 | -1 | -1 |
| 122 | -1 | -1 | 192 | -1 | -1 | -1 | -1 | -1 | 286 | -1 | -1 | 181 |
| -1 | 303 | -1 | -1 | -1 | 321 | -1 | 28 | -1 | -1 | 335 | -1 | -1 |
| 32 | -1 | -1 | 307 | -1 | -1 | -1 | -1 | -1 | 51 | -1 | -1 | 145 |
| 195 | 9 | -1 | -1 | -1 | -1 | -1 | -1 | 305 | -1 | 166 | -1 | -1 |
| -1 | 281 | 218 | -1 | -1 | 264 | -1 | -1 | -1 | -1 | -1 | -1 | -1 |
| 122 | -1 | -1 | -1 | 312 | -1 | -1 | -1 | -1 | -1 | -1 | -1 | 121 |
| 8 | 106 | -1 | -1 | -1 | 119 | -1 | -1 | -1 | -1 | 266 | -1 | -1 |
| 341 | -1 | -1 | -1 | -1 | -1 | -1 | 294 | -1 | -1 | -1 | 342 | -1 |
| 107 | 93 | -1 | 49 | -1 | -1 | -1 | -1 | -1 | -1 | -1 | -1 | -1 |
| 38 | -1 | -1 | -1 | -1 | -1 | 241 | -1 | -1 | -1 | 272 | -1 | -1 |
| 76 | -1 | 263 | -1 | -1 | -1 | -1 | -1 | -1 | -1 | -1 | -1 | 52 |
| -1 | 102 | -1 | -1 | -1 | -1 | -1 | -1 | -1 | 130 | -1 | 18 | -1 |
| 156 | -1 | -1 | -1 | 188 | -1 | -1 | -1 | -1 | -1 | 312 | -1 | -1 |
| 210 | -1 | 172 | -1 | -1 | 292 | -1 | -1 | -1 | -1 | -1 | -1 | -1 |
| 115 | 326 | -1 | -1 | -1 | -1 | -1 | -1 | 205 | -1 | 147 | -1 | -1 |
| 168 | -1 | -1 | 310 | -1 | -1 | -1 | -1 | -1 | -1 | -1 | -1 | 31 |
| -1 | 32 | -1 | -1 | -1 | -1 | 348 | -1 | -1 | -1 | 100 | -1 | -1 |
| 48 | -1 | -1 | -1 | 323 | -1 | -1 | -1 | -1 | -1 | -1 | -1 | 148 |
| 110 | -1 | -1 | -1 | -1 | -1 | -1 | -1 | 137 | -1 | -1 | 267 | -1 |
| 85 | -1 | 241 | -1 | -1 | -1 | -1 | -1 | -1 | -1 | 115 | -1 | -1 |
| -1 | 159 | -1 | 341 | -1 | -1 | -1 | -1 | 146 | -1 | -1 | -1 | -1 |
| 69 | -1 | -1 | -1 | -1 | 254 | -1 | -1 | -1 | -1 | -1 | -1 | 137 |
| 349 | -1 | -1 | -1 | 108 | -1 | -1 | -1 | -1 | -1 | -1 | 159 | -1 |
| 5 | -1 | 343 | -1 | -1 | -1 | -1 | -1 | -1 | -1 | 268 | -1 | -1 |
| 237 | -1 | -1 | -1 | -1 | -1 | 155 | -1 | -1 | -1 | -1 | -1 | 198 |
| -1 | 48 | -1 | -1 | -1 | -1 | -1 | -1 | -1 | -1 | -1 | 256 | -1 |

FROM FIG. 19B

| | | | | | | | | | | | | |
|---|---|---|---|---|---|---|---|---|---|---|---|---|
| 53 | -1 | -1 | 179 | -1 | -1 | -1 | -1 | 205 | -1 | 315 | -1 | -1 |
| 156 | -1 | 72 | -1 | -1 | -1 | 66 | -1 | -1 | -1 | -1 | -1 | -1 |
| 253 | -1 | -1 | -1 | -1 | 70 | -1 | -1 | -1 | -1 | -1 | 152 | -1 |
| -1 | -1 | -1 | -1 | -1 | -1 | -1 | -1 | 277 | -1 | 195 | -1 | 199 |
| 17 | -1 | -1 | -1 | 63 | -1 | -1 | -1 | -1 | -1 | -1 | 93 | -1 |
| 264 | -1 | -1 | 320 | -1 | -1 | -1 | -1 | -1 | -1 | 308 | -1 | -1 |
| -1 | 106 | 132 | -1 | -1 | -1 | -1 | -1 | -1 | 186 | -1 | -1 | -1 |
| 130 | -1 | -1 | -1 | -1 | 188 | -1 | -1 | -1 | -1 | -1 | 68 | -1 |
| -1 | -1 | -1 | -1 | -1 | -1 | -1 | 67 | -1 | -1 | 265 | -1 | 3 |
| -1 | -1 | 105 | -1 | -1 | -1 | -1 | -1 | -1 | -1 | -1 | 19 | -1 |
| -1 | -1 | -1 | -1 | -1 | -1 | 191 | -1 | -1 | -1 | 157 | -1 | 323 |
| 169 | -1 | -1 | -1 | 342 | -1 | -1 | -1 | -1 | -1 | -1 | 72 | -1 |
| -1 | 80 | -1 | -1 | -1 | -1 | -1 | -1 | -1 | -1 | -1 | -1 | 84 |
| 153 | -1 | -1 | 60 | -1 | -1 | -1 | -1 | 22 | -1 | 34 | -1 | -1 |
| -1 | 99 | -1 | -1 | -1 | 58 | -1 | -1 | -1 | -1 | -1 | -1 | 105 |
| 91 | -1 | -1 | -1 | 210 | -1 | -1 | -1 | -1 | -1 | 183 | -1 | -1 |
| -1 | -1 | 79 | -1 | -1 | -1 | -1 | -1 | -1 | 90 | -1 | -1 | 302 |
| -1 | -1 | -1 | -1 | -1 | -1 | -1 | 40 | -1 | -1 | 297 | 27 | -1 |
| 118 | -1 | -1 | 87 | -1 | -1 | -1 | -1 | -1 | -1 | -1 | -1 | -1 |
| 158 | 319 | -1 | -1 | -1 | -1 | 3 | -1 | -1 | -1 | -1 | 121 | -1 |
| -1 | -1 | 116 | -1 | -1 | -1 | -1 | -1 | -1 | -1 | 180 | -1 | -1 |
| -1 | -1 | -1 | -1 | -1 | -1 | 10 | -1 | -1 | -1 | -1 | 173 | 182 |
| -1 | 6 | -1 | -1 | 252 | -1 | -1 | -1 | 315 | -1 | 89 | -1 | -1 |
| -1 | 318 | -1 | -1 | -1 | -1 | -1 | -1 | -1 | -1 | -1 | 225 | -1 |
| -1 | -1 | -1 | -1 | -1 | 240 | -1 | -1 | -1 | 289 | 270 | -1 | 146 |
| -1 | -1 | -1 | 94 | -1 | -1 | -1 | -1 | -1 | -1 | -1 | 12 | -1 |
| 132 | 242 | -1 | -1 | -1 | -1 | -1 | 18 | -1 | -1 | 342 | -1 | -1 |
| -1 | 225 | -1 | -1 | 215 | -1 | -1 | -1 | -1 | -1 | -1 | -1 | -1 |
| -1 | -1 | 22 | -1 | -1 | -1 | -1 | -1 | -1 | -1 | -1 | -1 | 180 |
| 215 | 48 | -1 | -1 | -1 | -1 | 167 | -1 | 276 | -1 | 261 | -1 | -1 |
| -1 | -1 | -1 | -1 | -1 | -1 | -1 | -1 | -1 | -1 | -1 | 121 | 203 |
| 162 | -1 | 123 | -1 | -1 | -1 | -1 | 277 | -1 | -1 | 323 | -1 | -1 |
| 32 | -1 | -1 | -1 | -1 | 314 | -1 | -1 | -1 | -1 | -1 | -1 | 151 |
| -1 | -1 | -1 | 294 | -1 | -1 | -1 | -1 | -1 | -1 | 154 | -1 | -1 |
| 235 | 296 | -1 | -1 | -1 | -1 | 317 | -1 | 182 | 194 | -1 | -1 | 319 |
| -1 | -1 | -1 | -1 | -1 | -1 | -1 | -1 | -1 | -1 | 275 | 228 | |
| -1 | -1 | 267 | -1 | -1 | -1 | -1 | -1 | -1 | 335 | -1 | -1 | 189 |
| -1 | -1 | -1 | -1 | -1 | 283 | -1 | -1 | -1 | -1 | 101 | 63 | -1 |
| -1 | 226 | 151 | -1 | -1 | -1 | -1 | -1 | -1 | -1 | -1 | -1 | -1 |
| 265 | -1 | -1 | 227 | -1 | -1 | -1 | 148 | -1 | -1 | -1 | -1 | 137 |
| -1 | -1 | -1 | -1 | -1 | -1 | -1 | -1 | -1 | -1 | 336 | 59 | -1 |
| 143 | 14 | -1 | -1 | 217 | -1 | -1 | -1 | 272 | -1 | -1 | -1 | 166 |
| 101 | -1 | -1 | 319 | -1 | -1 | -1 | -1 | -1 | -1 | -1 | -1 | -1 |

TO FIG. 19D

FROM FIG. 19C

| | | | | | | | | | | | | |
|---|---|---|---|---|---|---|---|---|---|---|---|---|
| 323 | 259 | -1 | -1 | -1 | -1 | 44 | 163 | -1 | -1 | 216 | -1 | -1 |
| 250 | -1 | -1 | -1 | -1 | -1 | -1 | -1 | -1 | -1 | -1 | 58 | -1 |
| 95 | 92 | -1 | -1 | -1 | 340 | -1 | -1 | 149 | 278 | 346 | -1 | -1 |
| -1 | -1 | -1 | -1 | 298 | -1 | -1 | -1 | -1 | -1 | -1 | 258 | -1 |
| -1 | -1 | -1 | -1 | -1 | -1 | 269 | -1 | -1 | -1 | 335 | -1 | 109 |
| -1 | -1 | 160 | -1 | -1 | -1 | -1 | -1 | -1 | 172 | -1 | 95 | -1 |
| -1 | -1 | -1 | -1 | 345 | -1 | -1 | -1 | -1 | -1 | 212 | -1 | 259 |
| -1 | 217 | -1 | -1 | -1 | -1 | -1 | 82 | -1 | -1 | -1 | -1 | -1 |
| 159 | 202 | -1 | -1 | -1 | 254 | -1 | -1 | 165 | -1 | -1 | -1 | 53 |
| -1 | -1 | 246 | -1 | -1 | -1 | -1 | -1 | -1 | -1 | 323 | -1 | -1 |
| 187 | -1 | -1 | 168 | -1 | -1 | -1 | -1 | -1 | -1 | -1 | -1 | 250 |
| 121 | 38 | -1 | -1 | -1 | 127 | -1 | -1 | -1 | -1 | 192 | -1 | -1 |
| 69 | -1 | 155 | -1 | -1 | -1 | -1 | -1 | -1 | -1 | -1 | -1 | -1 |
| 166 | 192 | -1 | -1 | 213 | -1 | -1 | 20 | -1 | 29 | 265 | -1 | -1 |
| 81 | -1 | -1 | -1 | -1 | -1 | -1 | -1 | -1 | -1 | -1 | -1 | 47 |
| 11 | 276 | -1 | 321 | -1 | -1 | 107 | -1 | 212 | -1 | -1 | -1 | -1 |
| 226 | -1 | -1 | -1 | -1 | -1 | -1 | -1 | -1 | 315 | -1 | -1 | -1 |
| 200 | 282 | -1 | -1 | 345 | -1 | 337 | -1 | -1 | -1 | 140 | -1 | -1 |
| 62 | 158 | -1 | -1 | -1 | 334 | -1 | -1 | -1 | -1 | -1 | -1 | 202 |
| -1 | 129 | -1 | 5 | -1 | -1 | -1 | -1 | -1 | -1 | 318 | -1 | -1 |
| -1 | 164 | -1 | -1 | 35 | -1 | -1 | -1 | -1 | -1 | -1 | -1 | 175 |
| -1 | -1 | -1 | -1 | -1 | -1 | -1 | -1 | -1 | -1 | 234 | 142 | -1 |
| 226 | -1 | -1 | 263 | -1 | -1 | -1 | 51 | -1 | -1 | -1 | -1 | 242 |
| 203 | 150 | 313 | -1 | -1 | -1 | -1 | -1 | 88 | -1 | -1 | -1 | -1 |
| -1 | -1 | -1 | -1 | -1 | -1 | -1 | -1 | -1 | -1 | 315 | -1 | 211 |
| -1 | 124 | -1 | -1 | -1 | 319 | -1 | -1 | -1 | -1 | -1 | 224 | -1 |
| -1 | -1 | -1 | -1 | 145 | -1 | -1 | -1 | -1 | -1 | -1 | -1 | 19 |
| 135 | 259 | -1 | -1 | -1 | -1 | 21 | 288 | -1 | 21 | 261 | -1 | -1 |
| -1 | -1 | -1 | -1 | -1 | -1 | -1 | -1 | -1 | -1 | -1 | 318 | 311 |
| -1 | -1 | 280 | -1 | -1 | -1 | -1 | -1 | 349 | -1 | 28 | -1 | -1 |
| 335 | 205 | -1 | 291 | -1 | -1 | -1 | -1 | -1 | -1 | -1 | -1 | -1 |
| 102 | 201 | -1 | -1 | -1 | -1 | 21 | -1 | -1 | -1 | -1 | 274 | -1 |
| -1 | 326 | 50 | -1 | -1 | -1 | -1 | -1 | -1 | -1 | -1 | -1 | -1 |
| -1 | -1 | -1 | 34 | -1 | -1 | -1 | -1 | -1 | -1 | -1 | 64 | -1 |
| 204 | 267 | -1 | -1 | -1 | 117 | -1 | 343 | -1 | 81 | 300 | -1 | -1 |
| -1 | 8 | -1 | -1 | -1 | -1 | -1 | -1 | -1 | -1 | -1 | -1 | 203 |
| -1 | -1 | -1 | -1 | -1 | -1 | 27 | -1 | -1 | -1 | 202 | 230 | -1 |

| | | | | | | | | | | | | |
|---|---|---|---|---|---|---|---|---|---|---|---|---|
| 376 | 324 | 183 | 375 | 353 | 43 | 352 | 102 | 363 | 94 | 0 | 0 | -1 |
| -1 | 243 | 365 | 276 | 73 | 383 | 275 | 280 | 296 | 345 | 1 | 0 | 0 |
| 250 | 10 | 151 | 284 | 2 | 26 | 195 | 38 | 17 | 2 | 0 | -1 | 0 |
| 273 | 300 | -1 | -1 | -1 | -1 | -1 | -1 | -1 | -1 | -1 | -1 | -1 |
| 49 | -1 | 148 | -1 | -1 | -1 | -1 | 168 | -1 | 146 | 2 | -1 | -1 |
| 171 | 289 | -1 | -1 | -1 | -1 | 298 | -1 | -1 | -1 | -1 | -1 | 372 |
| 154 | 183 | -1 | -1 | 354 | -1 | -1 | 87 | -1 | 0 | -1 | -1 | -1 |
| -1 | 218 | -1 | 6 | -1 | -1 | 339 | -1 | -1 | -1 | 261 | -1 | -1 |
| 355 | 188 | -1 | -1 | -1 | -1 | -1 | 5 | -1 | 75 | -1 | -1 | 134 |
| 146 | -1 | -1 | -1 | 335 | 362 | -1 | -1 | -1 | -1 | 109 | -1 | -1 |
| 302 | 347 | 43 | -1 | -1 | -1 | -1 | 381 | -1 | -1 | -1 | -1 | -1 |
| 139 | -1 | -1 | 380 | -1 | -1 | -1 | -1 | -1 | 226 | -1 | -1 | 379 |
| -1 | 332 | -1 | -1 | -1 | 349 | -1 | 160 | -1 | -1 | 345 | -1 | -1 |
| 24 | -1 | -1 | 165 | -1 | -1 | -1 | -1 | -1 | 72 | -1 | -1 | 149 |
| 64 | 11 | -1 | -1 | -1 | -1 | -1 | -1 | 373 | -1 | 134 | -1 | -1 |
| -1 | 305 | 209 | -1 | -1 | 174 | -1 | -1 | -1 | -1 | -1 | -1 | -1 |
| 137 | -1 | -1 | -1 | 128 | -1 | -1 | -1 | -1 | -1 | -1 | -1 | 71 |
| 44 | 110 | -1 | -1 | -1 | 53 | -1 | -1 | -1 | -1 | 56 | -1 | -1 |
| 376 | -1 | -1 | -1 | -1 | -1 | -1 | 136 | -1 | -1 | -1 | 225 | -1 |
| 19 | 105 | -1 | 214 | -1 | -1 | -1 | -1 | -1 | -1 | -1 | -1 | -1 |
| 46 | -1 | -1 | -1 | -1 | -1 | 28 | -1 | -1 | -1 | 199 | -1 | -1 |
| 78 | -1 | 68 | -1 | -1 | -1 | -1 | -1 | -1 | -1 | -1 | -1 | 81 |
| -1 | 117 | -1 | -1 | -1 | -1 | -1 | -1 | -1 | 336 | -1 | 5 | -1 |
| 173 | -1 | -1 | -1 | 142 | -1 | -1 | -1 | -1 | -1 | 383 | -1 | -1 |
| 235 | -1 | 79 | -1 | -1 | 353 | -1 | -1 | -1 | -1 | -1 | -1 | -1 |
| 249 | 349 | -1 | -1 | -1 | -1 | -1 | -1 | 298 | -1 | 204 | -1 | -1 |
| 183 | -1 | -1 | 297 | -1 | -1 | -1 | -1 | -1 | -1 | -1 | -1 | 2 |
| -1 | 35 | -1 | -1 | -1 | -1 | 289 | -1 | -1 | -1 | 68 | -1 | -1 |
| 54 | -1 | -1 | -1 | 25 | -1 | -1 | -1 | -1 | -1 | -1 | -1 | 10 |
| 127 | -1 | -1 | -1 | -1 | -1 | -1 | -1 | 357 | -1 | -1 | 304 | -1 |
| 90 | -1 | 264 | -1 | -1 | -1 | -1 | -1 | -1 | -1 | 359 | -1 | -1 |
| -1 | 174 | -1 | 72 | -1 | -1 | -1 | -1 | 112 | -1 | -1 | -1 | -1 |
| 79 | -1 | -1 | -1 | -1 | 152 | -1 | -1 | -1 | -1 | -1 | -1 | 140 |
| 379 | -1 | -1 | -1 | 126 | -1 | -1 | -1 | -1 | -1 | -1 | 127 | -1 |
| 4 | -1 | 107 | -1 | -1 | -1 | -1 | -1 | -1 | -1 | 239 | -1 | -1 |
| 252 | -1 | -1 | -1 | -1 | -1 | 363 | -1 | -1 | -1 | -1 | -1 | 94 |
| -1 | 57 | -1 | -1 | -1 | -1 | -1 | -1 | -1 | -1 | -1 | 192 | -1 |

FROM FIG. 20B

| | | | | | | | | | | | | |
|---|---|---|---|---|---|---|---|---|---|---|---|---|
| 55 | -1 | -1 | 14 | -1 | -1 | -1 | -1 | 277 | -1 | 79 | -1 | -1 |
| 173 | -1 | 97 | -1 | -1 | -1 | 147 | -1 | -1 | -1 | -1 | -1 | -1 |
| 282 | -1 | -1 | -1 | -1 | 47 | -1 | -1 | -1 | -1 | -1 | 301 | -1 |
| -1 | -1 | -1 | -1 | -1 | -1 | -1 | -1 | 301 | -1 | 217 | -1 | 112 |
| 20 | -1 | -1 | -1 | 282 | -1 | -1 | -1 | -1 | -1 | -1 | 250 | -1 |
| 293 | -1 | -1 | 153 | -1 | -1 | -1 | -1 | -1 | -1 | 309 | -1 | -1 |
| -1 | 113 | 76 | -1 | -1 | -1 | -1 | -1 | -1 | 202 | -1 | -1 | -1 |
| 138 | -1 | -1 | -1 | -1 | 289 | -1 | -1 | -1 | -1 | -1 | 178 | -1 |
| -1 | -1 | -1 | -1 | -1 | -1 | -1 | 82 | -1 | -1 | 197 | -1 | 13 |
| -1 | -1 | 294 | -1 | -1 | -1 | -1 | -1 | -1 | -1 | -1 | 12 | -1 |
| -1 | -1 | -1 | -1 | -1 | -1 | 206 | -1 | -1 | -1 | 351 | -1 | 97 |
| 181 | -1 | -1 | -1 | 313 | -1 | -1 | -1 | -1 | -1 | -1 | 76 | -1 |
| -1 | 92 | -1 | -1 | -1 | -1 | -1 | -1 | -1 | -1 | -1 | -1 | 35 |
| 166 | -1 | -1 | 198 | -1 | -1 | -1 | -1 | 236 | -1 | 96 | -1 | -1 |
| -1 | 112 | -1 | -1 | -1 | 102 | -1 | -1 | -1 | -1 | -1 | -1 | 335 |
| 107 | -1 | -1 | -1 | 157 | -1 | -1 | -1 | -1 | -1 | 192 | -1 | -1 |
| -1 | -1 | 204 | -1 | -1 | -1 | -1 | -1 | -1 | 98 | -1 | -1 | 76 |
| -1 | -1 | -1 | -1 | -1 | -1 | -1 | 43 | -1 | -1 | 318 | 319 | -1 |
| 121 | -1 | -1 | 253 | -1 | -1 | -1 | -1 | -1 | -1 | -1 | -1 | -1 |
| 148 | 351 | -1 | -1 | -1 | -1 | 157 | -1 | -1 | -1 | -1 | 202 | -1 |
| -1 | -1 | 124 | -1 | -1 | -1 | -1 | -1 | -1 | -1 | 70 | -1 | -1 |
| -1 | -1 | -1 | -1 | -1 | -1 | 5 | -1 | -1 | -1 | -1 | 185 | 39 |
| -1 | 10 | -1 | -1 | 379 | -1 | -1 | -1 | 309 | -1 | 204 | -1 | -1 |
| -1 | 347 | -1 | -1 | -1 | -1 | -1 | -1 | -1 | -1 | -1 | 316 | -1 |
| -1 | -1 | -1 | -1 | -1 | 292 | -1 | -1 | -1 | 322 | 268 | -1 | 95 |
| -1 | -1 | -1 | 104 | -1 | -1 | -1 | -1 | -1 | -1 | -1 | 61 | -1 |
| 46 | 272 | -1 | -1 | -1 | -1 | -1 | 203 | -1 | -1 | 108 | -1 | -1 |
| -1 | 249 | -1 | -1 | 219 | -1 | -1 | -1 | -1 | -1 | -1 | -1 | -1 |
| -1 | -1 | 27 | -1 | -1 | -1 | -1 | -1 | -1 | -1 | -1 | -1 | 59 |
| 222 | 56 | -1 | -1 | -1 | -1 | 295 | -1 | 314 | -1 | 24 | -1 | -1 |
| -1 | -1 | -1 | -1 | -1 | -1 | -1 | -1 | -1 | -1 | -1 | 135 | 44 |
| 169 | -1 | 125 | -1 | -1 | -1 | -1 | 22 | -1 | -1 | 210 | -1 | -1 |
| 35 | -1 | -1 | -1 | -1 | 199 | -1 | -1 | -1 | -1 | -1 | -1 | 359 |
| -1 | -1 | -1 | 319 | -1 | -1 | -1 | -1 | -1 | -1 | 233 | -1 | -1 |
| 151 | 318 | -1 | -1 | -1 | -1 | 69 | -1 | 271 | 293 | -1 | -1 | 289 |
| -1 | -1 | -1 | -1 | -1 | -1 | -1 | -1 | -1 | -1 | 103 | 243 | |
| -1 | -1 | 131 | -1 | -1 | -1 | -1 | -1 | -1 | 362 | -1 | -1 | 357 |
| -1 | -1 | -1 | -1 | -1 | 301 | -1 | -1 | -1 | -1 | 79 | 208 | -1 |
| -1 | 247 | 277 | -1 | -1 | -1 | -1 | -1 | -1 | -1 | -1 | -1 | -1 |
| 294 | -1 | -1 | 98 | -1 | -1 | -1 | 170 | -1 | -1 | -1 | -1 | 80 |
| -1 | -1 | -1 | -1 | -1 | -1 | -1 | -1 | -1 | -1 | 274 | 63 | -1 |
| 6 | 13 | -1 | -1 | 240 | -1 | -1 | -1 | 321 | -1 | -1 | -1 | 170 |
| 119 | -1 | -1 | 277 | -1 | -1 | -1 | -1 | -1 | -1 | -1 | -1 | -1 |

TO FIG. 20D

Figure 20D:
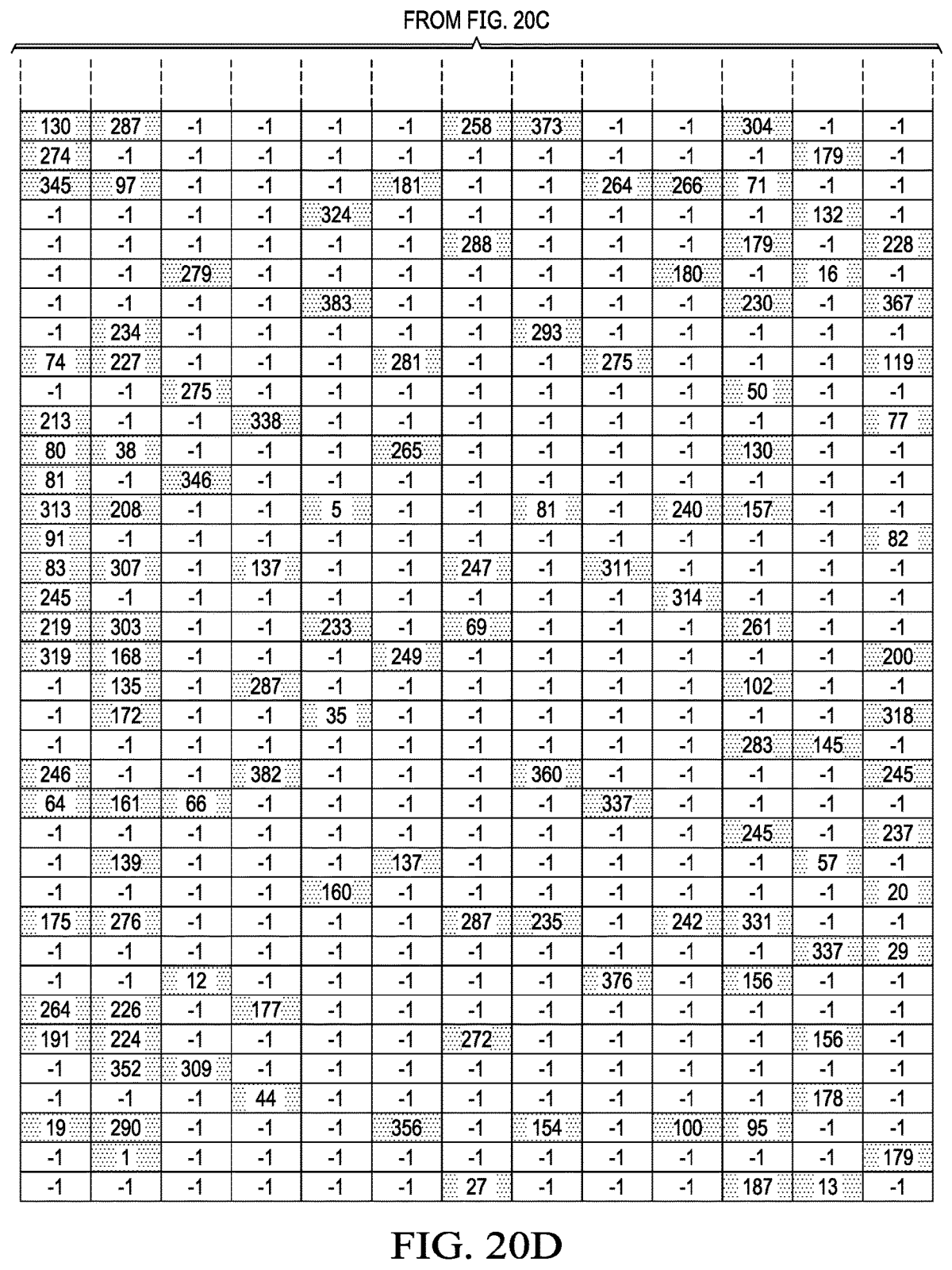

FROM FIG. 20C

| | | | | | | | | | | | | |
|---|---|---|---|---|---|---|---|---|---|---|---|---|
| 130 | 287 | -1 | -1 | -1 | -1 | 258 | 373 | -1 | -1 | 304 | -1 | -1 |
| 274 | -1 | -1 | -1 | -1 | -1 | -1 | -1 | -1 | -1 | -1 | 179 | -1 |
| 345 | 97 | -1 | -1 | -1 | 181 | -1 | -1 | 264 | 266 | 71 | -1 | -1 |
| -1 | -1 | -1 | -1 | 324 | -1 | -1 | -1 | -1 | -1 | -1 | 132 | -1 |
| -1 | -1 | -1 | -1 | -1 | -1 | 288 | -1 | -1 | -1 | 179 | -1 | 228 |
| -1 | -1 | 279 | -1 | -1 | -1 | -1 | -1 | -1 | 180 | -1 | 16 | -1 |
| -1 | -1 | -1 | -1 | 383 | -1 | -1 | -1 | -1 | -1 | 230 | -1 | 367 |
| -1 | 234 | -1 | -1 | -1 | -1 | -1 | 293 | -1 | -1 | -1 | -1 | -1 |
| 74 | 227 | -1 | -1 | -1 | 281 | -1 | -1 | 275 | -1 | -1 | -1 | 119 |
| -1 | -1 | 275 | -1 | -1 | -1 | -1 | -1 | -1 | -1 | 50 | -1 | -1 |
| 213 | -1 | -1 | 338 | -1 | -1 | -1 | -1 | -1 | -1 | -1 | -1 | 77 |
| 80 | 38 | -1 | -1 | -1 | 265 | -1 | -1 | -1 | -1 | 130 | -1 | -1 |
| 81 | -1 | 346 | -1 | -1 | -1 | -1 | -1 | -1 | -1 | -1 | -1 | -1 |
| 313 | 208 | -1 | -1 | 5 | -1 | -1 | 81 | -1 | 240 | 157 | -1 | -1 |
| 91 | -1 | -1 | -1 | -1 | -1 | -1 | -1 | -1 | -1 | -1 | -1 | 82 |
| 83 | 307 | -1 | 137 | -1 | -1 | 247 | -1 | 311 | -1 | -1 | -1 | -1 |
| 245 | -1 | -1 | -1 | -1 | -1 | -1 | -1 | -1 | 314 | -1 | -1 | -1 |
| 219 | 303 | -1 | -1 | 233 | -1 | 69 | -1 | -1 | -1 | 261 | -1 | -1 |
| 319 | 168 | -1 | -1 | -1 | 249 | -1 | -1 | -1 | -1 | -1 | -1 | 200 |
| -1 | 135 | -1 | 287 | -1 | -1 | -1 | -1 | -1 | -1 | 102 | -1 | -1 |
| -1 | 172 | -1 | -1 | 35 | -1 | -1 | -1 | -1 | -1 | -1 | -1 | 318 |
| -1 | -1 | -1 | -1 | -1 | -1 | -1 | -1 | -1 | -1 | 283 | 145 | -1 |
| 246 | -1 | -1 | 382 | -1 | -1 | -1 | 360 | -1 | -1 | -1 | -1 | 245 |
| 64 | 161 | 66 | -1 | -1 | -1 | -1 | -1 | 337 | -1 | -1 | -1 | -1 |
| -1 | -1 | -1 | -1 | -1 | -1 | -1 | -1 | -1 | -1 | 245 | -1 | 237 |
| -1 | 139 | -1 | -1 | -1 | 137 | -1 | -1 | -1 | -1 | -1 | 57 | -1 |
| -1 | -1 | -1 | -1 | 160 | -1 | -1 | -1 | -1 | -1 | -1 | -1 | 20 |
| 175 | 276 | -1 | -1 | -1 | -1 | 287 | 235 | -1 | 242 | 331 | -1 | -1 |
| -1 | -1 | -1 | -1 | -1 | -1 | -1 | -1 | -1 | -1 | -1 | 337 | 29 |
| -1 | -1 | 12 | -1 | -1 | -1 | -1 | -1 | 376 | -1 | 156 | -1 | -1 |
| 264 | 226 | -1 | 177 | -1 | -1 | -1 | -1 | -1 | -1 | -1 | -1 | -1 |
| 191 | 224 | -1 | -1 | -1 | -1 | 272 | -1 | -1 | -1 | -1 | 156 | -1 |
| -1 | 352 | 309 | -1 | -1 | -1 | -1 | -1 | -1 | -1 | -1 | -1 | -1 |
| -1 | -1 | -1 | 44 | -1 | -1 | -1 | -1 | -1 | -1 | -1 | 178 | -1 |
| 19 | 290 | -1 | -1 | -1 | 356 | -1 | 154 | -1 | 100 | 95 | -1 | -1 |
| -1 | 1 | -1 | -1 | -1 | -1 | -1 | -1 | -1 | -1 | -1 | -1 | 179 |
| -1 | -1 | -1 | -1 | -1 | -1 | 27 | -1 | -1 | -1 | 187 | 13 | -1 |

| | | | | | | | | | | | | |
|---|---|---|---|---|---|---|---|---|---|---|---|---|
| 206 | 188 | 165 | 102 | 189 | 48 | 143 | 96 | 196 | 207 | 0 | 0 | -1 |
| -1 | 100 | 195 | 150 | 123 | 188 | 171 | 107 | 72 | 199 | 1 | 0 | 0 |
| 135 | 56 | 158 | 21 | 106 | 50 | 122 | 9 | 56 | 203 | 0 | -1 | 0 |
| 121 | 136 | -1 | -1 | -1 | -1 | -1 | -1 | -1 | -1 | -1 | -1 | -1 |
| 69 | -1 | 152 | -1 | -1 | -1 | -1 | 173 | -1 | 131 | 18 | -1 | -1 |
| 177 | 57 | -1 | -1 | -1 | -1 | 126 | -1 | -1 | -1 | -1 | -1 | 44 |
| 85 | 7 | -1 | -1 | 181 | -1 | -1 | 198 | -1 | 72 | -1 | -1 | -1 |
| -1 | 162 | -1 | 129 | -1 | -1 | 80 | -1 | -1 | -1 | 81 | -1 | -1 |
| 162 | 168 | -1 | -1 | -1 | -1 | -1 | 79 | -1 | 160 | -1 | -1 | 72 |
| 167 | -1 | -1 | -1 | 52 | 89 | -1 | -1 | -1 | -1 | 121 | -1 | -1 |
| 18 | 38 | 108 | -1 | -1 | -1 | -1 | 205 | -1 | -1 | -1 | -1 | -1 |
| 28 | -1 | -1 | 190 | -1 | -1 | -1 | -1 | -1 | 63 | -1 | -1 | 128 |
| -1 | 136 | -1 | -1 | -1 | 197 | -1 | 71 | -1 | -1 | 135 | -1 | -1 |
| 94 | -1 | -1 | 14 | -1 | -1 | -1 | -1 | -1 | 49 | -1 | -1 | 113 |
| 166 | 45 | -1 | -1 | -1 | -1 | -1 | -1 | 62 | -1 | 177 | -1 | -1 |
| -1 | 80 | 55 | -1 | -1 | 19 | -1 | -1 | -1 | -1 | -1 | -1 | -1 |
| 186 | -1 | -1 | -1 | 150 | -1 | -1 | -1 | -1 | -1 | -1 | -1 | 185 |
| 188 | 202 | -1 | -1 | -1 | 99 | -1 | -1 | -1 | -1 | 96 | -1 | -1 |
| 148 | -1 | -1 | -1 | -1 | -1 | -1 | 164 | -1 | -1 | -1 | 181 | -1 |
| 200 | 74 | -1 | 181 | -1 | -1 | -1 | -1 | -1 | -1 | -1 | -1 | -1 |
| 192 | -1 | -1 | -1 | -1 | -1 | 111 | -1 | -1 | -1 | 40 | -1 | -1 |
| 159 | -1 | 107 | -1 | -1 | -1 | -1 | -1 | -1 | -1 | -1 | -1 | 203 |
| -1 | 144 | -1 | -1 | -1 | -1 | -1 | -1 | -1 | 24 | -1 | 66 | -1 |
| 147 | -1 | -1 | -1 | 151 | -1 | -1 | -1 | -1 | -1 | 0 | -1 | -1 |
| 32 | -1 | 114 | -1 | -1 | 158 | -1 | -1 | -1 | -1 | -1 | -1 | -1 |
| 145 | 202 | -1 | -1 | -1 | -1 | -1 | -1 | 30 | -1 | 72 | -1 | -1 |
| 38 | -1 | -1 | 33 | -1 | -1 | -1 | -1 | -1 | -1 | -1 | -1 | 1 |
| -1 | 12 | -1 | -1 | -1 | -1 | 179 | -1 | -1 | -1 | 158 | -1 | -1 |
| 148 | -1 | -1 | -1 | 194 | -1 | -1 | -1 | -1 | -1 | -1 | -1 | 107 |
| 59 | -1 | -1 | -1 | -1 | -1 | -1 | -1 | 131 | -1 | -1 | 62 | -1 |
| 102 | -1 | 207 | -1 | -1 | -1 | -1 | -1 | -1 | -1 | 79 | -1 | -1 |
| -1 | 119 | -1 | 116 | -1 | -1 | -1 | -1 | 95 | -1 | -1 | -1 | -1 |
| 126 | -1 | -1 | -1 | -1 | 27 | -1 | -1 | -1 | -1 | -1 | -1 | 61 |
| 163 | -1 | -1 | -1 | 188 | -1 | -1 | -1 | -1 | -1 | -1 | 167 | -1 |
| 20 | -1 | 120 | -1 | -1 | -1 | -1 | -1 | -1 | -1 | 2 | -1 | -1 |
| 10 | -1 | -1 | -1 | -1 | -1 | 204 | -1 | -1 | -1 | -1 | -1 | 0 |
| -1 | 109 | -1 | -1 | -1 | -1 | -1 | -1 | -1 | -1 | -1 | 202 | -1 |

FROM FIG. 21B

| | | | | | | | | | | | | |
|---|---|---|---|---|---|---|---|---|---|---|---|---|
| 121 | -1 | -1 | 139 | -1 | -1 | -1 | -1 | 205 | -1 | 163 | -1 | -1 |
| 102 | -1 | 52 | -1 | -1 | -1 | 113 | -1 | -1 | -1 | -1 | -1 | -1 |
| 24 | -1 | -1 | -1 | -1 | 187 | -1 | -1 | -1 | -1 | -1 | 86 | -1 |
| -1 | -1 | -1 | -1 | -1 | -1 | -1 | -1 | 195 | -1 | 70 | -1 | 79 |
| 134 | -1 | -1 | -1 | 168 | -1 | -1 | -1 | -1 | -1 | -1 | 9 | -1 |
| 173 | -1 | -1 | 65 | -1 | -1 | -1 | -1 | -1 | -1 | 131 | -1 | -1 |
| -1 | 8 | 66 | -1 | -1 | -1 | -1 | -1 | -1 | 197 | -1 | -1 | -1 |
| 26 | -1 | -1 | -1 | -1 | 159 | -1 | -1 | -1 | -1 | -1 | 170 | -1 |
| -1 | -1 | -1 | -1 | -1 | -1 | -1 | 92 | -1 | -1 | 11 | -1 | 25 |
| -1 | -1 | 63 | -1 | -1 | -1 | -1 | -1 | -1 | -1 | -1 | 75 | -1 |
| -1 | -1 | -1 | -1 | -1 | -1 | 17 | -1 | -1 | -1 | 104 | -1 | 176 |
| 47 | -1 | -1 | -1 | 204 | -1 | -1 | -1 | -1 | -1 | -1 | 190 | -1 |
| -1 | 48 | -1 | -1 | -1 | -1 | -1 | -1 | -1 | -1 | -1 | -1 | 63 |
| 99 | -1 | -1 | 36 | -1 | -1 | -1 | -1 | 133 | -1 | 165 | -1 | -1 |
| -1 | 102 | -1 | -1 | -1 | 147 | -1 | -1 | -1 | -1 | -1 | -1 | 87 |
| 8 | -1 | -1 | -1 | 8 | -1 | -1 | -1 | -1 | -1 | 184 | -1 | -1 |
| -1 | -1 | 26 | -1 | -1 | -1 | -1 | -1 | -1 | 138 | -1 | -1 | 32 |
| -1 | -1 | -1 | -1 | -1 | -1 | -1 | 121 | -1 | -1 | 48 | 119 | -1 |
| 53 | -1 | -1 | 197 | -1 | -1 | -1 | -1 | -1 | -1 | -1 | -1 | -1 |
| 28 | 57 | -1 | -1 | -1 | -1 | 44 | -1 | -1 | -1 | -1 | 102 | -1 |
| -1 | -1 | 24 | -1 | -1 | -1 | -1 | -1 | -1 | -1 | 30 | -1 | -1 |
| -1 | -1 | -1 | -1 | -1 | -1 | 204 | -1 | -1 | -1 | -1 | 64 | 112 |
| -1 | 69 | -1 | -1 | 10 | -1 | -1 | -1 | 9 | -1 | 153 | -1 | -1 |
| -1 | 184 | -1 | -1 | -1 | -1 | -1 | -1 | -1 | -1 | -1 | 157 | -1 |
| -1 | -1 | -1 | -1 | -1 | 40 | -1 | -1 | -1 | 33 | 179 | -1 | 65 |
| -1 | -1 | -1 | 126 | -1 | -1 | -1 | -1 | -1 | -1 | -1 | 103 | -1 |
| 50 | 139 | -1 | -1 | -1 | -1 | -1 | 147 | -1 | -1 | 169 | -1 | -1 |
| -1 | 162 | -1 | -1 | 201 | -1 | -1 | -1 | -1 | -1 | -1 | -1 | -1 |
| -1 | -1 | 157 | -1 | -1 | -1 | -1 | -1 | -1 | -1 | -1 | -1 | 205 |
| 143 | 51 | -1 | -1 | -1 | -1 | 186 | -1 | 37 | -1 | 110 | -1 | -1 |
| -1 | -1 | -1 | -1 | -1 | -1 | -1 | -1 | -1 | -1 | -1 | 91 | 196 |
| 119 | -1 | 187 | -1 | -1 | -1 | -1 | 198 | -1 | -1 | 18 | -1 | -1 |
| 105 | -1 | -1 | -1 | -1 | 130 | -1 | -1 | -1 | -1 | -1 | -1 | 81 |
| -1 | -1 | -1 | 177 | -1 | -1 | -1 | -1 | -1 | -1 | 121 | -1 | -1 |
| 19 | 10 | -1 | -1 | -1 | -1 | 182 | -1 | 107 | 86 | -1 | -1 | 80 |
| -1 | -1 | -1 | -1 | -1 | -1 | -1 | -1 | -1 | -1 | 33 | 171 | |
| -1 | -1 | 34 | -1 | -1 | -1 | -1 | -1 | -1 | 69 | -1 | -1 | 12 |
| -1 | -1 | -1 | -1 | -1 | 140 | -1 | -1 | -1 | -1 | 93 | 98 | -1 |
| -1 | 202 | 131 | -1 | -1 | -1 | -1 | -1 | -1 | -1 | -1 | -1 | -1 |
| 0 | -1 | -1 | 179 | -1 | -1 | -1 | 101 | -1 | -1 | -1 | -1 | 154 |
| -1 | -1 | -1 | -1 | -1 | -1 | -1 | -1 | -1 | -1 | 149 | 198 | -1 |
| 2 | 148 | -1 | -1 | 21 | -1 | -1 | -1 | 110 | -1 | -1 | -1 | 112 |
| 106 | -1 | -1 | 123 | -1 | -1 | -1 | -1 | -1 | -1 | -1 | -1 | -1 |

TO FIG. 21D

FROM FIG. 21C

| | | | | | | | | | | | | |
|---|---|---|---|---|---|---|---|---|---|---|---|---|
| 27 | 92 | -1 | -1 | -1 | -1 | 22 | 37 | -1 | -1 | 103 | -1 | -1 |
| 184 | -1 | -1 | -1 | -1 | -1 | -1 | -1 | -1 | -1 | -1 | 23 | -1 |
| 73 | 2 | -1 | -1 | -1 | 41 | -1 | -1 | 152 | 68 | 87 | -1 | -1 |
| -1 | -1 | -1 | -1 | 76 | -1 | -1 | -1 | -1 | -1 | -1 | 128 | -1 |
| -1 | -1 | -1 | -1 | -1 | -1 | 70 | -1 | -1 | -1 | 74 | -1 | 106 |
| -1 | -1 | 70 | -1 | -1 | -1 | -1 | -1 | -1 | 29 | -1 | 3 | -1 |
| -1 | -1 | -1 | -1 | 135 | -1 | -1 | -1 | -1 | -1 | 84 | -1 | 180 |
| -1 | 180 | -1 | -1 | -1 | -1 | -1 | 25 | -1 | -1 | -1 | -1 | -1 |
| 183 | 124 | -1 | -1 | -1 | 54 | -1 | -1 | 114 | -1 | -1 | -1 | 99 |
| -1 | -1 | 192 | -1 | -1 | -1 | -1 | -1 | -1 | -1 | 91 | -1 | -1 |
| 183 | -1 | -1 | 52 | -1 | -1 | -1 | -1 | -1 | -1 | -1 | -1 | 28 |
| 118 | 88 | -1 | -1 | -1 | 9 | -1 | -1 | -1 | -1 | 153 | -1 | -1 |
| 162 | -1 | 79 | -1 | -1 | -1 | -1 | -1 | -1 | -1 | -1 | -1 | -1 |
| 39 | 145 | -1 | -1 | 191 | -1 | -1 | 57 | -1 | 44 | 200 | -1 | -1 |
| 111 | -1 | -1 | -1 | -1 | -1 | -1 | -1 | -1 | -1 | -1 | -1 | 63 |
| 45 | 98 | -1 | 133 | -1 | -1 | 48 | -1 | 130 | -1 | -1 | -1 | -1 |
| 127 | -1 | -1 | -1 | -1 | -1 | -1 | -1 | -1 | 35 | -1 | -1 | -1 |
| 51 | 17 | -1 | -1 | 146 | -1 | 53 | -1 | -1 | -1 | 38 | -1 | -1 |
| 121 | 142 | -1 | -1 | -1 | 79 | -1 | -1 | -1 | -1 | -1 | -1 | 206 |
| -1 | 88 | -1 | 148 | -1 | -1 | -1 | -1 | -1 | -1 | 50 | -1 | -1 |
| -1 | 53 | -1 | -1 | 191 | -1 | -1 | -1 | -1 | -1 | -1 | -1 | 138 |
| -1 | -1 | -1 | -1 | -1 | -1 | -1 | -1 | -1 | -1 | 183 | 5 | -1 |
| 10 | -1 | -1 | 67 | -1 | -1 | -1 | 38 | -1 | -1 | -1 | -1 | 105 |
| 69 | 92 | 127 | -1 | -1 | -1 | -1 | -1 | 36 | -1 | -1 | -1 | -1 |
| -1 | -1 | -1 | -1 | -1 | -1 | -1 | -1 | -1 | -1 | 137 | -1 | 57 |
| -1 | 94 | -1 | -1 | -1 | 21 | -1 | -1 | -1 | -1 | -1 | 199 | -1 |
| -1 | -1 | -1 | -1 | 10 | -1 | -1 | -1 | -1 | -1 | -1 | -1 | 163 |
| 26 | 180 | -1 | -1 | -1 | -1 | 62 | 17 | -1 | 101 | 150 | -1 | -1 |
| -1 | -1 | -1 | -1 | -1 | -1 | -1 | -1 | -1 | -1 | -1 | 96 | 191 |
| -1 | -1 | 170 | -1 | -1 | -1 | -1 | -1 | 179 | -1 | 129 | -1 | -1 |
| 33 | 9 | -1 | 42 | -1 | -1 | -1 | -1 | -1 | -1 | -1 | -1 | -1 |
| 62 | 48 | -1 | -1 | -1 | -1 | 199 | -1 | -1 | -1 | -1 | 44 | -1 |
| -1 | 38 | 111 | -1 | -1 | -1 | -1 | -1 | -1 | -1 | -1 | -1 | -1 |
| -1 | -1 | -1 | 146 | -1 | -1 | -1 | -1 | -1 | -1 | -1 | 102 | -1 |
| 71 | 186 | -1 | -1 | -1 | 52 | -1 | 112 | -1 | 39 | 15 | -1 | -1 |
| -1 | 201 | -1 | -1 | -1 | -1 | -1 | -1 | -1 | -1 | -1 | -1 | 120 |
| -1 | -1 | -1 | -1 | -1 | -1 | 183 | -1 | -1 | -1 | 72 | 110 | -1 |

| | | | | | | | | | | | | |
|---|---|---|---|---|---|---|---|---|---|---|---|---|
| 221 | 200 | 194 | 140 | 186 | 91 | 221 | 218 | 125 | 219 | 0 | 0 | -1 |
| -1 | 106 | 32 | 111 | 208 | 213 | 218 | 118 | 85 | 214 | 1 | 0 | 0 |
| 144 | 41 | 8 | 11 | 63 | 37 | 184 | 7 | 17 | 161 | 0 | -1 | 0 |
| 128 | 213 | -1 | -1 | -1 | -1 | -1 | -1 | -1 | -1 | -1 | -1 | -1 |
| 78 | -1 | 184 | -1 | -1 | -1 | -1 | 139 | -1 | 31 | 198 | -1 | -1 |
| 185 | 109 | -1 | -1 | -1 | -1 | 50 | -1 | -1 | -1 | -1 | -1 | 30 |
| 104 | 5 | -1 | -1 | 192 | -1 | -1 | 89 | -1 | 194 | -1 | -1 | -1 |
| -1 | 180 | -1 | 173 | -1 | -1 | 188 | -1 | -1 | -1 | 137 | -1 | -1 |
| 168 | 59 | -1 | -1 | -1 | -1 | -1 | 4 | -1 | 63 | -1 | -1 | 33 |
| 179 | -1 | -1 | -1 | 185 | 163 | -1 | -1 | -1 | -1 | 65 | -1 | -1 |
| 21 | 208 | 213 | -1 | -1 | -1 | -1 | 169 | -1 | -1 | -1 | -1 | -1 |
| 37 | -1 | -1 | 186 | -1 | -1 | -1 | -1 | -1 | 11 | -1 | -1 | 48 |
| -1 | 149 | -1 | -1 | -1 | 67 | -1 | 193 | -1 | -1 | 1 | -1 | -1 |
| 107 | -1 | -1 | 22 | -1 | -1 | -1 | -1 | -1 | 187 | -1 | -1 | 86 |
| 57 | 53 | -1 | -1 | -1 | -1 | -1 | -1 | 149 | -1 | 29 | -1 | -1 |
| -1 | 96 | 99 | -1 | -1 | 213 | -1 | -1 | -1 | -1 | -1 | -1 | -1 |
| 198 | -1 | -1 | -1 | 69 | -1 | -1 | -1 | -1 | -1 | -1 | -1 | 123 |
| 144 | 214 | -1 | -1 | -1 | 110 | -1 | -1 | -1 | -1 | 83 | -1 | -1 |
| 166 | -1 | -1 | -1 | -1 | -1 | -1 | 144 | -1 | -1 | -1 | 115 | -1 |
| 201 | 77 | -1 | 25 | -1 | -1 | -1 | -1 | -1 | -1 | -1 | -1 | -1 |
| 196 | -1 | -1 | -1 | -1 | -1 | 164 | -1 | -1 | -1 | 117 | -1 | -1 |
| 171 | -1 | 3 | -1 | -1 | -1 | -1 | -1 | -1 | -1 | -1 | -1 | 48 |
| -1 | 160 | -1 | -1 | -1 | -1 | -1 | -1 | -1 | 138 | -1 | 32 | -1 |
| 154 | -1 | -1 | -1 | 92 | -1 | -1 | -1 | -1 | -1 | 212 | -1 | -1 |
| 33 | -1 | 53 | -1 | -1 | 121 | -1 | -1 | -1 | -1 | -1 | -1 | -1 |
| 159 | 213 | -1 | -1 | -1 | -1 | -1 | -1 | 177 | -1 | 95 | -1 | -1 |
| 33 | -1 | -1 | 167 | -1 | -1 | -1 | -1 | -1 | -1 | -1 | -1 | 31 |
| -1 | 12 | -1 | -1 | -1 | -1 | 24 | -1 | -1 | -1 | 66 | -1 | -1 |
| 162 | -1 | -1 | -1 | 66 | -1 | -1 | -1 | -1 | -1 | -1 | -1 | 14 |
| 57 | -1 | -1 | -1 | -1 | -1 | -1 | -1 | 209 | -1 | -1 | 165 | -1 |
| 105 | -1 | 219 | -1 | -1 | -1 | -1 | -1 | -1 | -1 | 28 | -1 | -1 |
| -1 | 128 | -1 | 52 | -1 | -1 | -1 | -1 | 145 | -1 | -1 | -1 | -1 |
| 134 | -1 | -1 | -1 | -1 | 159 | -1 | -1 | -1 | -1 | -1 | -1 | 65 |
| 178 | -1 | -1 | -1 | 50 | -1 | -1 | -1 | -1 | -1 | -1 | 148 | -1 |
| 26 | -1 | 206 | -1 | -1 | -1 | -1 | -1 | -1 | -1 | 123 | -1 | -1 |
| 8 | -1 | -1 | -1 | -1 | -1 | 128 | -1 | -1 | -1 | -1 | -1 | 138 |
| -1 | 124 | -1 | -1 | -1 | -1 | -1 | -1 | -1 | -1 | -1 | 35 | -1 |

FROM FIG. 22B

| | | | | | | | | | | | | |
|---|---|---|---|---|---|---|---|---|---|---|---|---|
| 132 | -1 | -1 | 116 | -1 | -1 | -1 | -1 | 149 | -1 | 199 | -1 | -1 |
| 106 | -1 | 55 | -1 | -1 | -1 | 25 | -1 | -1 | -1 | -1 | -1 | -1 |
| 18 | -1 | -1 | -1 | -1 | 151 | -1 | -1 | -1 | -1 | -1 | 180 | -1 |
| -1 | -1 | -1 | -1 | -1 | -1 | -1 | -1 | 213 | -1 | 68 | -1 | 63 |
| 148 | -1 | -1 | -1 | 23 | -1 | -1 | -1 | -1 | -1 | -1 | 112 | -1 |
| 191 | -1 | -1 | 167 | -1 | -1 | -1 | -1 | -1 | -1 | 38 | -1 | -1 |
| -1 | 7 | 179 | -1 | -1 | -1 | -1 | -1 | -1 | 60 | -1 | -1 | -1 |
| 38 | -1 | -1 | -1 | -1 | 58 | -1 | -1 | -1 | -1 | -1 | 89 | -1 |
| -1 | -1 | -1 | -1 | -1 | -1 | -1 | 106 | -1 | -1 | 49 | -1 | 139 |
| -1 | -1 | 202 | -1 | -1 | -1 | -1 | -1 | -1 | -1 | -1 | 79 | -1 |
| -1 | -1 | -1 | -1 | -1 | -1 | 21 | -1 | -1 | -1 | 223 | -1 | 79 |
| 49 | -1 | -1 | -1 | 82 | -1 | -1 | -1 | -1 | -1 | -1 | 60 | -1 |
| -1 | 53 | -1 | -1 | -1 | -1 | -1 | -1 | -1 | -1 | -1 | -1 | 51 |
| 110 | -1 | -1 | 185 | -1 | -1 | -1 | -1 | 59 | -1 | 111 | -1 | -1 |
| -1 | 110 | -1 | -1 | -1 | 149 | -1 | -1 | -1 | -1 | -1 | -1 | 219 |
| 9 | -1 | -1 | -1 | 78 | -1 | -1 | -1 | -1 | -1 | 83 | -1 | -1 |
| -1 | -1 | 104 | -1 | -1 | -1 | -1 | -1 | -1 | 140 | -1 | -1 | 111 |
| -1 | -1 | -1 | -1 | -1 | -1 | -1 | 136 | -1 | -1 | 74 | 54 | -1 |
| 69 | -1 | -1 | 14 | -1 | -1 | -1 | -1 | -1 | -1 | -1 | -1 | -1 |
| 40 | 65 | -1 | -1 | -1 | -1 | 74 | -1 | -1 | -1 | -1 | 13 | -1 |
| -1 | -1 | 24 | -1 | -1 | -1 | -1 | -1 | -1 | -1 | 121 | -1 | -1 |
| -1 | -1 | -1 | -1 | -1 | -1 | 214 | -1 | -1 | -1 | -1 | 86 | 27 |
| -1 | 76 | -1 | -1 | 158 | -1 | -1 | -1 | 81 | -1 | 15 | -1 | -1 |
| -1 | 203 | -1 | -1 | -1 | -1 | -1 | -1 | -1 | -1 | -1 | 134 | -1 |
| -1 | -1 | -1 | -1 | -1 | 78 | -1 | -1 | -1 | 33 | 168 | -1 | 217 |
| -1 | -1 | -1 | 134 | -1 | -1 | -1 | -1 | -1 | -1 | -1 | 13 | -1 |
| 179 | 141 | -1 | -1 | -1 | -1 | -1 | 104 | -1 | -1 | 73 | -1 | -1 |
| -1 | 168 | -1 | -1 | 34 | -1 | -1 | -1 | -1 | -1 | -1 | -1 | -1 |
| -1 | -1 | 180 | -1 | -1 | -1 | -1 | -1 | -1 | -1 | -1 | -1 | 196 |
| 102 | 52 | -1 | -1 | -1 | -1 | 202 | -1 | 165 | -1 | 10 | -1 | -1 |
| -1 | -1 | -1 | -1 | -1 | -1 | -1 | -1 | -1 | -1 | -1 | 111 | 129 |
| 127 | -1 | 106 | -1 | -1 | -1 | -1 | 86 | -1 | -1 | 143 | -1 | -1 |
| 116 | -1 | -1 | -1 | -1 | 147 | -1 | -1 | -1 | -1 | -1 | -1 | 115 |
| -1 | -1 | -1 | 184 | -1 | -1 | -1 | -1 | -1 | -1 | 191 | -1 | -1 |
| 176 | 3 | -1 | -1 | -1 | -1 | 219 | -1 | 143 | 86 | -1 | -1 | 108 |
| -1 | -1 | -1 | -1 | -1 | -1 | -1 | -1 | -1 | -1 | 131 | 183 | |
| -1 | -1 | 88 | -1 | -1 | -1 | -1 | -1 | -1 | 78 | -1 | -1 | 55 |
| -1 | -1 | -1 | -1 | -1 | 153 | -1 | -1 | -1 | -1 | 16 | 137 | -1 |
| -1 | 210 | 41 | -1 | -1 | -1 | -1 | -1 | -1 | -1 | -1 | -1 | -1 |
| 3 | -1 | -1 | 98 | -1 | -1 | -1 | 111 | -1 | -1 | -1 | -1 | 165 |
| -1 | -1 | -1 | -1 | -1 | -1 | -1 | -1 | -1 | -1 | 136 | 211 | -1 |
| 180 | 154 | -1 | -1 | 105 | -1 | -1 | -1 | 209 | -1 | -1 | -1 | 181 |
| 123 | -1 | -1 | 223 | -1 | -1 | -1 | -1 | -1 | -1 | -1 | -1 | -1 |

TO FIG. 22D

FROM FIG. 22C

| | | | | | | | | | | | | |
|---|---|---|---|---|---|---|---|---|---|---|---|---|
| 90 | 100 | -1 | -1 | -1 | -1 | 171 | 195 | -1 | -1 | 167 | -1 | -1 |
| 203 | -1 | -1 | -1 | -1 | -1 | -1 | -1 | -1 | -1 | -1 | 0 | -1 |
| 22 | 5 | -1 | -1 | -1 | 40 | -1 | -1 | 49 | 131 | 215 | -1 | -1 |
| -1 | -1 | -1 | -1 | 79 | -1 | -1 | -1 | -1 | -1 | -1 | 158 | -1 |
| -1 | -1 | -1 | -1 | -1 | -1 | 79 | -1 | -1 | -1 | 59 | -1 | 202 |
| -1 | -1 | 103 | -1 | -1 | -1 | -1 | -1 | -1 | 29 | -1 | 222 | -1 |
| -1 | -1 | -1 | -1 | 141 | -1 | -1 | -1 | -1 | -1 | 43 | -1 | 205 |
| -1 | 185 | -1 | -1 | -1 | -1 | -1 | 65 | -1 | -1 | -1 | -1 | -1 |
| 0 | 127 | -1 | -1 | -1 | 113 | -1 | -1 | 67 | -1 | -1 | -1 | 79 |
| -1 | -1 | 205 | -1 | -1 | -1 | -1 | -1 | -1 | -1 | 83 | -1 | -1 |
| 198 | -1 | -1 | 82 | -1 | -1 | -1 | -1 | -1 | -1 | -1 | -1 | 117 |
| 187 | 95 | -1 | -1 | -1 | 222 | -1 | -1 | -1 | -1 | 196 | -1 | -1 |
| 171 | -1 | 118 | -1 | -1 | -1 | -1 | -1 | -1 | -1 | -1 | -1 | -1 |
| 173 | 162 | -1 | -1 | 89 | -1 | -1 | 133 | -1 | 90 | 163 | -1 | -1 |
| 119 | -1 | -1 | -1 | -1 | -1 | -1 | -1 | -1 | -1 | -1 | -1 | 49 |
| 201 | 110 | -1 | 54 | -1 | -1 | 28 | -1 | 20 | -1 | -1 | -1 | -1 |
| 136 | -1 | -1 | -1 | -1 | -1 | -1 | -1 | -1 | 93 | -1 | -1 | -1 |
| 73 | 22 | -1 | -1 | 186 | -1 | 91 | -1 | -1 | -1 | 146 | -1 | -1 |
| 54 | 150 | -1 | -1 | -1 | 126 | -1 | -1 | -1 | -1 | -1 | -1 | 34 |
| -1 | 97 | -1 | 197 | -1 | -1 | -1 | -1 | -1 | -1 | 159 | -1 | -1 |
| -1 | 63 | -1 | -1 | 148 | -1 | -1 | -1 | -1 | -1 | -1 | -1 | 7 |
| -1 | -1 | -1 | -1 | -1 | -1 | -1 | -1 | -1 | -1 | 31 | 1 | -1 |
| 10 | -1 | -1 | 178 | -1 | -1 | -1 | 206 | -1 | -1 | -1 | -1 | 216 |
| 44 | 99 | 27 | -1 | -1 | -1 | -1 | -1 | 68 | -1 | -1 | -1 | -1 |
| -1 | -1 | -1 | -1 | -1 | -1 | -1 | -1 | -1 | -1 | 42 | -1 | 61 |
| -1 | 100 | -1 | -1 | -1 | 218 | -1 | -1 | -1 | -1 | -1 | 195 | -1 |
| -1 | -1 | -1 | -1 | 10 | -1 | -1 | -1 | -1 | -1 | -1 | -1 | 39 |
| 211 | 187 | -1 | -1 | -1 | -1 | 136 | 14 | -1 | 80 | 96 | -1 | -1 |
| -1 | -1 | -1 | -1 | -1 | -1 | -1 | -1 | -1 | -1 | -1 | 101 | 94 |
| -1 | -1 | 74 | -1 | -1 | -1 | -1 | -1 | 188 | -1 | 39 | -1 | -1 |
| 127 | 9 | -1 | 113 | -1 | -1 | -1 | -1 | -1 | -1 | -1 | -1 | -1 |
| 53 | 53 | -1 | -1 | -1 | -1 | 85 | -1 | -1 | -1 | -1 | 137 | -1 |
| -1 | 29 | 59 | -1 | -1 | -1 | -1 | -1 | -1 | -1 | -1 | -1 | -1 |
| -1 | -1 | -1 | 157 | -1 | -1 | -1 | -1 | -1 | -1 | -1 | 84 | -1 |
| 46 | 204 | -1 | -1 | -1 | 0 | -1 | 88 | -1 | 191 | 98 | -1 | -1 |
| -1 | 210 | -1 | -1 | -1 | -1 | -1 | -1 | -1 | -1 | -1 | -1 | 214 |
| -1 | -1 | -1 | -1 | -1 | -1 | 205 | -1 | -1 | -1 | 192 | 174 | -1 |

| | | | | | | | | | | | | |
|---|---|---|---|---|---|---|---|---|---|---|---|---|
| 228 | 208 | 229 | 174 | 118 | 51 | 81 | 234 | 212 | 78 | 0 | 0 | -1 |
| -1 | 173 | 83 | 119 | 220 | 233 | 210 | 226 | 46 | 136 | 1 | 0 | 0 |
| 146 | 145 | 77 | 20 | 5 | 9 | 65 | 118 | 8 | 35 | 0 | -1 | 0 |
| 147 | 164 | -1 | -1 | -1 | -1 | -1 | -1 | -1 | -1 | -1 | -1 | -1 |
| 80 | -1 | 95 | -1 | -1 | -1 | -1 | 50 | -1 | 51 | 119 | -1 | -1 |
| 199 | 56 | -1 | -1 | -1 | -1 | 41 | -1 | -1 | -1 | -1 | -1 | 60 |
| 50 | 14 | -1 | -1 | 182 | -1 | -1 | 12 | -1 | 31 | -1 | -1 | -1 |
| -1 | 193 | -1 | 231 | -1 | -1 | 144 | -1 | -1 | -1 | 125 | -1 | -1 |
| 184 | 60 | -1 | -1 | -1 | -1 | -1 | 91 | -1 | 84 | -1 | -1 | 12 |
| 183 | -1 | -1 | -1 | 86 | 182 | -1 | -1 | -1 | -1 | 33 | -1 | -1 |
| 23 | 35 | 212 | -1 | -1 | -1 | -1 | 191 | -1 | -1 | -1 | -1 | -1 |
| 41 | -1 | -1 | 131 | -1 | -1 | -1 | -1 | -1 | 186 | -1 | -1 | 55 |
| -1 | 161 | -1 | -1 | -1 | 179 | -1 | 83 | -1 | -1 | 237 | -1 | -1 |
| 108 | -1 | -1 | 70 | -1 | -1 | -1 | -1 | -1 | 157 | -1 | -1 | 3 |
| 61 | 59 | -1 | -1 | -1 | -1 | -1 | -1 | 151 | -1 | 237 | -1 | -1 |
| -1 | 102 | 191 | -1 | -1 | 199 | -1 | -1 | -1 | -1 | -1 | -1 | -1 |
| 210 | -1 | -1 | -1 | 95 | -1 | -1 | -1 | -1 | -1 | -1 | -1 | 117 |
| 175 | 235 | -1 | -1 | -1 | 101 | -1 | -1 | -1 | -1 | 211 | -1 | -1 |
| 168 | -1 | -1 | -1 | -1 | -1 | -1 | 122 | -1 | -1 | -1 | 187 | -1 |
| 176 | 89 | -1 | 27 | -1 | -1 | -1 | -1 | -1 | -1 | -1 | -1 | -1 |
| 224 | -1 | -1 | -1 | -1 | -1 | 230 | -1 | -1 | -1 | 159 | -1 | -1 |
| 192 | -1 | 235 | -1 | -1 | -1 | -1 | -1 | -1 | -1 | -1 | -1 | 148 |
| -1 | 175 | -1 | -1 | -1 | -1 | -1 | -1 | -1 | 106 | -1 | 158 | -1 |
| 179 | -1 | -1 | -1 | 44 | -1 | -1 | -1 | -1 | -1 | 82 | -1 | -1 |
| 35 | -1 | 45 | -1 | -1 | 121 | -1 | -1 | -1 | -1 | -1 | -1 | -1 |
| 138 | 232 | -1 | -1 | -1 | -1 | -1 | -1 | 237 | -1 | 106 | -1 | -1 |
| 33 | -1 | -1 | 197 | -1 | -1 | -1 | -1 | -1 | -1 | -1 | -1 | 88 |
| -1 | 2 | -1 | -1 | -1 | -1 | 157 | -1 | -1 | -1 | 140 | -1 | -1 |
| 178 | -1 | -1 | -1 | 122 | -1 | -1 | -1 | -1 | -1 | -1 | -1 | 33 |
| 60 | -1 | -1 | -1 | -1 | -1 | -1 | -1 | 130 | -1 | -1 | 77 | -1 |
| 111 | -1 | 204 | -1 | -1 | -1 | -1 | -1 | -1 | -1 | 68 | -1 | -1 |
| -1 | 148 | -1 | 40 | -1 | -1 | -1 | -1 | 155 | -1 | -1 | -1 | -1 |
| 138 | -1 | -1 | -1 | -1 | 192 | -1 | -1 | -1 | -1 | -1 | -1 | 95 |
| 180 | -1 | -1 | -1 | 209 | -1 | -1 | -1 | -1 | -1 | -1 | 125 | -1 |
| 15 | -1 | 206 | -1 | -1 | -1 | -1 | -1 | -1 | -1 | 179 | -1 | -1 |
| 5 | -1 | -1 | -1 | -1 | -1 | 155 | -1 | -1 | -1 | -1 | -1 | 161 |
| -1 | 124 | -1 | -1 | -1 | -1 | -1 | -1 | -1 | -1 | -1 | 102 | -1 |

FROM FIG. 23B

| | | | | | | | | | | | | |
|---|---|---|---|---|---|---|---|---|---|---|---|---|
| 139 | -1 | -1 | 217 | -1 | -1 | -1 | -1 | 102 | -1 | 232 | -1 | -1 |
| 112 | -1 | 44 | -1 | -1 | -1 | 158 | -1 | -1 | -1 | -1 | -1 | -1 |
| 28 | -1 | -1 | -1 | -1 | 105 | -1 | -1 | -1 | -1 | -1 | 46 | -1 |
| -1 | -1 | -1 | -1 | -1 | -1 | -1 | -1 | 227 | -1 | 215 | -1 | 158 |
| 151 | -1 | -1 | -1 | 172 | -1 | -1 | -1 | -1 | -1 | -1 | 180 | -1 |
| 208 | -1 | -1 | 189 | -1 | -1 | -1 | -1 | -1 | -1 | 50 | -1 | -1 |
| -1 | 2 | 198 | -1 | -1 | -1 | -1 | -1 | -1 | 155 | -1 | -1 | -1 |
| 38 | -1 | -1 | -1 | -1 | 179 | -1 | -1 | -1 | -1 | -1 | 213 | -1 |
| -1 | -1 | -1 | -1 | -1 | -1 | -1 | 113 | -1 | -1 | 157 | -1 | 76 |
| -1 | -1 | 230 | -1 | -1 | -1 | -1 | -1 | -1 | -1 | -1 | 88 | -1 |
| -1 | -1 | -1 | -1 | -1 | -1 | 23 | -1 | -1 | -1 | 70 | -1 | 21 |
| 45 | -1 | -1 | -1 | 73 | -1 | -1 | -1 | -1 | -1 | -1 | 193 | -1 |
| -1 | 45 | -1 | -1 | -1 | -1 | -1 | -1 | -1 | -1 | -1 | -1 | 107 |
| 113 | -1 | -1 | 237 | -1 | -1 | -1 | -1 | 156 | -1 | 30 | -1 | -1 |
| -1 | 110 | -1 | -1 | -1 | 191 | -1 | -1 | -1 | -1 | -1 | -1 | 50 |
| 1 | -1 | -1 | -1 | 228 | -1 | -1 | -1 | -1 | -1 | 171 | -1 | -1 |
| -1 | -1 | 195 | -1 | -1 | -1 | -1 | -1 | -1 | 161 | -1 | -1 | 218 |
| -1 | -1 | -1 | -1 | -1 | -1 | -1 | 141 | -1 | -1 | 146 | 16 | -1 |
| 62 | -1 | -1 | 79 | -1 | -1 | -1 | -1 | -1 | -1 | -1 | -1 | -1 |
| 39 | 70 | -1 | -1 | -1 | -1 | 38 | -1 | -1 | -1 | -1 | 5 | -1 |
| -1 | -1 | 16 | -1 | -1 | -1 | -1 | -1 | -1 | -1 | 11 | -1 | -1 |
| -1 | -1 | -1 | -1 | -1 | -1 | 225 | -1 | -1 | -1 | -1 | 35 | 14 |
| -1 | 81 | -1 | -1 | 179 | -1 | -1 | -1 | 96 | -1 | 93 | -1 | -1 |
| -1 | 222 | -1 | -1 | -1 | -1 | -1 | -1 | -1 | -1 | -1 | 211 | -1 |
| -1 | -1 | -1 | -1 | -1 | 225 | -1 | -1 | -1 | 36 | 25 | -1 | 176 |
| -1 | -1 | -1 | 148 | -1 | -1 | -1 | -1 | -1 | -1 | -1 | 54 | -1 |
| 10 | 150 | -1 | -1 | -1 | -1 | -1 | 109 | -1 | -1 | 191 | -1 | -1 |
| -1 | 191 | -1 | -1 | 62 | -1 | -1 | -1 | -1 | -1 | -1 | -1 | -1 |
| -1 | -1 | 191 | -1 | -1 | -1 | -1 | -1 | -1 | -1 | -1 | -1 | 230 |
| 66 | 59 | -1 | -1 | -1 | -1 | 63 | -1 | 114 | -1 | 55 | -1 | -1 |
| -1 | -1 | -1 | -1 | -1 | -1 | -1 | -1 | -1 | -1 | -1 | 116 | 51 |
| 142 | -1 | 199 | -1 | -1 | -1 | -1 | 170 | -1 | -1 | 106 | -1 | -1 |
| 122 | -1 | -1 | -1 | -1 | 62 | -1 | -1 | -1 | -1 | -1 | -1 | 0 |
| -1 | -1 | -1 | 203 | -1 | -1 | -1 | -1 | -1 | -1 | 121 | -1 | -1 |
| 51 | 12 | -1 | -1 | -1 | -1 | 179 | -1 | 143 | 27 | -1 | -1 | 21 |
| -1 | -1 | -1 | -1 | -1 | -1 | -1 | -1 | -1 | -1 | 226 | 204 | |
| -1 | -1 | 163 | -1 | -1 | -1 | -1 | -1 | -1 | 79 | -1 | -1 | 214 |
| -1 | -1 | -1 | -1 | -1 | 163 | -1 | -1 | -1 | -1 | 137 | 84 | -1 |
| -1 | 238 | 141 | -1 | -1 | -1 | -1 | -1 | -1 | -1 | -1 | -1 | -1 |
| 1 | -1 | -1 | 111 | -1 | -1 | -1 | 87 | -1 | -1 | -1 | -1 | 10 |
| -1 | -1 | -1 | -1 | -1 | -1 | -1 | -1 | -1 | -1 | 145 | 226 | -1 |
| 167 | 172 | -1 | -1 | 215 | -1 | -1 | -1 | 36 | -1 | -1 | -1 | 48 |
| 129 | -1 | -1 | 227 | -1 | -1 | -1 | -1 | -1 | -1 | -1 | -1 | -1 |

TO FIG. 23D

FROM FIG. 23C

| | | | | | | | | | | | | |
|---|---|---|---|---|---|---|---|---|---|---|---|---|
| 31 | 113 | -1 | -1 | -1 | -1 | 191 | 92 | -1 | -1 | 224 | -1 | -1 |
| 222 | -1 | -1 | -1 | -1 | -1 | -1 | -1 | -1 | -1 | -1 | 27 | -1 |
| 177 | 8 | -1 | -1 | -1 | 167 | -1 | -1 | 2 | 180 | 121 | -1 | -1 |
| -1 | -1 | -1 | -1 | 89 | -1 | -1 | -1 | -1 | -1 | -1 | 186 | -1 |
| -1 | -1 | -1 | -1 | -1 | -1 | 78 | -1 | -1 | -1 | 152 | -1 | 44 |
| -1 | -1 | 208 | -1 | -1 | -1 | -1 | -1 | -1 | 35 | -1 | 58 | -1 |
| -1 | -1 | -1 | -1 | 163 | -1 | -1 | -1 | -1 | -1 | 52 | -1 | 84 |
| -1 | 199 | -1 | -1 | -1 | -1 | -1 | 89 | -1 | -1 | -1 | -1 | -1 |
| 94 | 137 | -1 | -1 | -1 | 194 | -1 | -1 | 110 | -1 | -1 | -1 | 60 |
| -1 | -1 | 216 | -1 | -1 | -1 | -1 | -1 | -1 | -1 | 132 | -1 | -1 |
| 224 | -1 | -1 | 207 | -1 | -1 | -1 | -1 | -1 | -1 | -1 | -1 | 81 |
| 186 | 91 | -1 | -1 | -1 | 224 | -1 | -1 | -1 | -1 | 196 | -1 | -1 |
| 189 | -1 | 233 | -1 | -1 | -1 | -1 | -1 | -1 | -1 | -1 | -1 | -1 |
| 42 | 170 | -1 | -1 | 96 | -1 | -1 | 50 | -1 | 199 | 33 | -1 | -1 |
| 131 | -1 | -1 | -1 | -1 | -1 | -1 | -1 | -1 | -1 | -1 | -1 | 239 |
| 228 | 110 | -1 | 141 | -1 | -1 | 179 | -1 | 51 | -1 | -1 | -1 | -1 |
| 138 | -1 | -1 | -1 | -1 | -1 | -1 | -1 | -1 | 155 | -1 | -1 | -1 |
| 95 | 20 | -1 | -1 | 61 | -1 | 137 | -1 | -1 | -1 | 149 | -1 | -1 |
| 24 | 158 | -1 | -1 | -1 | 193 | -1 | -1 | -1 | -1 | -1 | -1 | 48 |
| -1 | 104 | -1 | 122 | -1 | -1 | -1 | -1 | -1 | -1 | 108 | -1 | -1 |
| -1 | 69 | -1 | -1 | 173 | -1 | -1 | -1 | -1 | -1 | -1 | -1 | 173 |
| -1 | -1 | -1 | -1 | -1 | -1 | -1 | -1 | -1 | -1 | 134 | 1 | -1 |
| 2 | -1 | -1 | 12 | -1 | -1 | -1 | 172 | -1 | -1 | -1 | -1 | 72 |
| 168 | 117 | 67 | -1 | -1 | -1 | -1 | -1 | 84 | -1 | -1 | -1 | -1 |
| -1 | -1 | -1 | -1 | -1 | -1 | -1 | -1 | -1 | -1 | 201 | -1 | 73 |
| -1 | 110 | -1 | -1 | -1 | 195 | -1 | -1 | -1 | -1 | -1 | 137 | -1 |
| -1 | -1 | -1 | -1 | 9 | -1 | -1 | 14 | -1 | -1 | -1 | -1 | 225 |
| 150 | 207 | -1 | -1 | -1 | -1 | 118 | 167 | -1 | 158 | 64 | -1 | -1 |
| -1 | -1 | -1 | -1 | -1 | -1 | -1 | -1 | -1 | -1 | -1 | 111 | 40 |
| -1 | -1 | 110 | -1 | -1 | -1 | -1 | -1 | 197 | -1 | 85 | -1 | -1 |
| 225 | 3 | -1 | 117 | -1 | -1 | -1 | -1 | -1 | -1 | -1 | -1 | -1 |
| 133 | 49 | -1 | -1 | -1 | -1 | 48 | -1 | -1 | -1 | -1 | 82 | -1 |
| -1 | 30 | 133 | -1 | -1 | -1 | -1 | -1 | -1 | -1 | -1 | -1 | -1 |
| -1 | -1 | -1 | 169 | -1 | -1 | -1 | -1 | -1 | -1 | -1 | 83 | -1 |
| 46 | 212 | -1 | -1 | -1 | 133 | -1 | 19 | -1 | 90 | 185 | -1 | -1 |
| -1 | 236 | -1 | -1 | -1 | -1 | -1 | -1 | -1 | -1 | -1 | -1 | 177 |
| -1 | -1 | -1 | -1 | -1 | -1 | 219 | -1 | -1 | -1 | 84 | 155 | -1 |

| Zorig | ΔZ index (3 bit) | Automatically calculated parameters | | | | Zorig | ΔZ index (3 bit) | Automatically calculated parameters | | | |
|---|---|---|---|---|---|---|---|---|---|---|---|
| | | ΔZ | Z=Zorig+ΔZ | a | Range of K | | | ΔZ | Z=Zorig+ΔZ | a | Range of K |
| 30 | 2 | 6 | 36 | 9 | 640-660 | 100 | 2 | 20 | 120 | 15 | 2179-2200 |
| 31 | 1 | 5 | 36 | 9 | 661-682 | 101 | 2 | 19 | 120 | 15 | 2201-2222 |
| 32 | 1 | 4 | 36 | 9 | 683-704 | 102 | 2 | 18 | 120 | 15 | 2223-2244 |
| 33 | 2 | 11 | 44 | 11 | 705-726 | 103 | 1 | 17 | 120 | 15 | 2245-2266 |
| 34 | 2 | 10 | 44 | 11 | 727-748 | 104 | 1 | 16 | 120 | 15 | 2267-2288 |
| 35 | 2 | 9 | 44 | 11 | 749-770 | 105 | 1 | 15 | 120 | 15 | 2289-2310 |
| 36 | 2 | 8 | 44 | 11 | 771-792 | 106 | 2 | 22 | 128 | 8 | 2311-2332 |
| 37 | 1 | 7 | 44 | 11 | 793-814 | 107 | 2 | 21 | 128 | 8 | 2333-2354 |
| 38 | 1 | 6 | 44 | 11 | 815-836 | 108 | 2 | 20 | 128 | 8 | 2355-2376 |
| 39 | 1 | 5 | 44 | 11 | 837-858 | 109 | 1 | 11 | 120 | 15 | 2377-2398 |
| 40 | 4 | 16 | 56 | 14 | 859-880 | 110 | 1 | 10 | 120 | 15 | 2399-2420 |
| 41 | 0 | 3 | 44 | 11 | 881-902 | 111 | 1 | 9 | 120 | 15 | 2421-2442 |
| 42 | 2 | 10 | 52 | 13 | 903-924 | 112 | 0 | 8 | 120 | 15 | 2443-2464 |
| 43 | 3 | 13 | 56 | 14 | 925-946 | 113 | 0 | 7 | 120 | 15 | 2465-2486 |
| 44 | 3 | 12 | 56 | 14 | 947-968 | 114 | 0 | 6 | 120 | 15 | 2487-2508 |
| 45 | 2 | 11 | 56 | 14 | 969-990 | 115 | 1 | 13 | 128 | 8 | 2509-2530 |
| 46 | 2 | 10 | 56 | 14 | 991-1012 | 116 | 1 | 12 | 128 | 8 | 2531-2552 |
| 47 | 2 | 9 | 56 | 14 | 1013-1034 | 117 | 1 | 11 | 128 | 8 | 2553-2574 |
| 48 | 2 | 8 | 56 | 14 | 1035-1056 | 118 | 1 | 10 | 128 | 8 | 2575-2596 |
| 49 | 1 | 7 | 56 | 14 | 1057-1078 | 119 | 1 | 9 | 128 | 8 | 2597-2618 |
| 50 | 1 | 6 | 56 | 14 | 1079-1100 | 120 | 1 | 8 | 128 | 8 | 2619-2640 |
| 51 | 1 | 5 | 56 | 14 | 1101-1122 | 121 | 0 | 7 | 128 | 8 | 2641-2662 |
| 52 | 0 | 4 | 56 | 14 | 1123-1144 | 122 | 0 | 6 | 128 | 8 | 2663-2684 |
| 53 | 0 | 3 | 56 | 14 | 1145-1166 | 123 | 0 | 5 | 128 | 8 | 2685-2706 |
| 54 | 1 | 6 | 60 | 15 | 1167-1188 | 124 | 2 | 36 | 160 | 10 | 2707-2728 |
| 55 | 1 | 5 | 60 | 15 | 1189-1210 | 125 | 2 | 35 | 160 | 10 | 2729-2750 |

FROM FIG. 24A

| | | | | | | | | | | | |
|---|---|---|---|---|---|---|---|---|---|---|---|
| 56 | 1 | 4 | 60 | 15 | 1211-1232 | 126 | 2 | 34 | 160 | 10 | 2751-2772 |
| 57 | 1 | 7 | 64 | 8 | 1233-1254 | 127 | 2 | 33 | 160 | 10 | 2773-2794 |
| 58 | 2 | 14 | 72 | 9 | 1255-1276 | 128 | 2 | 32 | 160 | 10 | 2795-2816 |
| 59 | 2 | 13 | 72 | 9 | 1277-1298 | 129 | 1 | 31 | 160 | 10 | 2817-2838 |
| 60 | 2 | 12 | 72 | 9 | 1299-1320 | 130 | 1 | 30 | 160 | 10 | 2839-2860 |
| 61 | 0 | 3 | 64 | 8 | 1321-1342 | 131 | 1 | 29 | 160 | 10 | 2861-2882 |
| 62 | 0 | 2 | 64 | 8 | 1343-1364 | 132 | 1 | 28 | 160 | 10 | 2883-2904 |
| 63 | 1 | 9 | 72 | 9 | 1365-1386 | 133 | 1 | 27 | 160 | 10 | 2905-2926 |
| 64 | 1 | 8 | 72 | 9 | 1387-1408 | 134 | 1 | 26 | 160 | 10 | 2927-2948 |
| 65 | 0 | 7 | 72 | 9 | 1409-1430 | 135 | 1 | 25 | 160 | 10 | 2949-2970 |
| 66 | 0 | 6 | 72 | 9 | 1431-1452 | 136 | 1 | 24 | 160 | 10 | 2971-2992 |
| 67 | 0 | 5 | 72 | 9 | 1453-1474 | 137 | 1 | 23 | 160 | 10 | 2993-3014 |
| 68 | 1 | 12 | 80 | 10 | 1475-1496 | 138 | 0 | 6 | 144 | 9 | 3015-3036 |
| 69 | 1 | 11 | 80 | 10 | 1497-1518 | 139 | 0 | 5 | 144 | 9 | 3037-3058 |
| 70 | 1 | 10 | 80 | 10 | 1519-1540 | 140 | 0 | 4 | 144 | 9 | 3059-3080 |
| 71 | 1 | 9 | 80 | 10 | 1541-1562 | 141 | 1 | 19 | 160 | 10 | 3081-3102 |
| 72 | 1 | 8 | 80 | 10 | 1563-1584 | 142 | 1 | 18 | 160 | 10 | 3103-3124 |
| 73 | 1 | 15 | 88 | 11 | 1585-1606 | 143 | 1 | 17 | 160 | 10 | 3125-3146 |
| 74 | 0 | 6 | 80 | 10 | 1607-1628 | 144 | 0 | 16 | 160 | 10 | 3147-3168 |
| 75 | 0 | 5 | 80 | 10 | 1629-1650 | 145 | 0 | 15 | 160 | 10 | 3169-3190 |
| 76 | 1 | 12 | 88 | 11 | 1651-1672 | 146 | 0 | 14 | 160 | 10 | 3191-3212 |
| 77 | 0 | 3 | 80 | 10 | 1673-1694 | 147 | 0 | 13 | 160 | 10 | 3213-3234 |

TO FIG. 24C

FROM FIG. 24B

| | | | | | |
|---|---|---|---|---|---|
| 78 | 0 | 2 | 80 | 10 | 1695-1716 |
| 79 | 1 | 9 | 88 | 11 | 1717-1738 |
| 80 | 1 | 8 | 88 | 11 | 1739-1760 |
| 81 | 1 | 15 | 96 | 12 | 1761-1782 |
| 82 | 1 | 14 | 96 | 12 | 1783-1804 |
| 83 | 1 | 13 | 96 | 12 | 1805-1826 |
| 84 | 1 | 12 | 96 | 12 | 1827-1848 |
| 85 | 1 | 11 | 96 | 12 | 1849-1870 |
| 86 | 1 | 10 | 96 | 12 | 1871-1892 |
| 87 | 1 | 9 | 96 | 12 | 1893-1914 |
| 88 | 1 | 8 | 96 | 12 | 1915-1936 |
| 89 | 2 | 23 | 112 | 14 | 1937-1958 |
| 90 | 0 | 6 | 96 | 12 | 1959-1980 |
| 91 | 0 | 5 | 96 | 12 | 1981-2002 |
| 92 | 2 | 20 | 112 | 14 | 2003-2024 |
| 93 | 2 | 19 | 112 | 14 | 2025-2046 |
| 94 | 2 | 18 | 112 | 14 | 2047-2068 |
| 95 | 3 | 25 | 120 | 15 | 2069-2090 |
| 96 | 3 | 24 | 120 | 15 | 2091-2112 |
| 97 | 2 | 23 | 120 | 15 | 2113-2134 |
| 98 | 2 | 22 | 120 | 15 | 2135-2156 |
| 99 | 2 | 21 | 120 | 15 | 2157-2178 |

| | | | | | |
|---|---|---|---|---|---|
| 148 | 0 | 12 | 160 | 10 | 3235-3256 |
| 149 | 0 | 11 | 160 | 10 | 3257-3278 |
| 150 | 0 | 10 | 160 | 10 | 3279-3300 |
| 151 | 0 | 9 | 160 | 10 | 3301-3322 |
| 152 | 0 | 8 | 160 | 10 | 3323-3344 |
| 153 | 2 | 39 | 192 | 12 | 3345-3366 |
| 154 | 2 | 38 | 192 | 12 | 3367-3388 |
| 155 | 2 | 37 | 192 | 12 | 3389-3410 |
| 156 | 2 | 36 | 192 | 12 | 3411-3432 |
| 157 | 2 | 35 | 192 | 12 | 3433-3454 |
| 158 | 2 | 34 | 192 | 12 | 3455-3476 |
| 159 | 2 | 33 | 192 | 12 | 3477-3498 |
| 160 | 2 | 32 | 192 | 12 | 3499-3520 |
| 161 | 2 | 47 | 208 | 13 | 3521-3542 |
| 162 | 2 | 46 | 208 | 13 | 3543-3564 |
| 163 | 2 | 45 | 208 | 13 | 3565-3586 |
| 164 | 1 | 28 | 192 | 12 | 3587-3608 |
| 165 | 1 | 27 | 192 | 12 | 3609-3630 |
| 166 | 1 | 26 | 192 | 12 | 3631-3652 |
| 167 | 1 | 25 | 192 | 12 | 3653-3674 |
| 168 | 1 | 24 | 192 | 12 | 3675-3696 |
| 169 | 1 | 23 | 192 | 12 | 3697-3718 |

FIG. 24C

| Zorig | ΔZ index (3 bit) | Automatically calculated parameters | | | | Zorig | ΔZ index (3 bit) | Automatically calculated parameters | | | |
|---|---|---|---|---|---|---|---|---|---|---|---|
| | | ΔZ | Z=Zorig+ΔZ | a | Range of K | | | ΔZ | Z=Zorig+ΔZ | a | Range of K |
| 170 | 2 | 38 | 208 | 13 | 3719-3740 | 240 | 0 | 16 | 256 | 8 | 5259-5280 |
| 171 | 2 | 37 | 208 | 13 | 3741-3762 | 241 | 0 | 15 | 256 | 8 | 5281-5302 |
| 172 | 2 | 36 | 208 | 13 | 3763-3784 | 242 | 0 | 14 | 256 | 8 | 5303-5324 |
| 173 | 1 | 19 | 192 | 12 | 3785-3806 | 243 | 0 | 13 | 256 | 8 | 5325-5346 |
| 174 | 1 | 18 | 192 | 12 | 3807-3828 | 244 | 0 | 12 | 256 | 8 | 5347-5368 |
| 175 | 1 | 17 | 192 | 12 | 3829-3850 | 245 | 0 | 11 | 256 | 8 | 5369-5390 |
| 176 | 1 | 32 | 208 | 13 | 3851-3872 | 246 | 0 | 10 | 256 | 8 | 5391-5412 |
| 177 | 1 | 31 | 208 | 13 | 3873-3894 | 247 | 0 | 9 | 256 | 8 | 5413-5434 |
| 178 | 1 | 30 | 208 | 13 | 3895-3916 | 248 | 0 | 8 | 256 | 8 | 5435-5456 |
| 179 | 1 | 29 | 208 | 13 | 3917-3938 | 249 | 1 | 39 | 288 | 9 | 5457-5478 |
| 180 | 1 | 28 | 208 | 13 | 3939-3960 | 250 | 1 | 38 | 288 | 9 | 5479-5500 |
| 181 | 1 | 27 | 208 | 13 | 3961-3982 | 251 | 1 | 37 | 288 | 9 | 5501-5522 |
| 182 | 1 | 26 | 208 | 13 | 3983-4004 | 252 | 1 | 36 | 288 | 9 | 5523-5544 |
| 183 | 1 | 25 | 208 | 13 | 4005-4026 | 253 | 1 | 35 | 288 | 9 | 5545-5566 |
| 184 | 1 | 24 | 208 | 13 | 4027-4048 | 254 | 1 | 34 | 288 | 9 | 5567-5588 |
| 185 | 1 | 23 | 208 | 13 | 4049-4070 | 255 | 0 | 1 | 256 | 8 | 5589-5610 |
| 186 | 1 | 22 | 208 | 13 | 4071-4092 | 256 | 0 | 0 | 256 | 8 | 5611-5632 |
| 187 | 1 | 21 | 208 | 13 | 4093-4114 | 257 | 0 | 31 | 288 | 9 | 5633-5654 |
| 188 | 2 | 36 | 224 | 14 | 4115-4136 | 258 | 0 | 30 | 288 | 9 | 5655-5676 |
| 189 | 2 | 35 | 224 | 14 | 4137-4158 | 259 | 0 | 29 | 288 | 9 | 5677-5698 |
| 190 | 2 | 34 | 224 | 14 | 4159-4180 | 260 | 0 | 28 | 288 | 9 | 5699-5720 |
| 191 | 1 | 17 | 208 | 13 | 4181-4202 | 261 | 0 | 27 | 288 | 9 | 5721-5742 |
| 192 | 1 | 16 | 208 | 13 | 4203-4224 | 262 | 0 | 26 | 288 | 9 | 5743-5764 |
| 193 | 1 | 31 | 224 | 14 | 4225-4246 | 263 | 0 | 25 | 288 | 9 | 5765-5786 |
| 194 | 1 | 30 | 224 | 14 | 4247-4268 | 264 | 0 | 24 | 288 | 9 | 5787-5808 |

FROM FIG. 24D

| | | | | | | | | | | | |
|---|---|---|---|---|---|---|---|---|---|---|---|
| 195 | 1 | 29 | 224 | 14 | 4269-4290 | 265 | 0 | 23 | 288 | 9 | 5809-5830 |
| 196 | 0 | 12 | 208 | 13 | 4291-4312 | 266 | 0 | 22 | 288 | 9 | 5831-5852 |
| 197 | 0 | 11 | 208 | 13 | 4313-4334 | 267 | 0 | 21 | 288 | 9 | 5853-5874 |
| 198 | 0 | 10 | 208 | 13 | 4335-4356 | 268 | 0 | 20 | 288 | 9 | 5875-5896 |
| 199 | 1 | 25 | 224 | 14 | 4357-4378 | 269 | 0 | 19 | 288 | 9 | 5897-5918 |
| 200 | 1 | 24 | 224 | 14 | 4379-4400 | 270 | 0 | 18 | 288 | 9 | 5919-5940 |
| 201 | 1 | 23 | 224 | 14 | 4401-4422 | 271 | 0 | 17 | 288 | 9 | 5941-5962 |
| 202 | 0 | 6 | 208 | 13 | 4423-4444 | 272 | 0 | 16 | 288 | 9 | 5963-5984 |
| 203 | 0 | 5 | 208 | 13 | 4445-4466 | 273 | 0 | 15 | 288 | 9 | 5985-6006 |
| 204 | 0 | 4 | 208 | 13 | 4467-4488 | 274 | 0 | 14 | 288 | 9 | 6007-6028 |
| 205 | 1 | 19 | 224 | 14 | 4489-4510 | 275 | 0 | 13 | 288 | 9 | 6029-6050 |
| 206 | 1 | 18 | 224 | 14 | 4511-4532 | 276 | 0 | 12 | 288 | 9 | 6051-6072 |
| 207 | 1 | 17 | 224 | 14 | 4533-4554 | 277 | 0 | 11 | 288 | 9 | 6073-6094 |
| 208 | 1 | 32 | 240 | 15 | 4555-4576 | 278 | 0 | 10 | 288 | 9 | 6095-6116 |
| 209 | 1 | 31 | 240 | 15 | 4577-4598 | 279 | 0 | 9 | 288 | 9 | 6117-6138 |
| 210 | 1 | 30 | 240 | 15 | 4599-4620 | 280 | 0 | 8 | 288 | 9 | 6139-6160 |
| 211 | 1 | 29 | 240 | 15 | 4621-4642 | 281 | 0 | 7 | 288 | 9 | 6161-6182 |
| 212 | 1 | 28 | 240 | 15 | 4643-4664 | 282 | 0 | 6 | 288 | 9 | 6183-6204 |
| 213 | 1 | 27 | 240 | 15 | 4665-4686 | 283 | 0 | 5 | 288 | 9 | 6205-6226 |
| 214 | 0 | 10 | 224 | 14 | 4687-4708 | 284 | 0 | 4 | 288 | 9 | 6227-6248 |
| 215 | 0 | 9 | 224 | 14 | 4709-4730 | 285 | 0 | 3 | 288 | 9 | 6249-6270 |
| 216 | 0 | 8 | 224 | 14 | 4731-4752 | 286 | 0 | 2 | 288 | 9 | 6271-6292 |

TO FIG. 25F

FROM FIG. 24E

| | | | | | | | | | | | |
|---|---|---|---|---|---|---|---|---|---|---|---|
| 217 | 1 | 23 | 240 | 15 | 4753-4774 | 287 | 0 | 33 | 320 | 10 | 6293-6314 |
| 218 | 1 | 22 | 240 | 15 | 4775-4796 | 288 | 0 | 32 | 320 | 10 | 6315-6336 |
| 219 | 1 | 21 | 240 | 15 | 4797-4818 | 289 | 0 | 31 | 320 | 10 | 6337-6358 |
| 220 | 0 | 4 | 224 | 14 | 4819-4840 | 290 | 0 | 30 | 320 | 10 | 6359-6380 |
| 221 | 0 | 3 | 224 | 14 | 4841-4862 | 291 | 0 | 29 | 320 | 10 | 6381-6402 |
| 222 | 0 | 2 | 224 | 14 | 4863-4884 | 292 | 0 | 28 | 320 | 10 | 6403-6424 |
| 223 | 1 | 17 | 240 | 15 | 4885-4906 | 293 | 0 | 27 | 320 | 10 | 6425-6446 |
| 224 | 1 | 16 | 240 | 15 | 4907-4928 | 294 | 0 | 26 | 320 | 10 | 6447-6468 |
| 225 | 0 | 15 | 240 | 15 | 4929-4950 | 295 | 0 | 25 | 320 | 10 | 6469-6490 |
| 226 | 0 | 14 | 240 | 15 | 4951-4972 | 296 | 0 | 24 | 320 | 10 | 6491-6512 |
| 227 | 0 | 13 | 240 | 15 | 4973-4994 | 297 | 0 | 23 | 320 | 10 | 6513-6534 |
| 228 | 1 | 28 | 256 | 8 | 4995-5016 | 298 | 0 | 22 | 320 | 10 | 6535-6556 |
| 229 | 1 | 27 | 256 | 8 | 5017-5038 | 299 | 0 | 21 | 320 | 10 | 6557-6578 |
| 230 | 1 | 26 | 256 | 8 | 5039-5060 | 300 | 0 | 20 | 320 | 10 | 6579-6600 |
| 231 | 1 | 25 | 256 | 8 | 5061-5082 | 301 | 0 | 19 | 320 | 10 | 6601-6622 |
| 232 | 1 | 24 | 256 | 8 | 5083-5104 | 302 | 0 | 18 | 320 | 10 | 6623-6644 |
| 233 | 1 | 23 | 256 | 8 | 5105-5126 | 303 | 0 | 17 | 320 | 10 | 6645-6666 |
| 234 | 1 | 22 | 256 | 8 | 5127-5148 | 304 | 0 | 16 | 320 | 10 | 6667-6688 |
| 235 | 1 | 21 | 256 | 8 | 5149-5170 | 305 | 0 | 15 | 320 | 10 | 6689-6710 |
| 236 | 1 | 20 | 256 | 8 | 5171-5192 | 306 | 0 | 14 | 320 | 10 | 6711-6732 |
| 237 | 1 | 19 | 256 | 8 | 5193-5214 | 307 | 0 | 13 | 320 | 10 | 6733-6754 |
| 238 | 1 | 18 | 256 | 8 | 5215-5236 | 308 | 0 | 12 | 320 | 10 | 6755-6776 |
| 239 | 1 | 17 | 256 | 8 | 5237-5258 | 309 | 0 | 11 | 320 | 10 | 6777-6798 |

| Zorig | ΔZ index (3 bit) | Automatically calculated parameters | | | |
|---|---|---|---|---|---|
| | | ΔZ | Z=Zorig+ΔZ | | Range of K |
| 3 | 1 | 6 | 9 | 9 | 40-48 |
| 4 | 3 | 7 | 11 | 11 | 49-64 |
| 5 | 1 | 4 | 9 | 9 | 65-80 |
| 6 | 5 | 7 | 13 | 13 | 81-96 |
| 7 | 5 | 6 | 13 | 13 | 97-112 |
| 8 | 4 | 4 | 12 | 12 | 113-128 |
| 9 | 7 | 7 | 16 | 8 | 129-144 |
| 10 | 7 | 8 | 18 | 9 | 145-160 |
| 11 | 4 | 4 | 15 | 15 | 161-176 |
| 12 | 7 | 10 | 22 | 11 | 177-192 |
| 13 | 6 | 9 | 22 | 11 | 193-208 |
| 14 | 5 | 8 | 22 | 11 | 209-224 |
| 15 | 4 | 7 | 22 | 11 | 225-240 |
| 16 | 5 | 10 | 26 | 13 | 241-256 |
| 17 | 5 | 11 | 28 | 14 | 257-272 |
| 18 | 6 | 12 | 30 | 15 | 273-288 |
| 19 | 4 | 9 | 28 | 14 | 289-304 |
| 20 | 5 | 10 | 30 | 15 | 305-320 |
| 21 | 5 | 11 | 32 | 8 | 321-336 |
| 22 | 7 | 18 | 40 | 10 | 337-352 |
| 23 | 6 | 17 | 40 | 10 | 353-368 |
| 24 | 5 | 12 | 36 | 9 | 369-384 |
| 25 | 4 | 11 | 36 | 9 | 385-400 |
| 26 | 5 | 14 | 40 | 10 | 401-416 |

| Zorig | ΔZ index (3 bit) | Automatically calculated parameters | | | |
|---|---|---|---|---|---|
| | | ΔZ | Z=Zorig+ΔZ | a | Range of K |
| 54 | 6 | 42 | 96 | 12 | 849-864 |
| 55 | 6 | 41 | 96 | 12 | 865-880 |
| 56 | 4 | 24 | 80 | 10 | 881-896 |
| 57 | 4 | 31 | 88 | 11 | 897-912 |
| 58 | 4 | 30 | 88 | 11 | 913-928 |
| 59 | 4 | 29 | 88 | 11 | 929-944 |
| 60 | 4 | 28 | 88 | 11 | 945-960 |
| 61 | 3 | 27 | 88 | 11 | 961-976 |
| 62 | 4 | 34 | 96 | 12 | 977-992 |
| 63 | 4 | 33 | 96 | 12 | 993-1008 |
| 64 | 4 | 32 | 96 | 12 | 1009-1024 |
| 65 | 5 | 47 | 112 | 14 | 1025-1040 |
| 66 | 5 | 46 | 112 | 14 | 1041-1056 |
| 67 | 3 | 29 | 96 | 12 | 1057-1072 |
| 68 | 3 | 28 | 96 | 12 | 1073-1088 |
| 69 | 3 | 27 | 96 | 12 | 1089-1104 |
| 70 | 3 | 26 | 96 | 12 | 1105-1120 |
| 71 | 5 | 41 | 112 | 14 | 1121-1136 |
| 72 | 5 | 40 | 112 | 14 | 1137-1152 |
| 73 | 4 | 39 | 112 | 14 | 1153-1168 |
| 74 | 4 | 38 | 112 | 14 | 1169-1184 |
| 75 | 1 | 13 | 88 | 11 | 1185-1200 |
| 76 | 1 | 12 | 88 | 11 | 1201-1216 |
| 77 | 4 | 35 | 112 | 14 | 1217-1232 |

FROM FIG. 24G

| | | | | | | | | | | | |
|---|---|---|---|---|---|---|---|---|---|---|---|
| 27 | 4 | 13 | 40 | 10 | 417-432 | 78 | 4 | 34 | 112 | 14 | 1233-1248 |
| 28 | 4 | 12 | 40 | 10 | 433-448 | 79 | 4 | 33 | 112 | 14 | 1249-1264 |
| 29 | 7 | 27 | 56 | 14 | 449-464 | 80 | 4 | 32 | 112 | 14 | 1265-1280 |
| 30 | 7 | 26 | 56 | 14 | 465-480 | 81 | 2 | 23 | 104 | 13 | 1281-1296 |
| 31 | 3 | 13 | 44 | 11 | 481-496 | 82 | 2 | 22 | 104 | 13 | 1297-1312 |
| 32 | 6 | 24 | 56 | 14 | 497-512 | 83 | 2 | 21 | 104 | 13 | 1313-1328 |
| 33 | 3 | 15 | 48 | 12 | 513-528 | 84 | 2 | 20 | 104 | 13 | 1329-1344 |
| 34 | 7 | 30 | 64 | 8 | 529-544 | 85 | 2 | 19 | 104 | 13 | 1345-1360 |
| 35 | 7 | 29 | 64 | 8 | 545-560 | 86 | 2 | 18 | 104 | 13 | 1361-1376 |
| 36 | 2 | 8 | 44 | 11 | 561-576 | 87 | 1 | 9 | 96 | 12 | 1377-1392 |
| 37 | 7 | 35 | 72 | 9 | 577-592 | 88 | 1 | 8 | 96 | 12 | 1393-1408 |
| 38 | 4 | 18 | 56 | 14 | 593-608 | 89 | 2 | 23 | 112 | 14 | 1409-1424 |
| 39 | 4 | 17 | 56 | 14 | 609-624 | 90 | 2 | 22 | 112 | 14 | 1425-1440 |
| 40 | 4 | 16 | 56 | 14 | 625-640 | 91 | 7 | 85 | 176 | 11 | 1441-1456 |
| 41 | 4 | 19 | 60 | 15 | 641-656 | 92 | 7 | 84 | 176 | 11 | 1457-1472 |
| 42 | 4 | 18 | 60 | 15 | 657-672 | 93 | 1 | 11 | 104 | 13 | 1473-1488 |
| 43 | 5 | 21 | 64 | 8 | 673-688 | 94 | 1 | 10 | 104 | 13 | 1489-1504 |
| 44 | 5 | 20 | 64 | 8 | 689-704 | 95 | 5 | 49 | 144 | 9 | 1505-1520 |
| 45 | 7 | 43 | 88 | 11 | 705-720 | 96 | 5 | 48 | 144 | 9 | 1521-1536 |
| 46 | 6 | 34 | 80 | 10 | 721-736 | 97 | 4 | 47 | 144 | 9 | 1537-1552 |
| 47 | 5 | 25 | 72 | 9 | 737-752 | 98 | 4 | 46 | 144 | 9 | 1553-1568 |
| 48 | 5 | 24 | 72 | 9 | 753-768 | 99 | 4 | 45 | 144 | 9 | 1569-1584 |
| 49 | 7 | 47 | 96 | 12 | 769-784 | 100 | 4 | 44 | 144 | 9 | 1585-1600 |
| 50 | 4 | 22 | 72 | 9 | 785-800 | 101 | 4 | 43 | 144 | 9 | 1601-1616 |
| 51 | 4 | 21 | 72 | 9 | 801-816 | 102 | 4 | 42 | 144 | 9 | 1617-1632 |
| 52 | 7 | 44 | 96 | 12 | 817-832 | 103 | 1 | 9 | 112 | 14 | 1633-1648 |
| 53 | 5 | 35 | 88 | 11 | 833-848 | 104 | 1 | 8 | 112 | 14 | 1649-1664 |

| Zorig | ΔZ index (3 bit) | Automatically calculated parameters | | | |
|---|---|---|---|---|---|
| | | ΔZ | Z=Zorig+ΔZ | a | Range of K |
| 105 | 4 | 55 | 160 | 10 | 1665-1680 |
| 106 | 4 | 54 | 160 | 10 | 1681-1696 |
| 107 | 0 | 5 | 112 | 14 | 1697-1712 |
| 108 | 0 | 4 | 112 | 14 | 1713-1728 |
| 109 | 3 | 35 | 144 | 9 | 1729-1744 |
| 110 | 3 | 34 | 144 | 9 | 1745-1760 |
| 111 | 3 | 33 | 144 | 9 | 1761-1776 |
| 112 | 3 | 32 | 144 | 9 | 1777-1792 |
| 113 | 2 | 31 | 144 | 9 | 1793-1808 |
| 114 | 2 | 30 | 144 | 9 | 1809-1824 |
| 115 | 4 | 61 | 176 | 11 | 1825-1840 |
| 116 | 4 | 60 | 176 | 11 | 1841-1856 |
| 117 | 2 | 27 | 144 | 9 | 1857-1872 |
| 118 | 2 | 26 | 144 | 9 | 1873-1888 |
| 119 | 2 | 25 | 144 | 9 | 1889-1904 |
| 120 | 2 | 24 | 144 | 9 | 1905-1920 |
| 121 | 3 | 55 | 176 | 11 | 1921-1936 |
| 122 | 3 | 54 | 176 | 11 | 1937-1952 |
| 123 | 3 | 53 | 176 | 11 | 1953-1968 |
| 124 | 3 | 52 | 176 | 11 | 1969-1984 |
| 125 | 3 | 51 | 176 | 11 | 1985-2000 |
| 126 | 3 | 50 | 176 | 11 | 2001-2016 |
| 127 | 2 | 33 | 160 | 10 | 2017-2032 |
| 128 | 2 | 32 | 160 | 10 | 2033-2048 |
| 129 | 1 | 31 | 160 | 10 | 2049-2064 |
| 130 | 1 | 30 | 160 | 10 | 2065-2080 |
| 131 | 1 | 29 | 160 | 10 | 2081-2096 |
| 132 | 1 | 28 | 160 | 10 | 2097-2112 |
| 133 | 3 | 59 | 192 | 12 | 2113-2128 |
| 134 | 3 | 58 | 192 | 12 | 2129-2144 |
| 135 | 3 | 57 | 192 | 12 | 2145-2160 |
| 136 | 3 | 56 | 192 | 12 | 2161-2176 |
| 137 | 0 | 7 | 144 | 9 | 2177-2192 |
| 138 | 0 | 6 | 144 | 9 | 2193-2208 |
| 139 | 0 | 5 | 144 | 9 | 2209-2224 |
| 140 | 0 | 4 | 144 | 9 | 2225-2240 |
| 141 | 1 | 19 | 160 | 10 | 2241-2256 |
| 142 | 1 | 18 | 160 | 10 | 2257-2272 |
| 143 | 1 | 17 | 160 | 10 | 2273-2288 |
| 144 | 1 | 16 | 160 | 10 | 2289-2304 |
| 145 | 1 | 31 | 176 | 11 | 2305-2320 |
| 146 | 1 | 30 | 176 | 11 | 2321-2336 |
| 147 | 1 | 29 | 176 | 11 | 2337-2352 |
| 148 | 1 | 28 | 176 | 11 | 2353-2368 |
| 149 | 0 | 11 | 160 | 10 | 2369-2384 |
| 150 | 0 | 10 | 160 | 10 | 2385-2400 |
| 151 | 0 | 9 | 160 | 10 | 2401-2416 |
| 152 | 0 | 8 | 160 | 10 | 2417-2432 |
| 153 | 1 | 23 | 176 | 11 | 2433-2448 |
| 154 | 1 | 22 | 176 | 11 | 2449-2464 |
| 155 | 1 | 21 | 176 | 11 | 2465-2480 |
| 156 | 1 | 20 | 176 | 11 | 2481-2496 |
| 157 | 1 | 19 | 176 | 11 | 2497-2512 |
| 158 | 1 | 18 | 176 | 11 | 2513-2528 |
| 159 | 1 | 17 | 176 | 11 | 2529-2544 |
| 160 | 1 | 16 | 176 | 11 | 2545-2560 |

| Zorig | ΔZ index (3 bit) | Automatically calculated parameters | | |
|---|---|---|---|---|
| | | ΔZ | Z=Zorig+ΔZ | Range of K |
| 4 | 7 | 7 | 11 | 40 |
| 5 | 7 | 7 | 12 | 41-50 |
| 6 | 5 | 5 | 11 | 51-60 |
| 7 | 5 | 5 | 12 | 61-70 |
| 8 | 3 | 3 | 11 | 71-80 |
| 9 | 7 | 7 | 16 | 81-90 |
| 10 | 6 | 6 | 16 | 91-100 |
| 11 | 5 | 5 | 16 | 101-110 |
| 12 | 4 | 4 | 16 | 111-120 |
| 13 | 4 | 5 | 18 | 121-130 |
| 14 | 4 | 6 | 20 | 131-140 |
| 15 | 3 | 5 | 20 | 141-150 |
| 16 | 5 | 10 | 26 | 151-160 |
| 17 | 5 | 11 | 28 | 161-170 |
| 18 | 7 | 14 | 32 | 171-180 |
| 19 | 3 | 7 | 26 | 181-190 |
| 20 | 6 | 12 | 32 | 191-200 |
| 21 | 6 | 15 | 36 | 201-210 |
| 22 | 6 | 14 | 36 | 211-220 |
| 23 | 6 | 17 | 40 | 221-230 |
| 24 | 6 | 16 | 40 | 231-240 |
| 25 | 4 | 11 | 36 | 241-250 |
| 26 | 7 | 22 | 48 | 251-260 |
| 27 | 6 | 21 | 48 | 261-270 |
| 28 | 7 | 24 | 52 | 271-280 |
| 29 | 3 | 11 | 40 | 281-290 |

| Zorig | ΔZ index (3 bit) | Automatically calculated parameters | | |
|---|---|---|---|---|
| | | ΔZ | Z=Zorig+ΔZ | Range of K |
| 65 | 1 | 15 | 80 | 641-650 |
| 66 | 1 | 14 | 80 | 651-660 |
| 67 | 1 | 13 | 80 | 661-670 |
| 68 | 1 | 12 | 80 | 671-680 |
| 69 | 1 | 11 | 80 | 681-690 |
| 70 | 1 | 10 | 80 | 691-700 |
| 71 | 1 | 9 | 80 | 701-710 |
| 72 | 1 | 8 | 80 | 711-720 |
| 73 | 0 | 7 | 80 | 721-730 |
| 74 | 0 | 6 | 80 | 731-740 |
| 75 | 0 | 5 | 80 | 741-750 |
| 76 | 0 | 4 | 80 | 751-760 |
| 77 | 0 | 3 | 80 | 761-770 |
| 78 | 0 | 2 | 80 | 771-780 |
| 79 | 0 | 1 | 80 | 781-790 |
| 80 | 1 | 8 | 88 | 791-800 |
| 81 | 1 | 15 | 96 | 801-810 |
| 82 | 1 | 14 | 96 | 811-820 |
| 83 | 1 | 13 | 96 | 821-830 |
| 84 | 1 | 12 | 96 | 831-840 |
| 85 | 1 | 11 | 96 | 841-850 |
| 86 | 1 | 10 | 96 | 851-860 |
| 87 | 1 | 9 | 96 | 861-870 |
| 88 | 1 | 8 | 96 | 871-880 |
| 89 | 1 | 15 | 104 | 881-890 |
| 90 | 1 | 14 | 104 | 891-900 |
| 91 | 1 | 13 | 104 | 901-910 |

FROM FIG. 25A

| | | | | | | | | | |
|---|---|---|---|---|---|---|---|---|---|
| 30 | 3 | 10 | 40 | 291-300 | 92 | 1 | 12 | 104 | 911-920 |
| 31 | 2 | 9 | 40 | 301-310 | 93 | 1 | 11 | 104 | 921-930 |
| 32 | 2 | 8 | 40 | 311-320 | 94 | 1 | 10 | 104 | 931-940 |
| 33 | 7 | 31 | 64 | 321-330 | 95 | 1 | 9 | 104 | 941-950 |
| 34 | 7 | 30 | 64 | 331-340 | 96 | 1 | 8 | 104 | 951-960 |
| 35 | 2 | 9 | 44 | 341-350 | 97 | 1 | 15 | 112 | 961-970 |
| 36 | 1 | 4 | 40 | 351-360 | 98 | 1 | 14 | 112 | 971-980 |
| 37 | 0 | 3 | 40 | 361-370 | 99 | 1 | 13 | 112 | 981-990 |
| 38 | 0 | 2 | 40 | 371-380 | 100 | 1 | 12 | 112 | 991-1000 |
| 39 | 6 | 25 | 64 | 381-390 | 101 | 0 | 3 | 104 | 1001-1010 |
| 40 | 6 | 24 | 64 | 391-400 | 102 | 0 | 2 | 104 | 1011-1020 |
| 41 | 1 | 7 | 48 | 401-410 | 103 | 0 | 1 | 104 | 1021-1030 |
| 42 | 1 | 6 | 48 | 411-420 | 104 | 1 | 16 | 120 | 1031-1040 |
| 43 | 6 | 29 | 72 | 421-430 | 105 | 1 | 15 | 120 | 1041-1050 |
| 44 | 6 | 28 | 72 | 431-440 | 106 | 1 | 14 | 120 | 1051-1060 |
| 45 | 6 | 35 | 80 | 441-450 | 107 | 2 | 21 | 128 | 1061-1070 |
| 46 | 2 | 10 | 56 | 451-460 | 108 | 2 | 20 | 128 | 1071-1080 |
| 47 | 6 | 33 | 80 | 461-470 | 109 | 2 | 19 | 128 | 1081-1090 |
| 48 | 6 | 32 | 80 | 471-480 | 110 | 0 | 2 | 112 | 1091-1100 |
| 49 | 1 | 7 | 56 | 481-490 | 111 | 0 | 1 | 112 | 1101-1110 |

FROM FIG. 25B

| | | | | | | | | | |
|---|---|---|---|---|---|---|---|---|---|
| 50 | 0 | 2 | 52 | 491-500 | 112 | 0 | 0 | 112 | 1111-1120 |
| 51 | 0 | 1 | 52 | 501-510 | 113 | 1 | 15 | 128 | 1121-1130 |
| 52 | 5 | 28 | 80 | 511-520 | 114 | 1 | 14 | 128 | 1131-1140 |
| 53 | 1 | 7 | 60 | 521-530 | 115 | 1 | 13 | 128 | 1141-1150 |
| 54 | 2 | 10 | 64 | 531-540 | 116 | 1 | 12 | 128 | 1151-1160 |
| 55 | 2 | 9 | 64 | 541-550 | 117 | 1 | 11 | 128 | 1161-1170 |
| 56 | 2 | 8 | 64 | 551-560 | 118 | 1 | 10 | 128 | 1171-1180 |
| 57 | 0 | 3 | 60 | 561-570 | 119 | 1 | 9 | 128 | 1181-1190 |
| 58 | 0 | 2 | 60 | 571-580 | 120 | 0 | 8 | 128 | 1191-1200 |
| 59 | 3 | 21 | 80 | 581-590 | 121 | 0 | 7 | 128 | 1201-1210 |
| 60 | 3 | 20 | 80 | 591-600 | 122 | 0 | 6 | 128 | 1211-1220 |
| 61 | 0 | 3 | 64 | 601-610 | 123 | 0 | 5 | 128 | 1221-1230 |
| 62 | 1 | 10 | 72 | 611-620 | 124 | 0 | 4 | 128 | 1231-1240 |
| 63 | 1 | 9 | 72 | 621-630 | 125 | 0 | 3 | 128 | 1241-1250 |
| 64 | 3 | 24 | 88 | 631-640 | 126 | 0 | 2 | 128 | 1251-1260 |

FIG. 25C

| Zorig | ΔZ index (3 bit) | Automatically calculated parameters | | |
|---|---|---|---|---|
| | | ΔZ | Z=Zorig+ΔZ | Range of K |
| 127 | 0 | 1 | 128 | 1261-1270 |
| 128 | 0 | 0 | 128 | 1271-1280 |
| 129 | 0 | 15 | 144 | 1281-1290 |
| 130 | 0 | 14 | 144 | 1291-1300 |
| 131 | 0 | 13 | 144 | 1301-1310 |
| 132 | 0 | 12 | 144 | 1311-1320 |
| 133 | 0 | 11 | 144 | 1321-1330 |
| 134 | 0 | 10 | 144 | 1331-1340 |
| 135 | 0 | 9 | 144 | 1341-1350 |
| 136 | 0 | 8 | 144 | 1351-1360 |
| 137 | 0 | 7 | 144 | 1361-1370 |
| 138 | 0 | 6 | 144 | 1371-1380 |
| 139 | 0 | 5 | 144 | 1381-1390 |
| 140 | 0 | 4 | 144 | 1391-1400 |
| 141 | 0 | 3 | 144 | 1401-1410 |
| 142 | 1 | 18 | 160 | 1411-1420 |
| 143 | 1 | 17 | 160 | 1421-1430 |
| 144 | 1 | 16 | 160 | 1431-1440 |
| 145 | 0 | 15 | 160 | 1441-1450 |
| 146 | 0 | 14 | 160 | 1451-1460 |
| 147 | 0 | 13 | 160 | 1461-1470 |
| 148 | 0 | 12 | 160 | 1471-1480 |
| 149 | 0 | 11 | 160 | 1481-1490 |
| 150 | 0 | 10 | 160 | 1491-1500 |
| 151 | 0 | 9 | 160 | 1501-1510 |
| 152 | 0 | 8 | 160 | 1511-1520 |
| 153 | 0 | 7 | 160 | 1521-1530 |

| Zorig | ΔZ index (3 bit) | Automatically calculated parameters | | |
|---|---|---|---|---|
| | | ΔZ | Z=Zorig+ΔZ | Range of K |
| 189 | 1 | 19 | 208 | 1881-1890 |
| 190 | 1 | 18 | 208 | 1891-1900 |
| 191 | 1 | 17 | 208 | 1901-1910 |
| 192 | 1 | 16 | 208 | 1911-1920 |
| 193 | 1 | 31 | 224 | 1921-1930 |
| 194 | 1 | 30 | 224 | 1931-1940 |
| 195 | 1 | 29 | 224 | 1941-1950 |
| 196 | 1 | 28 | 224 | 1951-1960 |
| 197 | 1 | 27 | 224 | 1961-1970 |
| 198 | 1 | 26 | 224 | 1971-1980 |
| 199 | 1 | 25 | 224 | 1981-1990 |
| 200 | 0 | 8 | 208 | 1991-2000 |
| 201 | 0 | 7 | 208 | 2001-2010 |
| 202 | 0 | 6 | 208 | 2011-2020 |
| 203 | 0 | 5 | 208 | 2021-2030 |
| 204 | 0 | 4 | 208 | 2031-2040 |
| 205 | 0 | 3 | 208 | 2041-2050 |
| 206 | 0 | 18 | 224 | 2051-2060 |
| 207 | 0 | 17 | 224 | 2061-2070 |
| 208 | 0 | 16 | 224 | 2071-2080 |
| 209 | 0 | 15 | 224 | 2081-2090 |
| 210 | 0 | 14 | 224 | 2091-2100 |
| 211 | 0 | 13 | 224 | 2101-2110 |
| 212 | 0 | 12 | 224 | 2111-2120 |
| 213 | 0 | 11 | 224 | 2121-2130 |
| 214 | 0 | 10 | 224 | 2131-2140 |
| 215 | 0 | 9 | 224 | 2141-2150 |
| 216 | 0 | 8 | 224 | 2151-2160 |
| 217 | 0 | 7 | 224 | 2161-2170 |
| 218 | 0 | 6 | 224 | 2171-2180 |

FROM FIG. 25D

| | | | | |
|---|---|---|---|---|
| 154 | 0 | 6 | 160 | 1531-1540 |
| 155 | 1 | 21 | 176 | 1541-1550 |
| 156 | 1 | 20 | 176 | 1551-1560 |
| 157 | 1 | 19 | 176 | 1561-1570 |
| 158 | 1 | 18 | 176 | 1571-1580 |
| 159 | 1 | 17 | 176 | 1581-1590 |
| 160 | 1 | 16 | 176 | 1591-1600 |
| 161 | 0 | 15 | 176 | 1601-1610 |
| 162 | 0 | 14 | 176 | 1611-1620 |
| 163 | 0 | 13 | 176 | 1621-1630 |
| 164 | 0 | 12 | 176 | 1631-1640 |
| 165 | 0 | 11 | 176 | 1641-1650 |
| 166 | 0 | 10 | 176 | 1651-1660 |
| 167 | 0 | 9 | 176 | 1661-1670 |
| 168 | 1 | 24 | 192 | 1671-1680 |
| 169 | 1 | 23 | 192 | 1681-1690 |
| 170 | 1 | 22 | 192 | 1691-1700 |
| 171 | 0 | 5 | 176 | 1701-1710 |
| 172 | 0 | 4 | 176 | 1711-1720 |
| 173 | 0 | 3 | 176 | 1721-1730 |

| | | | | |
|---|---|---|---|---|
| 219 | 0 | 5 | 224 | 2181-2190 |
| 220 | 0 | 4 | 224 | 2191-2200 |
| 221 | 0 | 3 | 224 | 2201-2210 |
| 222 | 0 | 2 | 224 | 2211-2220 |
| 223 | 0 | 1 | 224 | 2221-2230 |
| 224 | 0 | 0 | 224 | 2231-2240 |
| 225 | 0 | 15 | 240 | 2241-2250 |
| 226 | 0 | 14 | 240 | 2251-2260 |
| 227 | 0 | 13 | 240 | 2261-2270 |
| 228 | 0 | 12 | 240 | 2271-2280 |
| 229 | 0 | 11 | 240 | 2281-2290 |
| 230 | 0 | 10 | 240 | 2291-2300 |
| 231 | 0 | 9 | 240 | 2301-2310 |
| 232 | 0 | 8 | 240 | 2311-2320 |
| 233 | 0 | 7 | 240 | 2321-2330 |
| 234 | 0 | 6 | 240 | 2331-2340 |
| 235 | 0 | 5 | 240 | 2341-2350 |
| 236 | 0 | 4 | 240 | 2351-2360 |
| 237 | 0 | 3 | 240 | 2361-2370 |
| 238 | 0 | 18 | 256 | 2371-2380 |
| 239 | 0 | 17 | 256 | 2381-2390 |
| 240 | 0 | 16 | 256 | 2391-2400 |

FROM FIG. 25E

| | | | | |
|---|---|---|---|---|
| 174 | 1 | 18 | 192 | 1731-1740 |
| 175 | 1 | 17 | 192 | 1741-1750 |
| 176 | 1 | 16 | 192 | 1751-1760 |
| 177 | 1 | 31 | 208 | 1761-1770 |
| 178 | 1 | 30 | 208 | 1771-1780 |
| 179 | 1 | 29 | 208 | 1781-1790 |
| 180 | 1 | 28 | 208 | 1791-1800 |
| 181 | 0 | 11 | 192 | 1801-1810 |
| 182 | 0 | 10 | 192 | 1811-1820 |
| 183 | 0 | 9 | 192 | 1821-1830 |
| 184 | 1 | 24 | 208 | 1831-1840 |
| 185 | 1 | 23 | 208 | 1841-1850 |
| 186 | 1 | 22 | 208 | 1851-1860 |
| 187 | 1 | 21 | 208 | 1861-1870 |
| 188 | 1 | 20 | 208 | 1871-1880 |

| | | | | |
|---|---|---|---|---|
| 241 | 0 | 15 | 256 | 2401-2410 |
| 242 | 0 | 14 | 256 | 2411-2420 |
| 243 | 0 | 13 | 256 | 2421-2430 |
| 244 | 0 | 12 | 256 | 2431-2440 |
| 245 | 0 | 11 | 256 | 2441-2450 |
| 246 | 0 | 10 | 256 | 2451-2460 |
| 247 | 0 | 9 | 256 | 2461-2470 |
| 248 | 0 | 8 | 256 | 2471-2480 |
| 249 | 0 | 7 | 256 | 2481-2490 |
| 250 | 0 | 6 | 256 | 2491-2500 |
| 251 | 0 | 5 | 256 | 2501-2510 |
| 252 | 0 | 4 | 256 | 2511-2520 |
| 253 | 0 | 3 | 256 | 2521-2530 |
| 254 | 0 | 2 | 256 | 2531-2540 |
| 255 | 0 | 1 | 256 | 2541-2550 |
| 256 | 0 | 0 | 256 | 2551-2560 |

| Zorig | ΔZ index (3 bit) | Automatically calculated parameters | | | |
|---|---|---|---|---|---|
| | | ΔZ | Z=Zorig+ΔZ | a | Range of K |
| 4 | 7 | 7 | 11 | 11 | 40 |
| 5 | 7 | 7 | 12 | 12 | 41-50 |
| 6 | 5 | 5 | 11 | 11 | 51-60 |
| 7 | 5 | 5 | 12 | 12 | 61-70 |
| 8 | 3 | 3 | 11 | 11 | 71-80 |
| 9 | 7 | 7 | 16 | 8 | 81-90 |
| 10 | 6 | 6 | 16 | 8 | 91-100 |
| 11 | 5 | 5 | 16 | 8 | 101-110 |
| 12 | 4 | 4 | 16 | 8 | 111-120 |
| 13 | 4 | 5 | 18 | 9 | 121-130 |
| 14 | 4 | 6 | 20 | 10 | 131-140 |
| 15 | 3 | 5 | 20 | 10 | 141-150 |
| 16 | 5 | 10 | 26 | 13 | 151-160 |
| 17 | 5 | 11 | 28 | 14 | 161-170 |
| 18 | 7 | 14 | 32 | 8 | 171-180 |
| 19 | 3 | 7 | 26 | 13 | 181-190 |
| 20 | 6 | 12 | 32 | 8 | 191-200 |
| 21 | 6 | 15 | 36 | 9 | 201-210 |
| 22 | 6 | 14 | 36 | 9 | 211-220 |
| 23 | 6 | 17 | 40 | 10 | 221-230 |
| 24 | 6 | 16 | 40 | 10 | 231-240 |
| 25 | 4 | 11 | 36 | 9 | 241-250 |
| 26 | 7 | 22 | 48 | 12 | 251-260 |
| 27 | 6 | 21 | 48 | 12 | 261-270 |
| 28 | 7 | 24 | 52 | 13 | 271-280 |
| 29 | 3 | 11 | 40 | 10 | 281-290 |
| 30 | 3 | 10 | 40 | 10 | 291-300 |
| 31 | 2 | 9 | 40 | 10 | 301-310 |

| Zorig | ΔZ index (3 bit) | Automatically calculated parameters | | | |
|---|---|---|---|---|---|
| | | ΔZ | Z=Zorig+ΔZ | a | Range of K |
| 65 | 1 | 15 | 80 | 10 | 641-650 |
| 66 | 1 | 14 | 80 | 10 | 651-660 |
| 67 | 1 | 13 | 80 | 10 | 661-670 |
| 68 | 1 | 12 | 80 | 10 | 671-680 |
| 69 | 1 | 11 | 80 | 10 | 681-690 |
| 70 | 1 | 10 | 80 | 10 | 691-700 |
| 71 | 1 | 9 | 80 | 10 | 701-710 |
| 72 | 1 | 8 | 80 | 10 | 711-720 |
| 73 | 0 | 7 | 80 | 10 | 721-730 |
| 74 | 0 | 6 | 80 | 10 | 731-740 |
| 75 | 0 | 5 | 80 | 10 | 741-750 |
| 76 | 0 | 4 | 80 | 10 | 751-760 |
| 77 | 0 | 3 | 80 | 10 | 761-770 |
| 78 | 0 | 2 | 80 | 10 | 771-780 |
| 79 | 0 | 1 | 80 | 10 | 781-790 |
| 80 | 1 | 8 | 88 | 11 | 791-800 |
| 81 | 1 | 15 | 96 | 12 | 801-810 |
| 82 | 1 | 14 | 96 | 12 | 811-820 |
| 83 | 1 | 13 | 96 | 12 | 821-830 |
| 84 | 1 | 12 | 96 | 12 | 831-840 |
| 85 | 1 | 11 | 96 | 12 | 841-850 |
| 86 | 1 | 10 | 96 | 12 | 851-860 |
| 87 | 1 | 9 | 96 | 12 | 861-870 |
| 88 | 1 | 8 | 96 | 12 | 871-880 |
| 89 | 1 | 15 | 104 | 13 | 881-890 |
| 90 | 1 | 14 | 104 | 13 | 891-900 |
| 91 | 1 | 13 | 104 | 13 | 901-910 |
| 92 | 1 | 12 | 104 | 13 | 911-920 |

FROM FIG. 25G

| | | | | | | | | | | | |
|---|---|---|---|---|---|---|---|---|---|---|---|
| 32 | 2 | 8 | 40 | 10 | 311-320 | 93 | 1 | 11 | 104 | 13 | 921-930 |
| 33 | 7 | 31 | 64 | 8 | 321-330 | 94 | 1 | 10 | 104 | 13 | 931-940 |
| 34 | 7 | 30 | 64 | 8 | 331-340 | 95 | 1 | 9 | 104 | 13 | 941-950 |
| 35 | 2 | 9 | 44 | 11 | 341-350 | 96 | 1 | 8 | 104 | 13 | 951-960 |
| 36 | 1 | 4 | 40 | 10 | 351-360 | 97 | 1 | 15 | 112 | 14 | 961-970 |
| 37 | 0 | 3 | 40 | 10 | 361-370 | 98 | 1 | 14 | 112 | 14 | 971-980 |
| 38 | 0 | 2 | 40 | 10 | 371-380 | 99 | 1 | 13 | 112 | 14 | 981-990 |
| 39 | 6 | 25 | 64 | 8 | 381-390 | 100 | 1 | 12 | 112 | 14 | 991-1000 |
| 40 | 6 | 24 | 64 | 8 | 391-400 | 101 | 0 | 3 | 104 | 13 | 1001-1010 |
| 41 | 1 | 7 | 48 | 12 | 401-410 | 102 | 0 | 2 | 104 | 13 | 1011-1020 |
| 42 | 1 | 6 | 48 | 12 | 411-420 | 103 | 0 | 1 | 104 | 13 | 1021-1030 |
| 43 | 6 | 29 | 72 | 9 | 421-430 | 104 | 1 | 16 | 120 | 15 | 1031-1040 |
| 44 | 6 | 28 | 72 | 9 | 431-440 | 105 | 1 | 15 | 120 | 15 | 1041-1050 |
| 45 | 6 | 35 | 80 | 10 | 441-450 | 106 | 1 | 14 | 120 | 15 | 1051-1060 |
| 46 | 2 | 10 | 56 | 14 | 451-460 | 107 | 2 | 21 | 128 | 8 | 1061-1070 |
| 47 | 6 | 33 | 80 | 10 | 461-470 | 108 | 2 | 20 | 128 | 8 | 1071-1080 |
| 48 | 6 | 32 | 80 | 10 | 471-480 | 109 | 2 | 19 | 128 | 8 | 1081-1090 |
| 49 | 1 | 7 | 56 | 14 | 481-490 | 110 | 0 | 2 | 112 | 14 | 1091-1100 |
| 50 | 0 | 2 | 52 | 13 | 491-500 | 111 | 0 | 1 | 112 | 14 | 1101-1110 |
| 51 | 0 | 1 | 52 | 13 | 501-510 | 112 | 0 | 0 | 112 | 14 | 1111-1120 |

FROM FIG. 25H

| | | | | | | | | | | | |
|---|---|---|---|---|---|---|---|---|---|---|---|
| 52 | 5 | 28 | 80 | 10 | 511-520 | 113 | 1 | 15 | 128 | 8 | 1121-1130 |
| 53 | 1 | 7 | 60 | 15 | 521-530 | 114 | 1 | 14 | 128 | 8 | 1131-1140 |
| 54 | 2 | 10 | 64 | 8 | 531-540 | 115 | 1 | 13 | 128 | 8 | 1141-1150 |
| 55 | 2 | 9 | 64 | 8 | 541-550 | 116 | 1 | 12 | 128 | 8 | 1151-1160 |
| 56 | 2 | 8 | 64 | 8 | 551-560 | 117 | 1 | 11 | 128 | 8 | 1161-1170 |
| 57 | 0 | 3 | 60 | 15 | 561-570 | 118 | 1 | 10 | 128 | 8 | 1171-1180 |
| 58 | 0 | 2 | 60 | 15 | 571-580 | 119 | 1 | 9 | 128 | 8 | 1181-1190 |
| 59 | 3 | 21 | 80 | 10 | 581-590 | 120 | 0 | 8 | 128 | 8 | 1191-1200 |
| 60 | 3 | 20 | 80 | 10 | 591-600 | 121 | 0 | 7 | 128 | 8 | 1201-1210 |
| 61 | 0 | 3 | 64 | 8 | 601-610 | 122 | 0 | 6 | 128 | 8 | 1211-1220 |
| 62 | 1 | 10 | 72 | 9 | 611-620 | 123 | 0 | 5 | 128 | 8 | 1221-1230 |
| 63 | 1 | 9 | 72 | 9 | 621-630 | 124 | 0 | 4 | 128 | 8 | 1231-1240 |
| 64 | 3 | 24 | 88 | 11 | 631-640 | 125 | 0 | 3 | 128 | 8 | 1241-1250 |

FIG. 25I

| Zorig | ΔZ index (3 bit) | Automatically calculated parameters | | | |
|---|---|---|---|---|---|
| | | ΔZ | Z=Zorig+ΔZ | a | Range of K |
| 126 | 0 | 2 | 128 | 8 | 1251-1260 |
| 127 | 0 | 1 | 128 | 8 | 1261-1270 |
| 128 | 0 | 0 | 128 | 8 | 1271-1280 |
| 129 | 0 | 15 | 144 | 9 | 1281-1290 |
| 130 | 0 | 14 | 144 | 9 | 1291-1300 |
| 131 | 0 | 13 | 144 | 9 | 1301-1310 |
| 132 | 0 | 12 | 144 | 9 | 1311-1320 |
| 133 | 0 | 11 | 144 | 9 | 1321-1330 |
| 134 | 0 | 10 | 144 | 9 | 1331-1340 |
| 135 | 0 | 9 | 144 | 9 | 1341-1350 |
| 136 | 0 | 8 | 144 | 9 | 1351-1360 |
| 137 | 0 | 7 | 144 | 9 | 1361-1370 |
| 138 | 0 | 6 | 144 | 9 | 1371-1380 |
| 139 | 0 | 5 | 144 | 9 | 1381-1390 |
| 140 | 0 | 4 | 144 | 9 | 1391-1400 |
| 141 | 0 | 3 | 144 | 9 | 1401-1410 |
| 142 | 1 | 18 | 160 | 10 | 1411-1420 |
| 143 | 1 | 17 | 160 | 10 | 1421-1430 |
| 144 | 1 | 16 | 160 | 10 | 1431-1440 |
| 145 | 0 | 15 | 160 | 10 | 1441-1450 |
| 146 | 0 | 14 | 160 | 10 | 1451-1460 |
| 147 | 0 | 13 | 160 | 10 | 1461-1470 |
| 148 | 0 | 12 | 160 | 10 | 1471-1480 |
| 149 | 0 | 11 | 160 | 10 | 1481-1490 |
| 150 | 0 | 10 | 160 | 10 | 1491-1500 |
| 151 | 0 | 9 | 160 | 10 | 1501-1510 |
| 152 | 0 | 8 | 160 | 10 | 1511-1520 |
| 153 | 0 | 7 | 160 | 10 | 1521-1530 |

| Zorig | ΔZ index (3 bit) | Automatically calculated parameters | | | |
|---|---|---|---|---|---|
| | | ΔZ | Z=Zorig+ΔZ | a | Range of K |
| 187 | 1 | 21 | 208 | 13 | 1861-1870 |
| 188 | 1 | 20 | 208 | 13 | 1871-1880 |
| 189 | 1 | 19 | 208 | 13 | 1881-1890 |
| 190 | 1 | 18 | 208 | 13 | 1891-1900 |
| 191 | 1 | 17 | 208 | 13 | 1901-1910 |
| 192 | 1 | 16 | 208 | 13 | 1911-1920 |
| 193 | 1 | 31 | 224 | 14 | 1921-1930 |
| 194 | 1 | 30 | 224 | 14 | 1931-1940 |
| 195 | 1 | 29 | 224 | 14 | 1941-1950 |
| 196 | 1 | 28 | 224 | 14 | 1951-1960 |
| 197 | 1 | 27 | 224 | 14 | 1961-1970 |
| 198 | 1 | 26 | 224 | 14 | 1971-1980 |
| 199 | 1 | 25 | 224 | 14 | 1981-1990 |
| 200 | 0 | 8 | 208 | 13 | 1991-2000 |
| 201 | 0 | 7 | 208 | 13 | 2001-2010 |
| 202 | 0 | 6 | 208 | 13 | 2011-2020 |
| 203 | 0 | 5 | 208 | 13 | 2021-2030 |
| 204 | 0 | 4 | 208 | 13 | 2031-2040 |
| 205 | 0 | 3 | 208 | 13 | 2041-2050 |
| 206 | 0 | 18 | 224 | 14 | 2051-2060 |
| 207 | 0 | 17 | 224 | 14 | 2061-2070 |
| 208 | 0 | 16 | 224 | 14 | 2071-2080 |
| 209 | 0 | 15 | 224 | 14 | 2081-2090 |
| 210 | 0 | 14 | 224 | 14 | 2091-2100 |
| 211 | 0 | 13 | 224 | 14 | 2101-2110 |
| 212 | 0 | 12 | 224 | 14 | 2111-2120 |
| 213 | 0 | 11 | 224 | 14 | 2121-2130 |
| 214 | 0 | 10 | 224 | 14 | 2131-2140 |
| 215 | 0 | 9 | 224 | 14 | 2141-2150 |
| 216 | 0 | 8 | 224 | 14 | 2151-2160 |
| 217 | 0 | 7 | 224 | 14 | 2161-2170 |
| 218 | 0 | 6 | 224 | 14 | 2171-2180 |

FROM FIG. 25J

| | | | | | |
|---|---|---|---|---|---|
| 154 | 0 | 6 | 160 | 10 | 1531-1540 |
| 155 | 1 | 21 | 176 | 11 | 1541-1550 |
| 156 | 1 | 20 | 176 | 11 | 1551-1560 |
| 157 | 1 | 19 | 176 | 11 | 1561-1570 |
| 158 | 1 | 18 | 176 | 11 | 1571-1580 |
| 159 | 1 | 17 | 176 | 11 | 1581-1590 |
| 160 | 1 | 16 | 176 | 11 | 1591-1600 |
| 161 | 0 | 15 | 176 | 11 | 1601-1610 |
| 162 | 0 | 14 | 176 | 11 | 1611-1620 |
| 163 | 0 | 13 | 176 | 11 | 1621-1630 |
| 164 | 0 | 12 | 176 | 11 | 1631-1640 |
| 165 | 0 | 11 | 176 | 11 | 1641-1650 |
| 166 | 0 | 10 | 176 | 11 | 1651-1660 |
| 167 | 0 | 9 | 176 | 11 | 1661-1670 |
| 168 | 1 | 24 | 192 | 12 | 1671-1680 |
| 169 | 1 | 23 | 192 | 12 | 1681-1690 |
| 170 | 1 | 22 | 192 | 12 | 1691-1700 |
| 171 | 0 | 5 | 176 | 11 | 1701-1710 |
| 172 | 0 | 4 | 176 | 11 | 1711-1720 |
| 173 | 0 | 3 | 176 | 11 | 1721-1730 |
| 174 | 1 | 18 | 192 | 12 | 1731-1740 |

| | | | | | |
|---|---|---|---|---|---|
| 219 | 0 | 5 | 224 | 14 | 2181-2190 |
| 220 | 0 | 4 | 224 | 14 | 2191-2200 |
| 221 | 0 | 3 | 224 | 14 | 2201-2210 |
| 222 | 0 | 2 | 224 | 14 | 2211-2220 |
| 223 | 0 | 1 | 224 | 14 | 2221-2230 |
| 224 | 0 | 0 | 224 | 14 | 2231-2240 |
| 225 | 0 | 15 | 240 | 15 | 2241-2250 |
| 226 | 0 | 14 | 240 | 15 | 2251-2260 |
| 227 | 0 | 13 | 240 | 15 | 2261-2270 |
| 228 | 0 | 12 | 240 | 15 | 2271-2280 |
| 229 | 0 | 11 | 240 | 15 | 2281-2290 |
| 230 | 0 | 10 | 240 | 15 | 2291-2300 |
| 231 | 0 | 9 | 240 | 15 | 2301-2310 |
| 232 | 0 | 8 | 240 | 15 | 2311-2320 |
| 233 | 0 | 7 | 240 | 15 | 2321-2330 |
| 234 | 0 | 6 | 240 | 15 | 2331-2340 |
| 235 | 0 | 5 | 240 | 15 | 2341-2350 |
| 236 | 0 | 4 | 240 | 15 | 2351-2360 |
| 237 | 0 | 3 | 240 | 15 | 2361-2370 |
| 238 | 0 | 18 | 256 | 8 | 2371-2380 |
| 239 | 0 | 17 | 256 | 8 | 2381-2390 |
| 240 | 0 | 16 | 256 | 8 | 2391-2400 |
| 241 | 0 | 15 | 256 | 8 | 2401-2410 |
| 242 | 0 | 14 | 256 | 8 | 2411-2420 |

FROM FIG. 25K

| | | | | | |
|---|---|---|---|---|---|
| 175 | 1 | 17 | 192 | 12 | 1741-1750 |
| 176 | 1 | 16 | 192 | 12 | 1751-1760 |
| 177 | 1 | 31 | 208 | 13 | 1761-1770 |
| 178 | 1 | 30 | 208 | 13 | 1771-1780 |
| 179 | 1 | 29 | 208 | 13 | 1781-1790 |
| 180 | 1 | 28 | 208 | 13 | 1791-1800 |
| 181 | 0 | 11 | 192 | 12 | 1801-1810 |
| 182 | 0 | 10 | 192 | 12 | 1811-1820 |
| 183 | 0 | 9 | 192 | 12 | 1821-1830 |
| 184 | 1 | 24 | 208 | 13 | 1831-1840 |
| 185 | 1 | 23 | 208 | 13 | 1841-1850 |
| 186 | 1 | 22 | 208 | 13 | 1851-1860 |
| 243 | 0 | 13 | 256 | 8 | 2421-2430 |
| 244 | 0 | 12 | 256 | 8 | 2431-2440 |
| 245 | 0 | 11 | 256 | 8 | 2441-2450 |
| 246 | 0 | 10 | 256 | 8 | 2451-2460 |
| 247 | 0 | 9 | 256 | 8 | 2461-2470 |
| 248 | 0 | 8 | 256 | 8 | 2471-2480 |
| 249 | 0 | 7 | 256 | 8 | 2481-2490 |
| 250 | 0 | 6 | 256 | 8 | 2491-2500 |
| 251 | 0 | 5 | 256 | 8 | 2501-2510 |
| 252 | 0 | 4 | 256 | 8 | 2511-2520 |
| 253 | 0 | 3 | 256 | 8 | 2521-2530 |
| 254 | 0 | 2 | 256 | 8 | 2531-2540 |
| 255 | 0 | 1 | 256 | 8 | 2541-2550 |
| 256 | 0 | 0 | 256 | 8 | 2551-2560 |

MULTI-LABEL OFFSET LIFTING METHOD

CROSS-REFERENCE TO RELATED APPLICATIONS

This application is a divisional of U.S. application Ser. No. 15/968,597, filed on May 1, 2018 which claims the benefit of U.S. Provisional Application No. 62/500,370, filed on May 2, 2017, which application is hereby incorporated herein by reference.

TECHNICAL FIELD

The present application relates to data storage and communication technologies, in particular to methods and systems for encoding and decoding data using parity check codes.

BACKGROUND

Parity checking codes are used to facilitate the recovery of stored data as well as data transmitted through a communications channel. One type of parity check code is known as Low-Density-Parity-Check (LDPC), which is characterized by a sparse Parity Check Matrix (PCM), i.e., a PCM having a low percentage of 1's. An LDPC encoder at a transmitter is used for encoding source words to generate code words. An LDPC decoder at a receiver is used for decoding the received code words. LDPC codes of various rates are being widely adopted, or considered for adoption, in data storage and wireless communications technologies and standards such as those relating to IEEE 802.11 and 5G.

Almost all LDPC codes used in practice are quasi-cyclic (QC) LDPC with QC parity-check matrices, in which a quasi-cyclic identity matrix can be combined with an array of shift information (i.e., QC shift PCM) to define an expanded QC PCM (e.g., a QC LDPC PCM). QC LDPC encoding and recovery algorithms and the storage of PCM information can consume hardware resources, and accordingly there is a need for methods, systems, and technologies that improve the efficiency of and reduce the hardware resources required for QC LDPC coding systems.

SUMMARY

An embodiment of the disclosure provides a method for lifting a child code from a base code for encoding and decoding data. The method includes determining a single combination of a circulant size, a lifting function, and a labelled base matrix PCM according to an information length and a code rate using data stored in a lifting table. The lifting table was defined at a code generation stage. The method also includes calculating a plurality of shifts for the child code. Each shift is calculated by applying the lifting function to the labelled base matrix PCM with a defined index using the circulant size and using the derived child PCM to encode or decode data. The method also includes deriving a child PCM according to the single combination of the circulant size, the lifting function, and the labeled PCM and according to one of the plurality of shifts for the child code. The method also includes using the derived child PCM to encode or decode data.

An embodiment of the disclosure provides a method for generating a code. The method includes determining an allowed subset of lift sizes Z for each coding rate R and each information length K. The method also includes determining at least one lifting functions $f_i$ for each code rate R and each allowed Z. The method also includes determining a set of base PCMs describing a single protograph. The base PCMs are based on coding rates R and allowed Zs. The method also includes selecting a single combination of a lift size Z, a lifting function $f_i$ and a base $PCM_t$. The method also includes storing a circulant size offset and/or a circulant size index, a lifting function index, and a base code index corresponding to the single combination for each information length and each coding rate.

An embodiment of the disclosure provides a method for operating a device at a transmitting side. The method includes encoding, at an encoder, information bits into code word. The method also includes transmitting, at a transmitter, signals to a receiving side. The signals including the code words. The information bits are encoded using a plurality of labelled base PCMs. The labelled base PCMs are derived from a single base PCM describing a single protograph.

An embodiment of the disclosure provides a method for operating a device at a receiving side. The method includes receiving, at a receiver, signals from a transmitting side. The signals include a code words. The method also includes decoding, at a decoder, the code words by applying extracting information bits. The information bits are decoded using a plurality of labelled base PCMs. The labelled base PCMs are derived from a single base PCM describing a single protograph.

An embodiment of the disclosure provides an encoder or decoder. The encoder or decoder includes a processor and a computer readable storage medium storing programming for execution by the processor. The programming includes instructions to determine a single combination of a circulant size, a lifting function and a labelled PCM according to an information length and a code rate using data stored in a lifting table which was defined at a code generation stage. The programming also includes instructions to calculate a plurality of shifts for the child code, wherein each shift is calculated by applying the lifting function to the labelled PCM with a defined index using the circulant size. The programming also includes instructions to derive a child PCM according to the single combination of the circulant size, the lifting function, and the labeled PCM and according to one of the plurality of shifts for the child code. The programming also includes instructions to use the derived child PCM to encode or decode data.

In one or more aspects of the disclosure, shifts of non-zero circulants for predefined positions are unchanged.

In one or more aspects of the disclosure, the lifting function is selected from a single lifting function.

In one or more aspects of the disclosure, the lifting function is selected from a plurality of lifting functions.

In one or more aspects of the disclosure, the labelled base matrix PCM is directly derived from the circulant size.

In one or more aspects of the disclosure, the circulant size is Z, where Z=a*2^s.

In one or more aspects of the disclosure, the lifting function provides a code shift value.

In one or more aspects of the disclosure, the information bits have different bit lengths and are encoded with different coding rates.

In one or more aspects of the disclosure, a labelled base PCM is selected according to a coding rate.

In one or more aspects of the disclosure, encoding includes switching from a first labelled PCM to a second labelled PCM when the coding rate changes from a first coding rate to a second coding rate.

In one or more aspects of the disclosure, encoding includes switching from a first labelled PCM to a second labelled PCM when the lift size changes from a first lift size to a second lift size, the first and second lift sizes being dependent on different information bit lengths.

In one or more aspects of the disclosure, decoding includes switching from a first labelled PCM to a second labelled PCM when the coding rate changes from a first coding rate to a second coding rate.

In one or more aspects of the disclosure, decoding includes switching from a first labelled PCM to a second labelled PCM when the lift size changes from a first lift size to a second lift size, the first and second lift sizes being dependent on different information bit lengths.

In one or more embodiments, high performance is achieved by providing a rate adaptive code (switching from one code rate to another code rate), by providing an information length adaptive code, or by providing a combination of a rate adaptive and a length adaptive code. Further embodiments provide simple hardware based on these embodiments. One or more disclosed embodiments rely on a few coding schemes (PCM matrices) that are flexible with respect to coding rate and information length. This has the advantage that the embodiments provide substantially optimal performance in varying situations while also saving storage space.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3 shows a flow chart 300 for constructing a lifting table T;

FIGS. 4A-4C show examples of possible lifting tables T;

FIGS. 5A-5C show an example of a first base graph or protograph;

FIGS. 6A-6E, 7A-7E, 8A-8E, 9A-9E, 10A-10E, 11A-11E, 12A-12C, and 13A-13E show embodiments of specific labelled first graphs;

FIGS. 14A-14E show an example of a second base graph or protograph;

FIGS. 15A-15D, 16A-16D, 17A-17D, 18A-18D, 19A-19D, 20A-20D, 21A-21D, 22A-22-D, and 23A-23D show embodiments of a singled labeled second graph;

FIG. 24A-24I show embodiments of lifting tables T for the first graph;

FIG. 25A-25L show embodiments of lifting tables T for the second graph;

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Disclosed herein are systems, methods, and devices for encoding/decoding data using LDPC. Various embodiments include offset lifting procedures to determine a circulant offset to encode/decode data. Furthermore, various embodiments include non-sequential circulant offsets and larger circulant offsets than the prior art. Various embodiments also include multiple lifting functions. Having large circulant offsets allows the best offset to be determined more quickly and consumes fewer system resources than the prior art methods (e.g., less amount of offline simulations during lifting table construction, less memory needed to store the lifting table in the encoder/decoder, etc.). Furthermore, different lifting functions may be better suited for encoding different length code words.

Embodiments of the disclosure further provide a flexible method for allocating good codes (or matrices) when information length size K and coding rate R change (over time). Various embodiments provide a coding method capable for switching between different selected allowed lift values Z and different labeled PCMs for the same protograph. Various other embodiments provide a method capable of switching between different PCMs based on a coding rate R and a lift value Z. Further embodiments provide lifting tables for various ranges of coding rates R and information length K. This resulting code is advantageous because it provides a lift value and a labeled PCM for a given information length size K and a coding rate R.

The high performance may be achieved by providing a rate adaptive code (switching from one code rate to another code rate), by providing an information length adaptive code, or by providing a combination of a rate adaptive and a length adaptive code. Further embodiments provide simple hardware based on these embodiments.

These embodiments rely on a few coding schemes (PCM matrices) that are flexible with respect to coding rate and information length. This has the advantage that the embodiments provide optimal performance in every situation while saving storage space.

Figure 1:
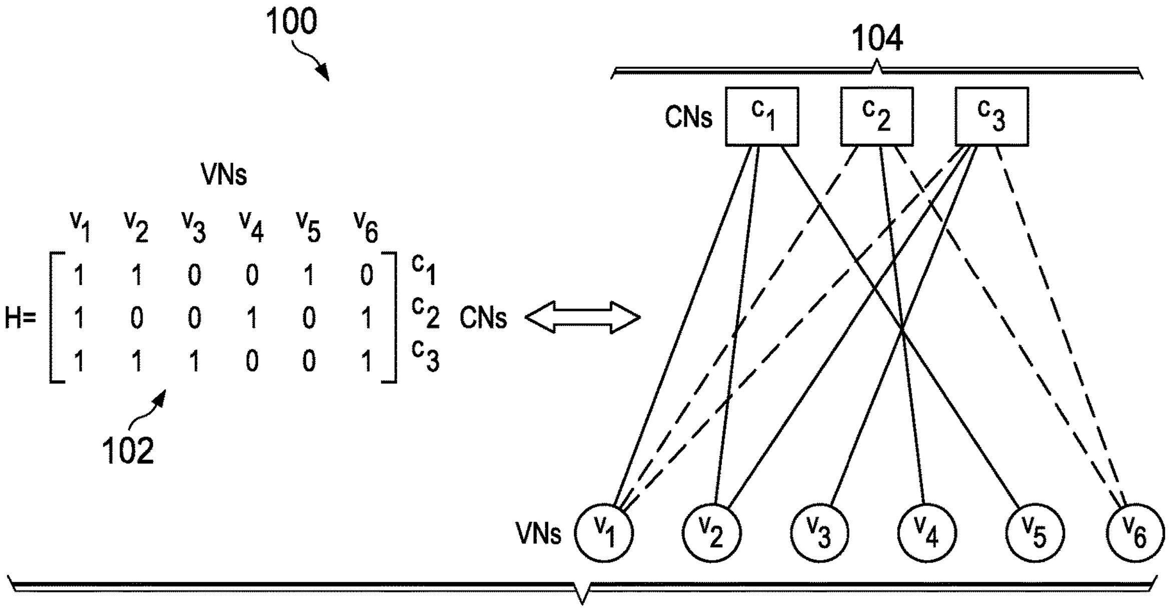
FIG. 1 is a diagram showing a 3 by 6 parity check matrix (PCM), H, and its corresponding Tanner graph representation.

FIG. 1 is a diagram 100 showing a 3 by 6 parity check matrix (PCM), H, 102 and its corresponding Tanner graph representation 104. An LDPC code is defined by a sparse parity check matrix (PCM), which is an (N-K) row by N column matrix, where N is the codeword size (number of bits in a codeword) and K is the information block size of a source word (number of message bits in each codeword). A Tanner graph 104 is a graphical representation of the parity check matrix specifying the parity check equations. In the depicted example, the Tanner graph 104 includes three check nodes (CNs) $c_1$, $c_2$, and $c_3$ and six variable nodes (VNs) $v_1$, $v_2$, $v_3$, $v_4$, $v_5$, and $v_6$. A Tanner graph consists of N variable nodes (VNs) and M check nodes (CNs). In the depicted example, the Tanner graph 104 includes three CNs $c_1$, $c_2$, and $c_3$ and six VNs $v_1$, $v_2$, $v_3$, $v_4$, $v_5$, and $v_6$. In the Tanner graph 104 shown in FIG. 1, the $m^{th}$ check node is connected to the $n^{th}$ variable node if, and only if, the $n^{th}$ element, $h_{mn}$, in the $m^{th}$ row in the parity check matrix, H, is 1.

Figure 2:
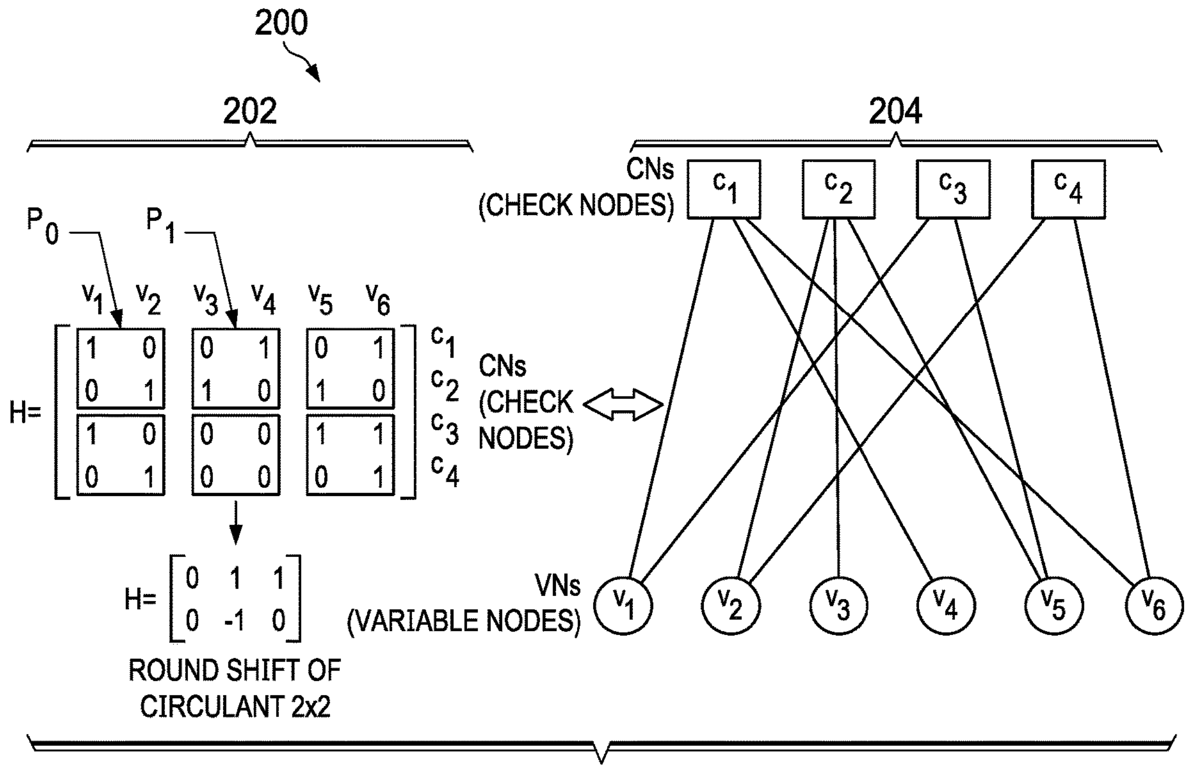
FIG. 2 is a diagram showing a 4 by 6 PCM, H, and its corresponding Tanner graph representation.

FIG. 2 is a diagram 200 showing a 4 by 6 PCM, H, 202 and its corresponding Tanner graph representation 204. A receiving entity can decode received code words that have been encoded in accordance with PCM H by applying the PCM H in combination with a message passing algorithm (MPA). As illustrated in the example of FIG. 2, LDPC decoding with MPA is an iterative decoding algorithm that uses the structure of the Tanner graph 204. In an LDPC decoder, each $m^{th}$ check node ($C_1$, $C_2$, $C_3$) is connected to the $n^{th}$ variable node ($V_1$, . . . , $V_6$) if and only if the $n^{th}$ element $h_{mn}$ in the $m^{th}$ row in the PCM H is 1.

For practical application, PCMs are typically configured as a more structured matrix rather than a simple collection of binary ones and zeros. For example, a more structured matrix is used to support a type of LDPC codes referred to as Quasi-Cyclic (QC) LDPC that are produced by cyclic permutation matrices with column weight 1. In particular, as shown in FIG. 2, LDPC PCM H can be partitioned into a set of square sub-matrices $P_i$ of size Z×Z that are either cyclic-permutations of an identity matrix $P_o$ or null submatrices with all zero entries. The matrix dimension Z of the QC sub-matrix is referred to as the circulant size and is also known as a lifting factor. The identity matrix $P_o$ has "1" entries on the diagonal from the top left corner to the bottom right corner and "0" entries everywhere else. An index value i can be used to denote the cyclic-permutation submatrix $P_i$ obtained from the Z×Z identity matrix $P_o$ by cyclically shifting the columns to the right by i elements. By way of example, FIG. 2 illustrates 4 by 6 LDPC PCM H partitioned into a set of 2 by 2 square submatrices. The submatrix $P_o$ is an identity matrix, and submatrix $P_i$ is obtained by cyclically shifting the columns of submatrix $P_o$ to the right by 1. QC LDPC allows large PCMs to be represented as smaller structured PCMs with each Z×Z submatrix represented by its index value i in a corresponding cell location of a QC PCM. By way of example, in FIG. 2, the 4 by 6 PCM H can be restated as (and thus generated from) a 2 by 3 QC PCM $H_e$ in which each cell includes with an cyclic shift index value or a null value. As used herein, H may be referred to as a protograph of the code (i.e., protograph matrix). Converting from H to $H_e$ is typically referred to as "edge labeling" or simply "labeling." Also, as used herein, $H_e$ may be referred to as a labelled protograph or a labelled matrix.

QC LDPC codes are usually decoded by a message passing decoder such as BP, Min-Sum, and their modifications (NMSA, OMSA, . . . ). Performance of the QC LDPC code depends on multiple factors like row and column weight distribution (typically optimized using Density evolution methods), code distance, amount of short cycles and trapping sets etc. However, prior art encoding/decoding systems and algorithms and storage of the PCM information consume large amounts of system resources.

Additionally, to support information length fine granularity and rate adaption, nested family of the codes may be used, where rate R adaption and length K adaption is performed by puncturing (removing) parity bits and shortening (zero-padding) information bits. Accordingly, a simple and powerful method is needed to construct child PCMs from every (labelled) base PCM.

Nested means adjusting the code for code rate R adaption by puncturing (removing) parity bits. The PCM itself corresponds to a lower or the lowest code. If one or few columns (either circulant columns or bit columns) are removed (punctured) from the right and the same amount of rows are removed from the bottom of PCM, the PCM still can be used for decoding/encoding, but the coding rate R has changed (increased). This procedure can be performed step-by step until a smallest possible PCM (called the "core" PCM corresponding to the highest rate) is identified. Accordingly, the PCM is actually a comprehensive code comprising a set of nested codes. These are called "nested" subcodes of the code, which corresponds to the nested subgraphs of the main (biggest) graph of the code.

Switching between rates is done by switching from one subcode to another one. If incremental retransmission of the additional parity bits is needed (meaning switching from one nested subcode (equivalent to a "smaller" PCM) to another (nested) subcode (equivalent to a "larger" PCM (meaning the code has a lower rate)), the lifting method may not be changed (or, in other embodiments, are not allowed to be changed). Thus, lifting tables may be shared for these subcodes.

As noted above, storage and use of QC PCM information can be resource intensive. Accordingly, embodiments of the present disclosure provide a QC PCM method and system that allows the same QC PCM information to be adaptively used to support a range of different information rates R and information block sizes K. Accordingly, methods and systems are disclosed herein that relate to shortening, puncturing and lifting QC LDPC codes. Shortening means padding information bits with zeros to match exactly the given rate (these bits are not transmitted but used by both encoder and decoder as zeros). Shortened bits may be padded from the left, the right side of the information block, or even from somewhere in the middle. Puncturing means removing some non-needed parity check bits to increase the rate of the code. This corresponds to cutting the last several columns and the same number of rows from the PCM.

To support information length fine granularity and rate adaption, nested family of the codes may be used, where rate and length adaption is performed by puncturing parity bits and shortening information bits. Accordingly, simple and powerful lifting methods are described herein to construct child PCMs from several base PCMs.

Figures 3, 4A:
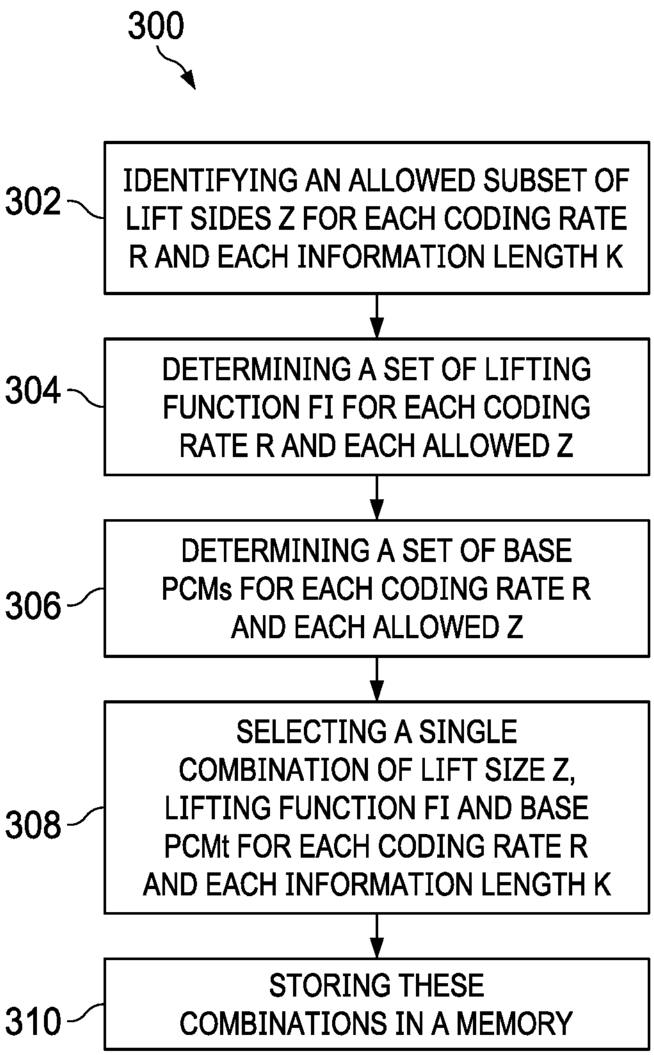

FIG. 3 shows a flow chart 300 for constructing a powerful parity check code. In particular, the code is a rate adaptive code. A base PCM corresponds to the lowest code rate. By removing or puncturing one or few columns from the right and the same amount of rows from the bottom of the base PCM, the code rate changes, i.e., increases. Based on this (e.g., a step-by-step procedure) a smallest possible PCM (called the "core" PCM) for a high code rate can be identified. Accordingly, a base PCM represents a set of codes.

In a first step, at 302, a subset $Z_i$ of a plurality of allowed lift sizes Z is determined for each coding rate R and each information length K. First, a minimum lift size is calculated $Z_{orig}$=K/$K_b$, wherein k is the number of information bits and $K_b$ is the number of information columns in the protograph.

$K_b$ is typically fixed for a specific hardware device such as a decoder or encoder. $K_b$ may be 10, 16 or 22. $K_b$ may have other values in the teens or twenties. $K_b$ may be the same for all base PCMs and all labelled PCMs. Second, a set of allowed Z, $Z_{allowed}$, is determined, wherein $Z_{allowed} \geq Z_{orig}$. The allowed values of Z may be a predefined fixed set of allowed values Z of the form of $a*2^s$, wherein a is a positive integer and s is a non-negative integer. Moreover, a range of values for a and for s or for pairs (a, s) may be specified. For example, if $a \in \{1, 2, \ldots, 16\}$, $s \in \{0, 1, 2, \ldots, 256\}$ and $Z=a*2^s$, Z may be limited to be not less than 8 and not larger than 384 then the $Z_{allowed}$ may be:

$$Z_{allowed}=\{8:1:16\} \cup \{16:2:32\} \cup \{32:4:64\} \cup \{64:8:128\} \cup \{128:16:256\} \cup \{256:32:384\}.$$

Third, a subset m of the allowed lift sizes $Z_{allowed}$ is selected. In an embodiment, the subset m may be the lowest m numbers of $Z_{allowed}$ such that $Z \geq Z_{orig}$. In an alternative embodiment, the subset m of the allowed lift sizes, $Z_{allowed}$, may be the lowest m options for Z such that $K_b \leq K_{bmax}$ and $Z \geq Z_{orig}$. Here, $K_b$ is the number of information QC-columns in the PCM that are not shortened and $K_{bmax}$ is a maximal number of information columns in a PCM for a given K and R.

In various other embodiments further constraints may be applied. For example, the lowest m options for Z may be $Z \geq \max(Z_{min}, Z_{orig})$, wherein $Z \in Z_{allowed}$, and wherein $Z_{min}$ is the minimal possible lift size. In a specific example, m may be equal to 8. Accordingly, there is m different Zs for each coding rate R and each information length K. However, only a single one of these Zs is stored in a memory (e.g., lifting table) for each coding rate R and each information length K.

In the next step, at step 304, at least one lifting function $f_i$ is defined for each coding rate R and for each $Z \in Z_{allowed}$. The lifting function $f_i$ may be defined as follows:

Each lifting function $f_i$ provides a non-negative integer shift value for the child code PCM using the formula: $h_{child}^j=f_i(h_{base}, Z)$, wherein $h_{base}$ is a non-negative-one shift value of a base code PCM, and $h_{child}^j$ is a resulting shift value of the child code.

For example, lifting function $f_i$ may have the following form:

- $h_{child}^j=h_{base} \bmod 2^{[\log 2(Z)]}$ where [x] is the (lower) integral part of x.
- $h_{child}^j=h_{base} \bmod Z$
- $h_{child}^j=[h_{base}*Z/Z_{max}]$, where $Z_{max}$ is the lift size of the base PCM.
- $h_{child}^j=h_{base} \gg ]\log_2(Z_{max}/Z)[$, where » is a right is a right binary shift operation (i.e. $a \gg b=[a/2^b]$) and ]x[ is an upper integral part of x.

In various embodiments, the number of lifting functions n may be equal to 1, which means that a single fixed lifting function is used to derive each child PCM from the set of base ones. However, in alternative embodiments, the number of lifting function n may be larger than 1, e.g., 2, 3, 4, 5, or more.

In a next step, at step 306, a set of labelled base PCMs all describing one protograph (base graph) is determined. The set of labelled base PCMs is determined for each coding rate R and each $Z \in Z_{allowed}$. The labelled base PCMs may be defined as follows base(R, Z)=$\{PCM_1, PCM_2, \ldots, PCM_t\}$. These labelled base PCMs correspond to the lowest code (e.g., the code with the highest overhead).

For example, base(R, Z) may be a set of all available labelled versions of the base graph or protograph. In another example, base(R, Z) may comprise or consist of a single PCM which is deterministically defined by a value K (using some function or a table).

In another example, base(R, Z) may comprise or consist of a single PCM which is deterministically defined by a lift size Z (using some function or table). Embodiments for construction such a function or table are provided as follows: if all lift or circulant sizes Z have the form of $a*2^s$ where $a \in \{8, 9, \ldots, 15\}$, a PCM $M_{a-7}$ may be assigned to a value Z. For example, if t=8, PCMs $M_1, M_2, \ldots M_8$ are predefined labelled versions of the same base protograph. Alternatively, t may be any other positive integer number, such as for example 2, 3, 4, 5, 6, 7 or 10.

Figure 5A:
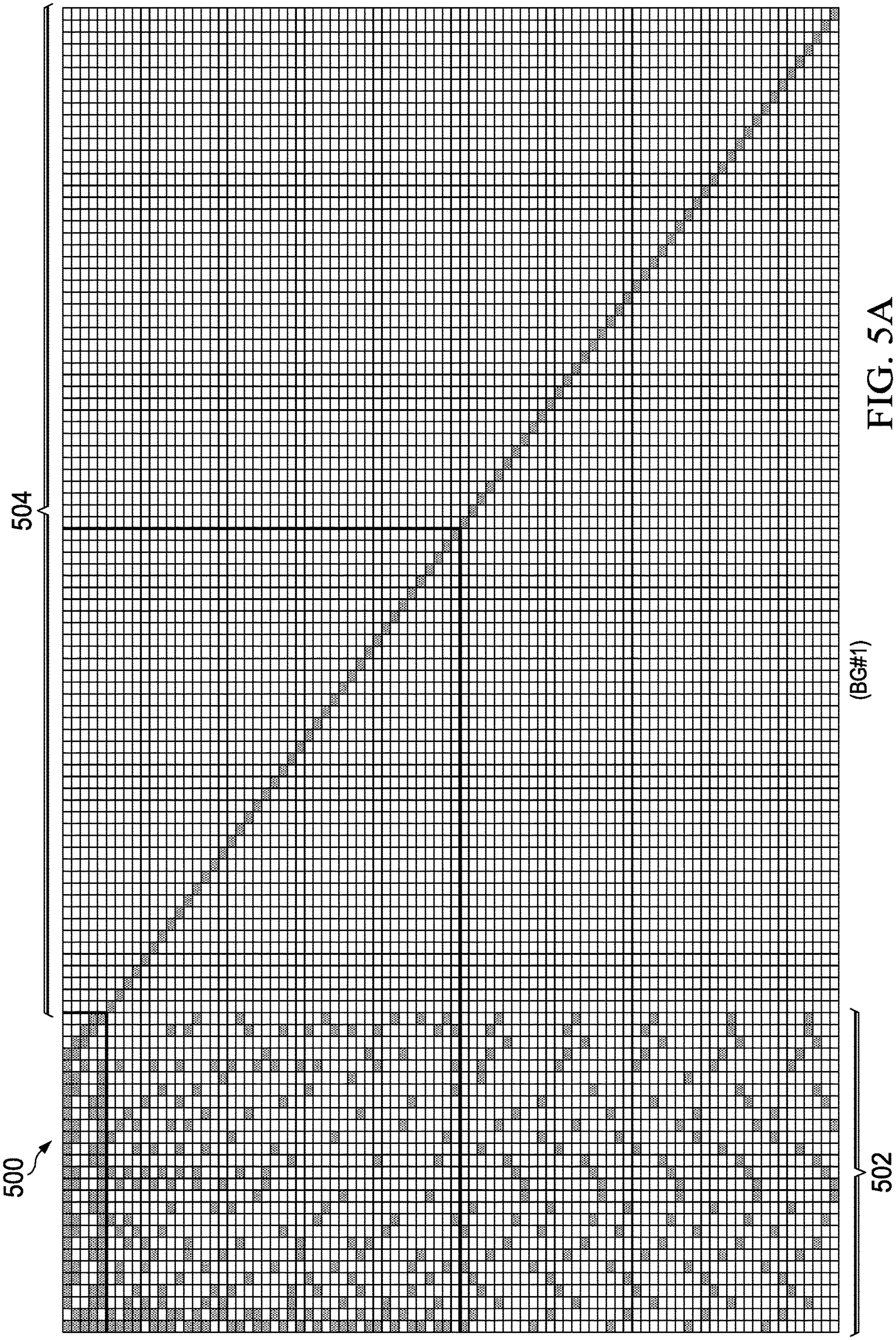
Figure 6A:
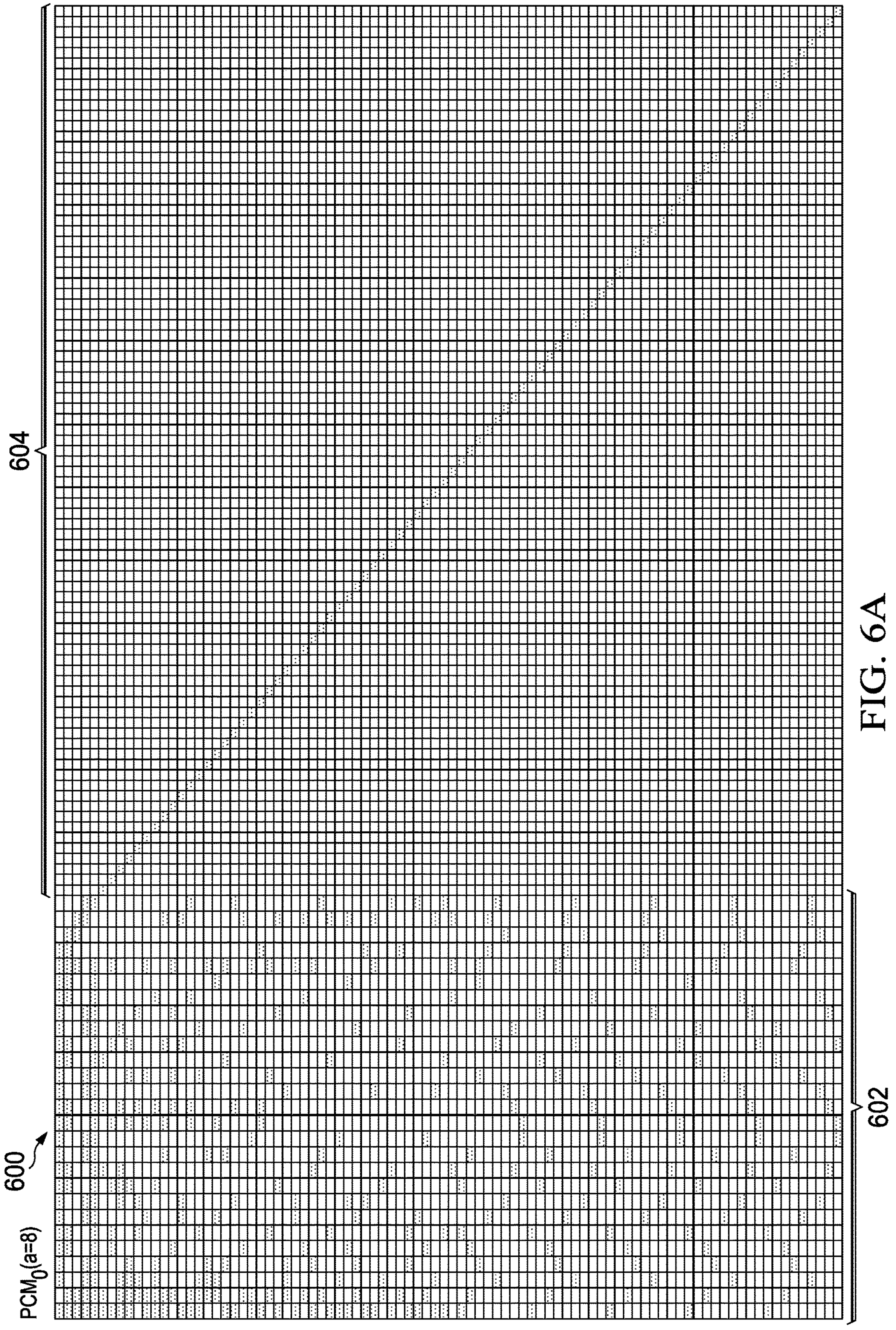
Figure 7A:
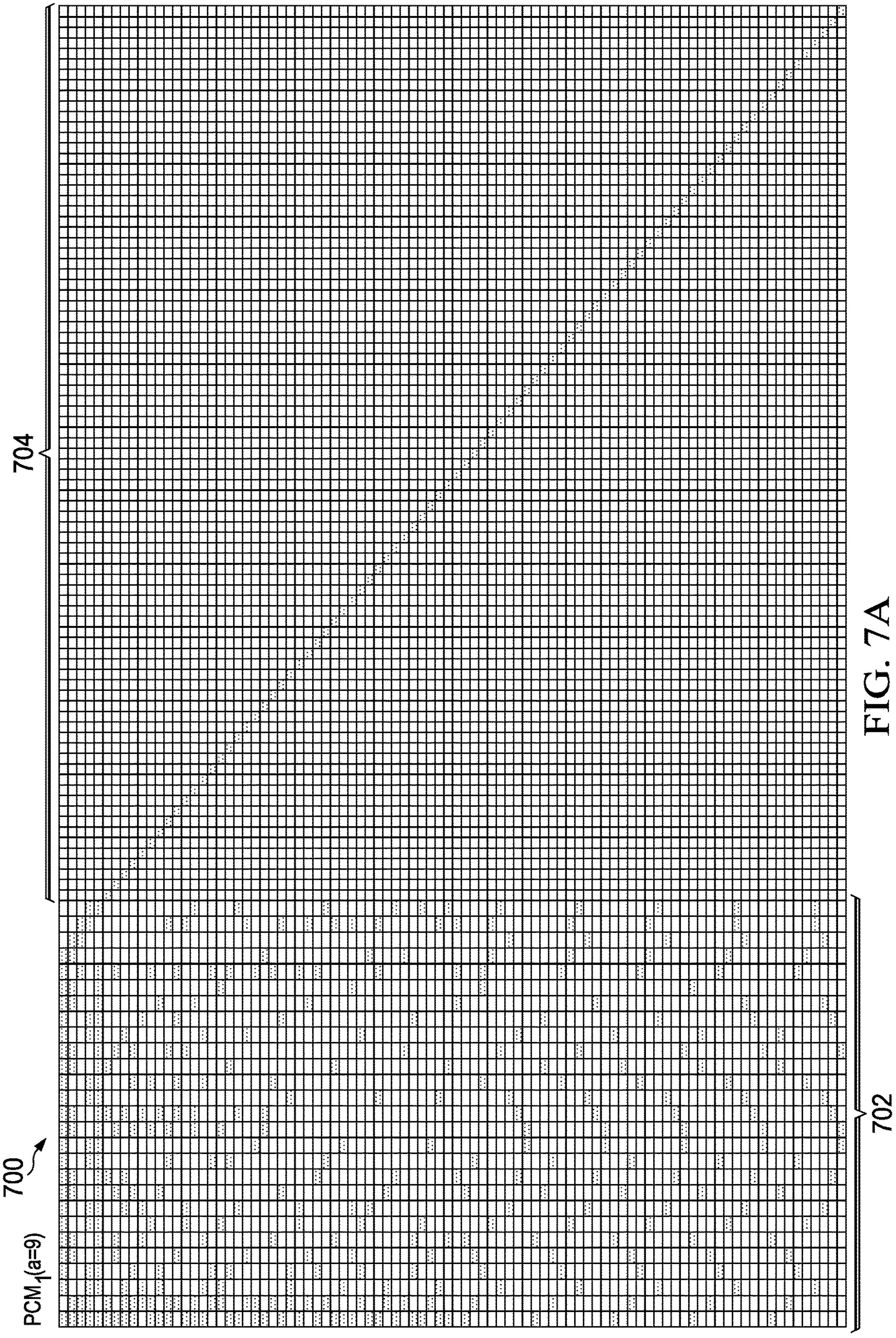
Figure 8A:
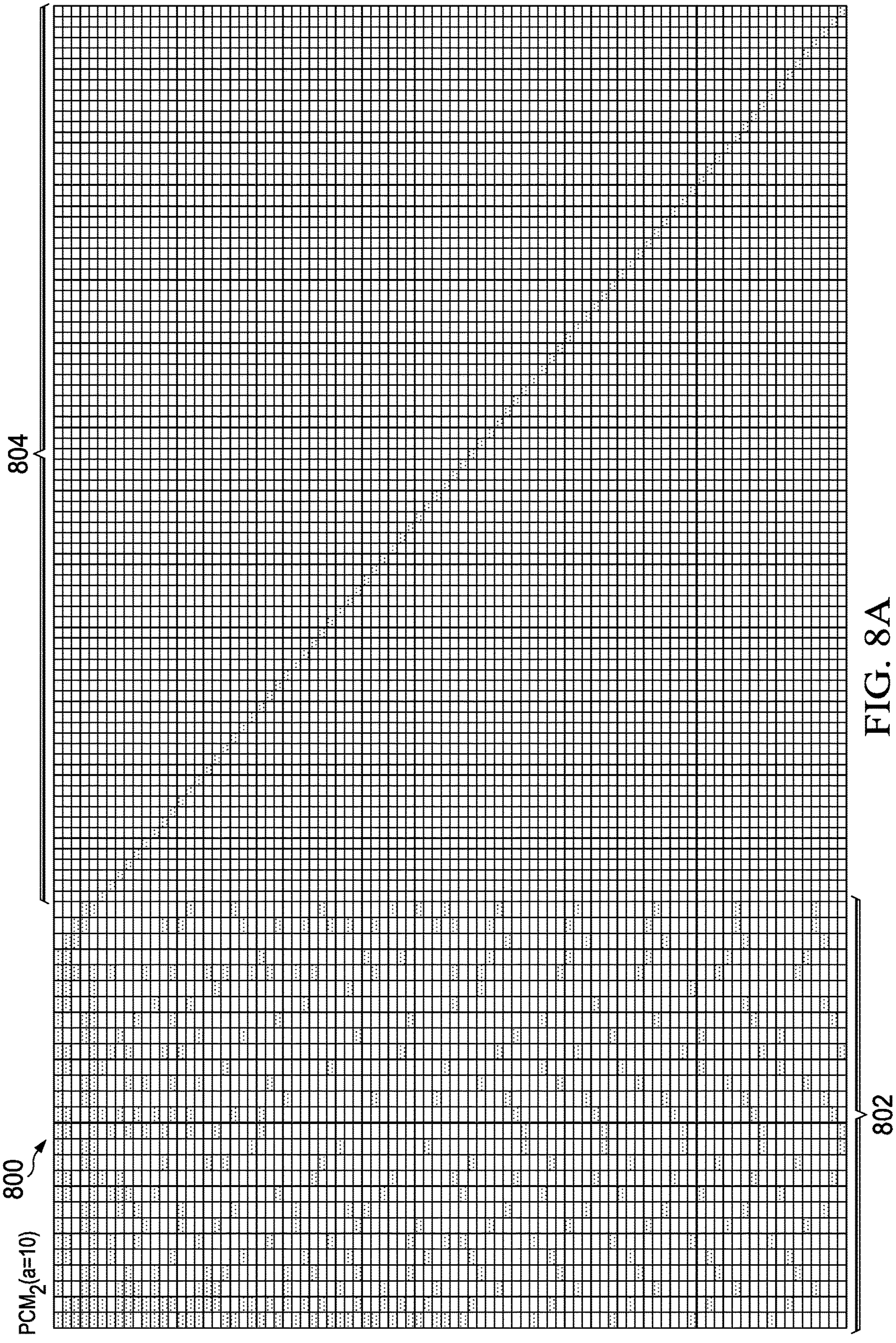
Figure 9A:
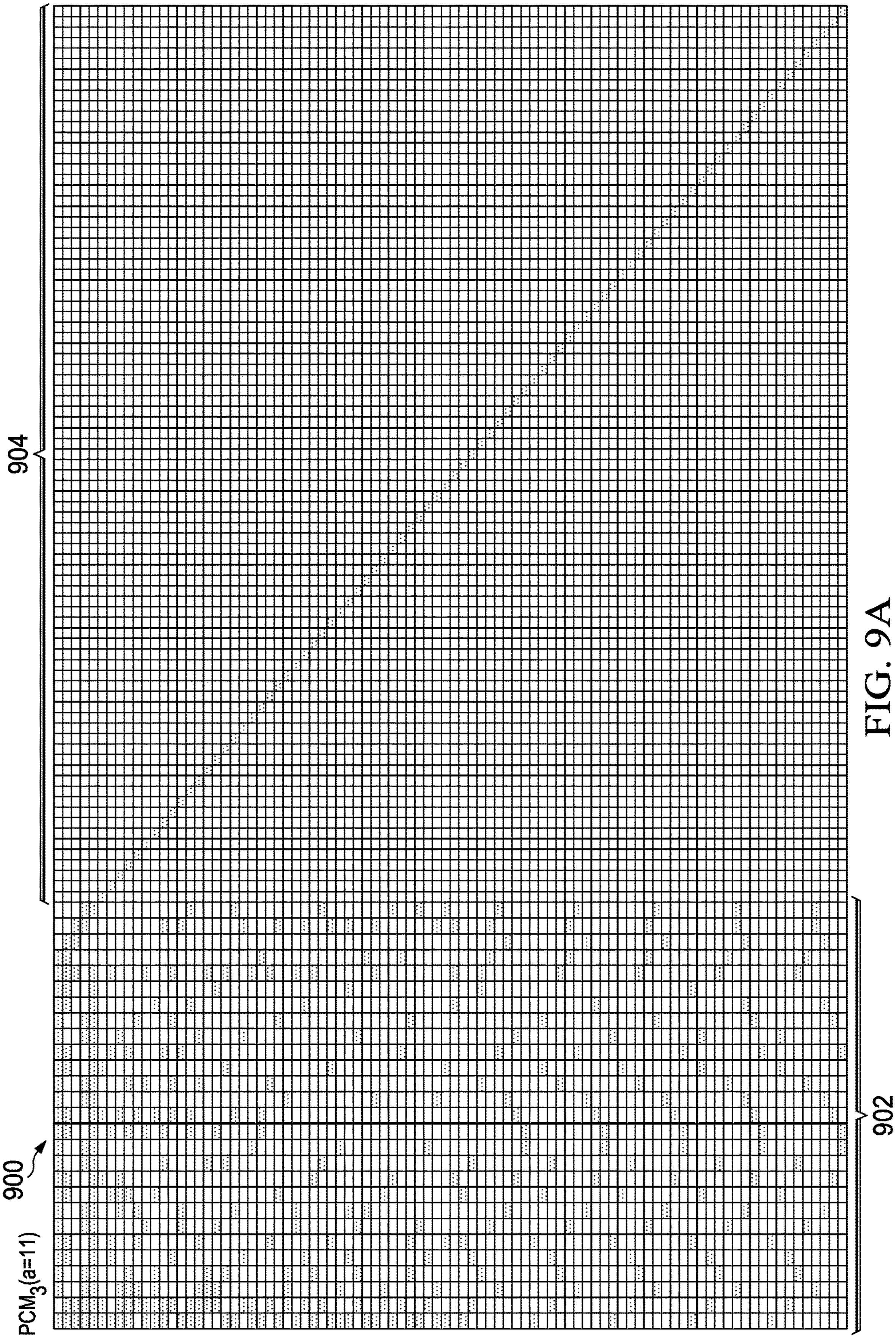
Figure 10A:
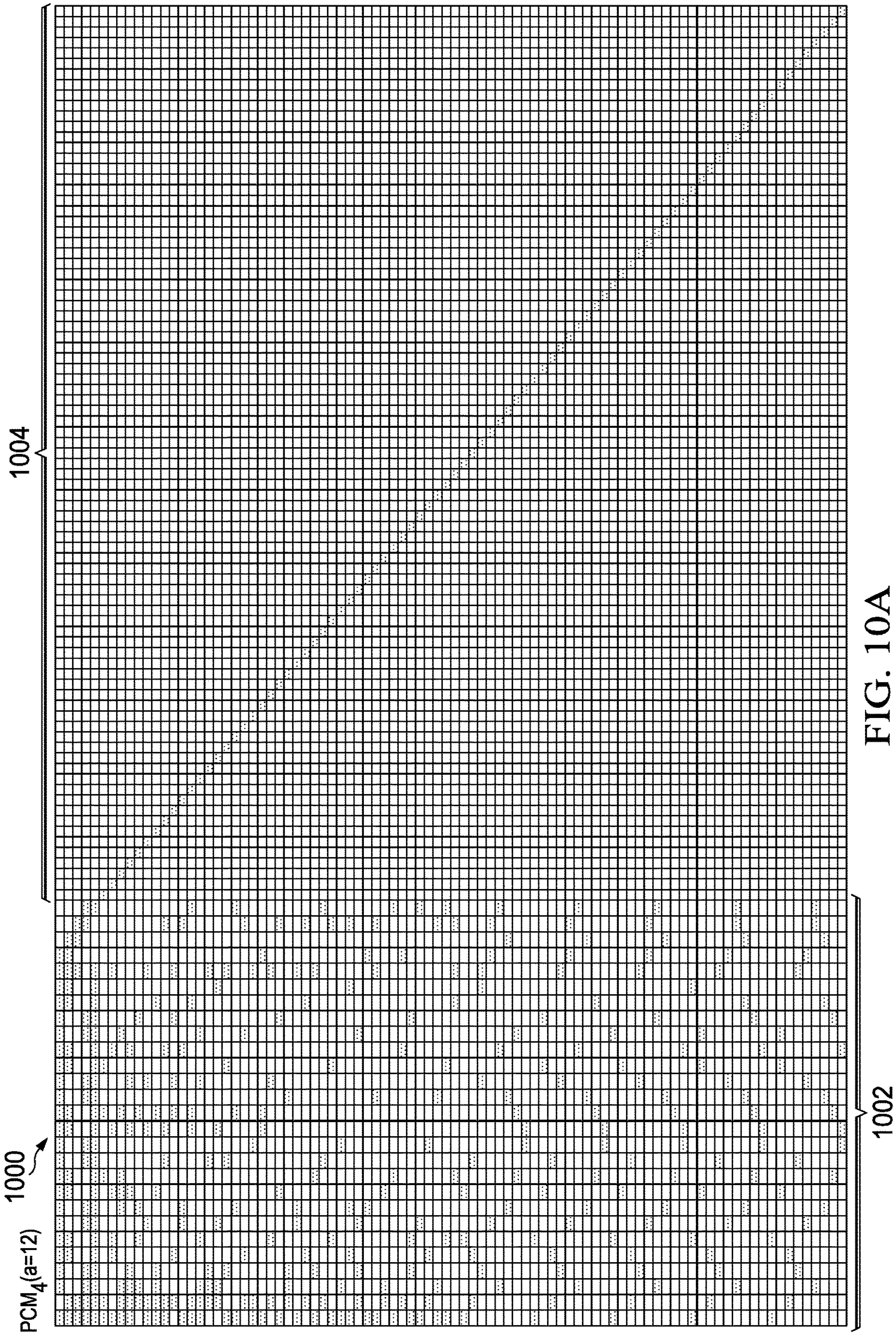
Figure 11A:
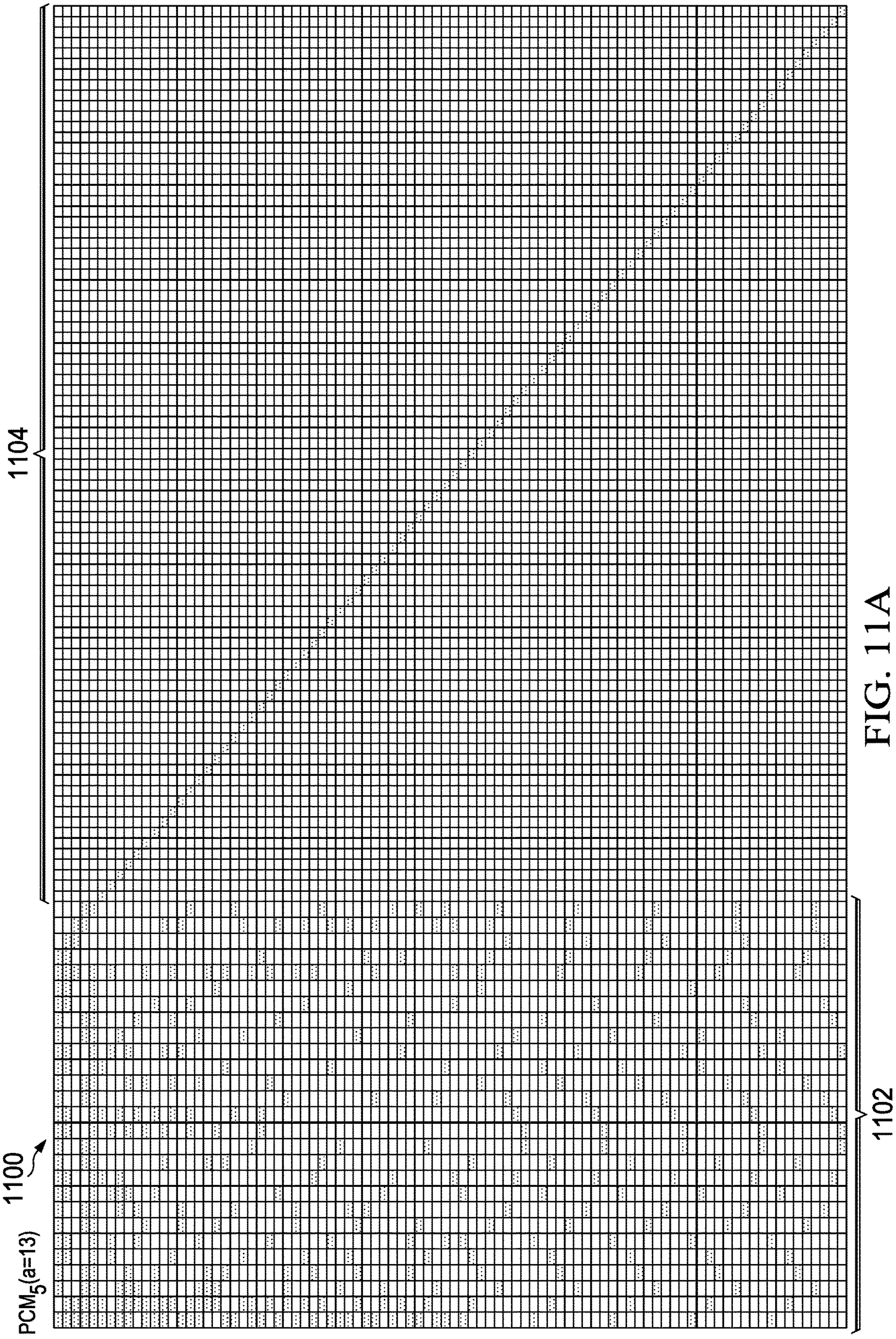
Figure 12A:
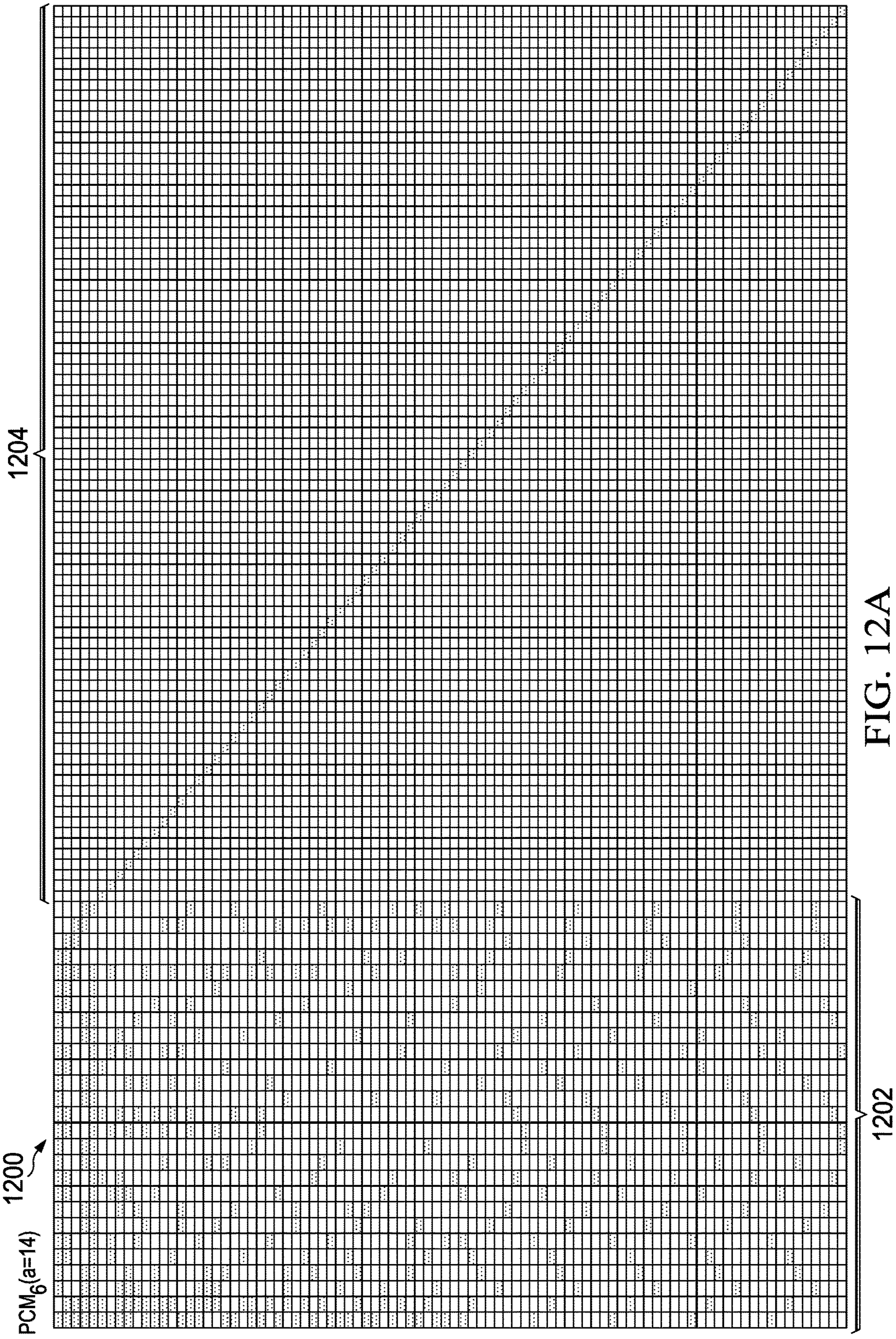
Figure 13A:
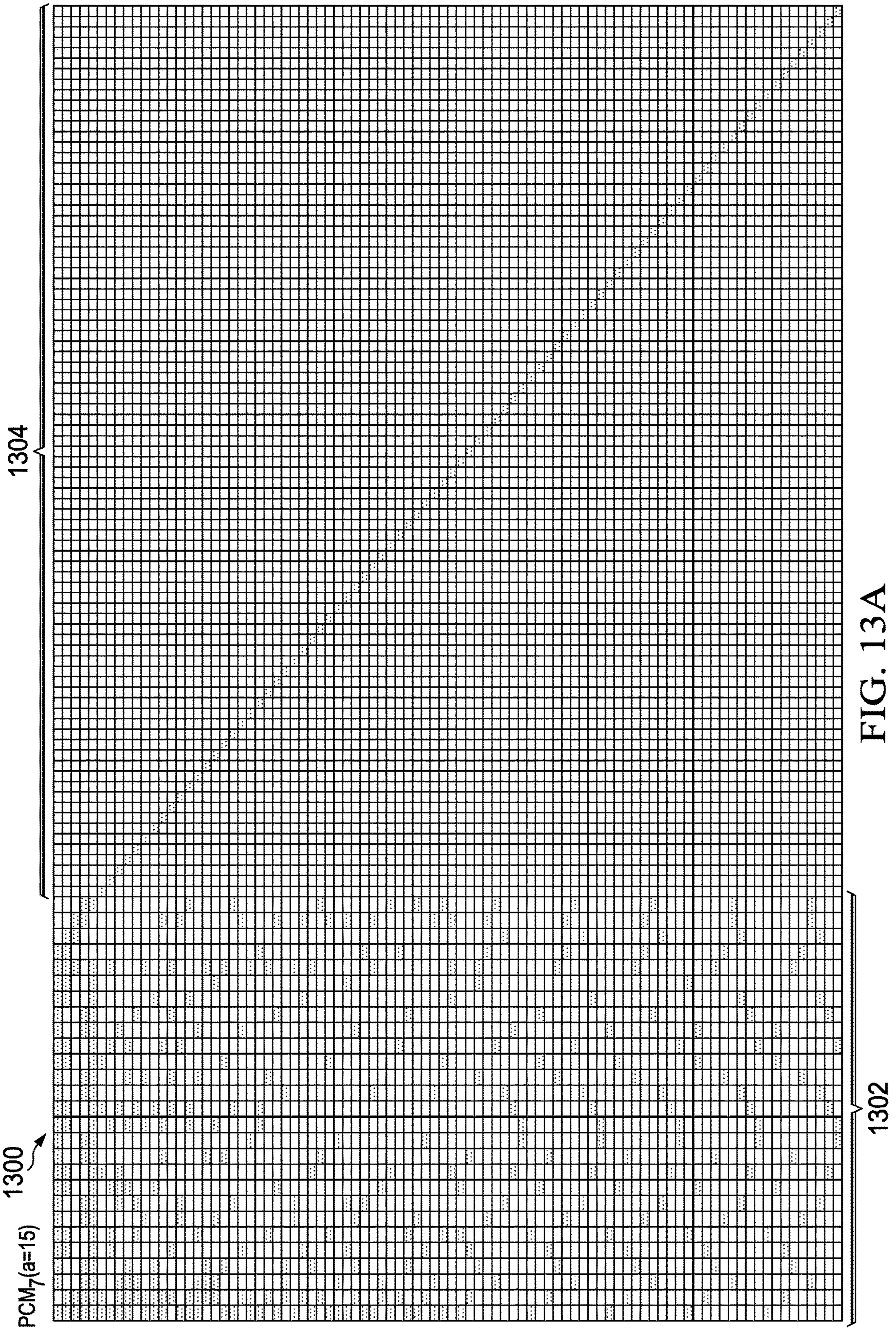

In an embodiment a first base PCM 500 is shown in FIG. 5A. FIGS. 5B and 5C is a representation of the left columns 502 of this base PCM 500 excluding the columns of the long identity matrix 504. FIG. 6A shows a labelled PCM 600 for a=8 ($PCM_0$). FIGS. 6B-6E is a representation of the left columns 602 of the $PCM_0$ 600 excluding the columns of the long identity matrix 604. FIG. 7A shows a labelled PCM 700 for a=9 ($PCM_1$). FIGS. 7B-7E is a representation of the left columns 702 of the $PCM_1$ 700 excluding the columns of the long identity matrix 704. FIG. 8A shows a labelled PCM 800 for a=10 ($PCM_2$). FIGS. 8B-8E is a representation of the left columns 802 of the $PCM_2$ 800 excluding the columns of the long identity matrix 804. FIG. 9A shows a labelled PCM 900 for a=11 ($PCM_3$). FIGS. 9B-9E is a representation of the left columns 902 of the $PCM_3$ 900 excluding the columns of the long identity matrix 904. FIG. 10A shows a labelled PCM 1000 for a=2 ($PCM_4$). FIGS. 10B-10E is a representation of the left columns 1002 of the $PCM_4$ 1000 excluding the columns of the long identity matrix 1004. FIG. 11A shows a labelled PCM 1100 for a=13 ($PCM_5$). FIGS. 11B-11E is a representation of the left columns 1102 of the $PCM_5$ 1100 excluding the columns of the long identity matrix 1104. FIG. 12A shows a labelled PCM 1200 for a=14 ($PCM_6$). FIGS. 12B-12C is a representation of the left columns 1202 of the $PCM_6$ 1200 excluding the columns of the long identity matrix 1204. FIG. 13A shows a labelled PCM 1300 for a=15 ($PCM_7$). FIGS. 13B-13E is a representation of the left columns 1302 of the $PCM_7$ 1300 excluding the columns of the long identity matrix 1304. FIGS. 6A-6E, 7A-7E, 8A-8E, 9A-9E, 10A-10E, 11A-11E, 12A-12C, and 13A-13E show labelled PCMs 600, 700, 800, 900, 1000, 1100, 1200, 1300 of the first base PCM 500.

Figure 14A:
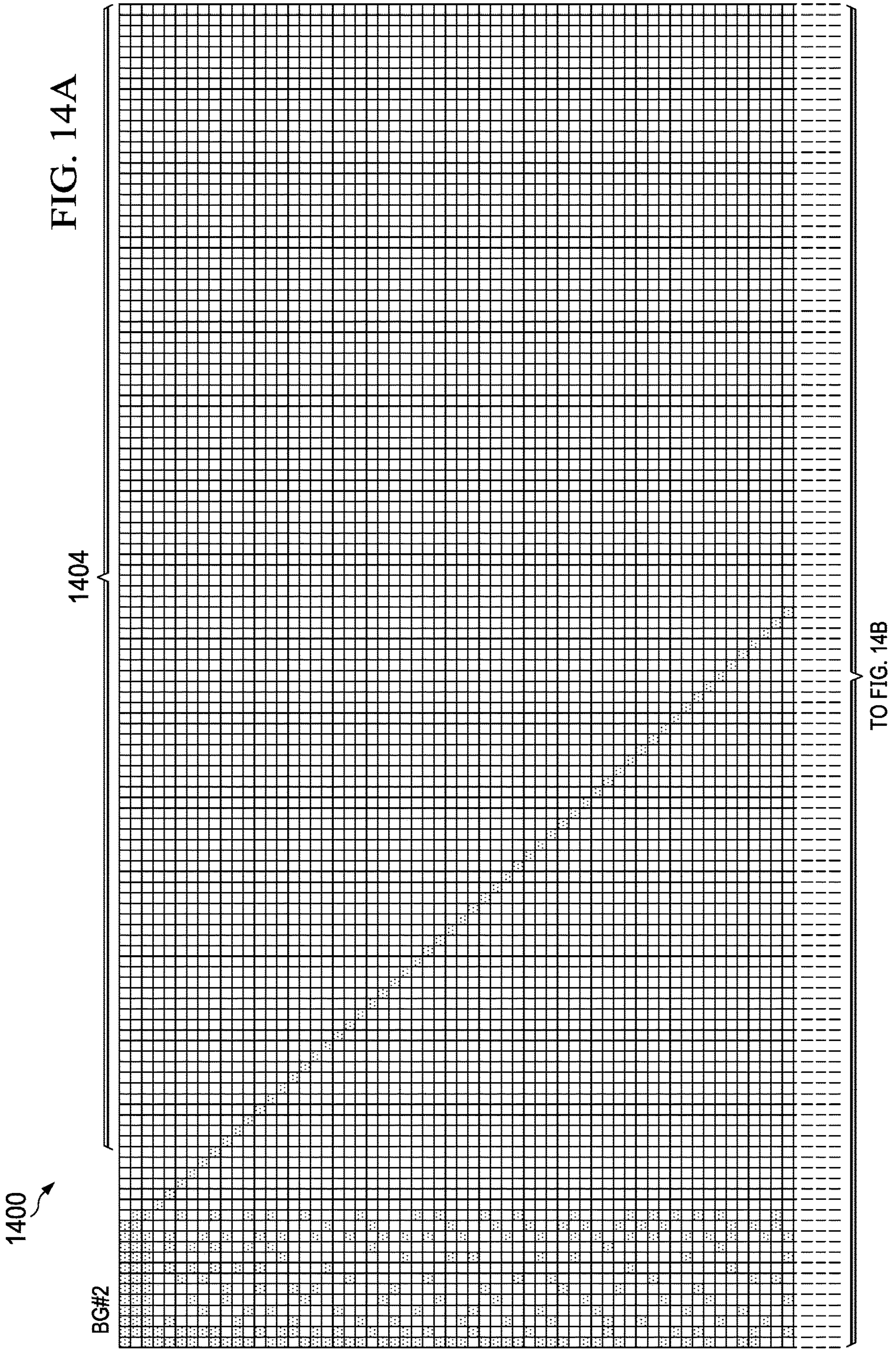
Figure 14B:
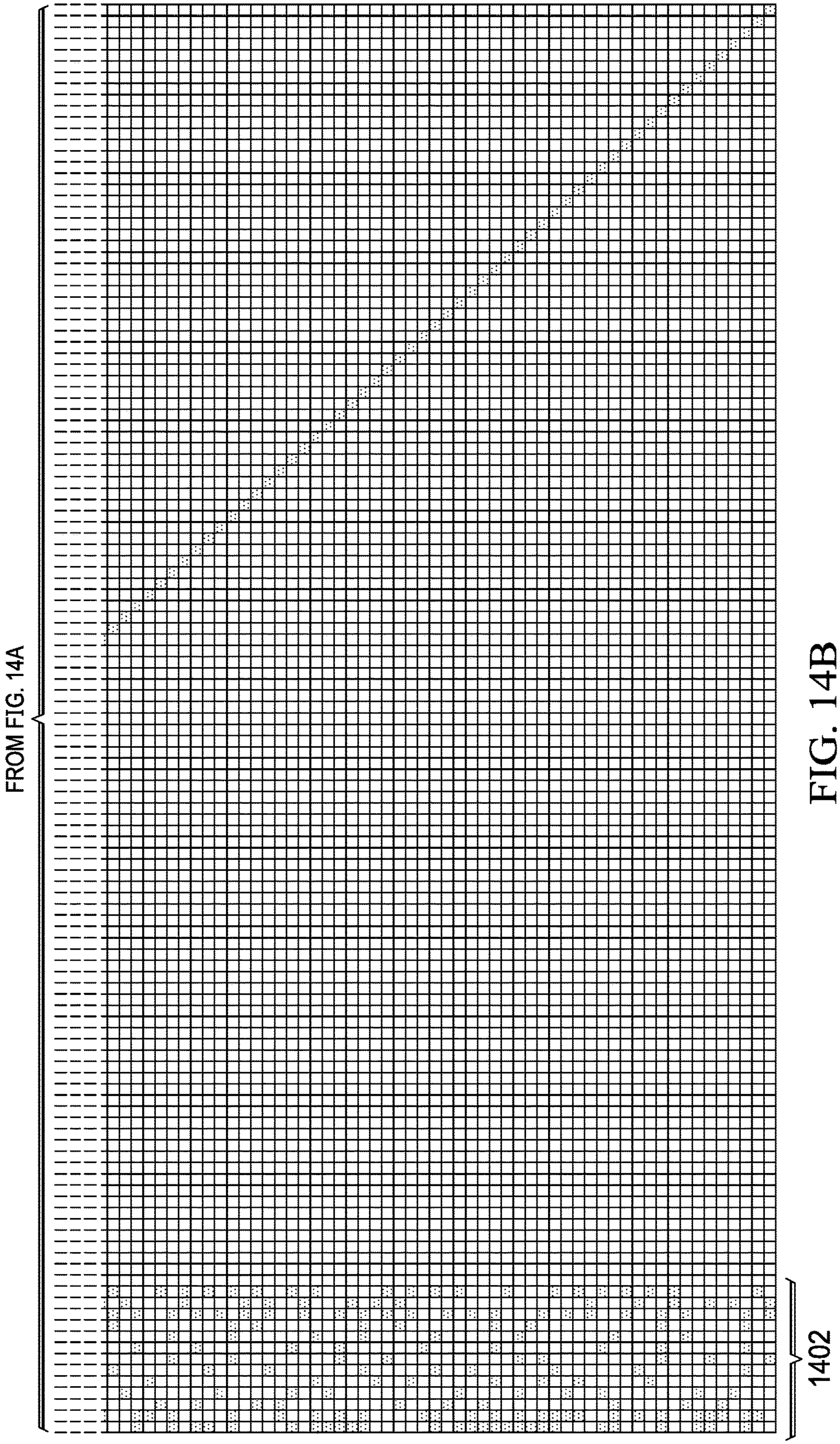
Figure 15A:
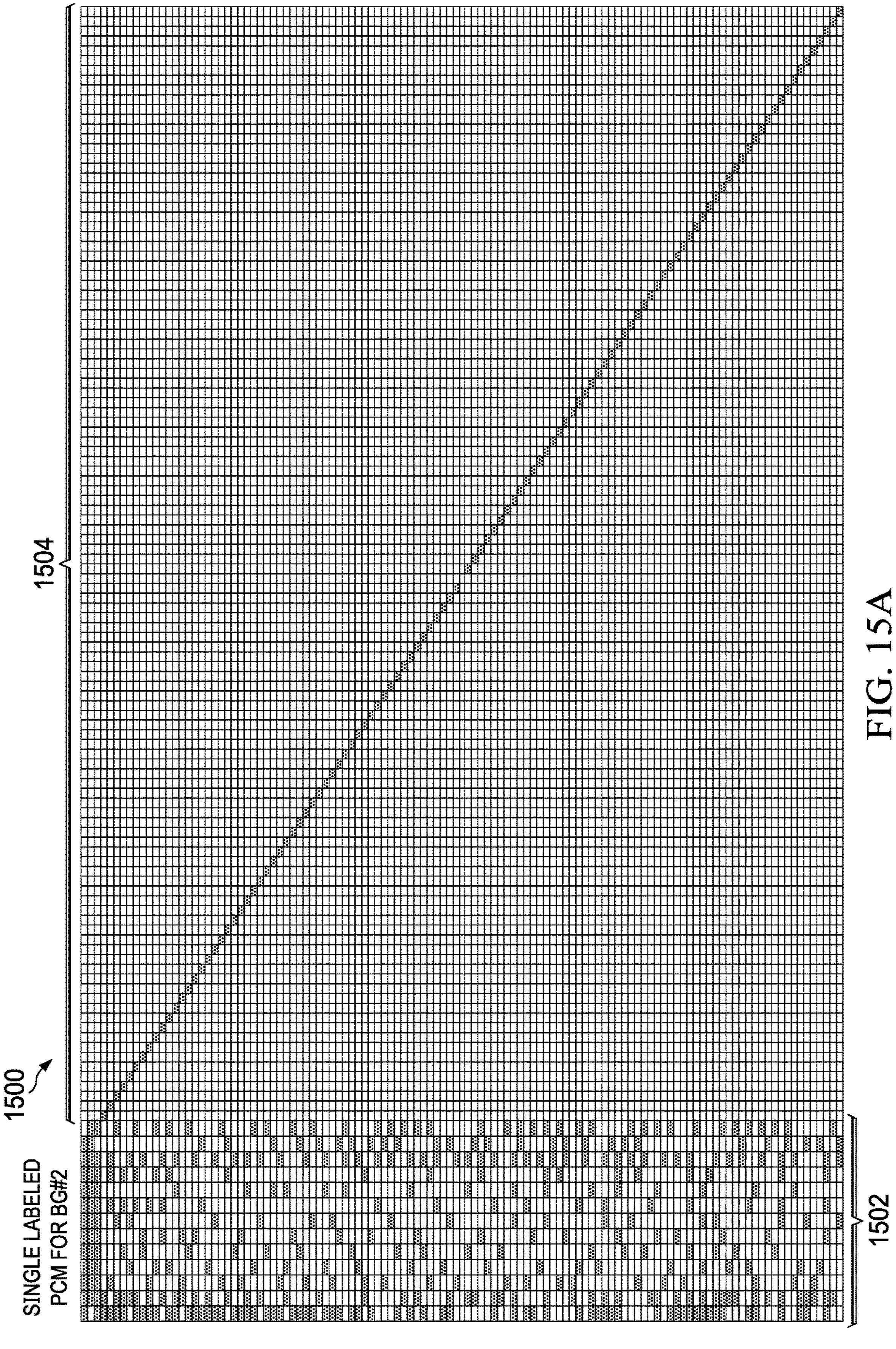

In another embodiment a second base PCM 1400 is shown in FIGS. 14A and 14B. FIGS. 14C and 14D is a representation of the left columns 1402 of this base PCM 1400 excluding the columns of the long identity matrix 1404. FIG. 15A shows a single labelled PCM 1500. FIGS. 15B-15D is a representation of the left columns 1502 of the single labelled PCM 1500 excluding the columns of the long identity matrix 1504.

Figure 16A:
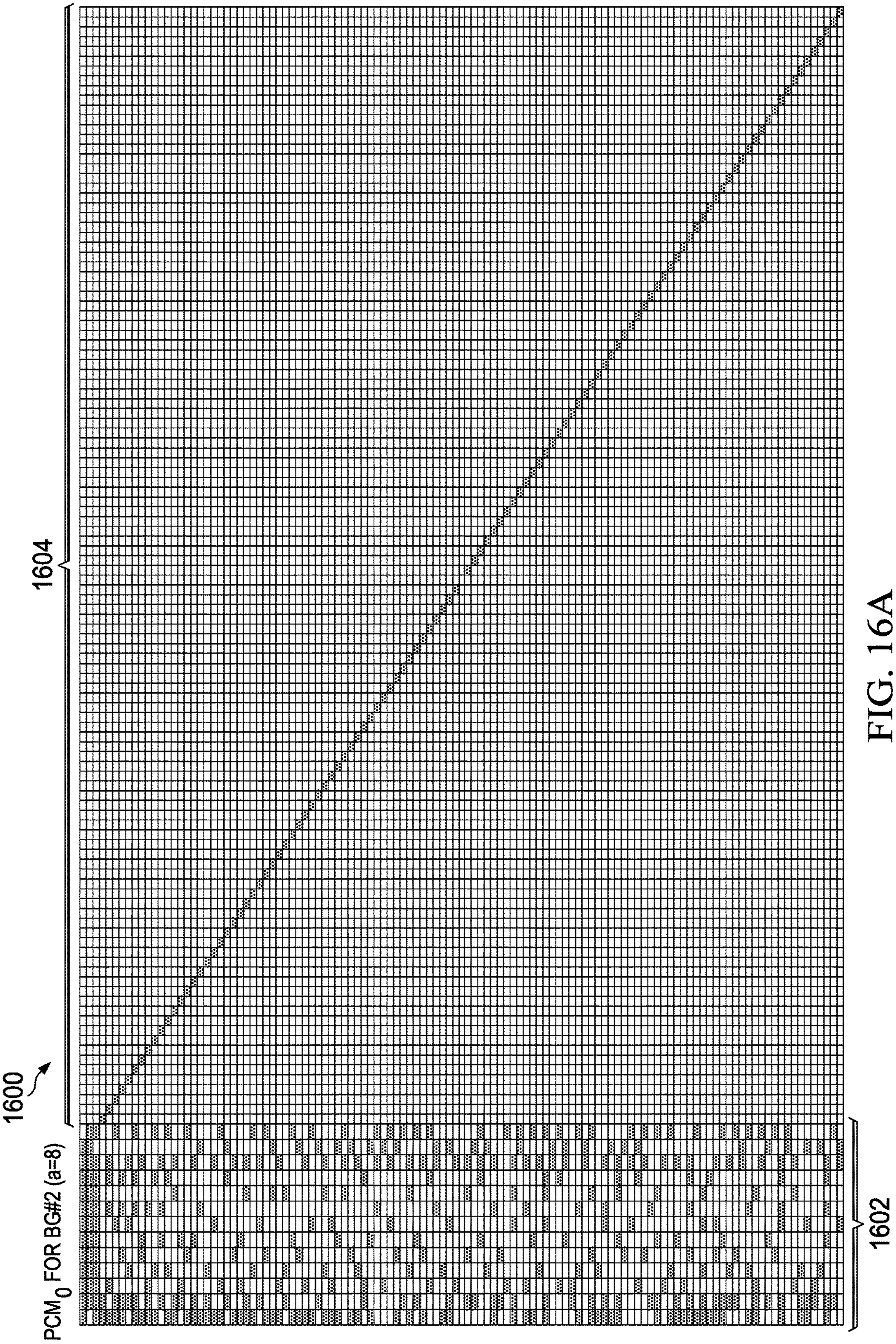
Figure 17A:
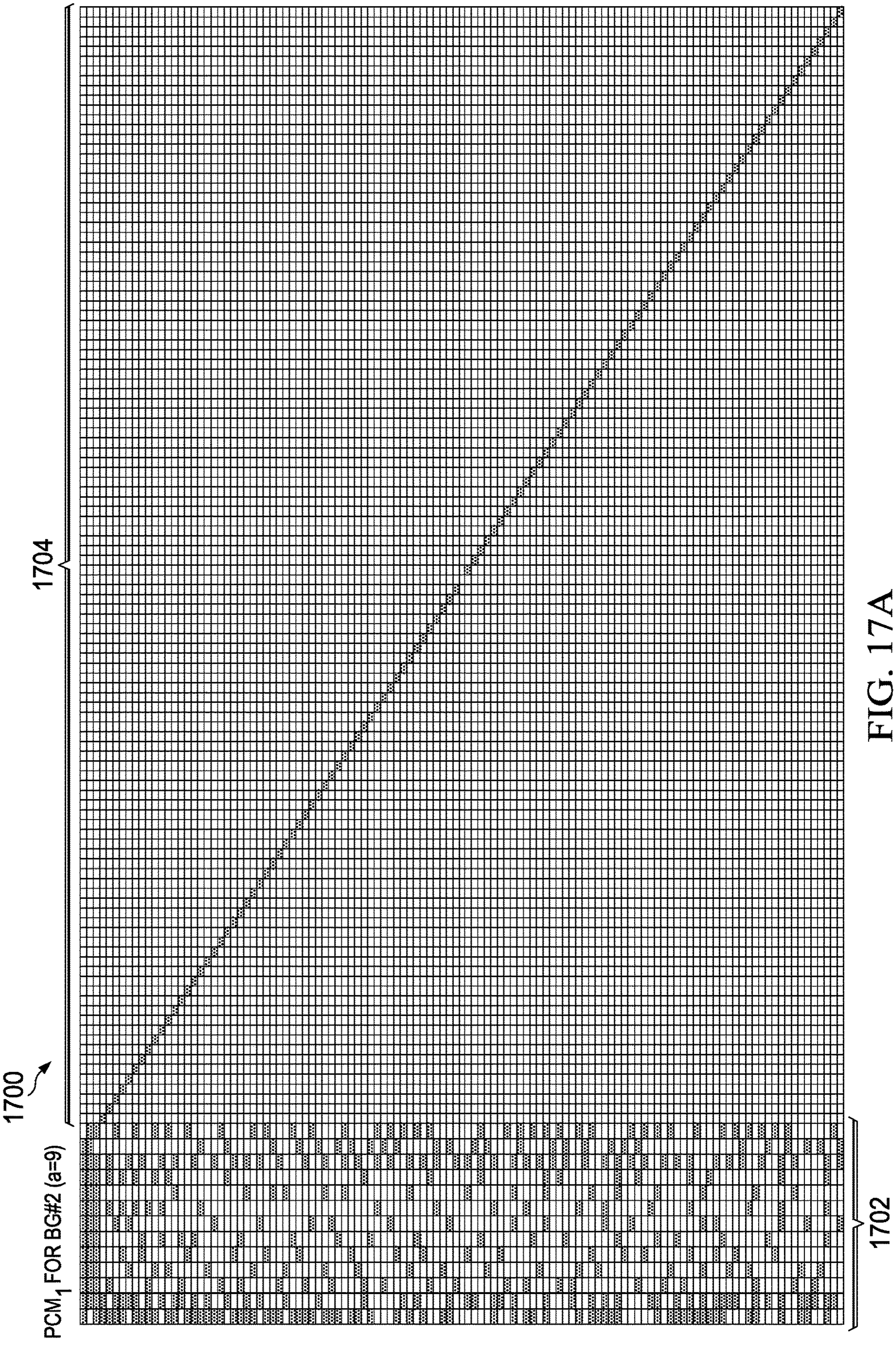
Figure 18A:
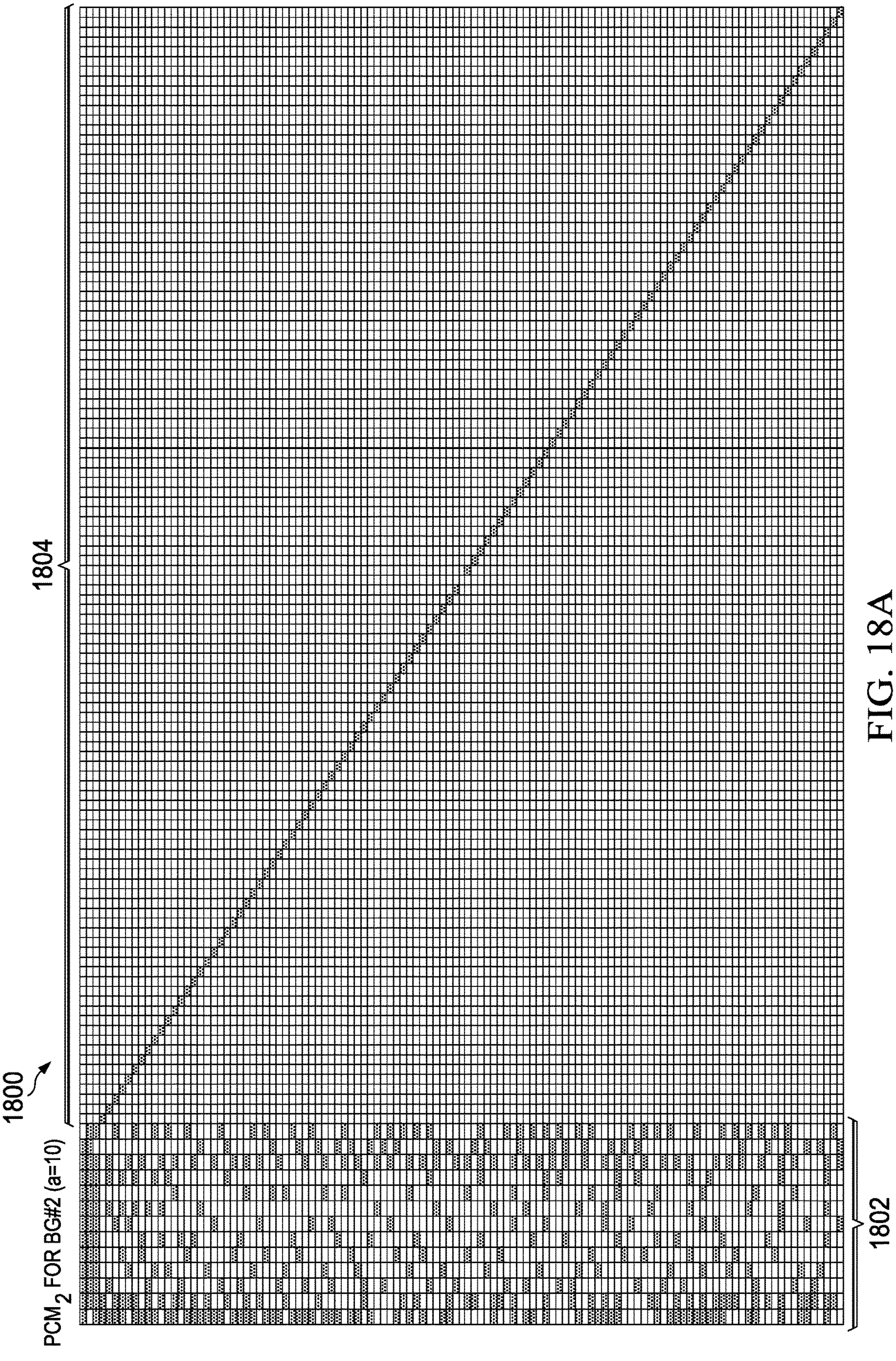
Figure 19A:
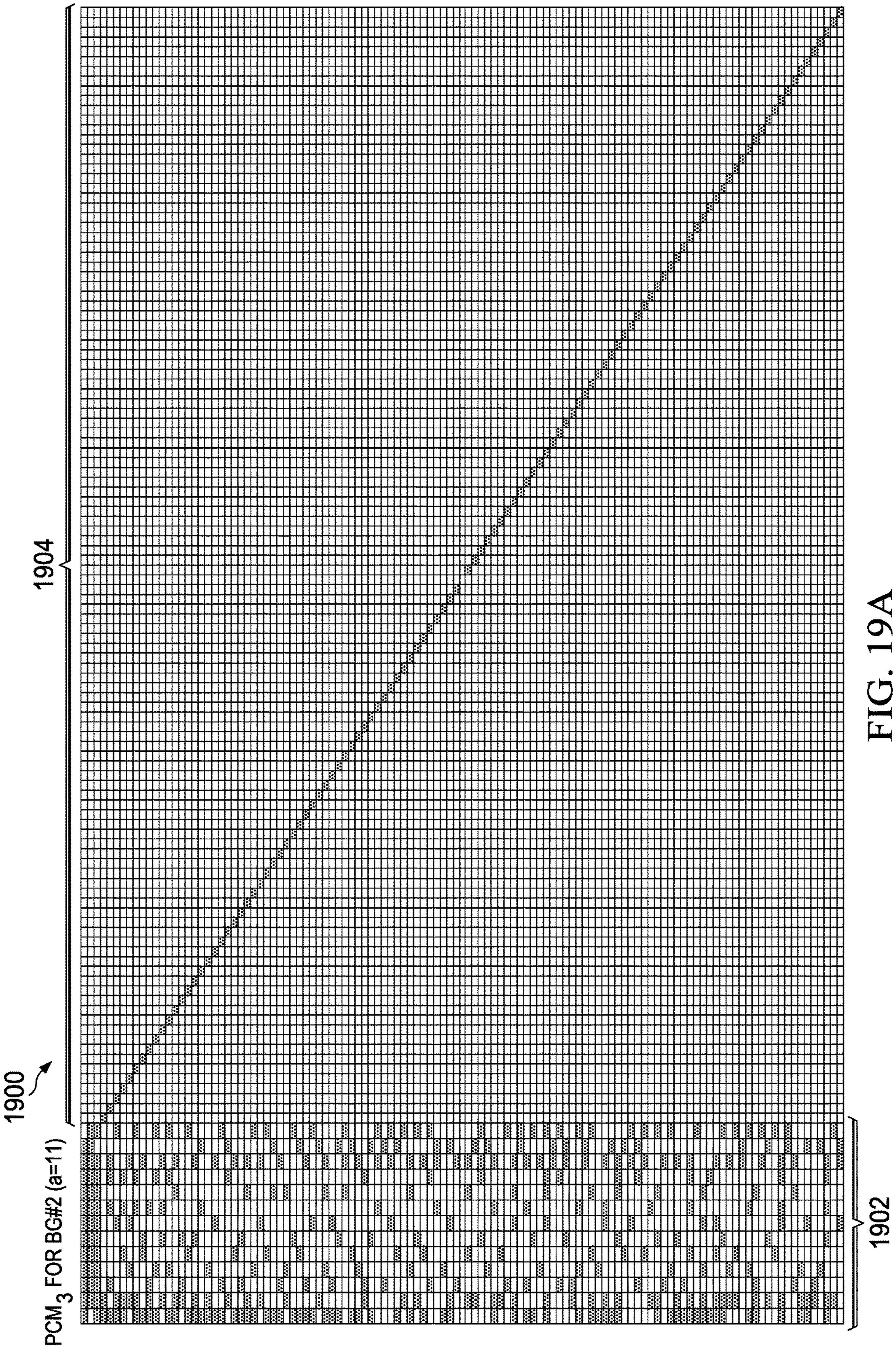
Figure 20A:
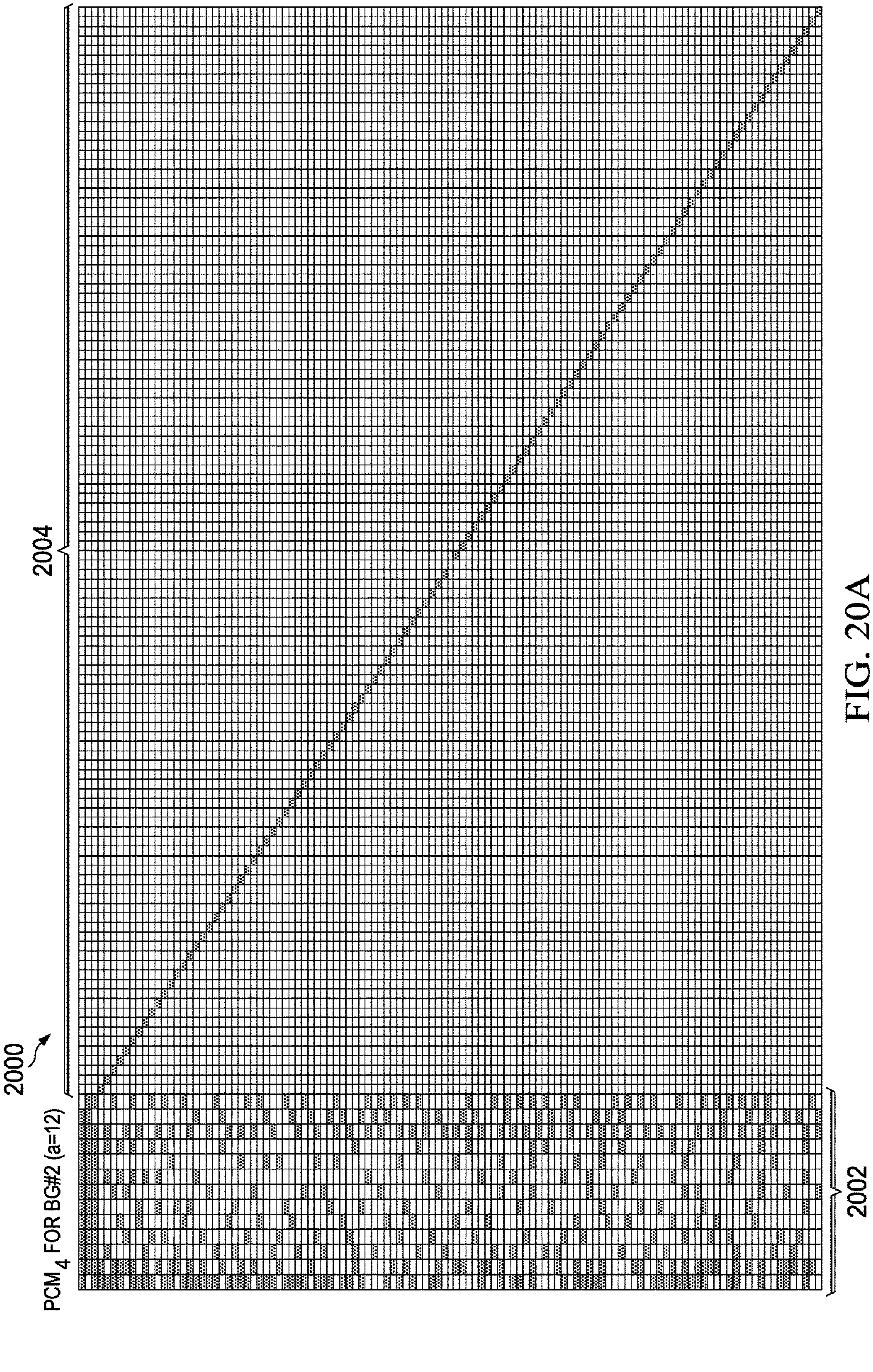

FIG. 16A shows a labelled PCM 1600 for a=8 ($PCM_0$). FIGS. 16B-16D is a representation of the left columns 1602 of the $PCM_0$ 1600 excluding the columns of the long identity matrix 1604. FIG. 17A shows a labelled PCM 1700 for a=9 ($PCM_1$). FIGS. 17B-17D is a representation of the left columns 1702 of the $PCM_1$ 1700 excluding the columns of the long identity matrix 1704. FIG. 18A shows a labelled PCM 1800 for a=10 ($PCM_2$). FIGS. 18B-18D is a representation of the left columns 1802 of the $PCM_2$ 1800 excluding the columns of the long identity matrix 1804. FIG. 19A shows a labelled PCM 1900 for a=11 ($PCM_3$). FIGS. 19B-19D is a representation of the left columns 1902 of the $PCM_3$ 1900 excluding the columns of the long identity matrix 1904. FIG. 20A shows a labelled PCM 2000 for a=12

Figure 21A:
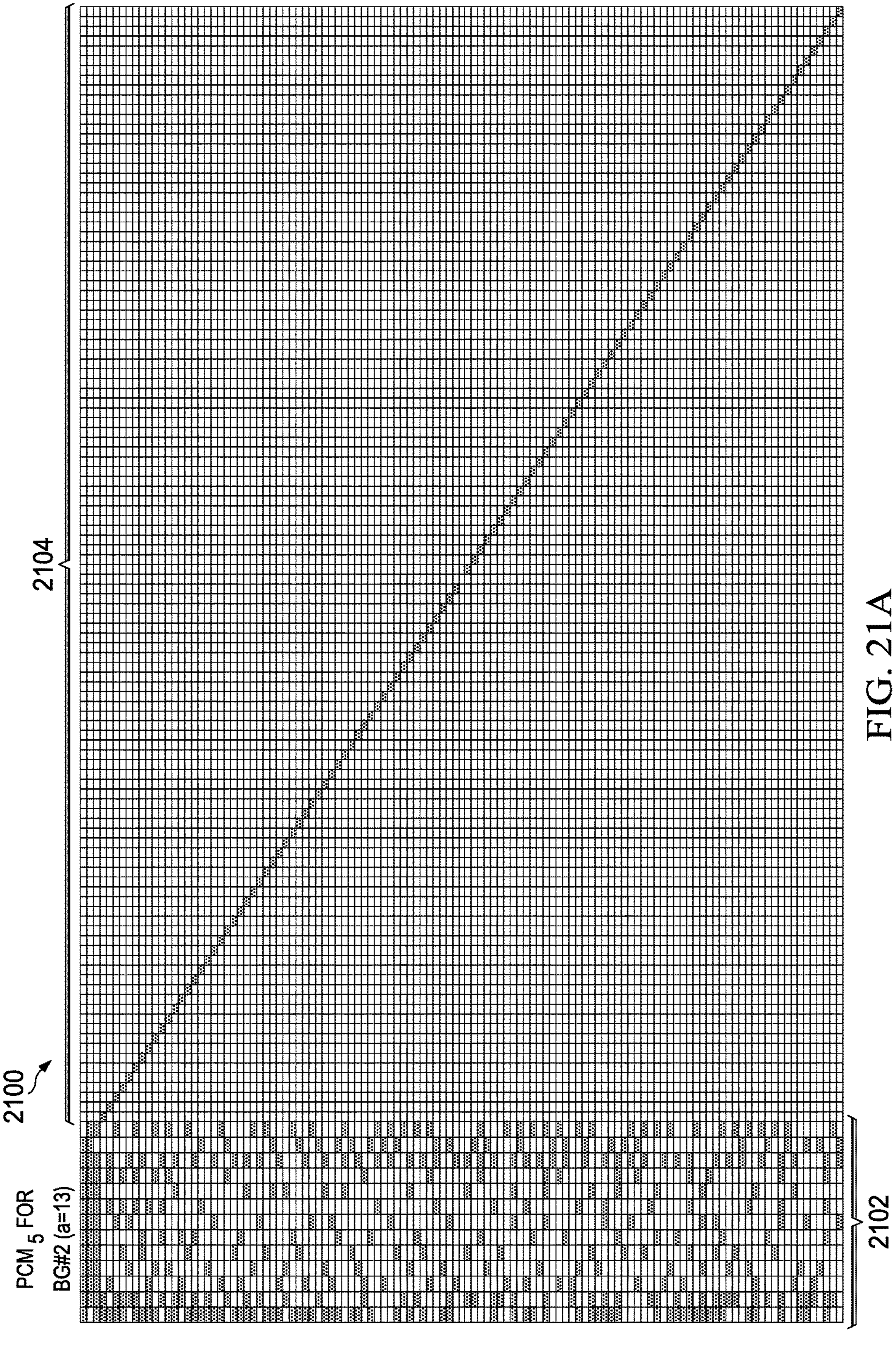
Figure 22A:
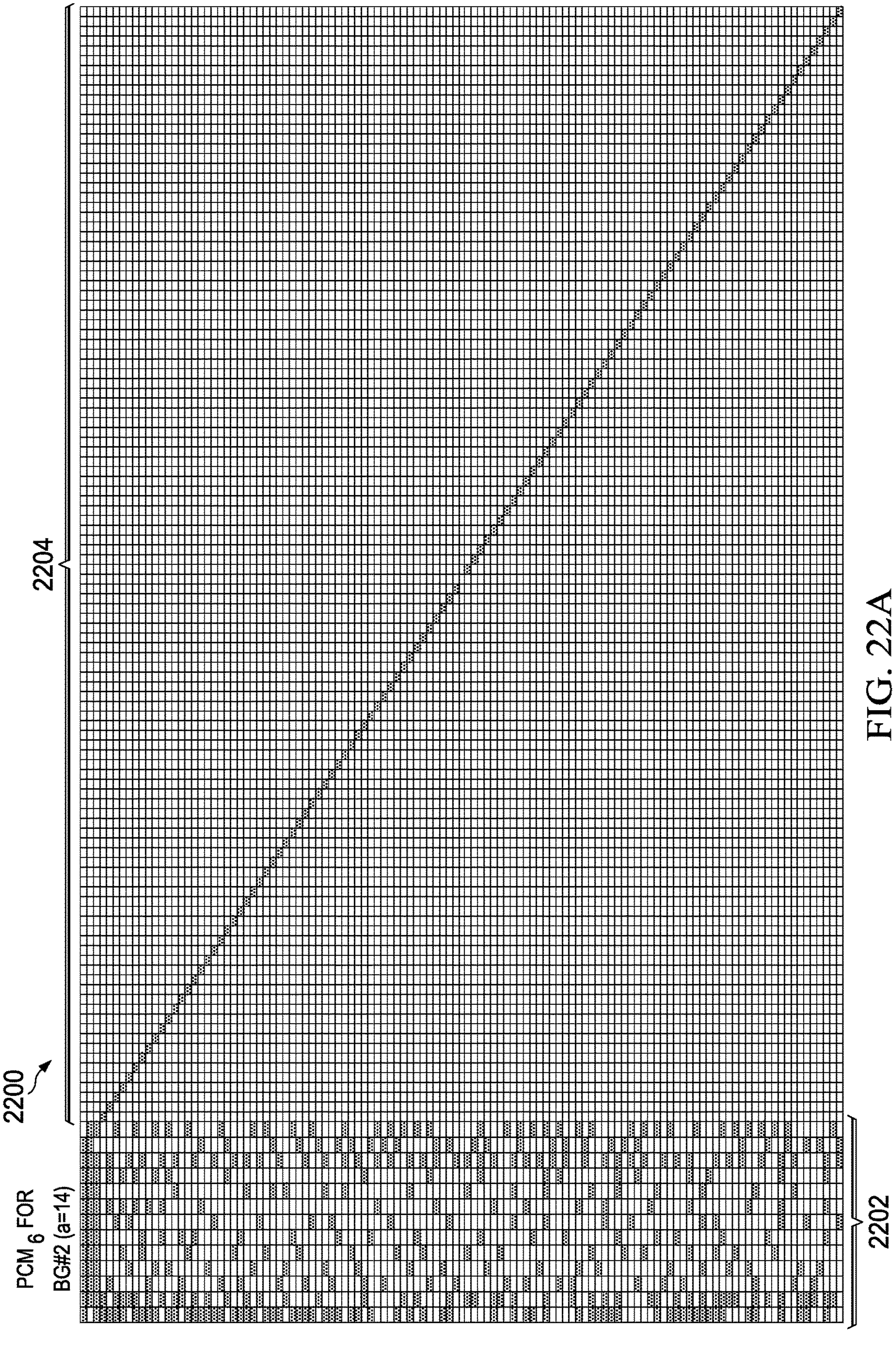
Figure 23A:
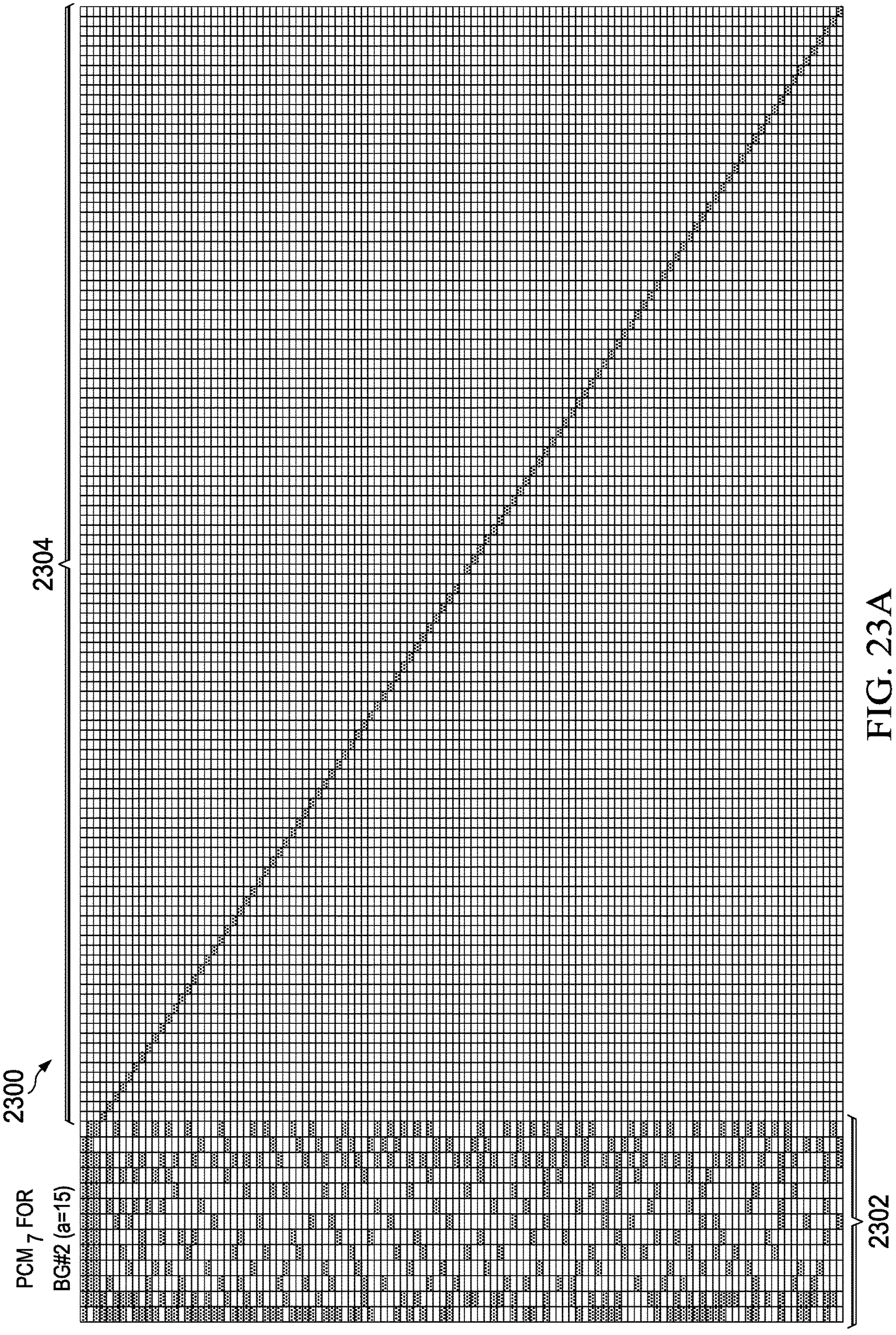

($PCM_4$). FIGS. 20B-20D is a representation of the left columns 2002 of the $PCM_4$ 2000 excluding the columns of the long identity matrix 2004. FIG. 21A shows a labelled PCM 2100 for a=13 ($PCM_5$). FIGS. 21B-21D is a representation of the left columns 2102 of the $PCM_5$ 2100 excluding the columns of the long identity matrix 2104. FIG. 22A shows a labelled PCM 2200 for a=14 ($PCM_6$). FIGS. 22B-22D is a representation of the left columns 2202 of the $PCM_6$ 2200 excluding the columns of the long identity matrix 2204. FIG. 23A shows a labelled PCM 2300 for a=15 ($PCM_7$). FIGS. 23A-23D is a representation of the left columns 2302 of the $PCM_7$ 2300 excluding the columns of the long identity matrix 2304. FIGS. 16A-16D, 17A-17D, 18A-18D, 19A-19D, 20A-20D, 21A-21D, 22A-22-D, and 23A-23D show labelled PCMs 1600, 1700, 1800, 1900, 2000, 2100, 2200, 2300 of the second base PCM 1400.

In step 308, a single combination of $\{Z, f_i, \text{base}(R, Z)\}$ is selected for each coding rate R and each information length K. This combination may be identified through simulation by measuring the error correction capabilities of the decoder for each possible combination and selecting the one having the best performance between all options. The result may be stored in a lifting table T which for each pair (R,Z) defines lift size Z (or lift size offset), lifting function $f_j$ and the index of the PCM used. For each pair (R,Z) a set of selected lift sizes Z may be explored each time. For example, the set of selected lift sizes Z may be 8.

Alternatively, m may be different for different (K,R) pairs. For example, m=8 options are explored for K<=2048 and m=4 are explored for K>2048.

As noted above, a set of lifting functions $f_i, f_2, \ldots, f_n$ may have only one entry, i.e., one lifting function (i.e. n=1). Alternatively, n>1 functions may be explored. In both cases, different functions may be used for different ranges of K, R or (K,R) pairs.

For every transmission of data the coding rate and the information length may be different. A low coding rate provides good protection (reliability) while a high coding rate does not provide as good protection. If a transmission with a certain coding rate does not go through, the data needs to be retransmitted. Retransmission in this case means that the data is transmitted with a lower coding rate than before but the same information length.

In step 310, the combination is stored for every information length and every code rate in a memory. The combination may be stored in a table (e.g., lifting table), in a list, in a linked list, in a database, in a tree or in any other type of storage device and format.

Accordingly, even though steps 302-310 provide a child PCM for each length K and each coding rate R, dependency on the rate R may be removed for a subsequent retransmission or for each subsequent retransmission.

For example, for each subsequent retransmission only additional parity bits are transmitted (so called IR HARQ). In this case the child PCMs, for starting and for all lower rates, should be nested which means that the lifting method and table should not depend on a coding rate R or be independent of the coding rate R.

At the same time, several different overlapping (or non-overlapping) ranges of rates $[R_{low1} \ldots R_{up1}]$, $[R_{low2} \ldots R_{up2}]$ etc. may be used so that for each range different rate-independent lifting tables $T_1, T_2, \ldots$ etc. are designed using steps 302-310. From this point of view, lift sizes, lifting functions and PCMs indirectly depend on a rate or to range of rates.

In various embodiments the same set of labelled PCMs may be shared for different ranges of rates. In various other embodiments, different sets of PCMs and even different protographs may be used for different ranges of rates.

The lifting table T may have the form as shown in FIG. 4A. The first column of lifting table T 402 in FIG. 4A is for $Z_{orig}$, the second column is for an index i for a specific lift size $Z_i$, the third column is for an index j for a specific lifting function $f_j$ and the fourth column is for an index t for a specific labelled PCM, $PCM_t$.

Figures 4B, 4C:
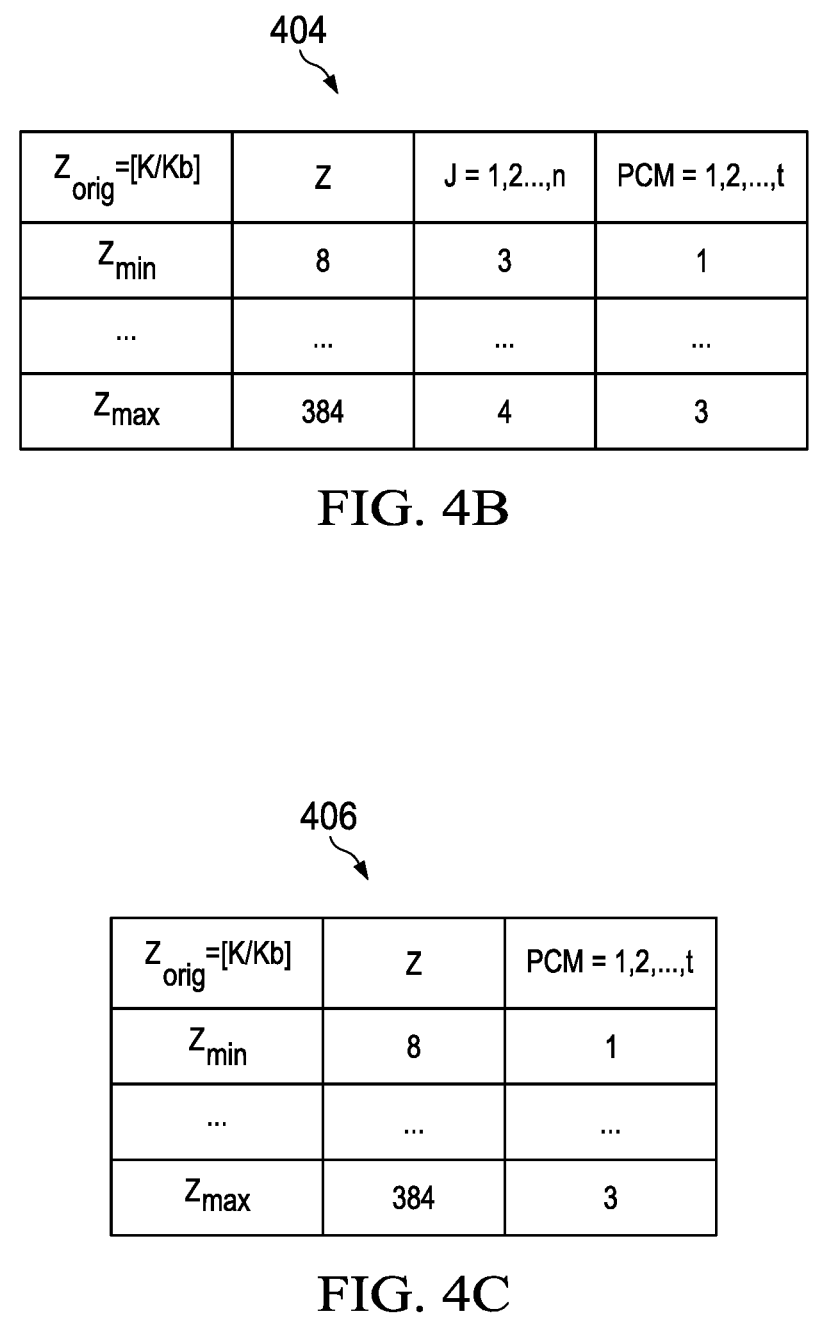

FIG. 4B shows a lifting table T 404 wherein the index i of the lift size Z in the second column is replaced by the lifting size Z so that the entries show the actual lift size.

FIG. 4C shows a lifting table T 406 for only one lifting function f so that the third column can be removed.

FIGS. 5A-5B show an example of a first multi label QC LDPC base Code 500 and FIGS. 6A, 6B, 7A, 7B, 8A, 8B, 9A, 9B, 10A, 10B, 11A, 11B, 12A, 12B-12C, 13A, and 13B-13E show first labelled QC LDPC codes 600, 700, 800, 900, 1000, 1100, 1200, 1300.

FIGS. 14A-14E show an example of a second multi label QC LDPC base Code 1400 and Figs. FIGS. 15A-15D, 16A-16D, 17A-17D, 18A-18D, 19A-19D, 20A-20D, 21A-21D, 22A-22-D, and 23A-23D show second labelled LDPC codes 1500, 1600, 1700, 1800, 1900, 2000, 2100, 2200, 2300.

24A-24I show lifting tables T 2402, 2404, 2406, 2408. The lifting table T1 2402 of FIG. 24A may be used for coding rates 1/3≤R≤8/9 and information length 640≤K≤8192 when $K_{bmax}$=22. The index i=0, . . . , 7 identifies the allowed Zs. The lifting table T2 2404 of FIG. 24B may be used for coding rates 1/5≤R≤2/3 and information length 40≤K≤2560 when $K_{bmax}$=16. The index i=0, . . . 7 identifies the allowed Zs. show lifting tables of the first code. FIGS. 25A-25L show lifting tables 2406, 2408 of the second code.

Figure 26A:
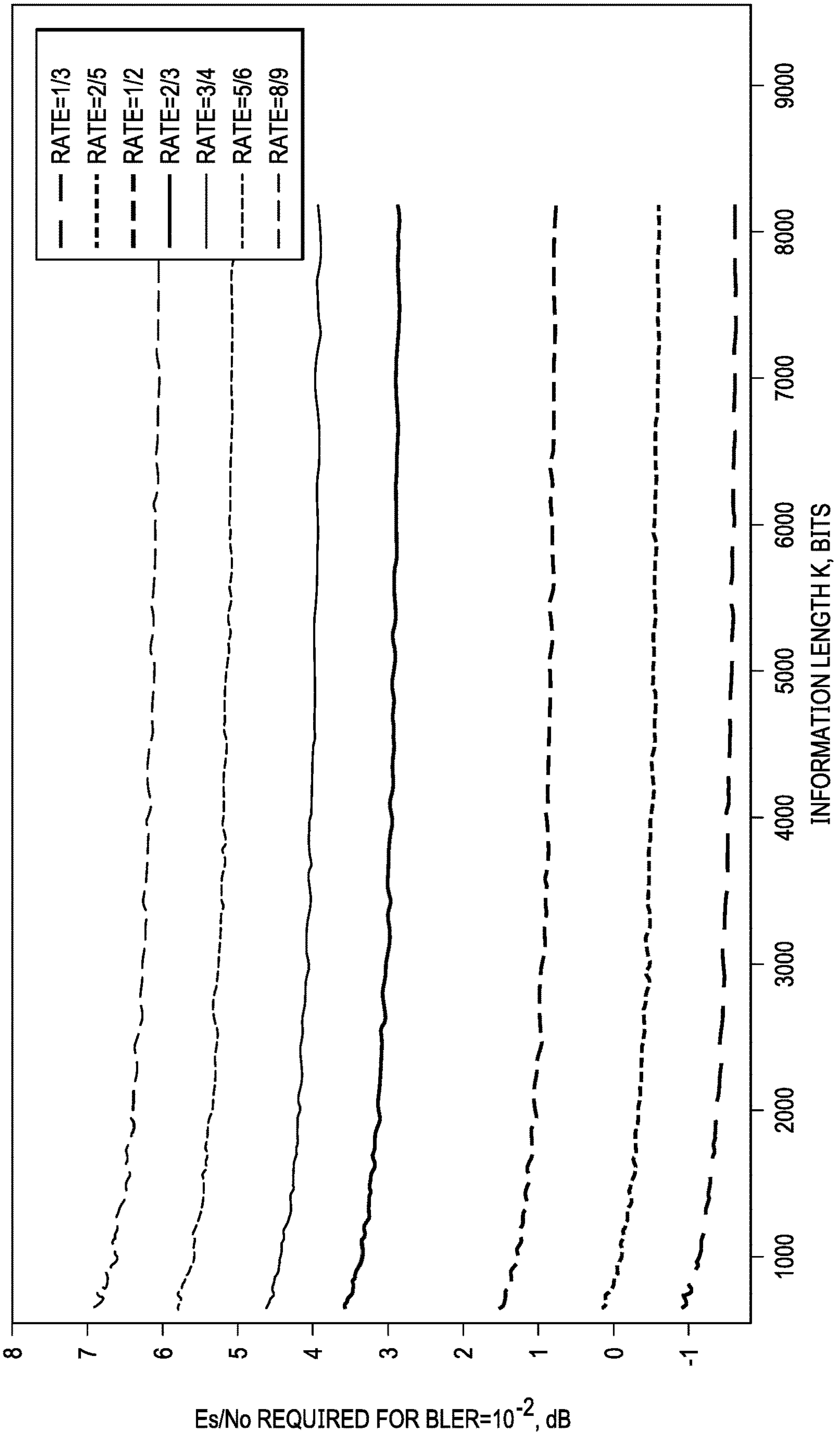
FIG. 26A-26D show the performance improvement of a decoder applying lifting tables T1 and T2 for different information length and different coding rates R.
Figure 26B:
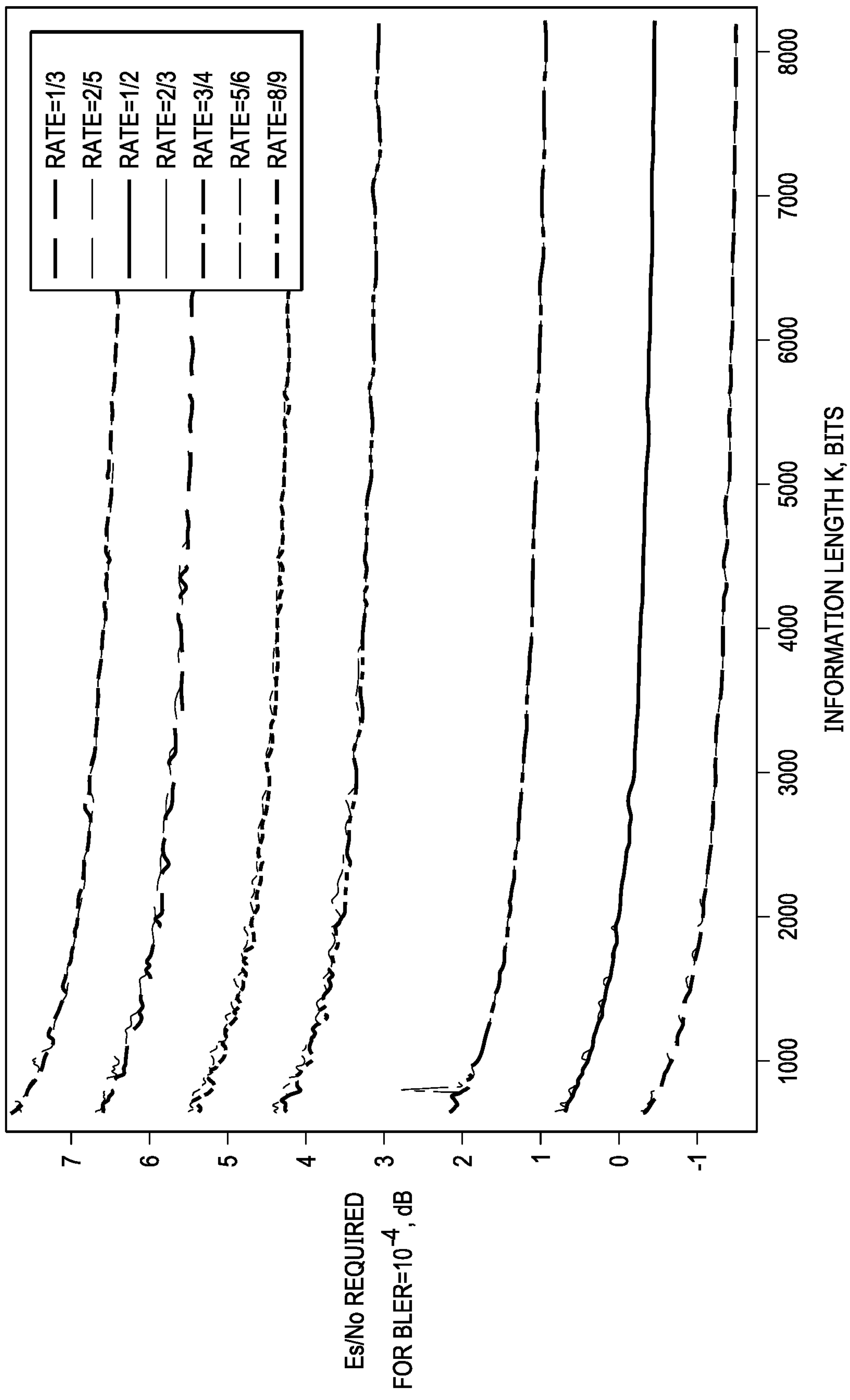
Figure 26C:
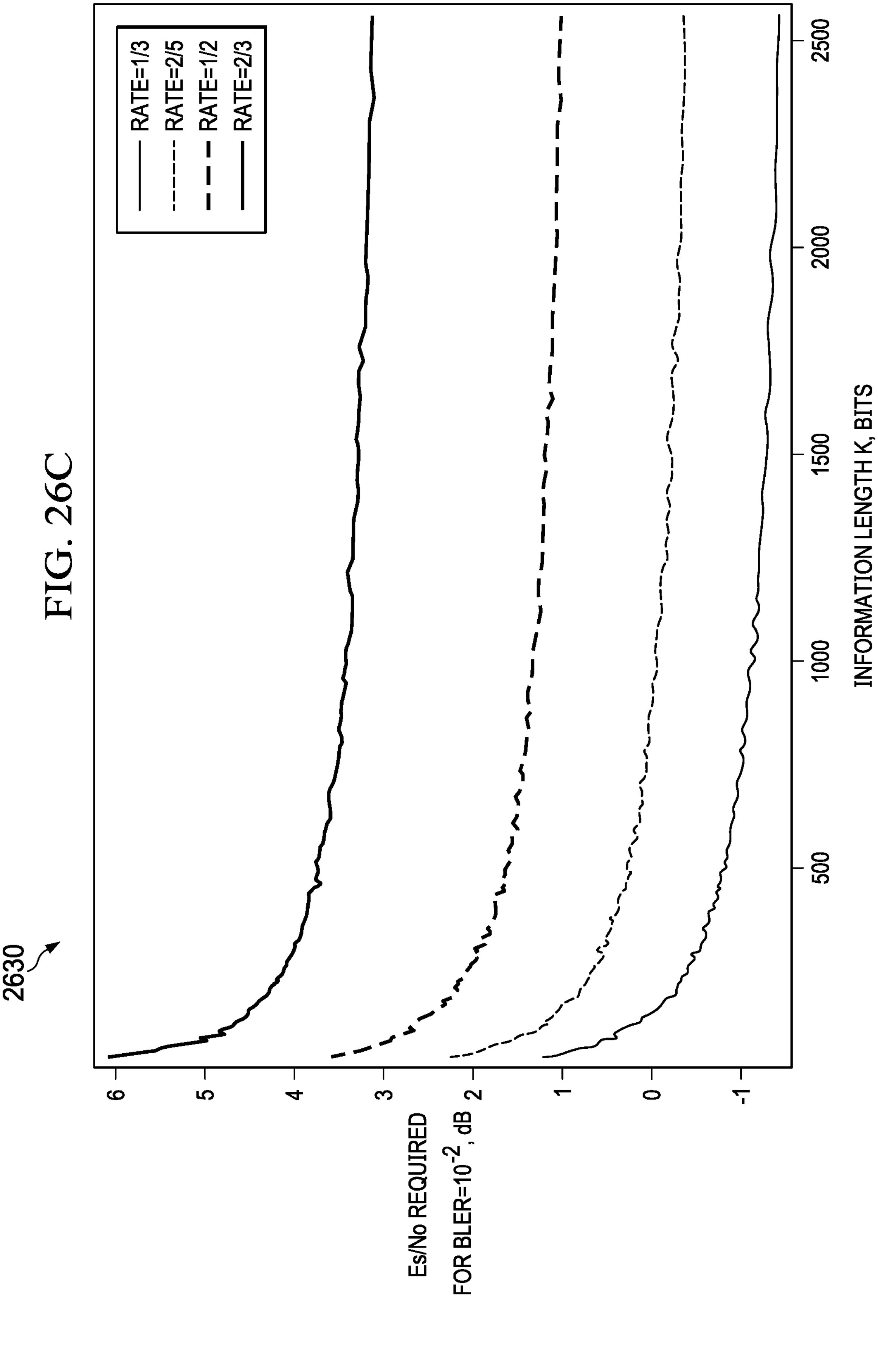
Figure 26D:
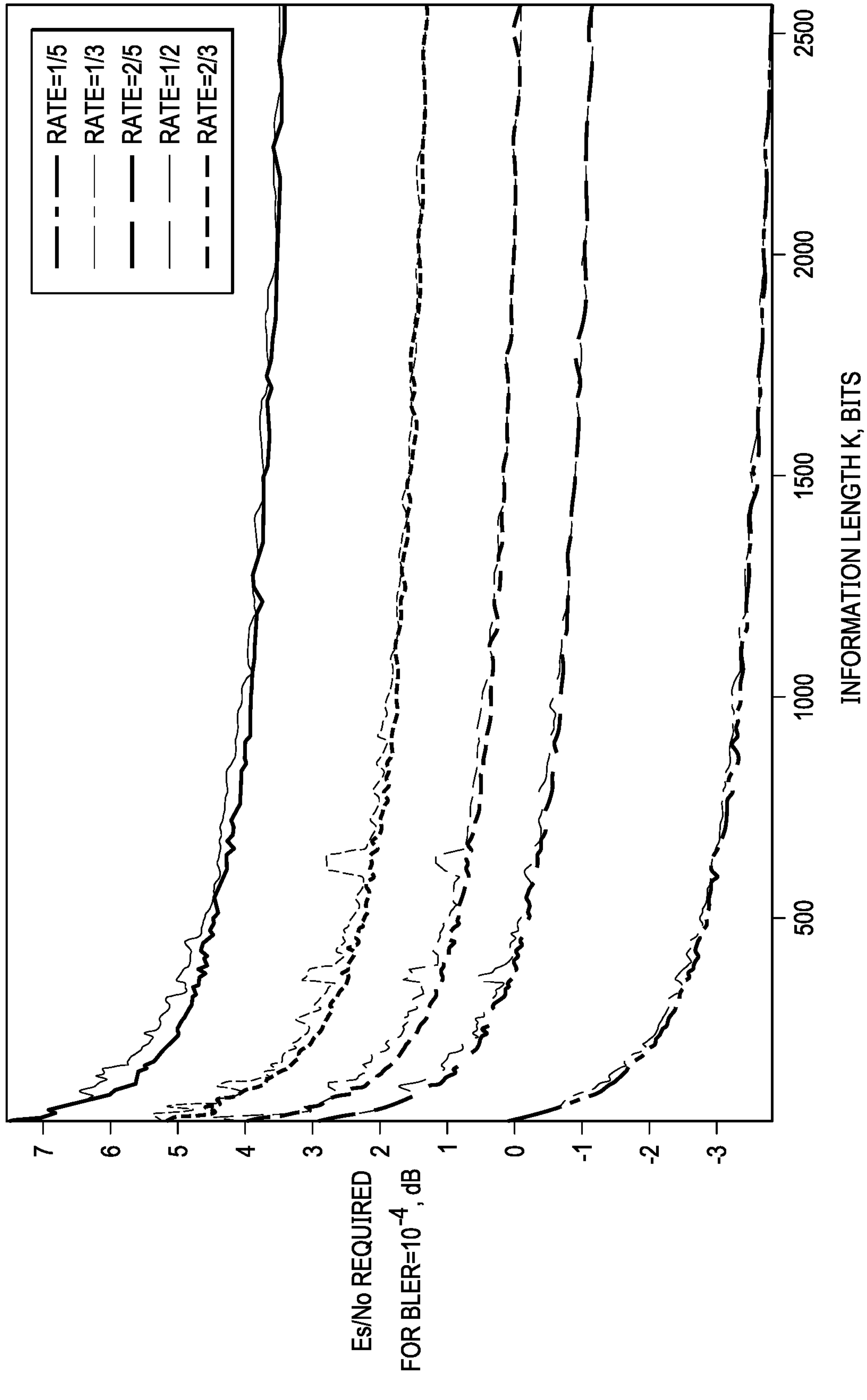

FIGS. 26A and 26C show the performance 702, 706 of a decoder for applying lifting tables T1 and T2 and for different coding rates R. FIGS. 26B and 26D show related graphs 704, 706 without the implementation of embodiments of the disclosure. As can be seen from comparing FIGS. 26A and 26B, and FIGS. 26C and 26D, embodiments of the disclosure show smooth graphs. In particular, no peaks or spikes can be seen in these smooth graphs showing the excellent performance of the codes using the tables T1 and T2 for a wide range of information length K.

Figure 27:
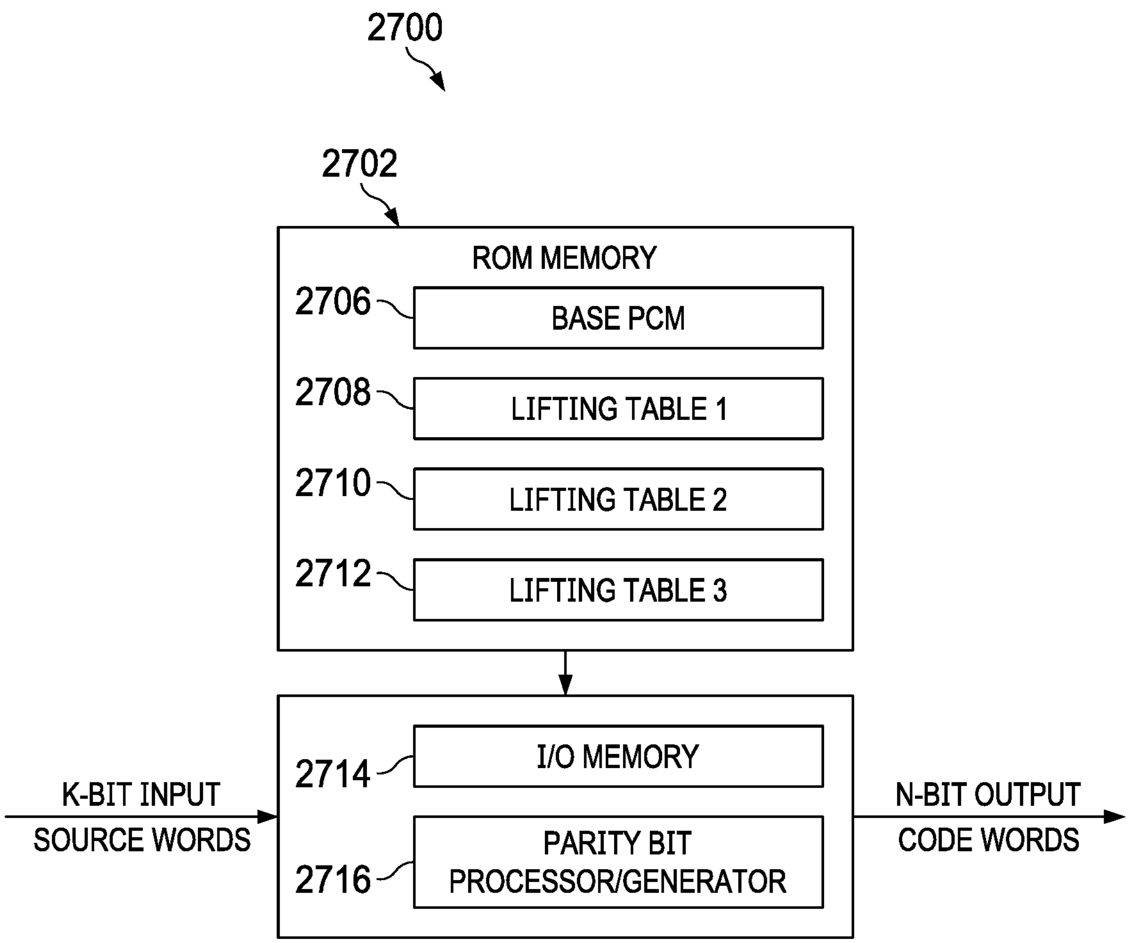
FIG. 27 is a block diagram of an embodiment of a LDPC encoder.

FIG. 27 is a block diagram of an embodiment of a LPDC encoder 2600. LPDC encoder 2600 includes a read-only memory 2602 where the base PCMs 2606 and one or more lifting tables T 2608, 2610, 2612 are stored, I/O memory 2614, and a parity bit processor/generator 2616. The encoder 2600 receives a K-bit input source word and generates an N-bit output code word. The I/O memory 2614 stores the input K-bit information word and is used by the encoder 2600 to generate the K-bit output. The read-only memory 2602 stores base code lift shift values and the lifting table 2608, 2610, 2612. In an embodiment, the lifting functions are implemented in hardware and are not stored in memory. The lifting table 2608, 2610, 2612 may comprise one of the lifting tables shown in FIGS. 4A-4C or FIGS. 6A-6E. The parity bit processor/generator 2616 generates an N-bit output code word according to the K-bit input using appropriate LDPC encoding method, using the child PCM generated on the fly from one of the base PCMs 2606 (or a generator matrix corresponding to this child PCM). This child PCM generation is done by producing offset values of the child code, for each non-zero circulant of the base PCM 2606, by selecting one of the lift size offset values and/or allowed lift sizes, and using this lift size offset and one of the lifting functions or a set of functions corresponding to selected indices in the lifting table 2608, 2610, 2612 that are appropriate for the given size, K, of the input. The N-bit output is then stored in the I/O memory 2614.

Figure 28:
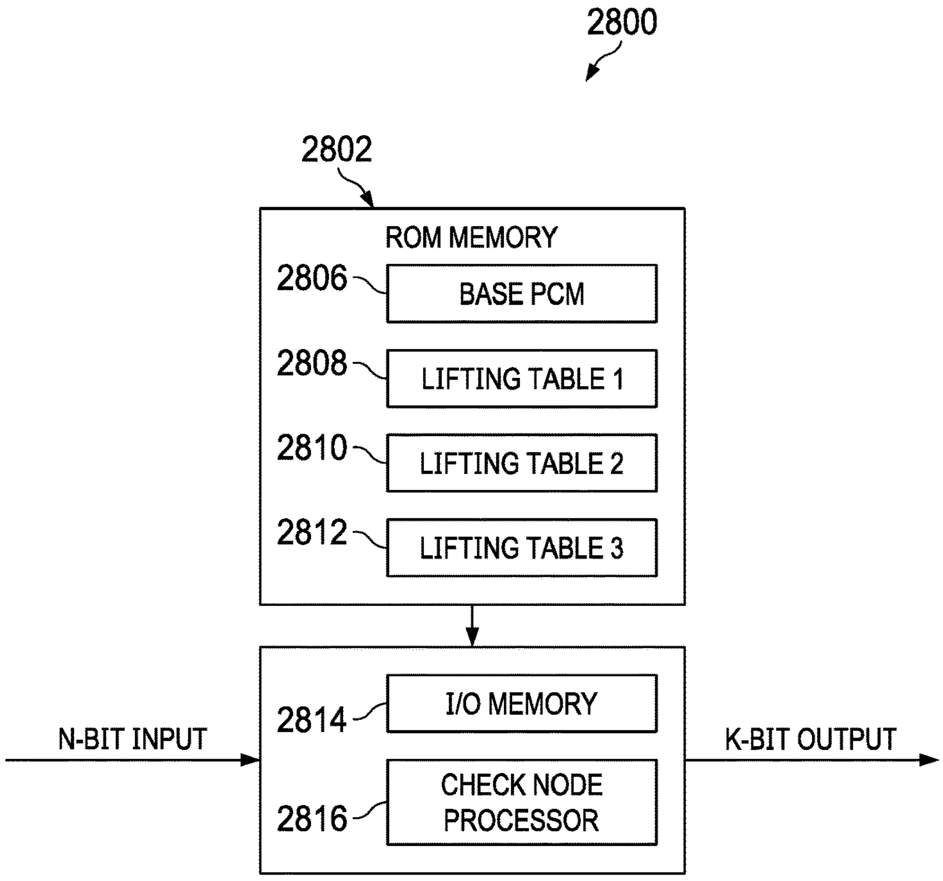
FIG. 28 is a block diagram of an embodiment of an LDPC decoder.

FIG. 28 is a block diagram of an embodiment of a LPDC decoder 2700. The LPDC decoder 2700 includes a read-only memory (ROM) 2702 for storing base PCMs 2706 and the one or more lifting tables T 2708, 2710, 2712, I/O memory 2714, and a check node processor 2716. The decoder 2700 receives an input LLR (log likelihood ratio) sequence of length N and generates a K-bit output. The read-only memory 2702 stores lift shift values of the base PCMs 2706 and the lifting table(s) 2708, 2710, 2712. The lifting table 2708, 2710, 2712 includes indices of lift size offsets and /or allowed circulant sizes, and indices corresponding to a lifting function. The I/O memory 2714 stores the input vector of length N of LLR values and is used by the check node processor 2716 to generate the K-bit output. The K-bit output is then stored in the I/O memory 2714. The check node processor 2716 generates a K-bit output information bit sequence according to the received N-component input, using a child PCM generated on the fly from one of the base PCMs 2706 by producing, for each non-zero circulant of the base PCM 2706, shift values of the child code from the base code shift value by selecting one of the circulant offset values and/or allowed circulant size and applying to it a lifting function or functions corresponding to selected indices in one of the lifting tables 2708, 2710, 2712.

Figure 29:
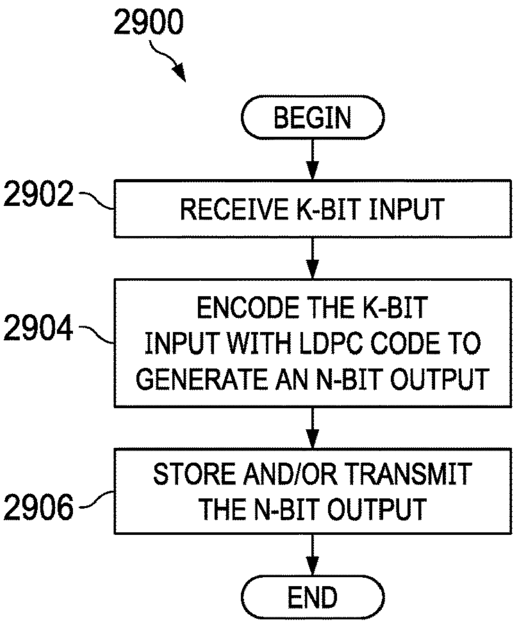
FIG. 29 is a flowchart of an embodiment of a method for encoding data using LDPC, the disclosed lifting tables, and the disclosed lifting functions.

FIG. 29 is a flowchart of an embodiment of a method moo for encoding data using LDPC, the disclosed lifting tables, and the disclosed lifting functions. The method 2800 includes, at a first step, at step 2802, receiving a K-bit source word. In the next step, at step 2804, the K-bit source word is encoded by an LPDC coder to produce an N-bit code word using the disclosed lifting table and lifting functions. In the next step, at step 2806, the encoder then transmits the N-bit code word.

Figure 30:
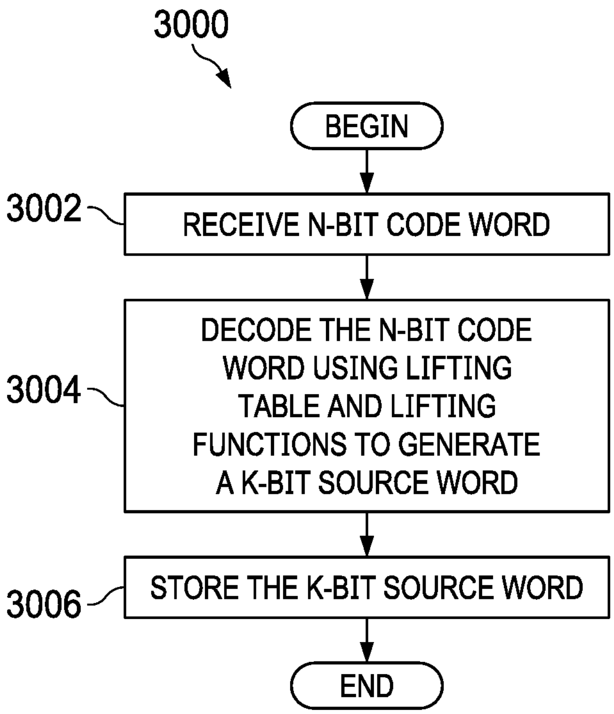
FIG. 30 is a flowchart of an embodiment of a method for decoding data using LDPC, the disclosed lifting tables, and the disclosed lifting functions.

FIG. 30 is a flowchart of an embodiment of a method 2900 for decoding data using LDPC, the disclosed lifting tables T, and the disclosed lifting functions. The method 2900 includes, in a first step, at 2902, receiving a K-bit source word. In the next step, at step 2904, the N-bit code word is decoded by an LPDC coder to produce a K-bit source word using the disclosed lifting table T and lifting functions. In the next step, at step 2906, the decoder then stores the K-bit source word. The decoder uses the redundancy in the received information sequence in a decoding operation performed by the decoder to correct errors in the received information sequence and produce a decoded information sequence. The decoded information sequence is an estimate of the encoded information sequence from which (an estimate of) the information sequence can be extracted.

Figure 31:
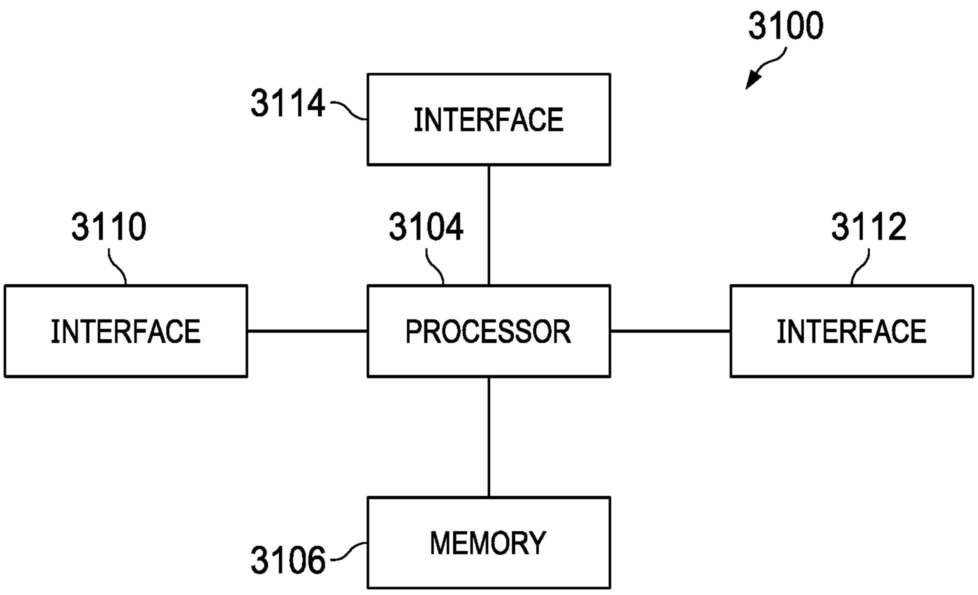
FIG. 31 illustrates a block diagram of an embodiment processing system for performing methods described herein, which may be installed in a host device.

FIG. 31 illustrates a block diagram of an embodiment processing system 3000 for performing methods described herein, which may be installed in a host device. As shown, the processing system 3000 includes a processor 3004, a memory 3006, and interfaces 3010-3014, which may (or may not) be arranged as shown in FIG. 31. The processor 3004 may be any component or collection of components adapted to perform computations and/or other processing related tasks, and the memory 3006 may be any component or collection of components adapted to store programming and/or instructions for execution by the processor 3004. In an embodiment, the memory 3006 includes a non-transitory computer readable medium. The interfaces 3010, 3012, 3014 may be any component or collection of components that allow the processing system 3000 to communicate with other devices/components and/or a user. For example, one or more of the interfaces 3010, 3012, 3014 may be adapted to communicate data, control, or management messages from the processor 3004 to applications installed on the host device and/or a remote device. As another example, one or more of the interfaces 3010, 3012, 3014 may be adapted to allow a user or user device (e.g., personal computer (PC), etc.) to interact/communicate with the processing system 3000. The processing system 3000 may include additional components not depicted in FIG. 31, such as long term storage (e.g., non-volatile memory, etc.).

In some embodiments, the processing system 3000 is included in a network device that is accessing, or part otherwise of, a telecommunications network. In one example, the processing system 3000 is in a network-side device in a wireless or wireline telecommunications network, such as a base station, a relay station, a scheduler, a controller, a gateway, a router, an applications server, or any other device in the telecommunications network. In other embodiments, the processing system 3000 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

In some embodiments, one or more of the interfaces 3010, 3012, 3014 connects the processing system 3000 to a transceiver adapted to transmit and receive signaling over the telecommunications network.

Figure 32:
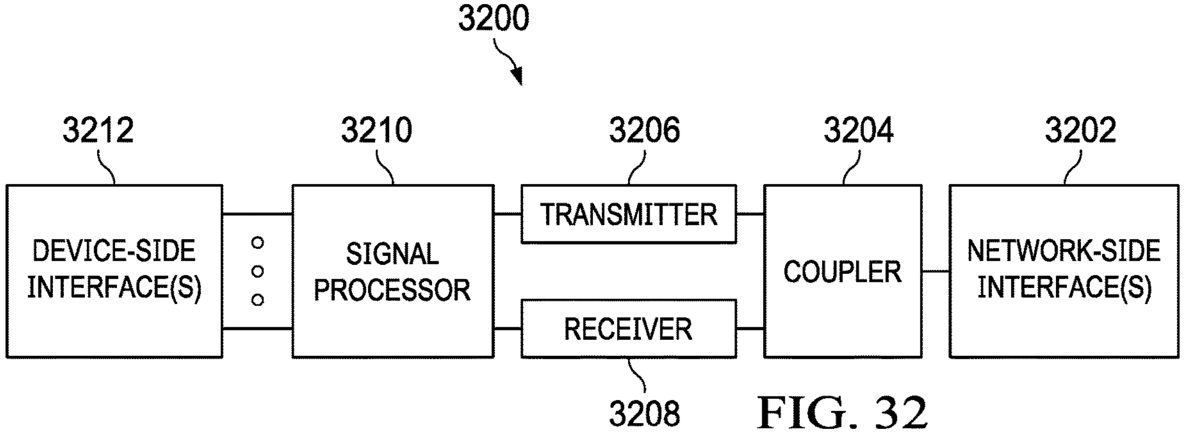
FIG. 32 illustrates a block diagram of a transceiver adapted to transmit and receive signaling over a telecommunications network.

FIG. 32 illustrates a block diagram of a transceiver 3100 adapted to transmit and receive signaling over a telecommunications network. The transceiver 3100 may be installed in a host device. As shown, the transceiver 3100 includes a network-side interface 3102, a coupler 3104, a transmitter 3106, a receiver 3108, a signal processor **311*o*, and a device-side interface 3112. The network-side interface 3102 may include any component or collection of components adapted to transmit or receive signaling over a wireless or wireline telecommunications network. The coupler 3104 may include any component or collection of components adapted to facilitate bi-directional communication over the network-side interface 3102. The transmitter 3106 may include any component or collection of components (e.g., up-converter, power amplifier, etc.) adapted to convert a baseband signal into a modulated carrier signal suitable for transmission over the network-side interface 3102. The receiver 3108 may include any component or collection of components (e.g., down-converter, low noise amplifier, etc.) adapted to convert a carrier signal received over the network-side interface 3102 into a baseband signal. The signal processor 3110 may include any component or collection of components adapted to convert a baseband signal into a data signal suitable for communication over the device-side interface(s) 3112, or vice-versa. The device-side interface(s) 3112 may include any component or collection of components adapted to communicate data-signals between the signal processor 3110 and components within the host device (e.g., the processing system 800**, local area network (LAN) ports, etc.).

The transceiver 3100 may transmit and receive signaling over any type of communications medium. In some embodiments, the transceiver 3100 transmits and receives signaling over a wireless medium. For example, the transceiver 3100 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 3102 includes one or more antenna/radiating elements. For example, the network-side interface 3102 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 3100 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Figure 33:
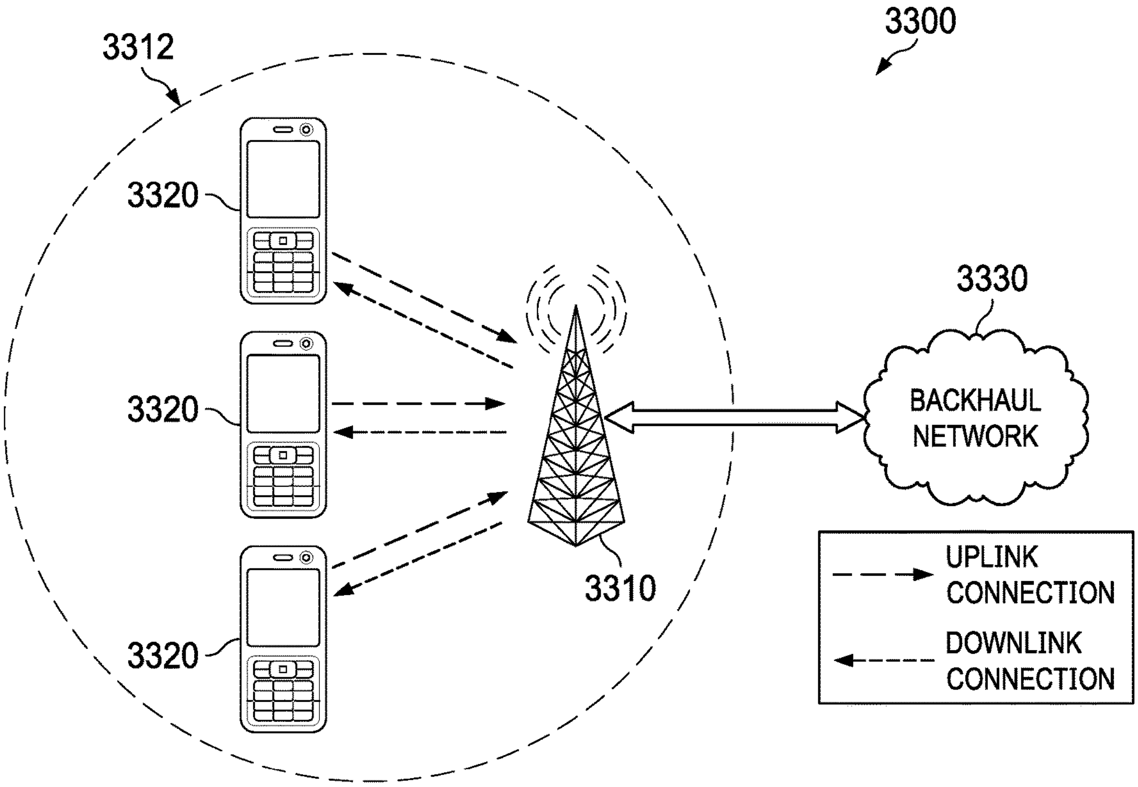
FIG. 33 illustrates an embodiment network for communicating data in which the disclosed methods and systems may be implemented.

FIG. 33 illustrates an embodiment network 3200 for communicating data in which the disclosed methods and systems may be implemented. The network 3200 includes a plurality of network components. The network components may include an access point (AP), a station (STA) (e.g., a wireless device or user equipment (UE) such as a wireless phone, etc.), or any other wireless reception point. In an embodiment, the network 3200 includes an access point (AP) 3210 having a coverage area 3212, a plurality of STAs 3220, and a backhaul network 3230. In an embodiment, the AP may be implemented as transceiver 3100 shown in FIG. 32. In an embodiment, the STAs 3220 may be implemented as, for example, processing system 3000 shown in FIG. 31. As used herein, the term AP may also be referred to as a transmission point (TP) and the two terms may be used interchangeably throughout this disclosure. In various embodiments, the AP 3210 may be a base station (BS) also referred to as a base transceiver station (BTS). Examples of a BS include an e Node B (eNB), a gNB, and the like. In an embodiment, the AP 3210 may be a wireless router. Thus, the AP 3210 may include any component capable of providing wireless access by, inter alia, establishing uplink (dashed line) and/or downlink (dotted line) connections with the STAs 3220. The STAs 3220 may include any component capable of establishing a wireless connection with the AP 3210. Examples of STAs 3220 include mobile phones, tablet computers, and laptop computers. The backhaul network 3230 may be any component or collection of components that allow data to be exchanged between the AP 3210 and a remote end (not shown). In some embodiments, the network 3200 may include various other wireless devices, such as relays, femtocells, etc.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by an iterating unit/module, a difference unit/module, an adjustment unit/module, a generating unit/module, a calculating unit/module, an assigning unit/module, an incrementing unit/module, a decrementing unit/module, and/or a setting unit/module. The respective units/modules may be hardware, software, or a combination thereof. For instance, one or more of the units/modules may be an integrated circuit, such as field programmable gate arrays (FPGAs) or application-specific integrated circuits (ASICs).

In an embodiment, a method for lifting a child code from a base code for encoding and decoding data includes determining a single combination of a circulant size, a lifting function, and a labelled base matrix PCM according to an information length and a code rate using data stored in a lifting table. The lifting table was defined at a code generation stage. The method also includes calculating a plurality of shifts for the child code. Each shift is calculated by applying the lifting function to the labelled base matrix PCM with a defined index using the circulant size. The method also includes using the derived child PCM to encode or decode data. The method also includes deriving a child PCM according to the single combination of the circulant size, the lifting function, and the labeled PCM and according to one of the plurality of shifts for the child code. The method also includes using the derived child PCM to encode or decode data.

An embodiment of the disclosure provides a method for generating a code. The method includes determining an allowed subset of lift sizes Z for each coding rate R and each information length K. The method also includes determining at least one lifting functions $f_i$ for each code rate R and each allowed Z. The method also includes determining a set of base PCMs describing a single protograph. The base PCMs are based on coding rates R and allowed Zs. The method also includes selecting a single combination of a lift size Z, a lifting function $f_i$ and a base $PCM_t$. The method also includes storing a circulant size offset and/or a circulant size index, a lifting function index, and a base code index corresponding to the single combination for each information length and each coding rate.

An embodiment of the disclosure provides a method for operating a device at a transmitting side. The method includes encoding, at an encoder, information bits into code word. The method also includes transmitting, at a transmitter, signals to a receiving side. The signals including the code words. The information bits are encoded using a plurality of labelled base PCMs. The labelled base PCMs are derived from a single base PCM describing a single protograph.

An embodiment of the disclosure provides a method for operating a device at a receiving side. The method includes receiving, at a receiver, signals from a transmitting side. The signals include a code words. The method also includes decoding, at a decoder, the code words by applying extracting information bits. The information bits are decoded using a plurality of labelled base PCMs. The labelled base PCMs are derived from a single base PCM describing a single protograph.

In an embodiment, an encoder or decoder includes a processor and a computer readable storage medium storing programming for execution by the processor. The programming includes instructions to determine a single combination of a circulant size, a lifting function and a labelled PCM according to an information length and a code rate using data stored in a lifting table which was defined at a code generation stage. The programming also includes instructions to calculate a plurality of shifts for the child code, wherein each shift is calculated by applying the lifting function to the labelled PCM with a defined index using the circulant size. The programming also includes instructions to derive a child PCM according to the single combination of the circulant size, the lifting function, and the labeled PCM and according to one of the plurality of shifts for the child code. The programming also includes instructions to use the derived child PCM to encode or decode data.

In one or more aspects of the disclosure, shifts of non-zero circulants for predefined positions are unchanged.

In one or more aspects of the disclosure, the labelled PCM is derived from a base code, and wherein the base code is represented by the PCM shown in FIGS. 5A and 5A1.

In one or more aspects of the disclosure, the labelled PCM is derived from a base code, and wherein the base code is represented by one of the PCMs depicted in the figures of this disclosure.

In one or more aspects of the disclosure, the labelled PCM is a labelled PCM represented by one of $PCM_0$-$PCM_7$ depicted in the figures of this disclosure.

In one or more aspects of the disclosure, the labelled PCMs is a labelled PCM shown in FIGS. 5L-5L1.

In one or more aspects of the disclosure, the lifting function is selected from a single lifting function.

In one or more aspects of the disclosure, the lifting function is selected from a plurality of lifting functions.

In one or more aspects of the disclosure, the labelled base matrix PCM is directly derived from the circulant size.

In one or more aspects of the disclosure, the circulant size is Z, where Z=a*2^s.

In one or more aspects of the disclosure, the lifting function provides a code shift value.

In an embodiment, a method for generating a code for encoding or decoding data includes determining a subset of allowed lift sizes Z for each coding rate R and each information length K. The method also includes determining at least one lifting functions fi for each code rate R and each Z of the subset of the allowed lift sizes Z. The method also includes determining a set of labelled PCMs describing a single protograph. The labelled PCMs are based on coding rates R and the subset of allowed lift sizes Z. The method also includes selecting a single combination of a lift size Z, a lifting function f, and a labelled PCMt. The method also includes storing a circulant size offset and/or a circulant size index, a lifting function index, and a labelled PCM index corresponding to the single combination for each information length and each coding rate.

In one or more aspects of the disclosure, the set of labelled PCMs describing the single protograph is based on the PCMs disclosed in the figures of this disclosure.

In one or more aspects of the disclosure, the set of labelled PCMs describing the single protograph is based on the PCMs disclosed in the figures of this disclosure.

In one or more aspects of the disclosure, the lifting function is selected from a single lifting function.

In an embodiment, a method for operating a device at a transmitting side includes encoding, at an encoder, information bits into code word. The method also includes transmitting, at a transmitter, signals to a receiving side. The signals include the code words. The information bits are encoded using a plurality of labelled base PCMs. The labelled base PCMs are derived from a single base PCM describing a single protograph.

In one or more aspects of the disclosure, the information bits have different bit lengths and are encoded with different coding rates.

In one or more aspects of the disclosure, a labelled base PCM is selected according to a coding rate.

In one or more aspects of the disclosure, encoding includes switching from a first labelled PCM to a second labelled PCM when the coding rate changes from a first coding rate to a second coding rate.

In one or more aspects of the disclosure, encoding includes switching from a first labelled PCM to a second labelled PCM when the lift size changes from a first lift size to a second lift size, the first and second lift sizes being dependent on different information bit lengths.

In one or more aspects of the disclosure, encoding information bits into code words includes encoding information bits into code words according to the lifting table shown in FIG. 6A, wherein an index a represents a labelled base PCM, wherein Z represents the lift size, and wherein Z is dependent from information bit length.

In one or more aspects of the disclosure, encoding information bits into code words includes encoding information bits into code words according to the lifting table shown in FIG. 6B, wherein an index a represents a labelled base PCM, and wherein Z represents the lift size.

In one or more aspects of the disclosure, encoding information bits into code words includes encoding information bits into code words according to the lifting table shown in FIG. 6C, wherein an index a represents a labelled base PCM, and wherein Z represents the lift size.

In one or more aspects of the disclosure, encoding information bits into code words includes encoding information bits into code words according to the lifting table shown in FIG. 6D, wherein an index a represents a labelled base PCM, and wherein Z represents the lift size.

In one or more aspects of the disclosure, the base PCM is represented by the PCMs disclosed in the figures of this disclosure.

In an embodiment, a method for operating a device at a receiving side includes receiving, at a receiver, signals from a transmitting side, the signals including a code word. The method also includes decoding, at a decoder, the code words by applying extracting information bits. The information bits are decoded using a plurality of labelled base PCMs. The labelled base PCMs are derived from a single base PCM describing a single protograph.

In one or more aspects of the disclosure, the information bits have different bit lengths and are decoded with different coding rates.

In one or more aspects of the disclosure, a labelled base PCM is selected according to a coding rate.

In one or more aspects of the disclosure, decoding comprises switching from a first labelled PCM to a second labelled PCM when the coding rate changes from a first coding rate to a second coding rate.

In one or more aspects of the disclosure, decoding includes switching from a first labelled PCM to a second labelled PCM when the lift size changes from a first lift size to a second lift size, the first and second lift sizes being dependent on different information bit lengths.

In one or more aspects of the disclosure, encoding code words into information bits includes decoding code words into information bits according to the lifting table shown in FIG. 6A, wherein an index a represents a labelled base PCM, wherein Z represents the lift size, and wherein Z is dependent from information bit length.

In one or more aspects of the disclosure, decoding code words into information bits includes decoding code words into information bits according to the lifting table shown in FIG. 6B, wherein an index a represents a labelled base PCM, and wherein Z represents the lift size.

In one or more aspects of the disclosure, decoding code words into information bits includes decoding code words into information bits according to the lifting table shown in FIG. 6C, wherein an index a represents a labelled base PCM, and wherein Z represents the lift size.

In one or more aspects of the disclosure, decoding code words into information bits includes decoding code words into information bits according to the lifting table shown in FIG. 6D, wherein an index a represents a labelled base PCM, and wherein Z represents the lift size.

In one or more aspects of the disclosure, the base PCM is represented by the PCM shown in FIGS. 5A and 5A1.

In one or more aspects of the disclosure, the base PCM is represented by the PCM shown in FIGS. 5K and 5K1.

In an embodiment, an encoder or decoder includes a processor and a computer readable storage medium storing programming for execution by the processor. The programming includes instructions to determine a single combination of a circulant size, a lifting function and a labelled PCM according to an information length and a code rate using data stored in a lifting table which was defined at a code generation stage. The programming also includes instructions to calculate a plurality of shifts for the child code, wherein each shift is calculated by applying the lifting function to the labelled PCM with a defined index using the circulant size. The programming also includes instructions to use the derived child PCM to encode or decode data.

The content of the following references are incorporated herein by reference as if reproduced in their entirety:

Provisional Application No. 62/454,416 (HW 85338016 US01) titled OFFSET LIFTING METHOD and filed Feb. 3, 2017

U.S. patent application Ser. No. 15/887,148 (HW 85338016 US02) titled OFFSET LIFTING METHOD and filed Feb. 2, 2018

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for operating a transmitting device, the method comprising:

encoding, by the transmitting device, information bits into codewords using labelled base Parity Check Matrices (PCMs), the labelled base PCMs derived from a single base PCM describing a single protograph; and transmitting, by the transmitting device, the codewords to a receiving device.

2. The method of claim 1, wherein the information bits have different bit lengths and are encoded with different coding rates.

3. The method of claim 2, wherein a labelled base PCM is selected according to a coding rate.

4. The method of claim 2, wherein encoding the information bits into the codewords using the labelled base PCMs comprises switching from a first labelled base PCM to a second labelled base PCM upon detecting a change in a coding rate of the information bits.

5. The method of claim 2, wherein encoding the information bits into the codewords using the labelled base PCMs comprises switching from a first labelled base PCM to a second labelled base PCM upon detecting a change in a lift size, the lift size being dependent on a length of the information bits.

6. An transmitting device comprising:

a processor; and a non-transitory computer readable storage medium storing programming for execution by the processor, the programming including instructions to:

encode information bits into codewords using labelled base Parity Check Matrices (PCMs), the labelled base PCMs derived from a single base PCM describing a single protograph; and transmit the codewords to a receiving device.

7. The transmitting device of claim 6, wherein the information bits have different bit lengths and are encoded at different coding rates.

8. The transmitting device of claim 7, wherein a labelled base PCM is selected according to a coding rate.

9. The transmitting device of claim 7, wherein the instructions to encode the information bits into the codewords using the labelled base PCMs include instructions to switch from a first labelled base PCM to a second labelled base PCM upon detecting a change in a coding rate of the information bits, the coding rate of the information bits based on a length of the information bits.

10. The transmitting device of claim 7, wherein the instructions to encode the information bits into the codewords using the labelled base PCMs includes instructions to switch from a first labelled base PCM to a second labelled base PCM upon detecting a change in a lift size associated with the information bits, the lift size being dependent on a length of the information bits.

11. A method for operating a device at a receiving side, the method comprising:

receiving, by the receiving device, codewords from a transmitting device; and decoding, by the receiving device, the codewords using labelled base Parity Check Matrices (PCMs) to obtain information bits, the labelled base PCMs derived from a single base PCM describing a single protograph.

12. The method of claim 11, wherein at least some of the codewords have different coding rates.

13. The method of claim 12, wherein each of the labelled base PCMs is used to decode a different codeword at a different coding rate.

14. The method of claim 11, wherein decoding the codewords using the labelled base PCMs to obtain the information bits comprises switching from a first labelled PCM to a second labelled PCM upon detecting a change in a coding rate of the codewords.

15. The method of claim 11, wherein decoding the codewords using the labelled base PCMs to obtain the information bits comprises switching from a first labelled PCM to a second labelled PCM upon detecting a change in a lift size associated with the codewords, the lift size being dependent on a length of the information bits.

16. A receiving device comprising:

a processor; and a non-transitory computer readable storage medium storing programming for execution by the processor, the programming including instructions to:

receive codewords from a transmitting device; and decode the codewords using labelled base Parity Check Matrices (PCMs) to obtain information bits, the labelled base PCMs derived from a single base PCM describing a single protograph.

17. The receiving device of claim 16, wherein at least some of the codewords have different coding rates.

18. The receiving device of claim 17, wherein each of the labelled base PCMs is used to decode a different codeword at a different coding rate.

19. The receiving device of claim 16, wherein the instructions to decode the codewords using the labelled base PCMs to obtain the information bits include instructions to switch from a first labelled PCM to a second labelled PCM upon detecting a change in a coding rate of the codewords.

20. The receiving device of claim 16, wherein the instructions to decode the codewords using the labelled base PCMs to obtain the information bits include instructions to switch from a first labelled PCM to a second labelled PCM upon detecting a change in a lift size associated with the codewords, the lift size being dependent on a length of the information bits.

* * * * *